United States Patent [19]

Lowndes et al.

[11] Patent Number: 5,107,191
[45] Date of Patent: Apr. 21, 1992

[54] TRACTION MOTOR CURRENT CONTROL BATTERY MONITORING SYSTEM

[75] Inventors: Michael W. Lowndes, Moseley; Derek S. Adams, Solihull; Neville J. Arlidge, Kings Heath, all of England

[73] Assignee: Lucas Industries, Ltd., Birmingham, England

[21] Appl. No.: 537,970

[22] Filed: Sep. 30, 1983

Related U.S. Application Data

[62] Division of Ser. No. 208,097, Nov. 18, 1980, Pat. No. 4,433,278.

[30] Foreign Application Priority Data

Jun. 28, 1980 [GB] United Kingdom ............... 8021285

[51] Int. Cl.$^5$ ................................................ H02J 7/00
[52] U.S. Cl. ................................... 318/139; 320/43; 320/48
[58] Field of Search ................... 318/139, 434; 320/2, 320/15, 17, 32, 43, 48; 324/427, 429, 430, 433, 434

[56] References Cited

U.S. PATENT DOCUMENTS

| | | |
|---|---|---|
| 3,417,307 | 4/1966 | Kosa et al. |
| 3,568,175 | 3/1971 | Schwehr ........................... 320/48 X |
| 4,006,397 | 11/1976 | Catotti et al. |
| 4,008,423 | 12/1976 | Christianson et al. ............... 318/139 |
| 4,012,681 | 3/1977 | Finger et al. ..................... 320/48 X |
| 4,210,855 | 7/1980 | Harer et al. ....................... 320/32 X |

FOREIGN PATENT DOCUMENTS

| | | |
|---|---|---|
| 0051722 | 5/1982 | European Pat. Off. .............. 320/48 |
| 1413940 | 2/1968 | Fed. Rep. of Germany ........ 320/48 |
| 2852625 | 12/1978 | Fed. Rep. of Germany . |
| 599415 | 3/1948 | United Kingdom . |
| 1262016 | 2/1972 | United Kingdom . |
| 1432318 | 4/1976 | United Kingdom . |
| 1494458 | 12/1977 | United Kingdom . |
| 1531294 | 11/1978 | United Kingdom . |
| 2015171 | 9/1979 | United Kingdom . |
| 2031168 | 4/1980 | United Kingdom . |
| 2086060 | 5/1982 | United Kingdom . |

Primary Examiner—Bentsu Ro
Attorney, Agent, or Firm—Ladas & Parry

[57] ABSTRACT

A microprocessor based electric vehicle traction battery monitoring system evaluates the state of charge, interfaces with a traction motor control system, and controls recharging. The state of charge is evaluated during the first part of discharge by integrating the current after compensating it for rate of discharge and during the last part of discharge by dividing the battery into sub-packs and evaluating the state of charge from the lowest sub-pack voltage compensated for polarization voltage. The charge storage capacity is also calculated from the lowest sub-pack voltage. The maximum traction motor current is progressively limited during the last part of discharge. During charging, the charge withdrawn is replaced while progressively reducing the charging current and the battery is then charged at a constant current until the rate of rise of the lowest sub-pack voltage falls below a fixed level.

1 Claim, 89 Drawing Sheets

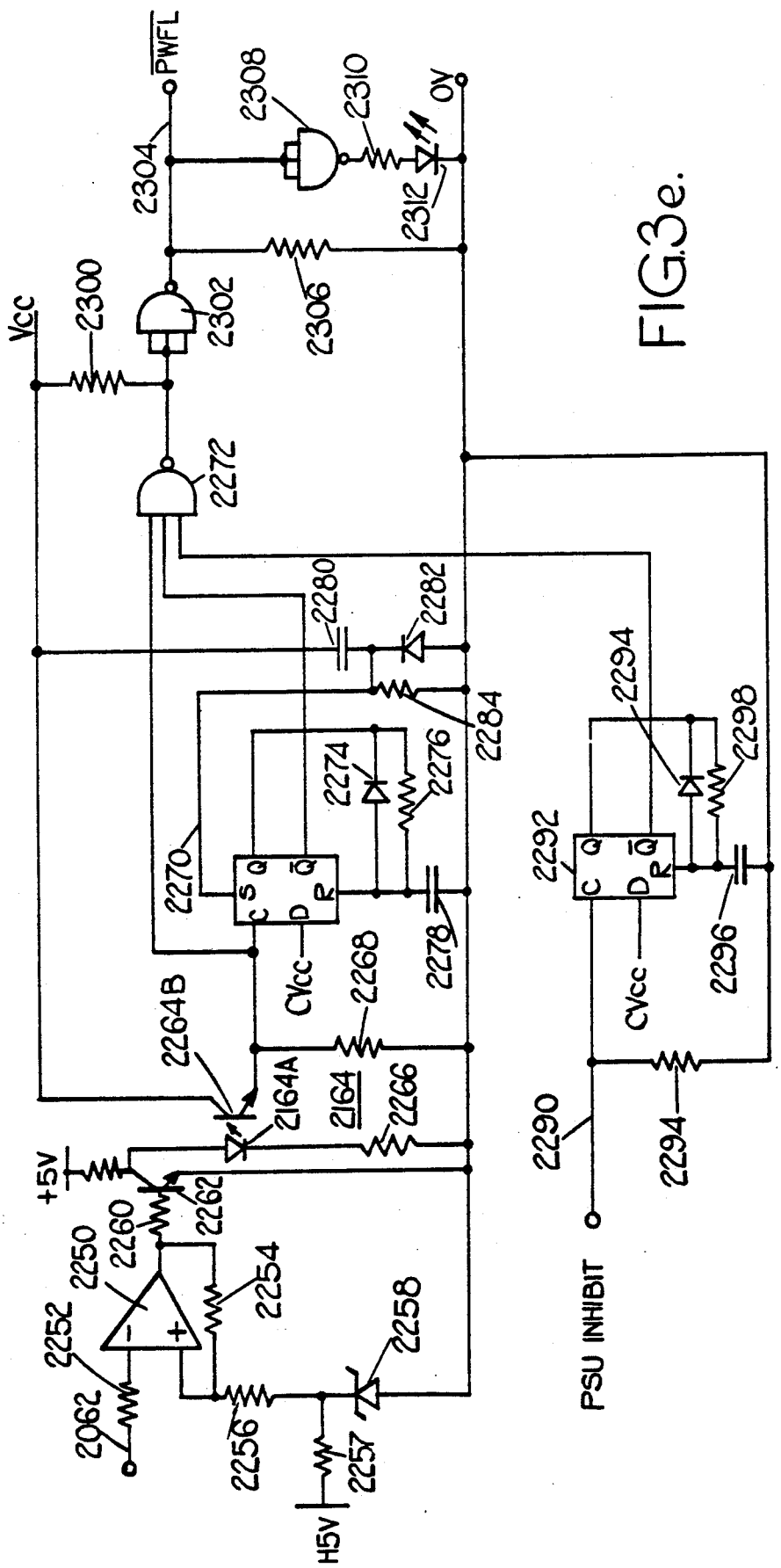

DEBPI

| b7 | b6 | b5 | b4 | b3 | b2 | b1 | b0 |
|----|----|----|----|----|----|----|----|

- b7: UNASSIGNED
- b6: UNASSIGNED
- b5: UNASSIGNED
- b4: CHARGER POWER ON
- b3: GAS HEADS NOT TRIPPED
- b2: FANS RUNNING
- b1: CHARGER CONNECTED
- b0: VEHICLE POWER ON

FIG.19a.

CHWORD

| b7 | b6 | b5 | b4 | b3 | b2 | b1 | b0 |
|----|----|----|----|----|----|----|----|

- b7: IDLE DISCHARGE
- b6: UNASSIGNED
- b5–b3: BINARY CHARGE STATE NUMBER
- b2–b0: BINARY CURRENT LEVEL NUMBER

FIG.19b.

STCH

| b7 | b6 | b5 | b4 | b3 | b2 | b1 | b0 |
|----|----|----|----|----|----|----|----|
| UNASSIGNED | UNASSIGNED | UNASSIGNED | UNASSIGNED | IDLE - CHARGE | IDLE - DRIVE | CHARGE - IDLE | DRIVE - IDLE |

FIG. 19c.

PGFW

| b7 | b6 | b5 | b4 | b3 | b2 | b1 | b0 |
|----|----|----|----|----|----|----|----|
| DISCHARGE > 10 AMP HOURS | AHL CORRECTED | PARTIAL CHARGE FLAG | NEW VALUE OF AHL AVAILABLE | GAS HEADS RESETTING | FAN FAILURE | GAS HEAD FAILURE | CHARGE ENABLE |

FIG. 19d.

VEHICLE STATE LINE PIA

A SIDE

B SIDE

CLOCK PIA

A SIDE

B SIDE

TRACTION MOTOR CURRENT CONTROL BATTERY MONITORING SYSTEM

This is a division of co-pending application Ser. No. 208,097 filed Nov. 18,1980, now U.S. Pat. No. 4,433,278.

This invention relates to a battery monitoring system and particularly, but not exclusively, to such a system for an electric vehicle traction battery pack. More particularly this invention relates to a battery state of charge evaluator, to a combination of a battery monitoring sytem and a control system for a traction motor supplied with current from a traction battery, and to a battery charging system.

During discharge of a battery at a constant current, its total on-load voltage falls regularly with charge withdrawn until a point is reached at which all the available active materials have been exhausted. After this point, known as end of discharge, the internal resistance of the battery rises sharply and consequently its voltage falls sharply with further charge withdrawal. In some known state of charge evaluators this fall of voltage is used to determine the state of charge of the battery, the accuracy of the state of charge evaluator improving towards the end of discharge.

A traction battery pack comprises many cells connected in series and in such a battery pack there is an approximately Gaussian variation of charge storage capacities among the individual cells. In the case of a lead-acid battery the variation is of the order of ±2% of the nominal cell capacity when the battery is new but, when the battery pack has been subjected to deep discharge/recharging cycling, the capacity of some of the weaker cells may fall to 10–15% below their nominal capacity. With such a battery pack towards the end of discharge some of the cells will have passed their individual end of discharge points whilst other cells are still on the useful side of their end of discharge points. If the battery pack is permitted to discharge until the average cell voltage is equal to the voltage which corresponds to the end of discharge for a single cell then some of the cells may start charging with the reverse polarity.

This effect which is known as cell reversal is very damaging to a cell and so discarge should be terminated before cell reversal occurs. Thus, towards the end of discharge the total battery voltage does not provide a reliable indication of the state of charge.

It is an object of this invention to provide a state of charge evaluator for a traction battery pack of greater reliability than the evaluator mentioned above.

According to one aspect of this invention there is provided a state of charge evaluator for a traction battery pack having a pluralilty of cells connected in series and divided into a plurality of sub-packs each of which includes one or more cells comprising;

means for measuring the voltage of the individual sub-packs, means for selecting the sub-pack having the lowest voltage, and means for determining the state of charge of the battery pack, said means using the voltage of said sub-pack having the lowest voltage for determining the state of charge in the last part of discharge.

By determining the state of charge from the lowest sub-pack voltage, a reliable result is obtained and the point beyond which the battery should not be further discharged may be indicated accurately.

It would be possible to arrange the state of charge evaluator so that each sub-pack comprises a single cell with end of discharge for the entire battery pack being indicated when any clell voltage falls below a datum value. However, if the datum value is equal to the end of discharge voltage for a single cell and the evaluator is used with a battery having one cell which has deteriorated to the point where it has for example 15% less storage capacity than the remaining cells, this end of discharge will be indicated when the remaining cells still possess a substantial part for example 20% of their charge. On the other hand, if the datum value is below the end of discharge voltage for a single cell and the evaluator is used with a battery in which there is little variation in storage capacity between the individual cells, the end of discharge will be indicated a long time after there is any useful charge remaining in the battery. It would also be necessary to provide a very extensive circuit to monitor the voltage of each cell of a large traction battery.

Therefore, it is preferred that each sub-pack comprises more than one cell.

By forming each sub-pack from more than one cell the datum value may be made equal to the end of discharge voltage for a single cell without the risk of indicating end of discharge when most of the cells still possess a substantial part of their charge. For example, if there are n cells in each sub-pack and one of the sub-packs includes a weak cell of low storage capacity, then this weak cell will contribute only 1/n to the overall sub-pack voltage. Consequently, when the average cell voltage of the sub-pack is equal to the end of discharge voltage for a single cell, the weak cell will have been discharged well beyond its end of discharge point and the other cells will no longer possess a substantial part of their charge. By selecting a suitable value for n it may be arranged that no cell reversal will normally occur before end of discharge for the entire pack is indicated.

Conveniently, the number of cells in each sub-pack selected to be as large as possible without the risk of cell reversal occurring before end of discharge is indicated.

In the case of a lead-acid battery, there may be twelve cells in each sub-pack.

As mentioned above the accuracy of a state of charge evaluator based on a voltage measurement improves towards the end of discharge. In order to obtain an accurate evaluation of the state of charge in the early part of discharge, it is preferred that a state of charge evaluator according to this aspect of the invention includes means responsive to the battery current for producing a current value, and means for integrating this current value with respect to time to obtain a value representing charge withdrawn, the determining means determining the state of charge from the charge withdrawn value and a value representing the battery pack charge storage capacity during the first part of each discharge, and from the lowest sub-pack voltage during the last part of each discharge.

In general, the charge which may be withdrawn from a battery decreases with increasing discharge current. The cause of this effect is the selection of progressively more preferential reaction sites at the surfaces of the battery plates at higher current because of the limited diffusion rate of the active ions to the centres of the plates.

It is preferred, therefore, that the state of charge evaluator includes means for adjusting the current value according to the rate of discharge, the integration means integrating the adjusted current value to obtain an effective charge withdrawn value, and the determining means using the effective charge withdrawn value during the first part of discharge to obtain the state of charge.

The tern "effective charge withdrawn value" as herein used means the actual charge withdrawn compensated to allow for the rate of discharge. Thus, a discharge current increases the effective charge withdrawn becomes progressively greater than the actual charge withdrawn. For a complete discharge the total effective charge withdrawn does not vary with discharge current.

The charge which may be withdrawn from a battery has been expressed mathematically by Peukert, whose equation states:

$$\int_0^T I^n dt = \text{Constant}$$

where I is the discharge current, n is a constant, typically 1.15 load acid batteries, and T is discharge time.

It is preferred, therefore, that the adjusting means raises the current value to the power n.

In some known battery state of charge evaluators the state of charge is evaluated by integrating the discharge current with respect to time to obtain a value representing charge withdrawn then determining the state of charge by comparing this value with a value representing the charge storage capacity of the battery. However, such state of charge evaluators suffer from the problem that the charge capacity of a battery varies during the life of the battery and also with the manner in which the battery is used.

Accordingly it is another object of this invention to provide a state of charge evaluator in which this problem is overcome or reduced.

According to a second aspect of this invention, there is provided a battery state of charge evaluator comprising:

means responsive to the battery current for producing a current value.

means for integrating the current value with respect to time to obtain a value representing charge withdrawn, means responsive to the battery voltage for producing a voltage value, means for determining the state of charge, said means determining the state of charge from the charge withdrawn value and the value representing the charge storage capacity during the first part of each discharge and determining the state of charge from the voltage value during the last part of each discharge, and means for correcting the battery charge storage capacity value in accordance with the state of charge as determined from the battery voltage and the charge withdrawn value.

As the state of charge may be determined accurately from the voltage value during the last part of discharge, the battery capacity is accurately up-dated at the end of each discharge.

Preferably, the state of charge valuator includes means for adjusting the charge withdrawn value to allow for self-discharge when the battery is idle in accordance with the time it is idle.

Conveniently, the units representing state of charge are re-scaled during the last part of discharge in order to avoid a discontinuity in the value representing the state of charge.

When a state of charge evaluator according to this aspect of the invention is used wiht an electrical vehicle traction battery, the arrangement may be such that the battery and evaluator are detachable as a single unit from the vehicle. This has the advantage that the evaluator is associated with a particular battery pack.

The state of charge evaluator according to one of the previous two aspects of this invention may comprise a computer permanently programmed to evaluate the state of charge.

The computer may comprise a microprocessor unit and associated random-access-memory and read-only-memory, the read-only-memory containing a program for evaluating the state of charge.

In operating an electric vehicle having a main electric traction motor supplied with current from a traction battery pack, it is usual for the battery pack to be discharged deeply before re-charging so as to obtain the maximum possible range from each charge. Towards the end of such a deep discharge, the weaker lower capacity cells of the battery pack will reach their individual end of discharge points before stronger cells and further discharge may cause damage such as cell reversal to these weaker cells.

It is accordingly, a further object of this invention to prevent or reduce such damaging discharge.

According to a third aspect of this invention, there is provided a combined motor control and battery monitoring system for an electric vehicle having a main electric traction motor, said system comprising:

A traction battery pack having a plurality of cells connected in series for providing power to the traction motor, said battery pack being divided into a plurality of sub-packs each of which includes one or more cells;

means for controlling the current supplied to the traction motor;

means for determining when the voltage of the sub-pack having the lowest voltage falls below a critical value; and means interconnected with the control means and the determination means for restricting the current supplied to the traction motor when the lowest sub-pack voltage falls below said critical value.

By restricting the curent suplied to the motor, dagaming discharge will be at least reduced whilst at the same time it will still be possible to drive the vehicle.

The determining means may determine the remaining charge in the battery and the restricting means may progressively limit the maximum current which may be supplied to the traction motor as the remaining charge of the battery falls after the lowest sub-pack voltage has fallen below said critical value.

Preferably, each sub-pack comprises a plurality of cells.

According to a fourth aspect of this invention, there is provided a method of discharging a traction battery pack having a plurality of cells connected in series and supplying current to the main traction motor of an electric vehicle, said method comprising:

dividing the battery pack into a plurality of sub-packs each of which comprises one or more cells;

monitoring the sub-packs to determine when the voltage of the sub-pack having the lowest voltage falls below a critical value; and restricting the current supplied by the battery pack to the motor when the lowest sub-pack voltage has fallen below said critical value.

Preferably, the lowest sub-pack voltage is used to determine the remaining charge in the battery pack and the maximum current supplied to the motor is progressively limited as the remaining charge falls after the lowest sub-pack voltage has fallen below said critical value.

Preferably, each sub-pack comprises a plurality of cells.

When a battery pack is charged, some of the individual cells of the pack will reach their fully charged state before the remaining cells. Consequently, there is a problem that a traction battery pack charger may terminate its charging cycle berfore all the cells are fully charged or may continue charging for a substantial period after the weaker lower capacity cells have been fully charged. In the former case, the weaker cells will become progressively more undercharged over a number of charge and discharge cycles and may even become damaged towards the end of the discharge phases. In the latter case, the over charging will result in energy being wasterd and also may cause damage to the battery pack.

Accordingly, it is a further object of this invention to overcome or reduce this problem.

According to a fifth aspect of this invention, there is provided a charging system for a traction battery pack divided into a plurality of sub-packs comprising:

means for charging the battery pack according to a predetermined charging cycle, the charging cycle having a plurality of phases, means for measuring the voltages of the individual sub-packs.

means ror selecting the sub-pack having the lowest voltage, means for determining the rate of rise of the voltage of said selected sub-pack and means for determining when said rate of rise falls below a predetermined level, one of said phases of the charging cycle being terminated when said rate of rise falls below said predetermined level.

By terminating one of the phases when the rate of voltage rise of the weakest sub-pack is below a predetermined level, it is ensured that the sub-pack containing the weakest cells is fully charged and that the pack as a whole is not overcharged.

The charging sytem may include means for determining the charge withdrawn from the battery pack during discharge, one of the phases of the charging cycle supplying the battery pack with a charge equivalent to the charge withdrawn.

Preferably, the charging system includes means responsive to the temperature of the electrolyte of the battery pack, the voltage of the individual sub-packs being corrected in accordance with this temperature.

Acording to a sixth aspect of this invention, there is provided a method of charging a traction battery pack comprising:

performing a predetermined charging cycle on the pack, the cycle having a plurality of phases, dividing the battery pack into a plurality of sub-packs.

measuring the voltage of each individual sub-pack, selecting the sub-pack having the lowest voltage, determining the rate of rise of voltage of said selected sub-pack, and determining when said rate of rise falls below a predetermined level, one of said phases of the charging cycle being terminated when said rate or rise falls below said predetermined level.

The method may include determining the charge withdrawn from the battery pack during discharge, one of the phases of the charging clycle supplying the battery with a charge equivalent to the charge withdrawn.

Preferably, the method includes measuring the temperature of the battery electrolyte and correcting the voltage measurements of the individual sub-packs in accordance with the temperature.

When recharging a battery, the charging efficiency is reduced as the charging current increases, particularly towards the end of recharging. In the case of a lead acid battery, this inefficiency is caused by heat dissipated by the internal resistance of the battery and by electrolysis of water at voltages around 2.35 volts/cell or greater. As the battery voltage increases towards the end of a recharge, the charging current must be progressively reduced to avoid an increase in electrolysis. However, as the charging current is reduced, the overall time for charging is increased which is undesirable where there is only a limited time available for recharging. It is desirable therefore to select and vary the charging current so as to obtain a satisfactory compromise between charging efficiency and overall charging time.

It is a yet further object of this invention to obtain such a compromise.

According to a seventh aspect of this invention, there is provided a charging system for a battery comprising;

means responsive to the battery current during charging and discharging for obtaining a current value, means for integrating the current value with respect to time to obtain a charge withdrawn value, and means for charging the battery according to a predetermined cycle, said cycle including a phase in which the battery is supplied with a charge range equivalent to the charge withdrawn, the current being varied during said phase in accordance with the charge withdrawn value.

According to an eighth aspect of this invention, there is provided a method of charging a battery comprising;

measuring the battery current during charging and discharging to obtain a current value, integrating the current value with respect to time to obtain a charge withdrawn value, charging the battery in accordance with a predetermined cycle including a phase in which the battery is supplied with a charge equivalent to the charge withdrawn value, the current being varied during said phase in accordance with the charge withdrawn value.

This invention will now be described in more detail, by way of example, with reference to the accompanying drawings in which.

Figure 4A:
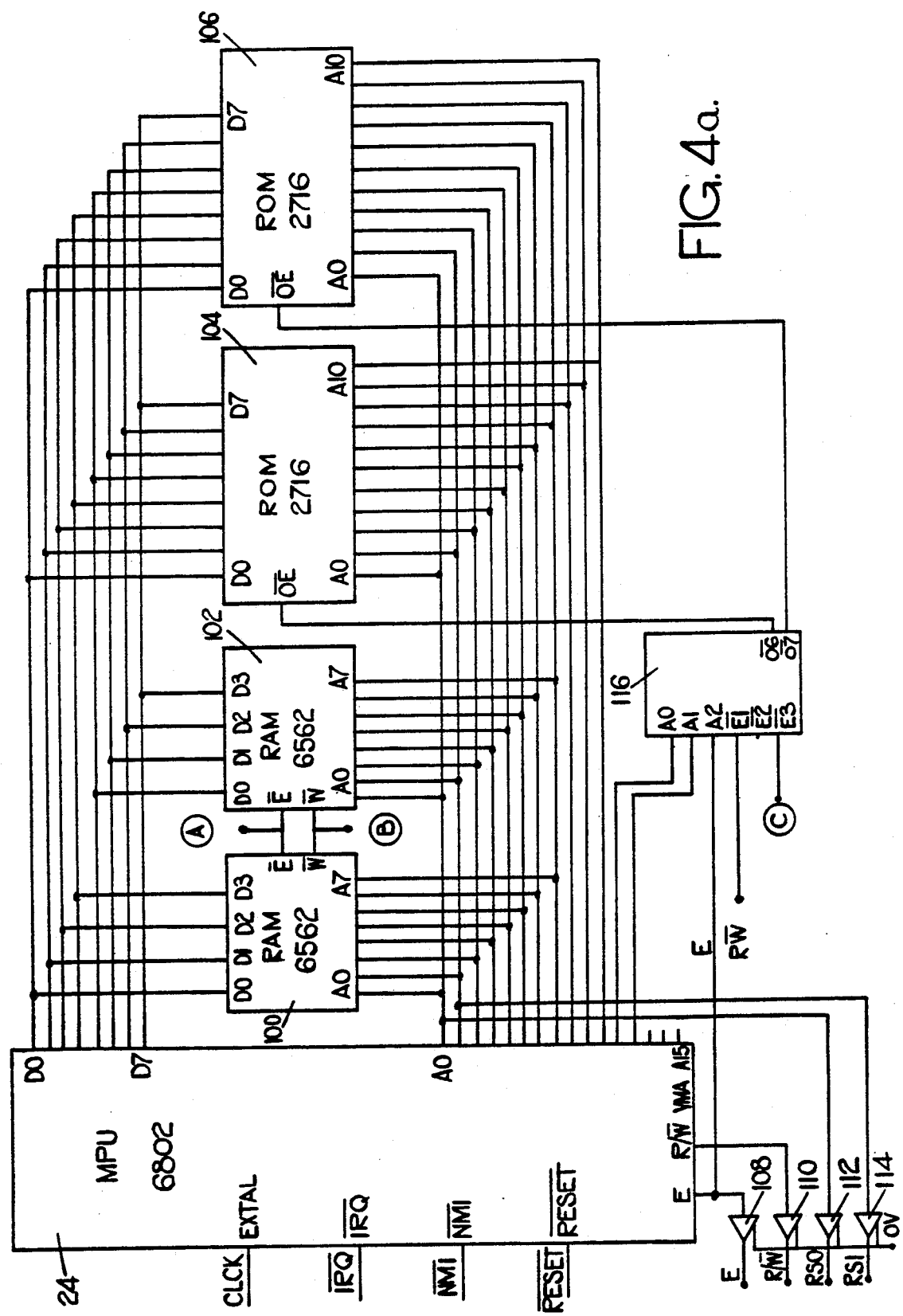
Figure 4B:
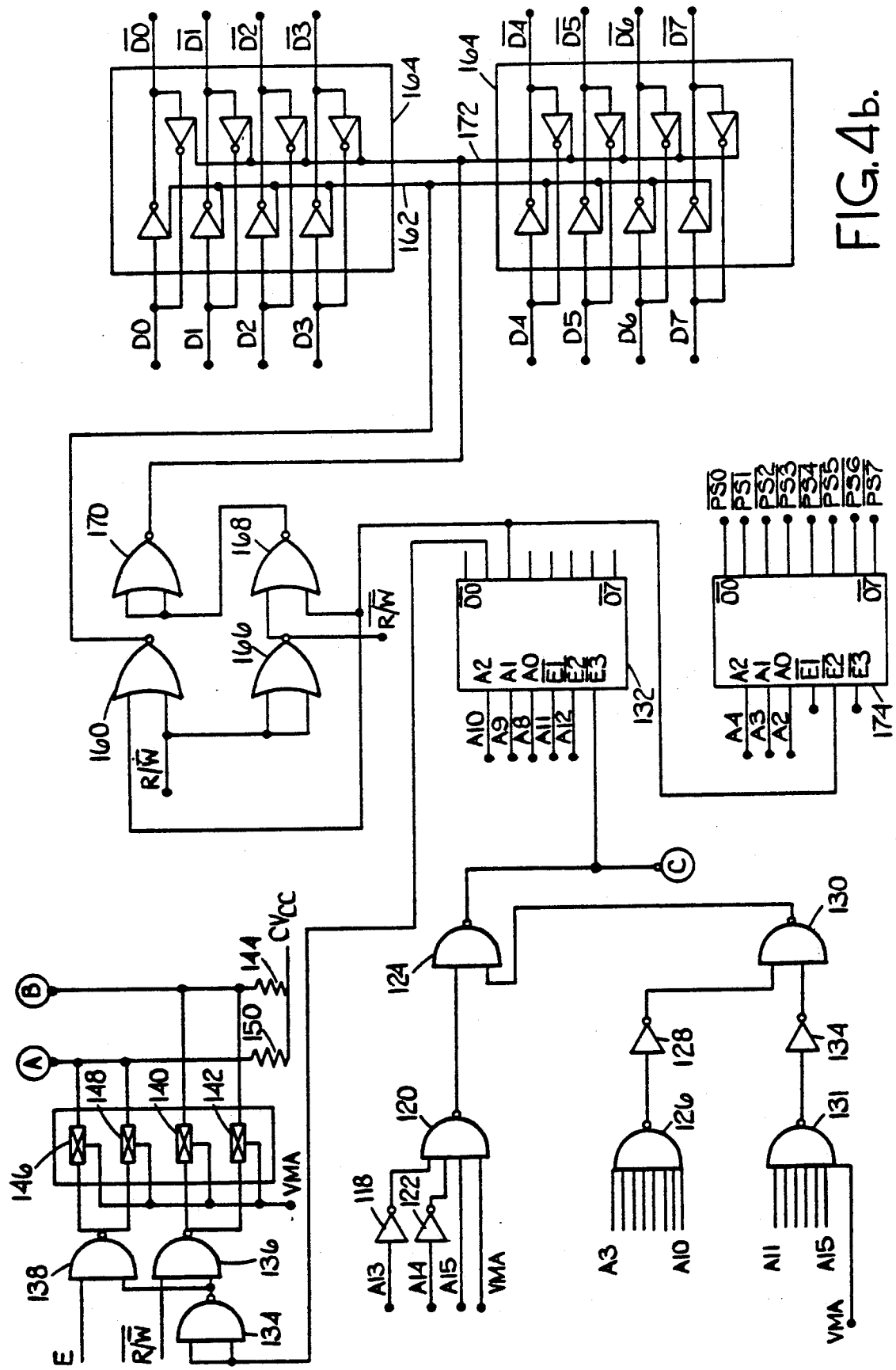
Figure 5A:
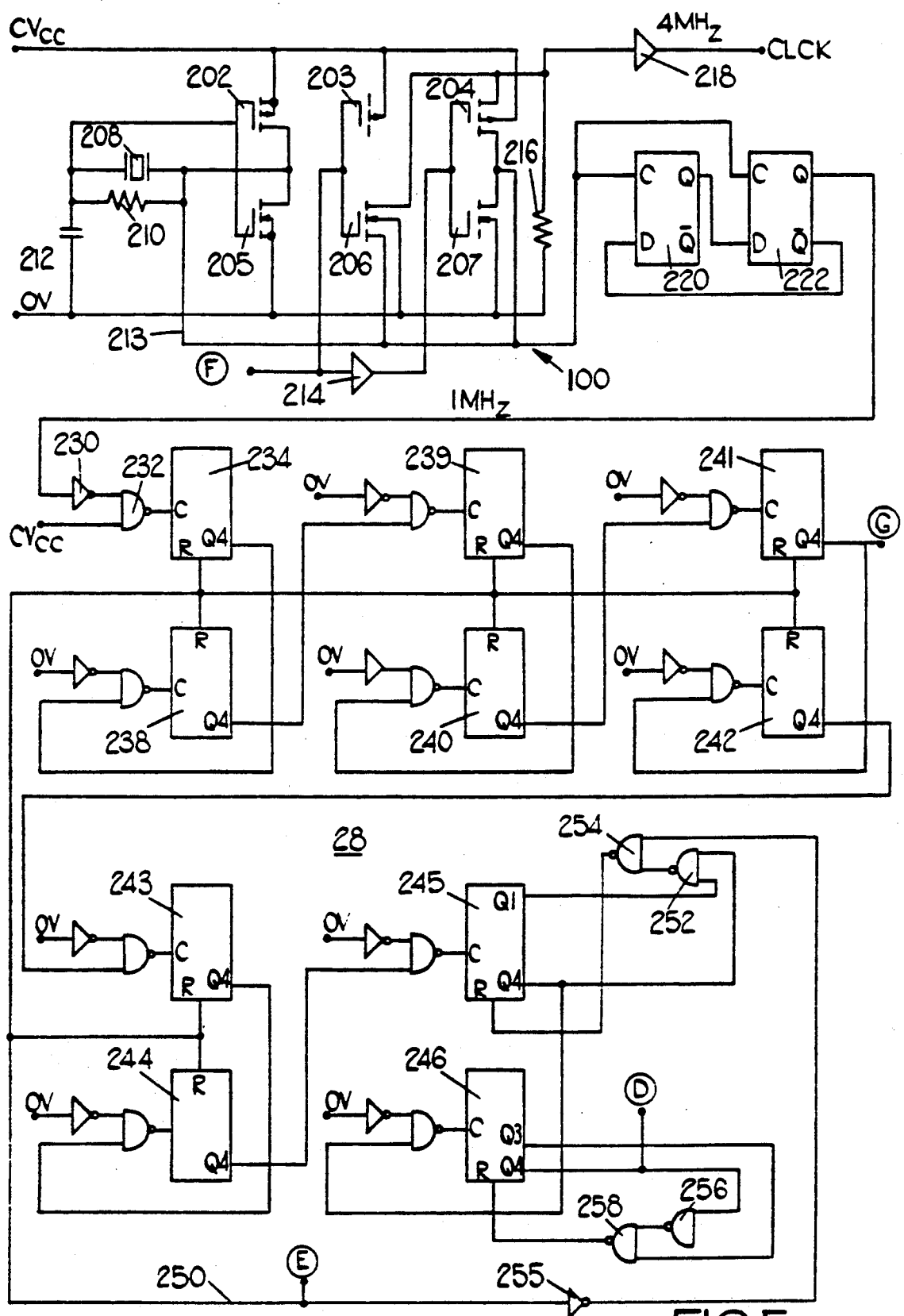
Figure 5B:
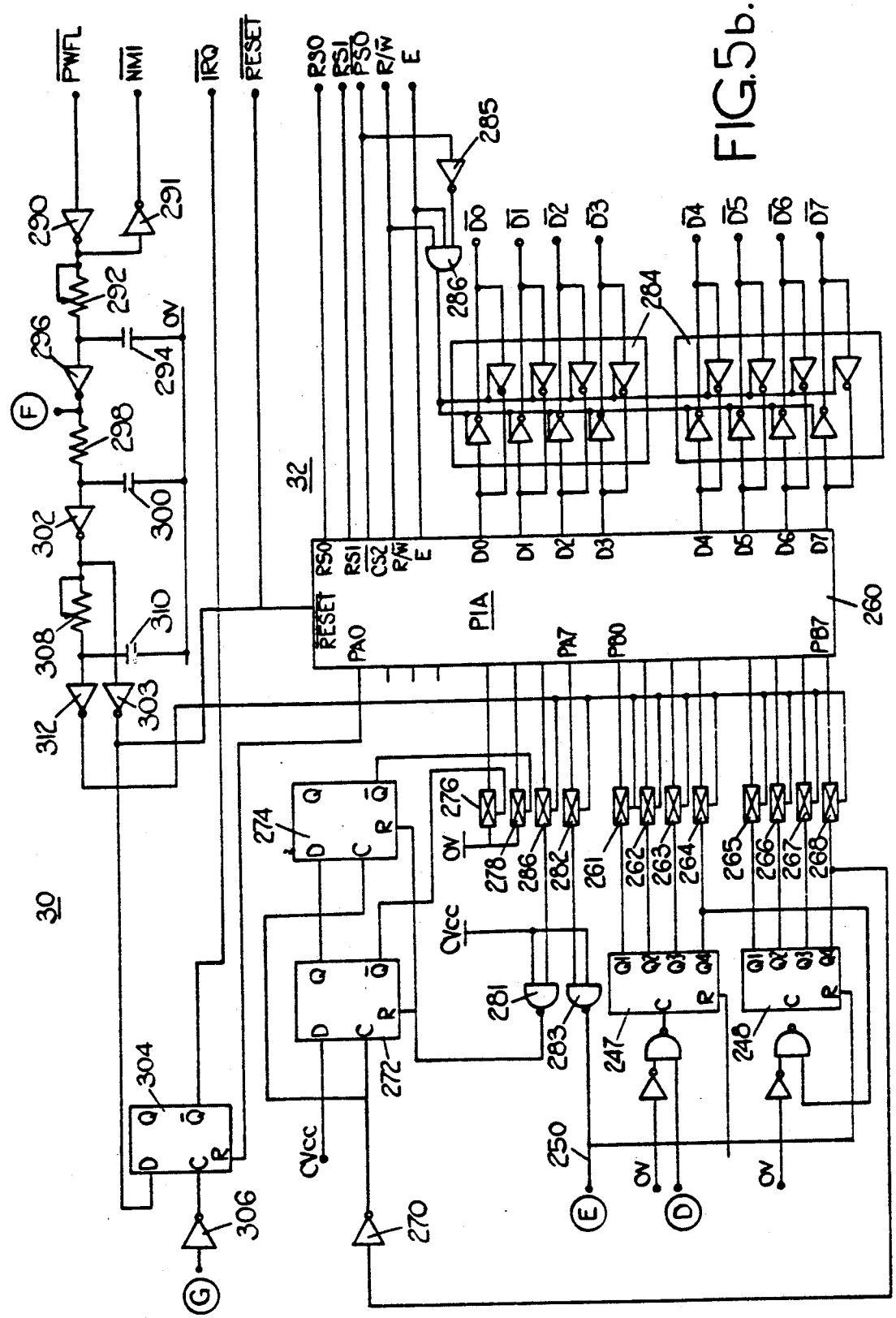
Figure 6A:
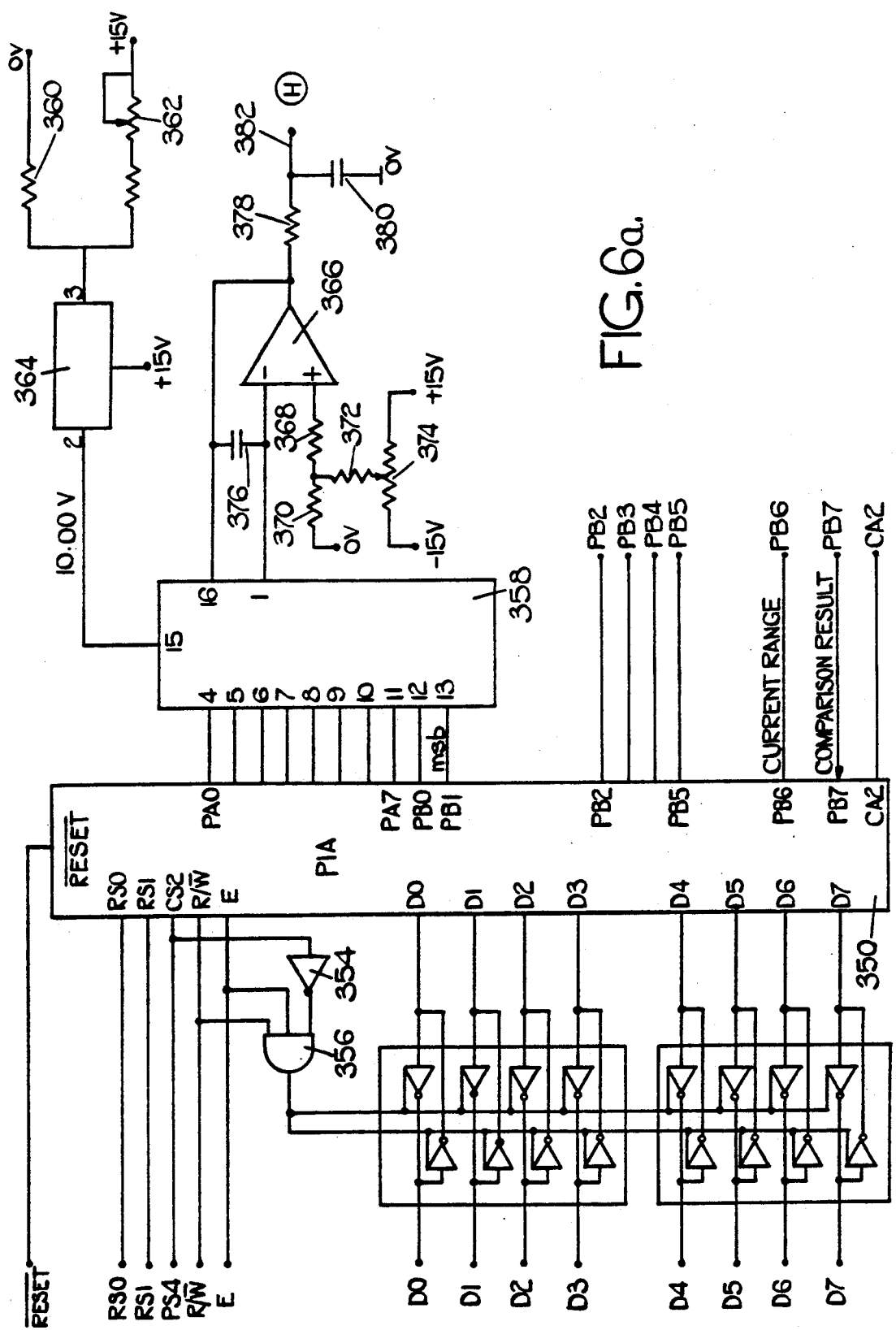
Figure 6B:
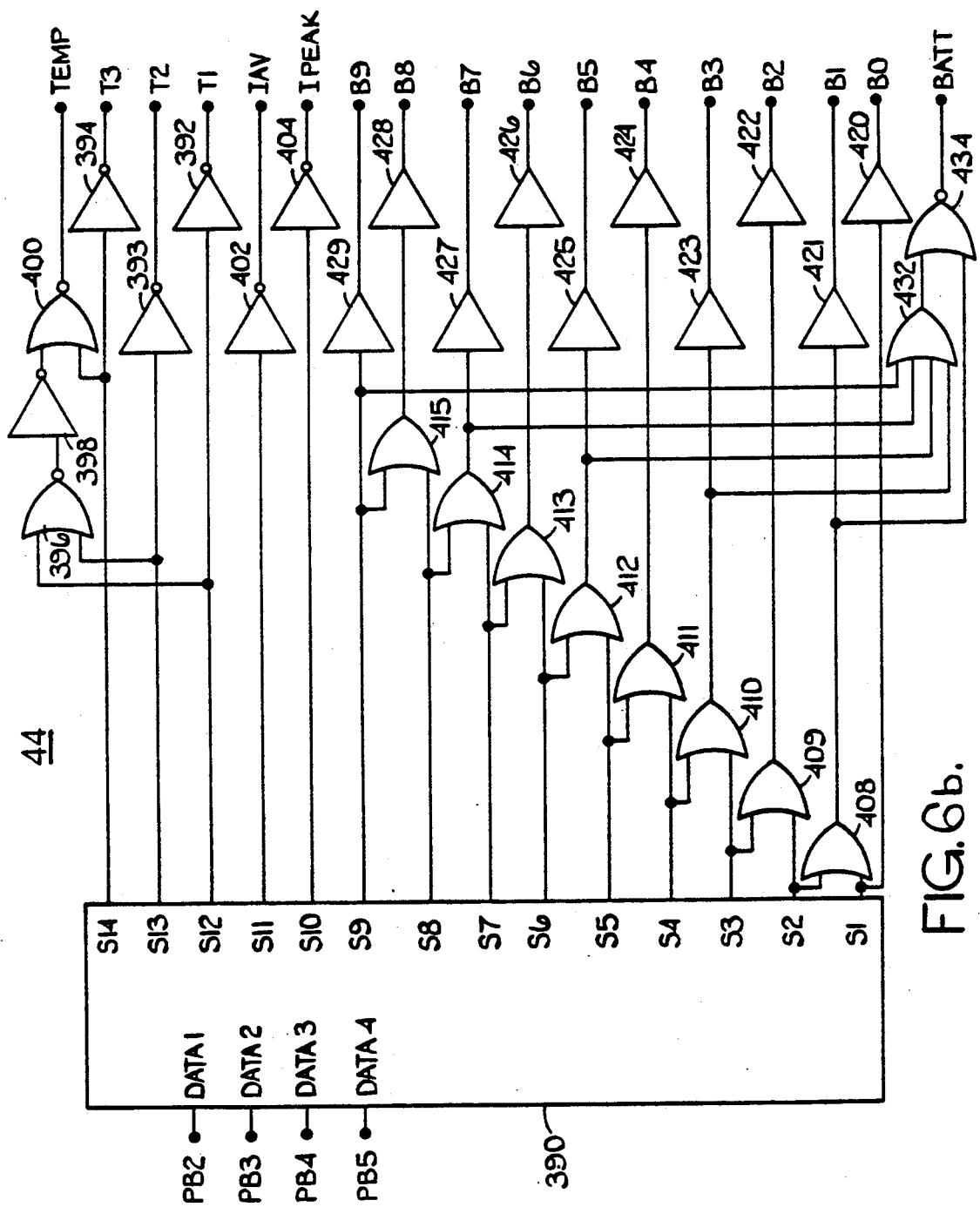
Figure 8A:
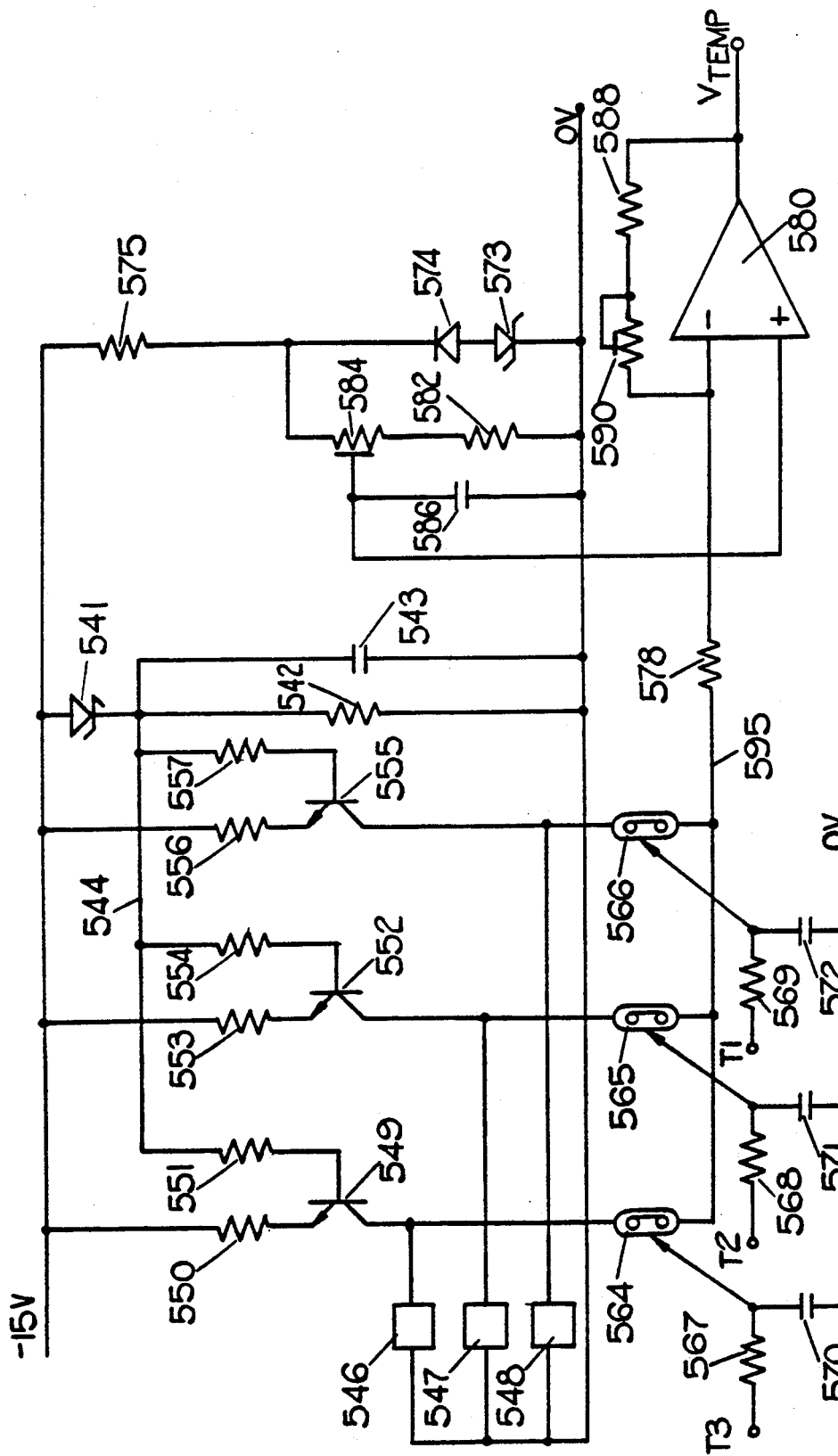
Figure 8B:
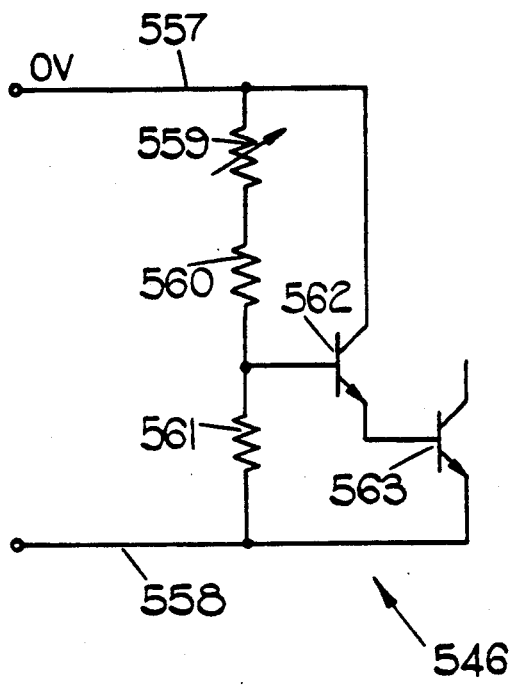
Figure 9:
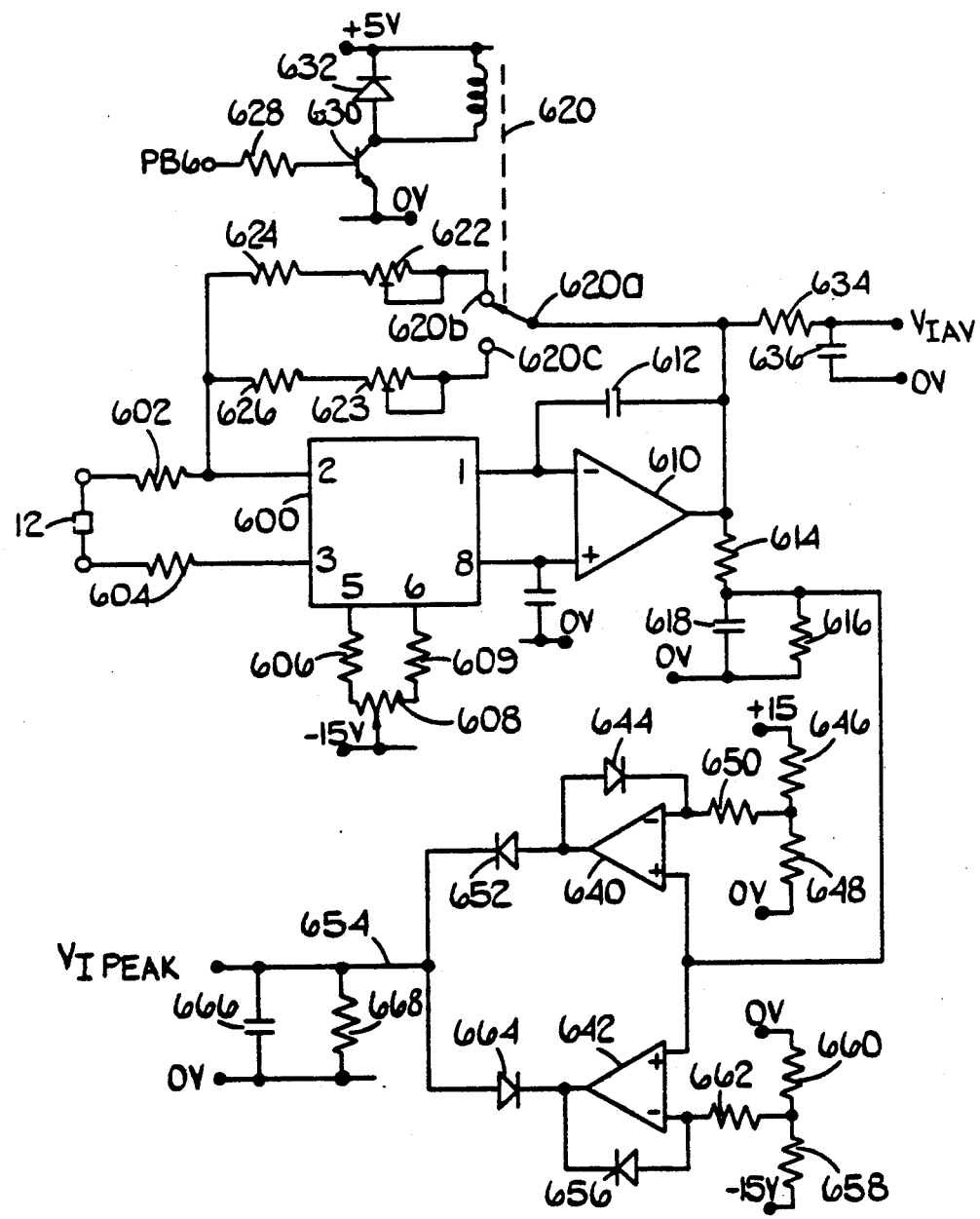
Figure 10:
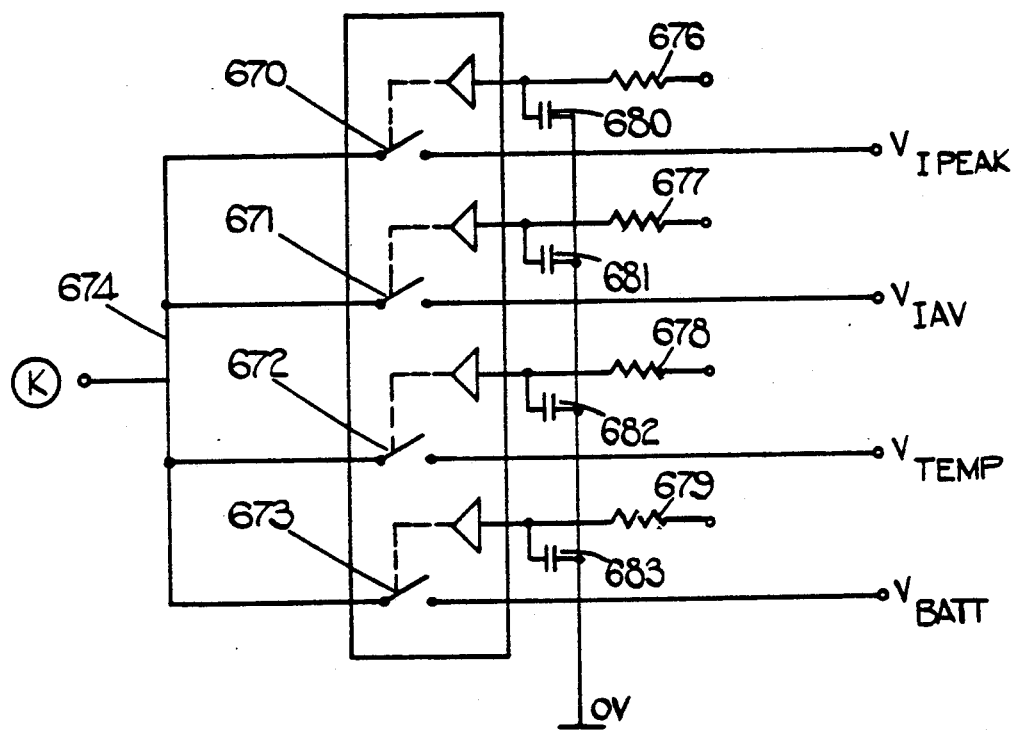
Figure 11:
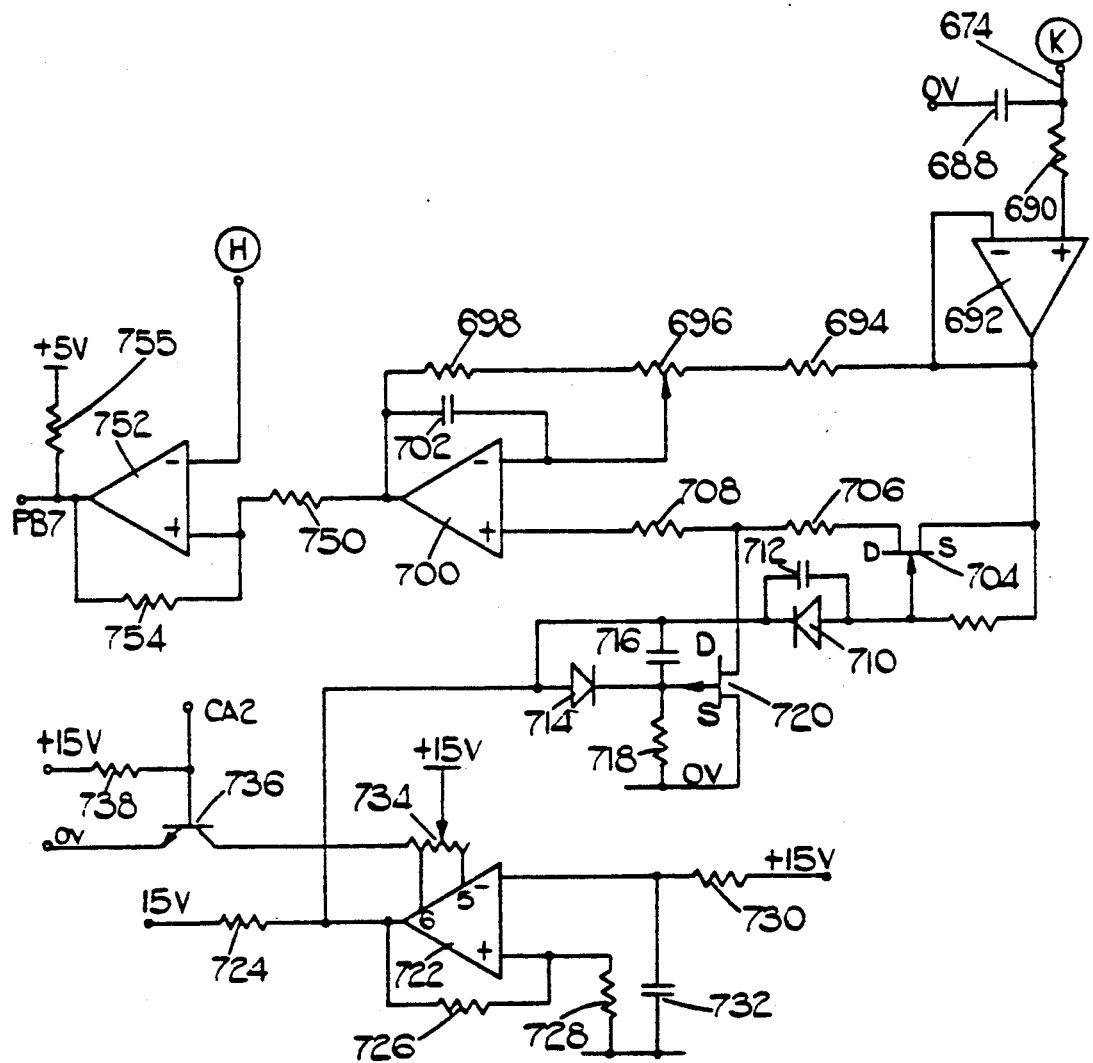
Figure 12:
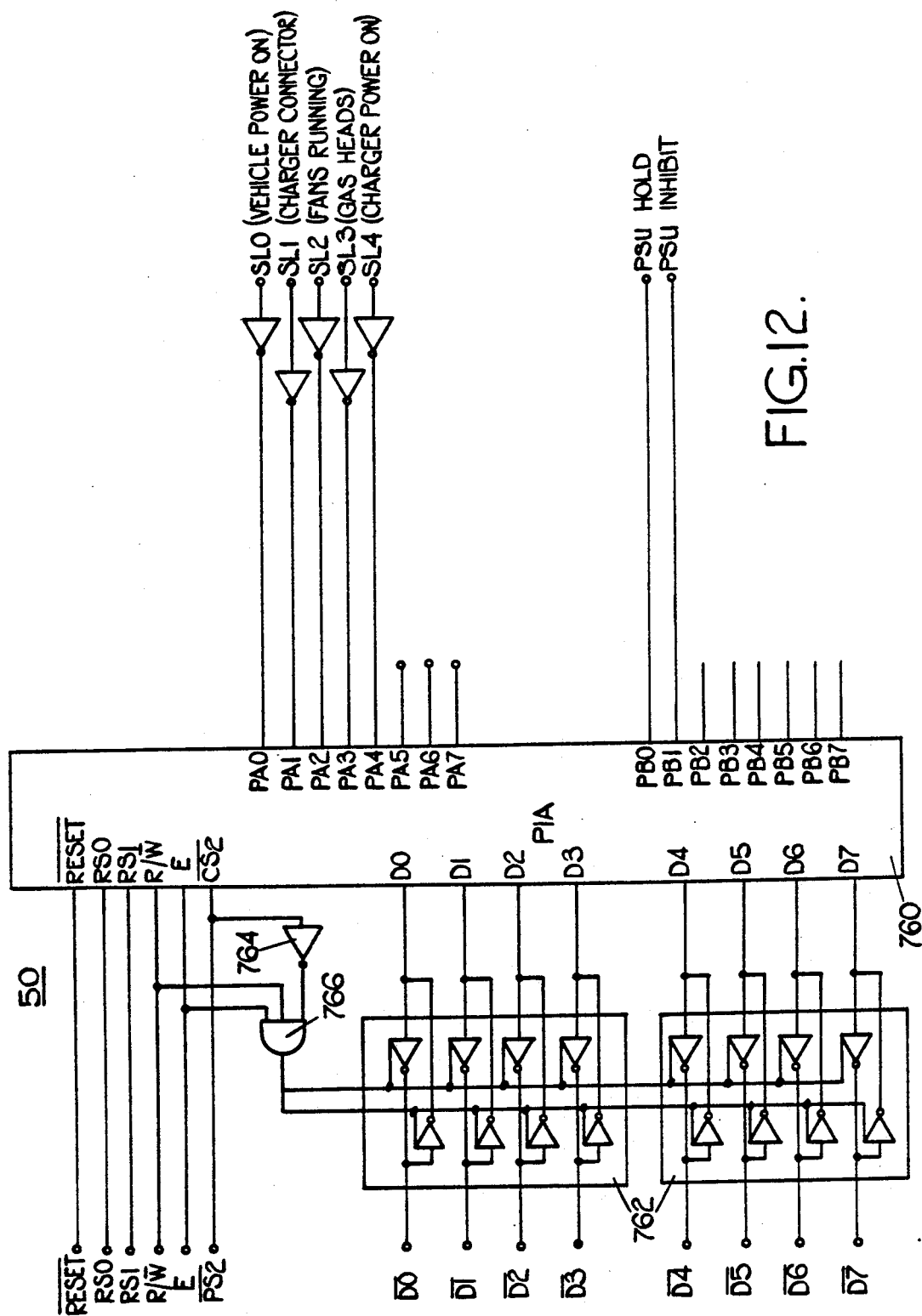
Figure 13:
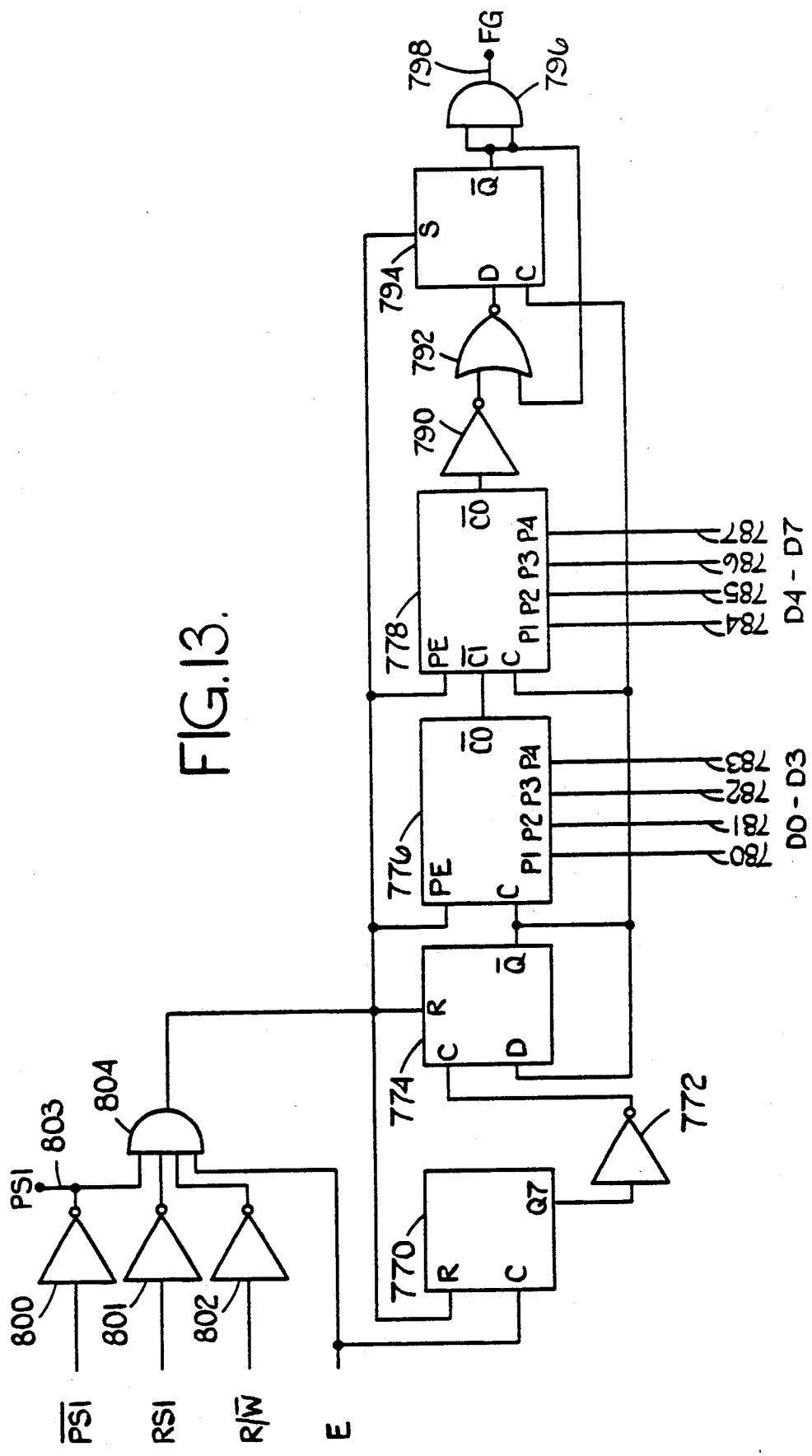
Figure 14:
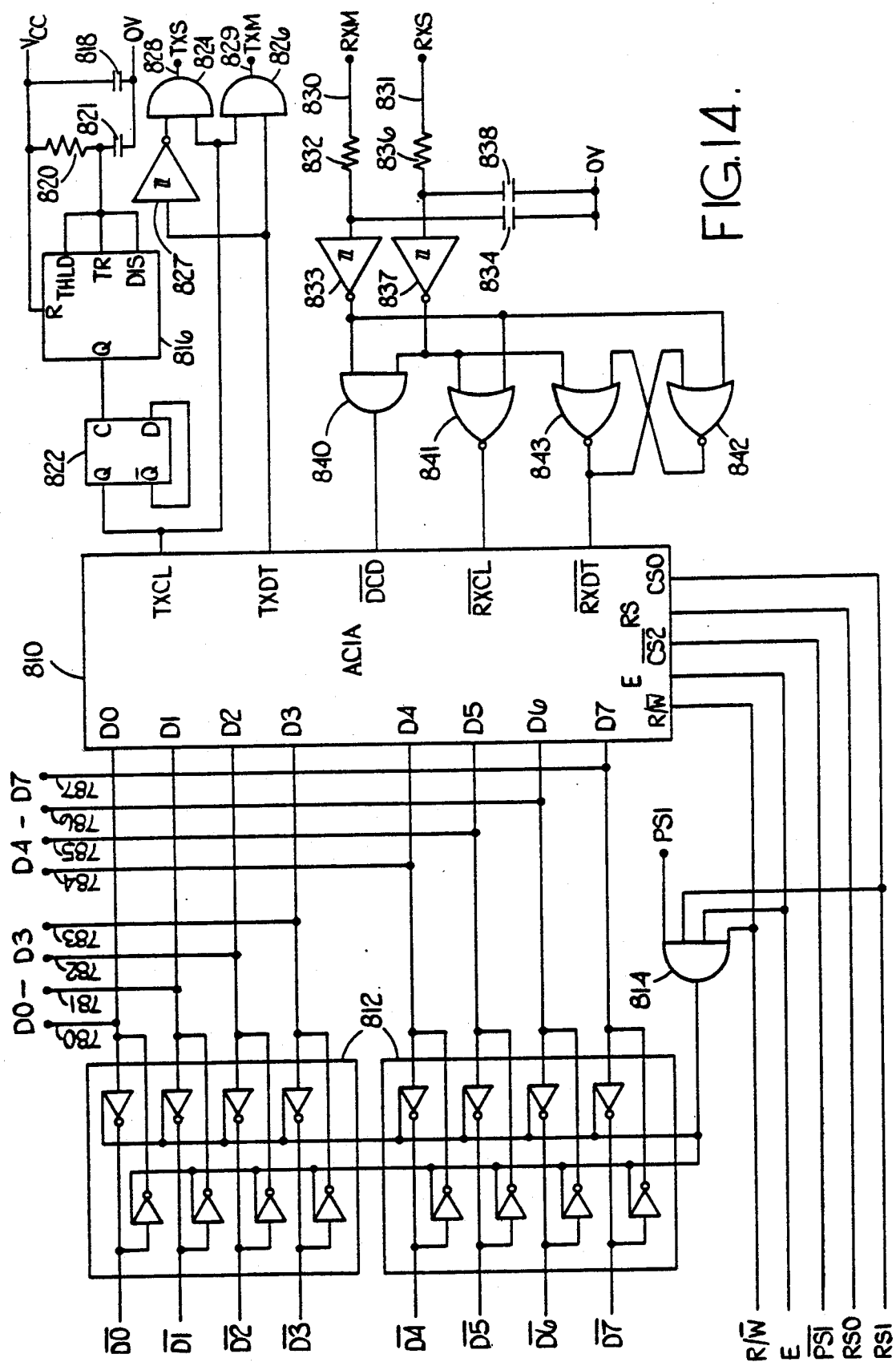
Figure 15:
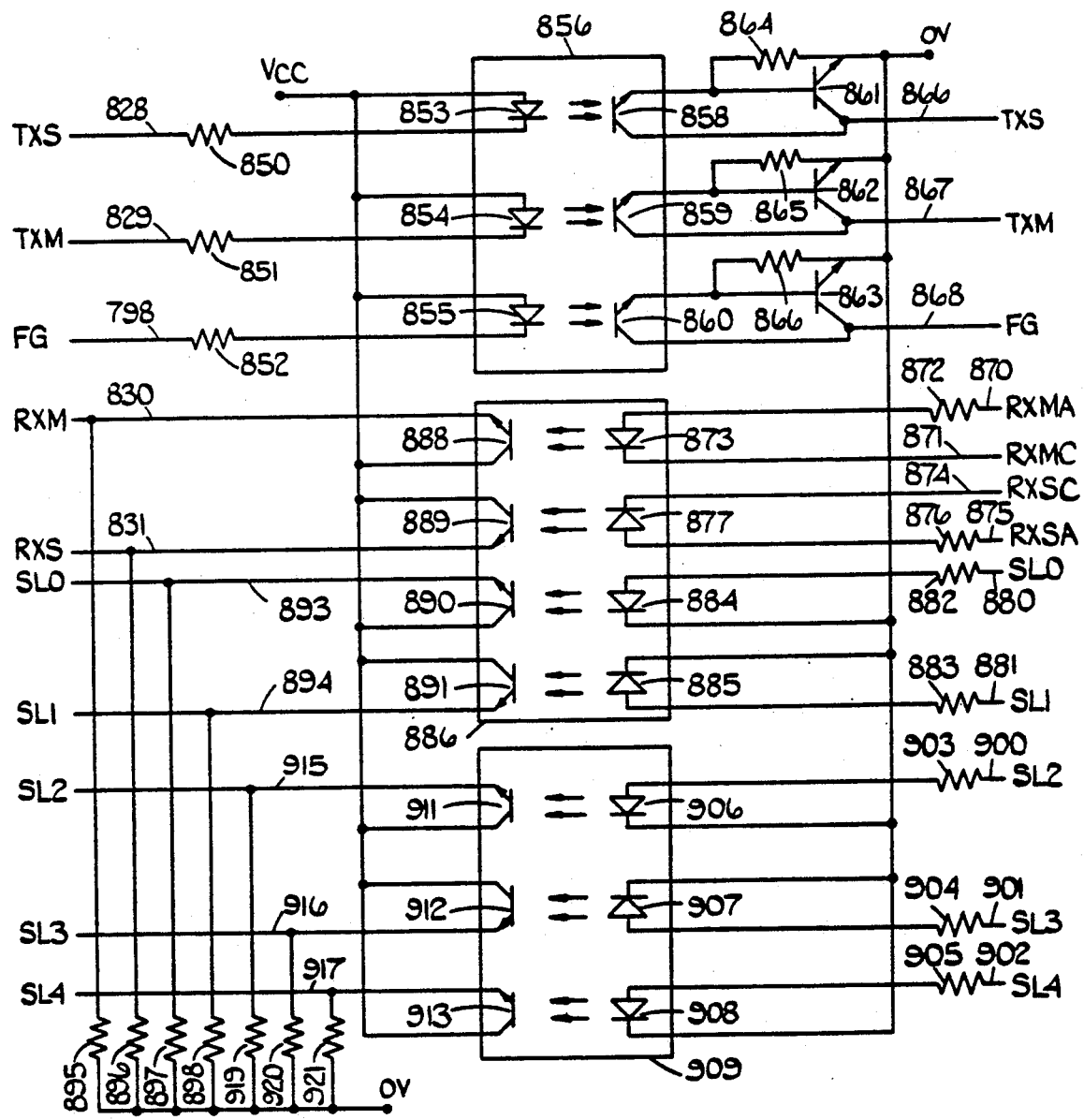
Figure 17:
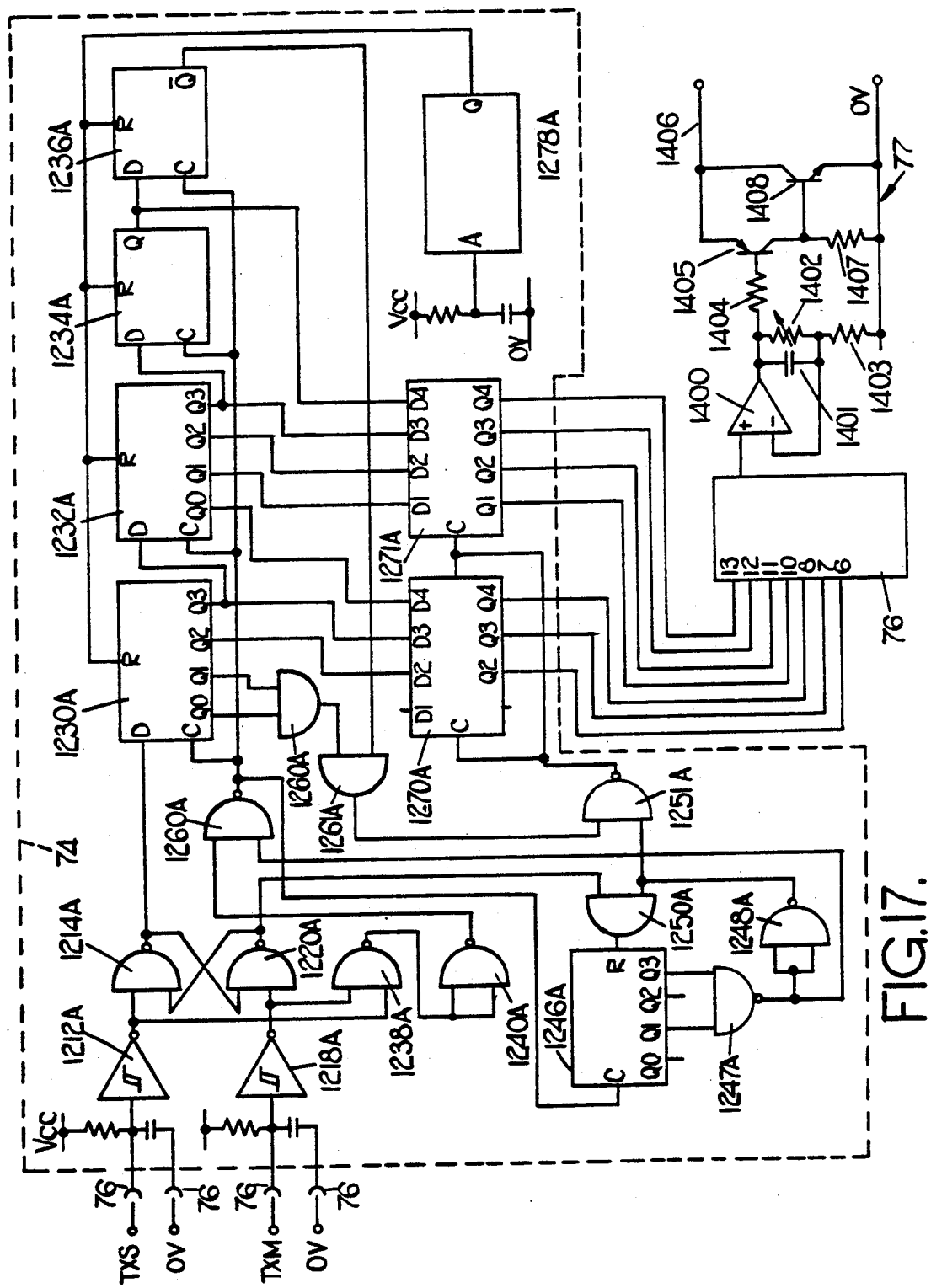
Figure 18:
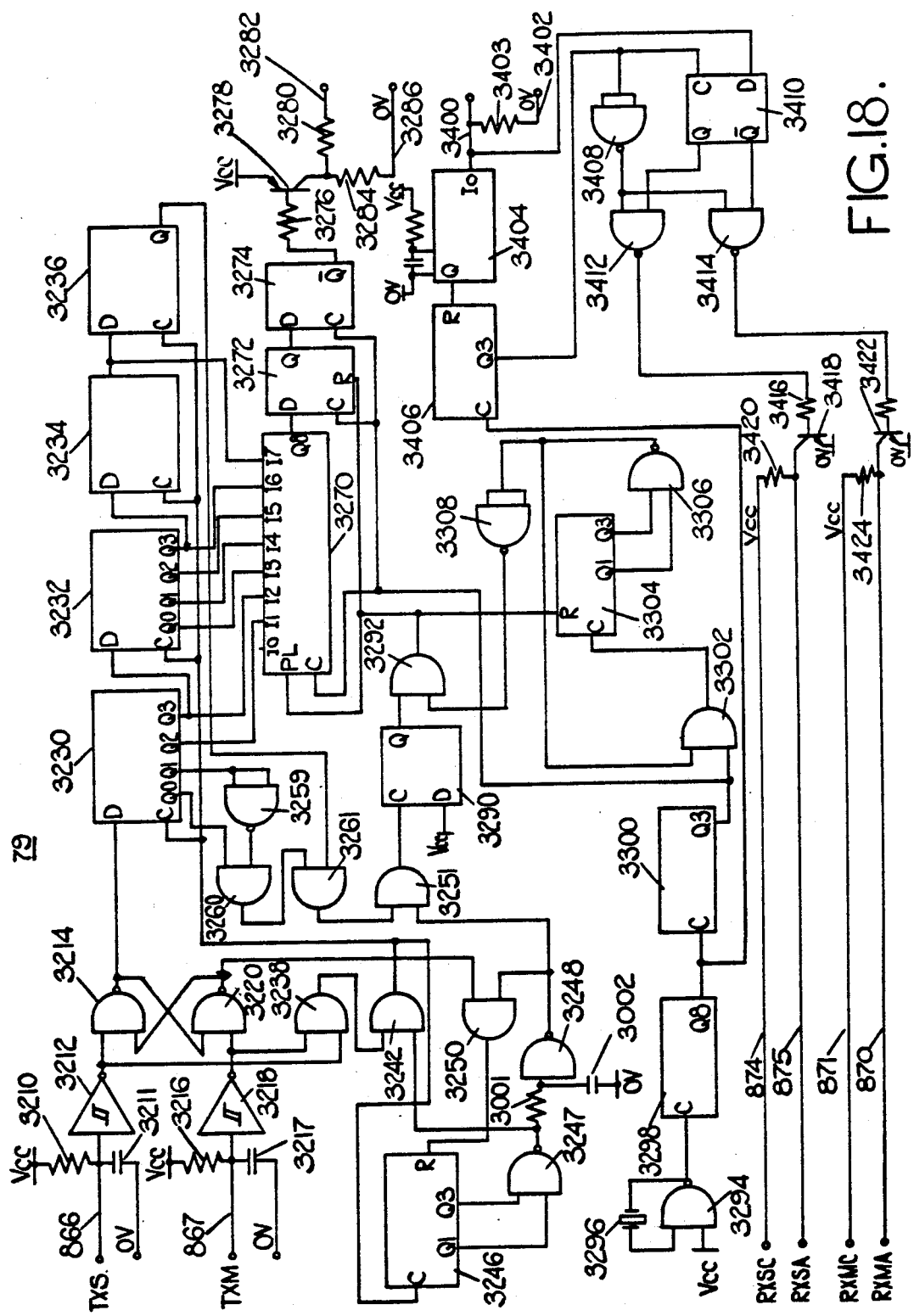

FIGS. 3a, 3b, 3c, 3d and 3e together form a circuit diagram of the power supply for the monitoring system;

FIGS. 4a and 4b together form a circuit diagram of the microprocessor unit and associated memories;

FIGS. 5a and 5b together form a circuit diagram of the clock pulse generator and associated interface;

FIGS. 6a and 6b together form a circuit diagram of the digital to analog converter and the associated interface and decoder;

FIGS. 7a, 7b, 7c and 7d together form a circuit diagram of the battery voltage signal generator circuit;

FIGS. 8a and 8b is a circuit of the temperature signal generator circuit;

FIG. 9 is a circuit diagram of the circuit for generating current signals;

FIG. 10 is a circuit diagram of the analog signal selector;

FIG. 11 is a circuit diagram of the comparator;

FIG. 12 is a circuit diagram of the vehicle state line interface;

FIG. 13 is a circuit diagram of the driver for a state of charge meter;

FIG. 14 is a circuit diagram of the interface for conversion between serial and parallel transmission;

FIG. 15 is a circuit diagram of the opto-isolator;

FIGS. 16a, 16b, 16c and 16d together form a circuit diagram of the battery charger;

FIG. 17 is a circuit diagram of the serial to parallel converter, the associated digital to analog converter, and the override signal output circuit;

FIG. 18 is a circuit diagram of the converter for use with the teletype device, and FIGS. 19a to 61 are flow charts illustrating the operation of the system described in the preceding figures.

GENERAL ARRANGEMENT

Figure 2:
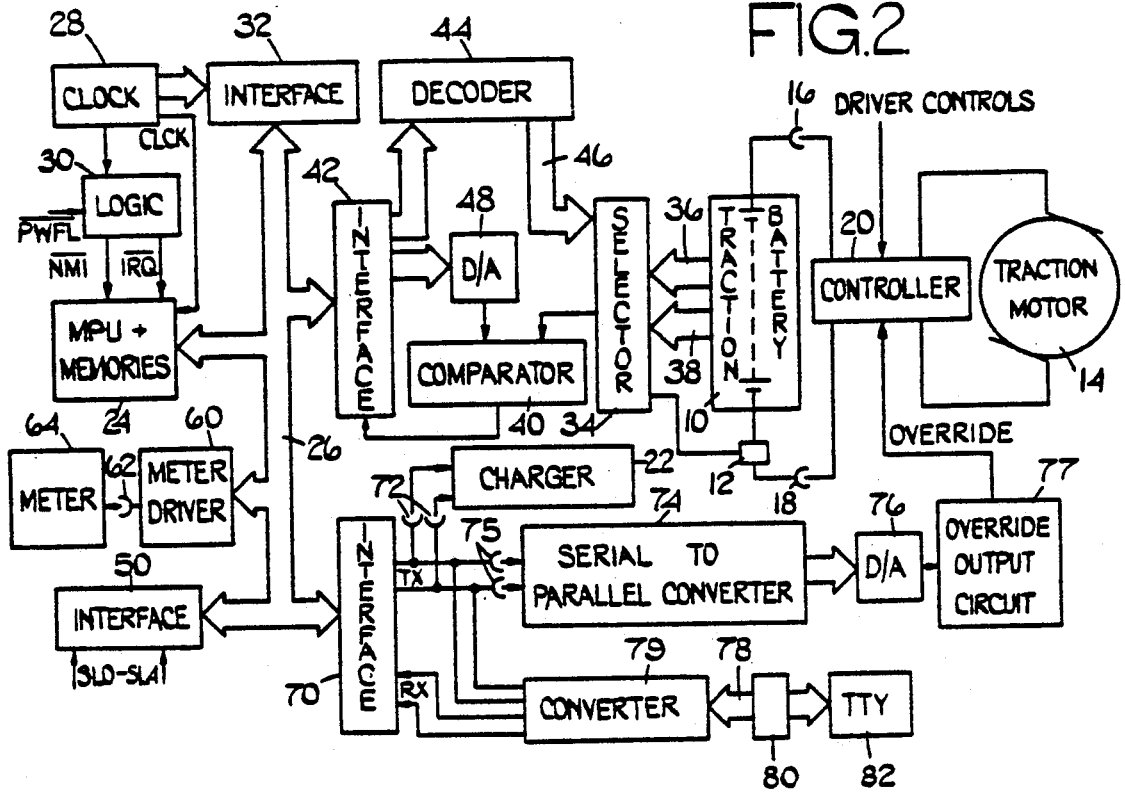
FIG. 2 is a block diagram of a battery monitoring system.

Turning now to FIG. 2, there is shown the general arrangement of a battery monitoring system for an electric vehicle. The monitoring system comprises a lead-acid 180 Ah traction battery pack 10 which is formed from nine individual 24 volt 12 cell sub-packs which are connected in series to provide an output nominal voltage of 216 volts. The negative pole of the battery is connected in series with a current measuring resistor 12. The battery 10 provides power to a traction motor 14, which is the main traction motor of the vehicle, via detachable connectors 16 and 18 and a motor controller 20. The controller 20 also receives driver controls, such as accelerator pedal position and brake pedal position, and also an override signal as will be described below. The battery 10 may be charged by an offboard charger 22.

The resason for dividing the traction battery pack 10 into nine individual sub-packs each of which contains twelve cells will now be explained.

In the present system during the last part of discharge battery voltage is used to evaluate the remaining available of the battery. In a traction battery which has been subjected to deep discharge/re-charge cycling the charge storage capacity of some of the weaker cells may have fallen to 10 to 15% below their nominal capacity. Consequently, if the total battery voltage is used to evaluate the available charge some of the weaker cells may have suffered cell reversal (i.e. become charged with the reverse polarity), when end of discharge is indicated for the entire pack. Such cell reversal would cause severe damage. On the other hand, if the available charge is evaluated from the voltage of the weakest cell, then the remaining cells may still possess a substantial part of their charge when end of discharge is indicated. Also extensive circuitry would be necessary to monitor individual cells.

Consequently, it is considered desirable to divide the battery pack into sub-packs and to evaluate the available charge from the voltage of the weakest sub-pack. The number of cells in each sub-pack should be selected to be as large as possible without the risk of cell reversal occurring before end of discharge is indicated, and in the case of a lead-acid battery it is considered that each sub-pack should be formed from twelve cells.

Figure 1:
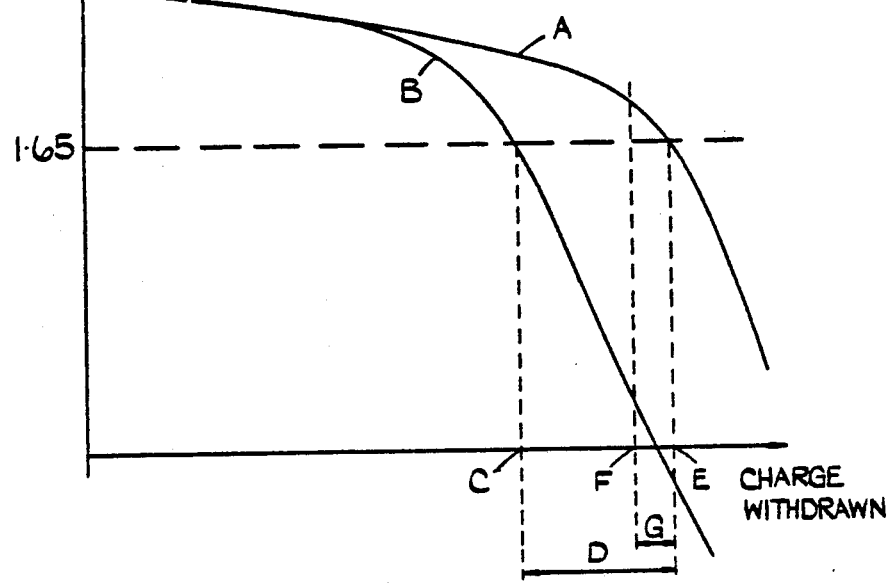
FIG. 1 is a graph of the discharge characteristics of a twelve cell sub-pack forming part of a lead-acid traction battery.

Referring to FIG. 1 there is shown the discharge characteristics for a twelve cell sub-pack forming part of a lead-acid traction battery. The sub-pack comprises eleven cells which have retained their nominal charge storage capacity as indicated by curve A and one cell indicated by curve B which has lost 15% of its storage capacity. As indicated by the dashed line, a single cell reaches its end of discharge at 1.65 volts. If end of discharge for the sub-pack is indicated when the voltage of the weak cells falls to 1.65 volts as indicated by point C then the remaining cells will still possess a substantial part of their charge as indicated by the arrow D. Alternatively, if end of discharge is indicated at point E when the voltage of the other cells has fallen to 1.65 volts, as might be the case if the overall battery voltage is used to indicate the state of charge, then the weak cell will have suffered cell reversal. However, if end of discharge is indicated when the average cell voltage has fallen to 1.65 volts as indicated at point F, then although the voltage of weak cell have fallen well below 1.65 volts cell reversal will now have occurred. Also, the remaining cells will only possess a small part of their charge as indicated by arrow G.

The battery 10 is monitored by a microprocessor syatem which also controls the charger 22 and provides the override signal.

At the centre of the microprocessor system there is a microprocessor unit (MPU) 24 which together with its associated memories communicates with a signal bus 26. The microprocessor system also includes a clock 28 which provides clock pulses CLCK to the MPU 24 and a timing signal to a logic circuit 30. The logic circuit 30 receives a power fail signal $\overline{PWFL}$ from the power supply for the microprocessor system and provides a non-maskable interrupt signal $\overline{NMI}$ and an interrupt request signal $\overline{IRQ}$ to the MPU 24. The clock 28 also provides lapsed time information to the MPU 24 via an interface 32 and the signal bus 26.

The microprocessor system monitors the battery 10 via an analog to digital unit. This unit comprises a selector circuit 34 which receives various analog signals concerning the battery pack 10. These signals comprise a current signal from the measuring resistor 12, three temperature signals which are transmitted by a data bus 36 from two temperature probes positioned in the electrolyte of the traction battery pack 10 and one probe positioned to sense the system electronics, and voltage signals from the individual sub-packs which are transmitted via a bus 38. The selector 34 provides a single analog output signal to a comparator 40. The analog to digital unit also comprises an interface 42 which communicates with the signal bus 26. The interface 42 provides output signals to a decoder 44 which in turn provides output signals via a bus 46 to the selector 34 and which determine the particular analog signal which is to be selected and transmitted to the comparator 40. The interface 42 also provides signals to a digital to analog converter 48 which provides a second analog signal to the comparator 40. The comparator provides an output signal, representing the result of the comparison to the interface 42.

The MPU 24 also receives information concerning the vehicle state via an interface 50 and the data bus 26. The interface 50 receives five vehicle state signals and these are a vehicle power on signal SLO, a charger connected signal SL1, a fans running signal SL2, a gas heads signal SL3, and a charger power on signal SL4. The vehicle power on signal, charger connected signal and the charger power on signal are considered self-explanatory. The fans running signal indicates proper operation of a fan which is provided for removing gas from the space adjacent to the traction battery pack. The gas head signal concerns four gas heads mounted in the battery compartments of the battery 10. These gas heads monitor the rate at which gas is being generated and provide a warning signal in the event of excessive gassing. The vehicle power on signal SLO and the charger connected signal SL1 are provided from relays associated with the vehicle and the generation of the signals SL2 to SL4 will be discussed later with reference to the charger 22.

The MPU calculates the state of charge of the traction battery 10 and this information is transmitted via the signal bus 26, a meter driver 60, and a detachable connection 62 to a state of charge meter 64 positioned on the dashboard of the vehicle.

The signal bus 26 also communicates with an interface 70 which converts data provided by the MPU 24 in parallel form into serial form and transmits this onto transmission lines TX, and also converts serial data arriving onto receiving lines RX into parallel format for transmission to the MPU 24. The serial data on the transmission lines TX is supplied to the charger 22 via detachable connections 72. This serial data is also supplied to a serial to parallel converter 74 via detachable connections 75. Data is transmitted in parallel format from the converter 74 to a digital to analog converter 76 which supplies an analog signal to an override output circuit 77 which in turn provides an override signal to the controller 20. As will be explained below, when the state of charge of the battery 10 is low this override signal limits the maximum current which may be supplied to the traction motor 14.

The transmission lines TX and receiver lines RX are also connected to a converter 79. The converter 79 converts the serial data which it receives on the transmission lines TX into serial teletype format and provides this data on its data bus 78. It also converts incoming serial teletype data provided its data bus 78 into the suitable serial format for transmission on the receiver lines RX to the interface 70. The data bus 78 is joined by a detachable connection 80 to a teletype unit 82 which is provided for initialising and monitoring the microprocessor system.

The traction battery 10 and the microprocessor system that is the MPU 24, the clock 28, the interface 32, the logic circuit 30, the selector 34, comparator 40, interface 42, decoder 44, digital to analog converter 48, meter driver 60, interface 50, interface 70 and converter 79, may be removed from the vehicle as a single unit. By arranging the traction battery and microprocessor system as a single unit, the microprocessor system can monitor the battery for its entire life including periods when the battery is not positioned in the vehicle. The details of the controller 20 are described in our published Patent Co-operation Treaty Application No. 78/00046. The remainder of the battery monitoring system will now be described in greater detail hereinafter.

Power Supply Section

Figure 3A:
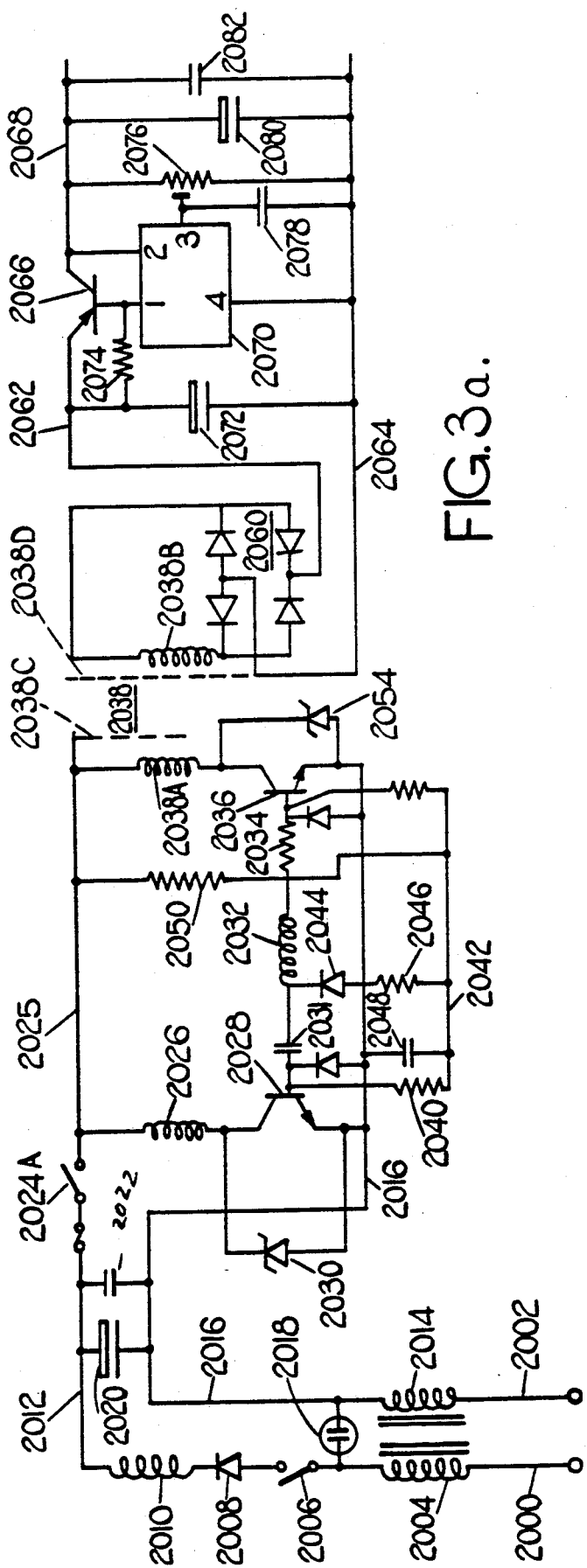

The power supply section will now be described with reference to FIG. 3. Turning firstly to FIG. 3a, the power supply includes a pair of rails 2000 and 2002 which are connected respectively to the positive and negative terminals of the traction battery pack 10. The rail 2000 is connected through an inductor 2004 and a manually operated switch 2006 to the anode of a diode 2008, the cathode of which is connected through an inductor 2010 to a rail 2012. The rail 2002 is connected through an inductor 2014 to a rail 2016. The junction of inductor 2004 and switch 2006 is connected through a neon lamp 2018 to the rail 2016 and a pair of capacitors 2020 and 2022 are connected between the rails 2012 and 2016. The inductors 2004, 2010, 2014, together with the capacitors 2020 and 2022 form an anti-interference network.

The rail 2012 is connected through a relay switch 2024A to a rail 2025, and the rail 2025 is connected through an inductor 2026 to the collector of an NPN transistor 2028, the emitter of which is connected to the rail 2016 and the emitter-collector path of which is bridged by a protection zener diode 2030. The base of transistor 2028 is connected through a capacitor 2031, an inductor 2032 and a resistor 2034 to the base of an NPN transistor 2036, the emitter of which is connected to the rail 2016 and the collector of which is connected through the primary winding 2038A of a transformer 2038 to the rail 2025. The base of transistor 2028 is also connected through a resistor 2040 to a rail 2042, the junction of capacitor 2031 and inductor 2032 is connected to the cathode of a diode 2044, the anode of which is connected through a resistor 2046 to the rail 2042. The rails 2016 and 2042 are joined by capacitor 2048 and the rails 2025 and 2042 are connected by a resistor 2050. The collector emitter path of transistor 2036 is bridged by a protection zener diode 2054. In operation, the transistors 2028 and 2036 operate as a self oscillating inverter.

A pair of screens 2038C and 2038D are positioned between the primary and secondary windings 2038A and 2038B, of transformer 2038 so as to reduce transient currents induced by stray capacitance in the circuit. Also, each of the transistors 2028 and 2036 is screened from its associated heat sink by copper foil sandwiched between a pair of mica washers.

The secondary winding 2038B is connected across a full-wave bridge rectifier 2060, the positive output of which is connected to a positive supply rail 2062 and the negative output of which is connected to a negative supply rail 2064. The rail 2062 is connected to the emitter of a PNP transistor 2066, the collector of which is connected to a rail 2068 and the base of which is connected to terminal 1 of a Fairchild uA 72MG/SV series regulator 2070. A capacitor 2072 is connected between rails 2062 and 2064 and rail 2062 is also connected to the base of transistor 2066 by a resistor 2074. Terminal 3 of regulator 2070 is connected to a tapping of a resistor 2076 connected between rails 2068 and 2064 and also to rail 2064 by a capacitor 2078. A pair of capacitors 2080 and 2082 are connected in parallel between rails 2068 and 2064.

Figure 3C:
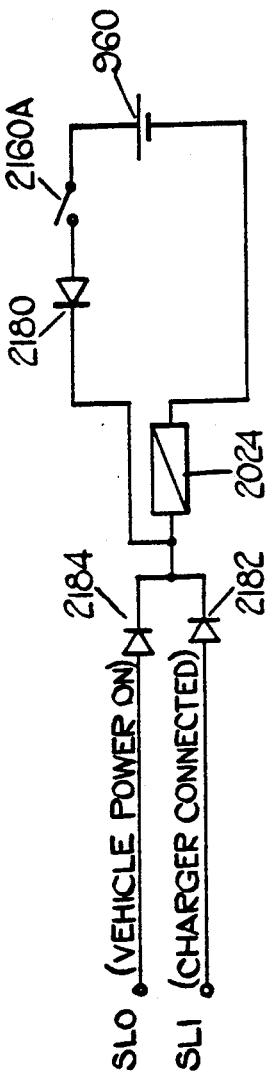
Figure 3B:
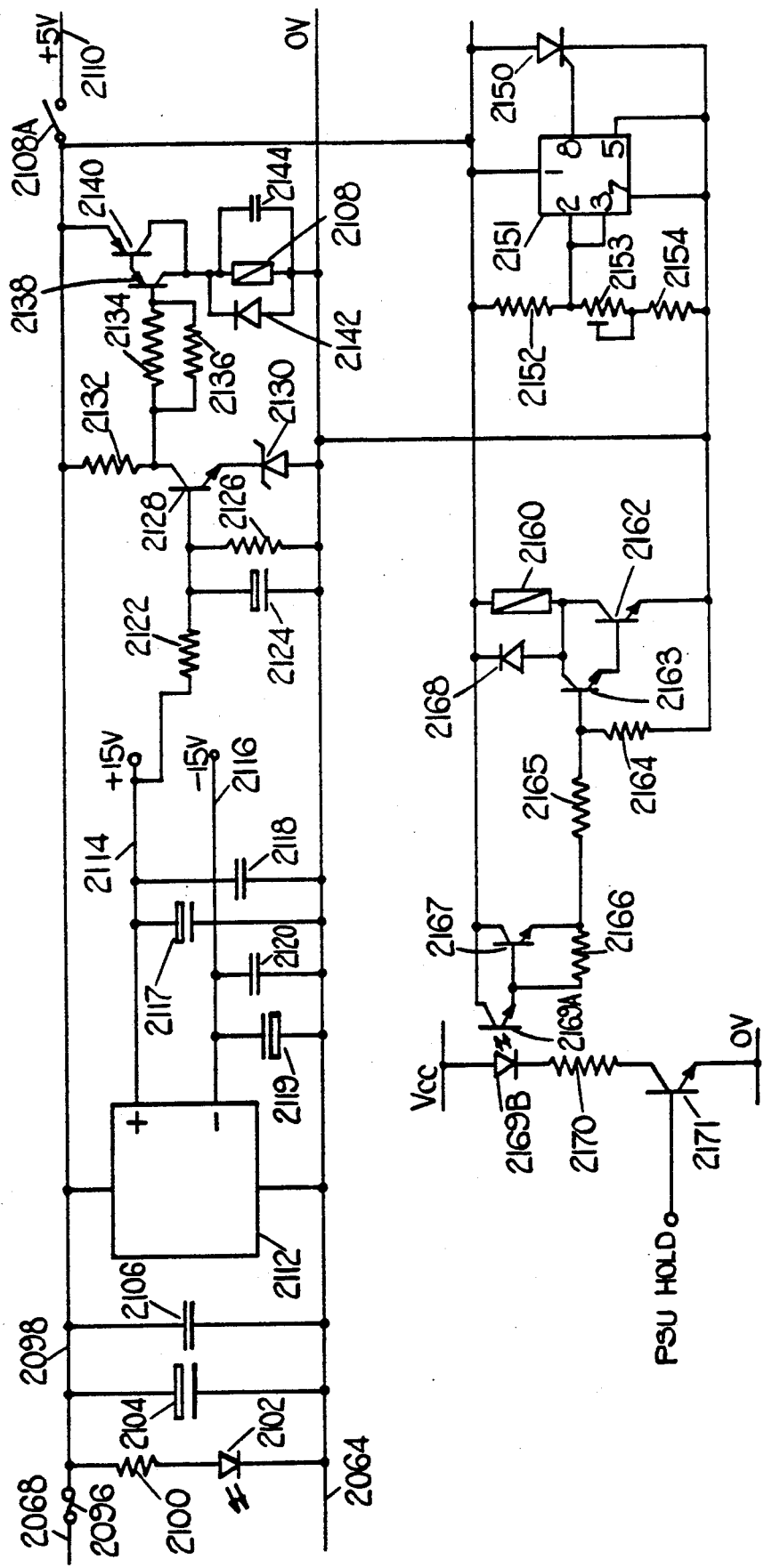

Turning now to FIG. 3b, the rail 2068 is connected through a fuse 2096 to a rail 2098, and the rail 2098 is connected through a resistor 2100 to the anode of a light emitting diode 2102, the cathode of which is connected to the rail 2064. The diode 2102 indicates correct operation of the power supply. Connected in parallel between rails 2098 and 2064 are a pair of capacitors 2104 and 2106 and the rail 2098 is connected through contacts 2108A of a relay 2108 to a rail 2110 which is the +5 V supply rail for the microprocessor system. The rail 2064 forms the 0 V supply rail for the system.

Also connected between rails 2098 and 2064 there is provided a Gemini type 952 DC to DC converter 2112 and the putputs of the converter 2112 are connected to rails 2114 and 2116 which form the +15 V and −15 V supply rails for the system. The rails 2114 and 2064 are connected by a pair of capacitors 2117 and 2118 connected in parallel and the rails 2116 and 2064 are connected by a pair of capacitors 2119 and 2120 also connected in parallel.

The rail 2114 is connected through a resistor 2122 and a capacitor 2124 to a rail 2064 and the junction of resistor 2122 and capacitor 2124 is connected through a resistor 2126 to the rail 2064 and also to the base of an NPN transistor 2128. The emitter of transistor 2128 is connected to the cathode of a zener diode 2130 the anode of which is connected to rail 2064, and the collector of transistor 2128 is connected through a resistor 2132 to the rail 2098 and through a pair of resistors 2134 and 2136 connected in parallel to the base of a PNP transistor 2138. The transistor 2138 is connected as a Darlington pair to a further PNP transistor 2140, the emitter of which is connected to the rail 2098. The collectors of transistors 2138 and 2140 are connected through the winding of relay 2108 to the 0 V rail and this winding is bridged by a free-wheel diode 2142 and a capacitor 2144.

Thus, in operation, the +15 V supply rail 2114 must be energised before contacts 2108A are closed and power is supplied to the +5 V rail 2110.

Rail 2096 is connected to the anode of a thyristor 2150, the cathode of which is connected to the rail 2064 and the gate of which is connected to terminal 8 of a crow bar circuit 2151 supplied by R.S. Components of London under type number 307-890 and which is connected between rails 2098 and 2064. Terminals 2 and 3 of circuit 2151 are connected through a resistor 2152 to rail 2098 and through a pre-set resistor 2153 and a resistor 2154 to rail 2064. In operation, the components 2150 to 2154 function as a protection circuit against overvoltages appearing between rails 2098 and 2064.

The rail 2098 is connected through the winding of a relay 2160 to the collector of an NPN transistor 2162 and also to the collector of a transistor 2163. The emitter of transistor 2163 is connected to the base of transistor 2162, the emitter of which is connected to the 0 V rail. The rail 2098 is connected further to the collector of an NPN photo-transistor 2169A which is connected as a Darlington pair with an NPN transistor 2167. The emitter of transistor 2169A is connected to the base of transistor 2167 and through resistor 2166, 2165 and 2164 connected in series to the 0 V rail. The junctions of resistors 2166 and 2165 is connected to the emitter of transistor 2167 and the junctions of resistors 2164 and 2165 connected to the base of transistor 2163. A rail $V_{cc}$ is connected to the anode of a light emitting diode 2169B, which forms a photocoupler with the transistor 2169A, and the cathode of this diode is connected through a resistor 2170 to the collector of an NPN transistor, 2171. The emitter of transistor 2172 is connected to the 0 V rail. A signal PSU HOLD is supplied to the base of transistor 2171 and as will be explained with reference to FIG. 12 the signal PSU HOLD goes high when it is desired to maintain the power supply in a powered up state.

Turning now to FIG. 3c, there is shown an auxiliary 12 volt battery 960 which is provided in the electric vehicle and which is charged from the main traction battery pack 10. The positive terminal of the battery 960 is connected through the contact 2160A of relay 2160 to the anode of a diode 2180, the cathode of which is connected through the winding of relay 2024 to the negative terminal of battery 960. The vehicle power-on signal SL0 and the charger connector signal SL1 are connected through diodes 2182 amd 2184 to the winding 2024.

In operation, when one of the signals SL0 or SL1 goes high, the winding of relay 2024 is energised and thereby closing contacts 2024A and thereby causing the power supply to assume its powered-up state. Also, if the signal PSU HOLD goes high, the winding 2024 will remain energised even if both of the signals SL0 and SL1 are low.

Figure 3D:
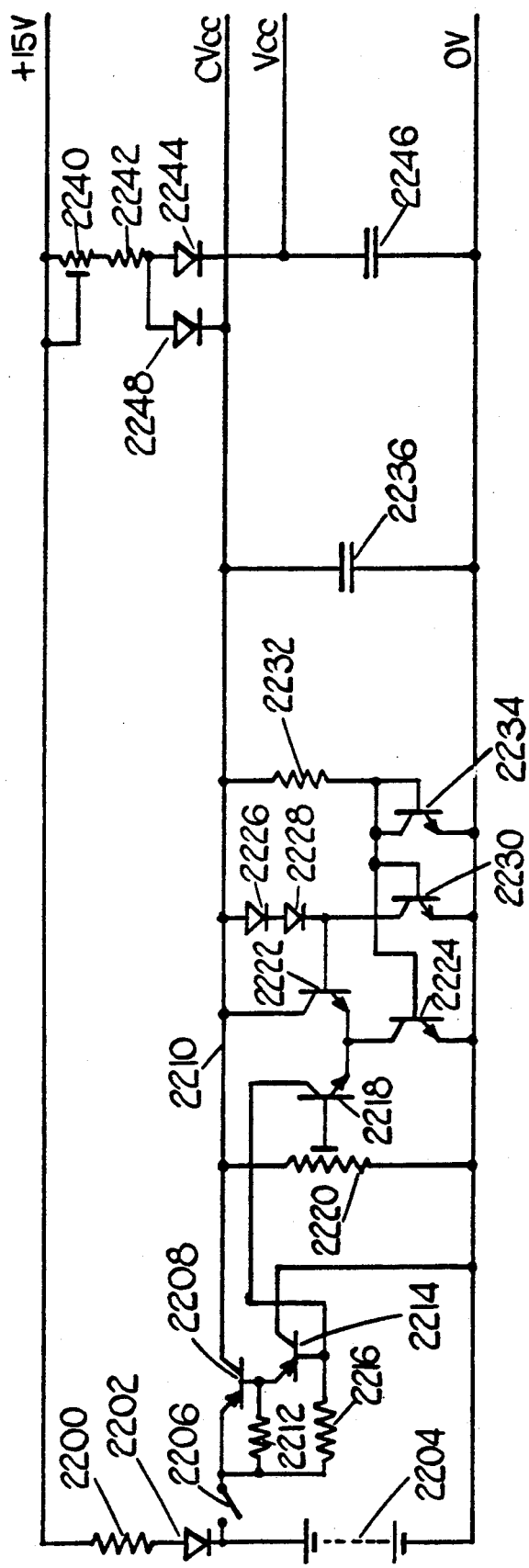

Turning now to FIG. 3d, the +15 V rail is connected through a resistor 2200 to the anode of a diode 2202, the cathode of which is connected to the positive terminal of an Ni-Cd battery 2204, the negative terminal of which is connected to the 0 V rail. The cathode of diode 2202 is connected through a switch 2206 to the emitter of a PNP transistor 2208 the collector of which is connected to a rail 2210 and the base of which is connected to its emitter through a resistor 2212 and to the emitter of a further PNP transistor 2214. The base of transistor 2214 is connected to the emitter of transistor 2208 through a resistor 2216 and the collector of transistor 2214 is connected to the 0 V rail. The base of transistor 2214 is also connected to the collector of an NPN transistor 2218, the base of which is connected to a tapping of a potentiometer 2220 connected between the rail 2210 and the 0 V rail, and the emitter of transistor 2218 is connected to the emitter of an NPN transistor 2222. The collector of transistor 2222 is connected to rail 2210 and its emitter is connected through the collector emitter path of an NPN transistor 2224 to the 0 V rail. The 2210 is connected through a pair of forwardly conducting diodes 2226 and 2228 and also the collector emitter path of an NPN tansistor 2230 to the 0 V rail, and the collector of transistor 2230 is connected to the base of transistor 2222. The rail 2210 is also connected through a resistor 2232 to the base of an NPN transistor 2234, to the base of transistor 2230 and also to the base of tansistor 2224. The emitter of transistor 2234 is connected to the 0 V rail. A smoothing capacitor 2236 is connected between the rail 2210 and the 0 V rail.

As will be explained with reference to FIG. 4a, the system includes a pair of random access memories (RAMs) and the function of these memories is to store data from the internal RAM of the MPU when the power supply is in a powered down state. The rail 2210 is connected to the power supply rail CVcc for these RAMs, the transistors 2218, 2222, 2224, 2230 and 2234 serving to stabilize the voltage on this rail. When the supply is in a powered up state, the battery 2204 is trickle charged through the resistor 2200 and when the power supply is in a power down state the battery 2204 supplies power for the RAMs.

The +15 V rail is connected through a pre-set resistor 2240, and a resistor 2242 to the anode of a diode 2244, the cathode of which is connected through a capacitor 2246 to the 0 V rail. The anode of diode 2244 is also connected to the anode of a diode 2248, the cathode of which is connected to the rail 2210. The cathode of diode 2244 is also connected to a supply rail Vcc for the majority of the CMOS components of the system with the main exception of the RAMs. The two diodes 2244 and 2248 compare the voltages of the rails CVcc and Vcc and serve to protect the RAMs by preventing the voltage of the rail Vcc rising above that of the rail CVcc during powering up of the power supply.

Referring now to FIG. 3e, there is shown the circuit for producing the power fail signal $\overline{PWFL}$. This system includes an opertional amplifier 2250, the inverting input of whic is connected to the rail 2062 through a resistor 2252 and the output of which is connected to its non-inverting input through a feedback resistor 2254. The non-inverting input is also connected through a pair of resistors 2256 and 2257, connected in series, to the +15 V rail, and the junction of these resistors is connected to the cathode of a zener diode 2258, the cathode of which is connected to the 0 V rail. The zener diode 2258 serves to provide a voltage reference for the amplifier 2250 and this amplifier detects the presence of power on rail 2062, its output going low when power is detected.

The output of amplifier 2250 is connected through a resistor 2260 to the base of an NPN transistor 2262, the emitter of which is connected to the 0 V +5 V rail and the collector of which is connected through a resistor 2263 to the +5 V rail and to the anode of a light emitting diode 2264A which forms one half of an opto isolator 2264, and the cathode of diode 2264A is connected through a resistor 2266 to the 0 V rail. The other half of the opto isolator 2264 comprises a NPN photo transistor 2264B, the collector of which is connected to the rail Vcc and the emitter of which is connected through a resistor 2268 to the 0 V rail and also to the clock input C of a D-type flip-flop 2270. The emitter of transistor 2264B is also connected to one input of a NAND gate 2272. The data input D of flip-flop 2270 is connected to the rail CVcc and its Q output is connected to the cathode of a diode 2274, which is bridged by a resistor 2276, and a capacitor 2278 to the 0 V rail. The junction of resistor 2276 and capacitor 2278 is connected to the reset input R of flip-flop 2270. The $\overline{Q}$ output of flip-flop 2270 is connected to another input of NAND gate 2272. The rail Vcc is connected through a capacitor 2280 to the cathode of a diode 2282, the anode of which is connected to the 0 V rail and which is bridged by a resistor 2284. The junction of capacitor 2280 and resistor 2284 is connected to the set input S of flip-flop 2270.

A signal PSU INHIBIT is supplied to a rail 2290 and this rail is connected to the clock input C of a D-type flip-flop 2292, the data input of which is connected to the rail CVcc. The rail 2290 is also connected to the 0 V rail through a resistor 2294. The $\overline{Q}$ output of flip-flop 2292 is connected to the third input of NAND gate 2272. The Q output of flip-flop 2292 is connected to the cathode of a diode 2294, the anode of which is connected through a capacitor 2296 to the 0 V rail and the diode 2294 is bridge by a resistor 2298. The junction of resistor 2298 and capacitor 2296 is connected to the re-set input R of flip-flop 2292.

The output of NAND gate 2272 is connected through a resistor 2300 to the rail Vcc and also to the three inputs of a NAND gate 2302, the output of which is connected to a rail 2304 which provides the signal $\overline{PWFL}$. The rail 2304 is connected through a resistor 2306 to 0 V rail and also to the three inputs of a NAND gate 2308, the output of which is connected through a resistor 2310 to the anode of a light emitting diode 2312, the cathode of which is connected to the 0 V rail.

As will be explained in greater detail below, when the power supply fails the micro processor system performs a power failure routine in which the variables stored in the internal RAM of the microprocessor are saved in the RAMs mentioned above. Also, when power is restored to the system, a reset routine is performed. The system enters the power failure routine when the signal $\overline{PWFL}$ goes low and the reset routine when it goes high. When the power supply is in a powered up state, all three inputs to NAND gate 272 are high with the result that the output of NAND gate 2302 is also high. If a power failure occurs, the output of amplifier 2250 goes high thereby rendering transistor 2262 non-conductive and de-energising light emitting diode 2264A with the result that transistor 2264B is rendered non-conductive and so its emitter applies a low signal to the NAND gate 2272. This causes the signal $\overline{PWFL}$ to go low. Also, when the system enters an idle state after either the vehicle power has been on or the charge has been connected, it is a requirement of the system that the signal $\overline{PWFL}$ goes low so as to force the system to enter the power failure routine. In order to achieve this, the signal PSU INHIBIT goes high thereby causing the Q output of flip-flop 2292 to go high with the result that the $\overline{Q}$ output goes low until the flip-flop 2292 is reset by the network comprising capacitor 2296, a resistor 2298 and diode 2294. Consequently, a low pulse is provided by the signal $\overline{PWFL}$. When the power supply is powering up after being in a power down state, one or both of the circuit comprising capacitor 2280, diode 2282 and resistor 2284 and the resistor comprising diode 2274, resistor 2276 and capacitor 2278 cause the signal $\overline{PWFL}$ to go low for a short period until it assumes its high state.

MPU Section

Referring now to FIGS. 4a and 4b there is shown the MPU 24 together with its associated memories and other circuitry. The MPU 24 is a Motorola M6802 microprocessing unit and the associated memories comprise two Harris HM-6562-9 random acess memories (RAM) 100 and 102, and two Mostek MK 2716 read only memories (ROM) 104 and 106. The manufacturers' manuals for these devices should be studied before reading further. The MPU data lines D0 to D3 are connected to the data pins D0 to D3 of RAM 100 and the MPU data lines D4 to D7 are connected to the data pins D0 to D3 of RAM 102. The MPU address lines A0 to A7 are connected to the address pins A0 of A7 of both RAM 100 and RAM 102. The MPU data lines D0 to D7 are connected to the data pins D0 to D7 of both ROM 104 and ROM 106. The MPU address lines A0 to A10 are connected to the address pins A0 to A10 of both ROM 104 and ROM 106.

The MPU enable line E is connectecd to an output buffer 108 to provide an enable signal E. The MPU read/write line R/$\overline{W}$ is connected to an output buffer 110 to provide an output read/write signal R/$\overline{W}$. The MPU address line A0 is connected to an output buffer 12 to provide a register select signal RS0 and the MPU address line A1 is connected to an output buffer 114 to provide a register select signal RS1. The tri-state controls of buffers 108, 110, 112 and 114 are connected to a 0 V rail.

The MPU address lines A11 and A12 are connected to inputs A0 and A1 of a type 74 LS 138 3 to 8 decoder 116 which is provided for enabling the ROM 104 or ROM 106 when required. To this end, the output $\overline{O6}$ of decoder 116 is connected to the input $\overline{OE}$ of ROM 104 and the output $\overline{O7}$ is connected to the input $\overline{OE}$ of ROM 106. The input A2 of decoder 116 is connected to the MPU enable line E.

As shown in FIG. 4b, the MPU address line A13 is connected through an inverter 118 to one input of a NAND gate 120, MPU address line A14 is connected through an inverter 122 to a second input of NAND gate 120, MPU address line A15 is connected to a third input of NAND gate 120 and the MPU valid memory address line VMA is connected to the fourth input of this gate. The output of NAND gate 120 is connected to one input of a NAND gate 124. The MPU address lines A3 to A10 are connected to the inputs of a NAND gate 126, the output of which is connected through an inverter 128 to one input of a NAND gate 130. The MPU address lines A11 to A15 are connected to five inputs of a NAND gate 131, the sixth input of which is connected to the MPU line VMA. The output of NAND gate 131 is connected through an inverter 134 to the other input of NAND gate 130 and the output of NAND gate 130 is connected to the other input of NAND GATE 124. The output of NAND gate 124 is connected to the input $\overline{E3}$ of decoder 116 and also to the $\overline{E3}$ input of a type 74 LS 138 3 to 8 decoder 132. The MPU address lines A10 to A8 are connected respectively to the input pins A2, A1 and A0 of decoder 132 and the MPU address lines A11 and A12 are connected respectively to the inputs pins $\overline{E1}$ and $\overline{E2}$. The decoder 132 is provided to enable selectively RAM 100 and RAM 102 or the data bus connected to the various peripheral interfaces.

To this end, the output $\overline{O1}$ of decoder 132 is connected to the two inputs of a NAND gate 134, the output of which is connected to one input of a NAND gate 136 and one input of a NAND gate 138. The other input of NAND gate 136 receives the signal $\overline{R/W}$ from a gate to be described and the output of NAND gate 136 is connected to the inputs of two bilateral gates 140 and 142. The outputs of gates 140 and 142 are connected through a resistor 144 to the rail CVcc and also to the write pins $\overline{W}$ of RAM 10 and RAM 102. The other input of NAND gate 138 is connected to the MPU enable line E and the output of this gate is connected to the input of two bilateral gates 146 and 148.

The outputs of gates 146 and 148 are connected through a resistor 150 to the rail CVcc and also to the enable inputs E of RAM 100 and RAM 102. Thus, the output $\overline{O1}$ of decoder 132 must be low to enable RAM 100 and RAM 102.

The output O2 of decoder 132 is connected to one input of a NOR gate 160, the other input of which is connected to the MPU line $R/\overline{W}$. The output of NOR gate 160 is connected to the control terminal 162 of a set of eight input/output inverting gates 164. The eight inputs of the gates 164 are connected respectively to the MPU data lines $\overline{D0}$ to $\overline{D7}$ and the eight outputs of these gates 164 provide data signals D0 to D7. A high signal at the output of NOR gate 160 enables data to be transmitted from the MPU 24 to the various peripheral interfaces.

The MPU line $R/\overline{W}$ is also connected to the two inputs of a NOR gate 166 the output of which is connected to one input of a NOR gate 168. The output of NOR gate 166 also generates the signal $\overline{R/W}$ which is supplied to one of the inputs of NAND gate 136 and also to the input $\overline{E1}$ of decoder 116. The other input of NOR gate 148 is connected to the output $\overline{O2}$ of decoder 132 and the output of NOR gate 168 is connected to the two inputs of a NOR gate 170. The output of NOR gate 170 is connected to a control terminal 172 of the gates 164. A low signal at the output of NOR gate 170 enables data to be transmitted from the various peripheral interfaces to the MPU 24.

The output $\overline{O2}$ of decoder 132 is also connected to the $\overline{E2}$ input of a type 74 LS 138 3 to 8 decoder 174. The inputs A2, A1 and A0 of decoder 174 are connected respectively to the MPU address lines A4, A3 and A2. The decoder 174 is provided to select a particular one of the peripheral devices and the outputs $\overline{O0}$ to $\overline{O7}$ of decoder 174 provide peripheral selection signals $\overline{PS0}$ to $\overline{PS7}$.

The complete program for operating the microprocessor system is permanently stored in the ROM 104 and the ROM 106 and the variables generated during operation of the system are stored in the RAM 100 and RAM 102 and also in the internal RAM of MPU 24.

Referring now to FIGS. 5a and 5b there is known shown the detailed circuit diagram for the clock 28, the associated interface 32 and the logic circuitry 34. The clock includes a pulse generator 100 which is formed from three P channel MOS transistors 202, 203 and 204, three N channel MOS transistors 205, 206 and 207, a quartz crystal 208, resistor 210 and a capacitor 212. The six transistors 202 to 207 comprises an RCA CD 4007A dual complementary pair puls inverter. The transistors 203 and 207 are not used but are shown for reason of clarity. The 0 V rail is connected through the capacitor 212 to the common gate of transistors 202 and 205, the source of transistor 202 is connected to the CVcc rail, the drain of transistor 202 is connected to the drain of transistor 205, and the source of transistor 205 is connected to the 0 V rail. The common point of capacitor 212 and the gate of transistor 202 is connected through crystal 208 and resistor 210, connected in parallel to the common drains of transistors 202 and 205. The drain of transisotr 202 is also connected through a rail 213 to the source of transistor 206, the drain of which is connected to the source of transistor 204 and the gate of which is connected to the input of an inverter 214. The output of inveter 214 is connected to the gate of transistor 204, the drain of which is connected to the rail 213. The source of transistor 204 is also connected through a resistor 216 to the 0 V rail and to the input of a buffer 218. A 4 MHz clock signal CLCK is available at the output of buffer 218 and this is connected to the clock pulse input pin EXTAL of MPU 24.

A 4 MHz signal is also present on rail 213 and this is connected to the clock inputs of D-type flip-flops 220 and 222. The Q output of flip-flop 220 is connected to the D input of flip-flop 222, the $\overline{Q}$ outpuf of which is connected to the D input of flip-flop 220. The flip-flops 220 and 222 perform a divdie by four operation and so a 1 MHz signal is present at the Q output flip-flop 222.

As will now be described, the 1 MHz signal is connected through a series of counters which operate as an elapsed time counter.

The Q output of flip-flop 22 is connected to the input of an inverter 230, the output of which is connected to one input of a NAND gate 232, the other input of which is connected to the CVcc rail. The output of NAND gate 232 is connected to the clock input C of a BCD counter 238. The Q4 output of counter 238 is connected to a set of cascaded BCD counters 239 to 248. Each of these counters 239 to 248 is associated with an inverter and a NAND gate. The input of each inverter is connected to the 0 V rail and its output is connected to one input of the NAND gate. The other input of the NAND gate is connected to the Q4 output of the preceding counter and the output of the NAND gate is connected to the clock input C of its associated counter. Each of the counters 234 and 236 to 248 together with the associated inverter and NAND gate comprises one half of a type 4520 counter.

The reset inputs R of counters 234 and 238 to 244 are connected to a rail 250. The Q1 and Q4 outputs of counter 245 are connected to the two inputs of a NAND gate 252, the output of which is connected to one input of a NAND gate 245. The rail 250 is connected to the input of an inverter 255, the output of which is connected to the other input of the NAND gate 245. The output of NAND gate 254 is connected to the reset input R of counter 245. The Q3 and Q4 outputs of counter 246 are connected to the two inputs of a NAND gate 256, the outputs of which is connected to one input of a NAND gate 258. The other input of NAND gate 258 is connected to the output of NAND gate 256 and the output of NAND gate 258 is connected to the reset input R of counter 246.

The interface 32 includes a Motorola MC6821 peripheral interface adapter (PIA) 260.

The Q1 to Q4 outputs of counter 247 and the Q1 to Q4 outputs of counter 248 are connected through bilateral switches 261 to 268 to the peripheral data lines PBO to PB7 of the PIA 260. The Q4 output of counter 248 is connected to the input of an inverter 270, the output of which is connected to the C input of a flip-flop 272 and also to the input of a flip-flop 274. The D input of flip-flop 272 is connected to the CVcc rail and the Q output of flip-flop 272 is connected to the D input of flip-flop 274. The $\overline{Q}$ output of flip-flop 272 is connected to the control terminal of a bilateral switch 276 and the $\overline{Q}$ output of flip-flop 274 is connected to the control terminal of a bilateral switch 278. The inputs of switches 276 are connected to the 0 V rail. The output signals from switches 276 and 278 represent overflow signals from the elasped time counter and these are connected respectively to the peripheral data lines PA4 and PA5 of the PIA 260.

The peripheral data line PA6 of PIA 260 is connected to the input of a bilateral switch 280, the output of which is connected to one inout of a NAND gate 281. The other input of the NAND gate 281 is connected to the CVcc rail and the output of NAND gate 281 is connected to the reset inputs R of flip-flops 272 and 274. Thus, the data line PA6 controls resetting of the flip-flops 272 and 274.

The peripheral data line PA7 is connected to the input of a bilateral switch 282, the output of which is connected to one input of a NAND gate 283. The other input of NAND gate 283 is connected to the CVcc rail. The output of NAND gate 283 is connected to the rail 250 and thus provides the signal for setting the elaspsed time counter.

On the side of the PIA 260 which communicates with the MPU 24, the register select line RS0 receives the signal RS0 from gate 112, the register select line RS1 receives the signal RS1 from gate 114, the chip select line CS2 receives the signal $\overline{PS0}$, the read/write line R/$\overline{W}$ receives signal R/$\overline{W}$ gate 114, and the enable line E receives the enable signal E from gate 108. The reset input $\overline{RESET}$ receives the signal $\overline{RESET}$.

The data line inputs $\overline{D0}$ to $\overline{D7}$ of PIA 260 receive the data signals D0 to D7 through an input/output inverting gate 284. The signal $\overline{PSO}$ is supplied to the input of an inverter 285, the output of which is connected to one input of an AND gate 286. The remaining inputs of AND gate 286 receive the signal R/$\overline{W}$ and the signal E and the output of AND gate 286 is connected to the control terminal of input/output gate 284.

The logic circuitry 30 will now be described. As shown in FIG. 3b, the power fail signal $\overline{PWFL}$ from the power supply is connected to the input of an inverter 290, the output of which is connected to the input of an inverter 291, the output of which supplied the non-maskable interrupt signal $\overline{NMI}$ to the line $\overline{NMI}$ of MPU 24. The output of inverter 290 is also connected through a resistor 292 and a capacitor 294 connected in series, to the 0 V rail, and the junction of resistor 292 and capacitor 294 is connected to the input of an inverter 296. The output of inverter 296 is connected to the input of inverter 214 forming part of the clock pulse generator 100. As may be appreciated, this results in the power fail signal $\overline{PWFL}$ being supplied to the inverter 214 after a short delay.

The output of inverter 296 is connected through resistor 298 and a capacitor 300, connected in series, to the 0 V rail, and the junction of resistor 298 and capacitor 300 is connected to the input of an inverter 302. The output of inverter 302 is connected through an inverter 303 to the D input of a flip-flop 304. The C input of flip-flop 304 is connected to the output of an inverter 306, the input of which is connected to the Q4 output of counter 239. The Q4 output of counter 239 provides a 10 Hz signal and as may be appreciated this signal will be transmitted to the Q output of flip-flop 304 providing the flip-flop 304 is reset between pulses and the signal $\overline{PWFL}$ is high. The $\overline{Q}$ output of flip-flop 304 is connected to the interrupt request line $\overline{IRQ}$ of MPU 24 and thus provides hardware interrupt signals to the MPU at a frequency of 10 Hz. As may be appreciated, the power fail signal $\overline{PWFL}$ will be supplied to the D input of flip-flop 304 with a short delay and will then block further signals at the $\overline{Q}$ output of flip-flop 304.

The output of inverter 302 is also connected through a resistor 308 and a capacitor 310 to the 0 V rail. The junction of resistor 308 and capacitor 310 is connected to the input of an inverter 312, the output of which is connected to the control terminals of switches 261 to 268, 280 and 282. Thus, the power fail signal $\overline{PWFL}$ will be supplied to these control terminals thereby blocking further communication between the elapsed time counter and PIA 260.

Analog to Digital Section

Referring now to FIGS. 6a and 6b, there is shown the detailed circuit diagram for the interface 42, the digital to analog converter 48, and the decoder 44 which form part of the analog to digital converter. The interface 42 includes a Motorola MC6821 peripheral interface adaptor (PIA) denoted by the numeral 350. On the side of the PIA 350 which communicates with the MPU 24, the register select line RSO receives the signal RSO, the register select line RS1 receives the signal RS1, the chip select line $\overline{CS2}$ receives the selection signal $\overline{PS4}$, the read/write line R/$\overline{W}$ receives the signal R/$\overline{W}$ and the enable line E receives the signal E. The data line inputs D0 to D7 receive the data signals $\overline{D0}$ to $\overline{D7}$ via an input/output inverting gate 352. The signal $\overline{PS4}$ is connected to the input of an inverter 354, the output of which is connected to one input of an AND gate 356. The remaining inputs of AND gate 356 receive the signal $R/\overline{W}$ and the signal E, and the output of AND gate 356 is connected to the control terminal of gate 352. The reset input $\overline{RESET}$ receives the reset signal $\overline{RESET}$.

The peripheral data lines PA0 to PA7, PB0 and PB1 of PIA 350 are connected respectively to input pins 4 to 13 of an Intersil type AD752OLD digital to analog converter 358 forming part of the D/A converter 48. The 0 V rail is connected through a resistor 360 and a preset resistor 362 to the $-15$ V rail, and the junction of resistors 360 and 362 is connected to pin 3 of a National Semiconductor type LH0070 voltage source 364. An accurate 10.00 volt signal is present at pin 2 of the voltage source 364 and this is connected to pin 15 of converter 358. Pin 1 D/A of converter 358 is connected to the inverting input of an operational amplifier 366, the non-inverting input of which is connected through a resistor 368 and a resistor 370, connected in series, to the 0 V rail, and the junction of resistors 368 and 370 is connected through a resistor 372 to a tapping on a variable resistor 374 connected between the $+15$ V rail and the $-15$ V rail. The output of amplifier 366 is connected through a capacitor 376 to the inverting input and also to pin 16 of D/A converter 358. The output of amplifier 366 is also connected through a resistor 378 and a capacitor 380 to the 0 V rail. The junction of resistor 378 and capacitor 380 is connected to a rail 382 which, as will be explained below, provides one input to the comparator 40.

The peripheral data line PB6 provides a signal PB6 for controlling current range, as will be explained below. The control line CA2 provides a signal CA2 which controls the polarity of the analog signal supplied to the comparator 40.

The peripheral data lines PB2 to PB5 of PIA 350 are connected to the inputs DATA 1 to DATA 4 of a type 4514 4 to 16 decoder 390 which forms part of the decoder 44. As will now be described, the output signals of the decoder 390 are combined to provide control signals for determining which analog signal is supplied to the comparator 40.

The outputs S12 to S14 of decoder 390 are connected respectively to the inputs of inverters 392 to 394, the outputs of which provide temperature selection signals T1 to T3. The outputs S12 and S13 are also connected to the two inputs of a NOR gate 396, the output of which is connected to the input of an inverter 398, and the output of which is connected to one input of a NOR gate 400. The other input of NOR gate 400 is connected to the output S14 and the output of NOR gate 400 provides the temperature selection signal TEMP.

The output S11 is connected to the input of an inverter 402, the output of which provides the average current selection signal IAV. The output S10 is connected to the input of an inverter 404, the output of which provides the peak current selection signal IPEAK.

The outputs S1 to S8 are connected respectively to one input of each of OR gates 408 to 415, the other inputs of which are connected respectively to the outputs S2 to S9. The output S1 is also connected to the input of a buffer 420, the outputs of OR gates 408 to 415 are connected respectively to the inputs of buffers 421 to 428, and the output S9 is connected to the input of a buffer 429. At the outputs of buffers 420 to 429 there are provided voltage selection signals B0 to B9. The output S9 is also connected to one input of an OR gate 432, the remaining inputs of which are connected respectively to the outputs of OR gates 410, 412 and 414. The output of OR gate 432 is connected to one input of a NOR gate 434, the other input of which is connected to the output of OR gate 408. The output of OR gate 408 provides a voltage selection signal BATT. As may be appreciated, when anyone of the outputs S1 to S9 goes high, two of the signals B0 to B9 will go high and also the signal BATT will go low.

Figure 7A:
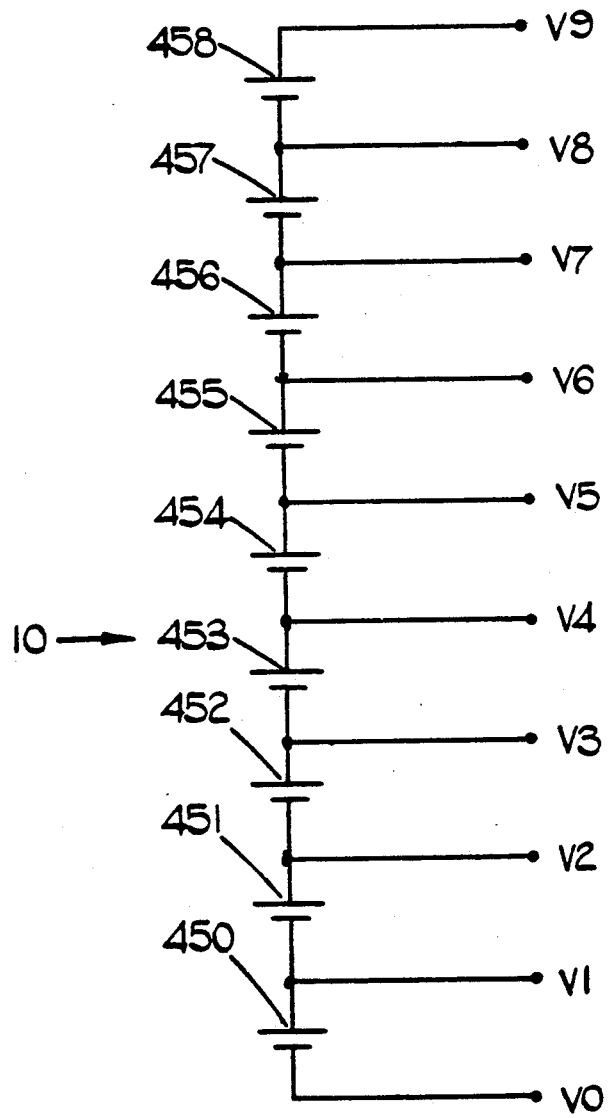

Referring now to FIGS. 7a to 7d, there is shown a circuit for generating a signal representing the voltage of one of the sub-packs. As shown in FIG. 7a, the battery pack 10 is divided into nine sub-packs denoted therein by reference numerals 450 to 458. The negative pole of sub-pack 450 is connected to a terminal V0, the junctions between the various sub-packs are connected respectively to terminals V1 to V8, and the positive pole of sub-packs 458 is connected to a terminal V9.

Figure 7B:
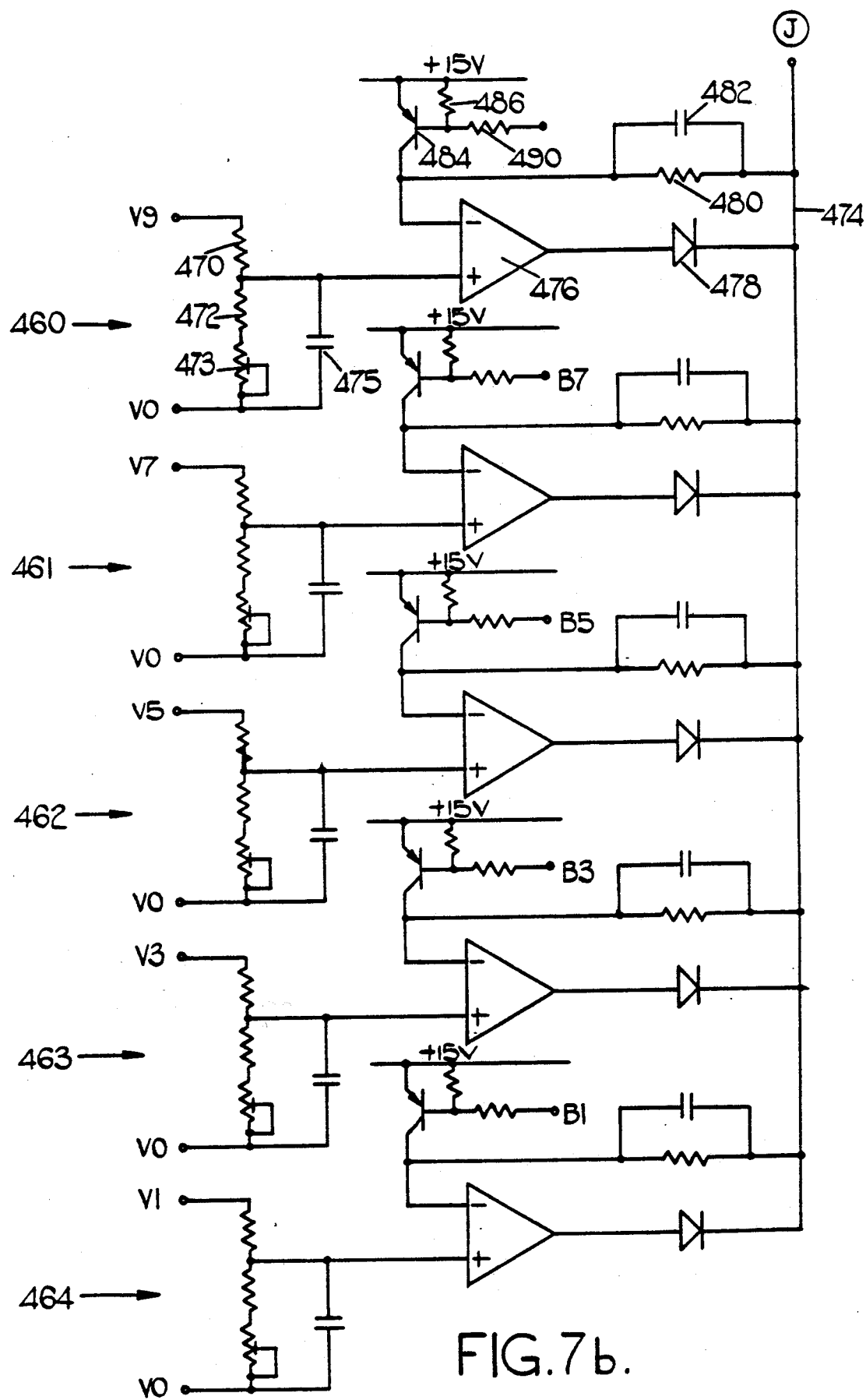
Figure 7C:
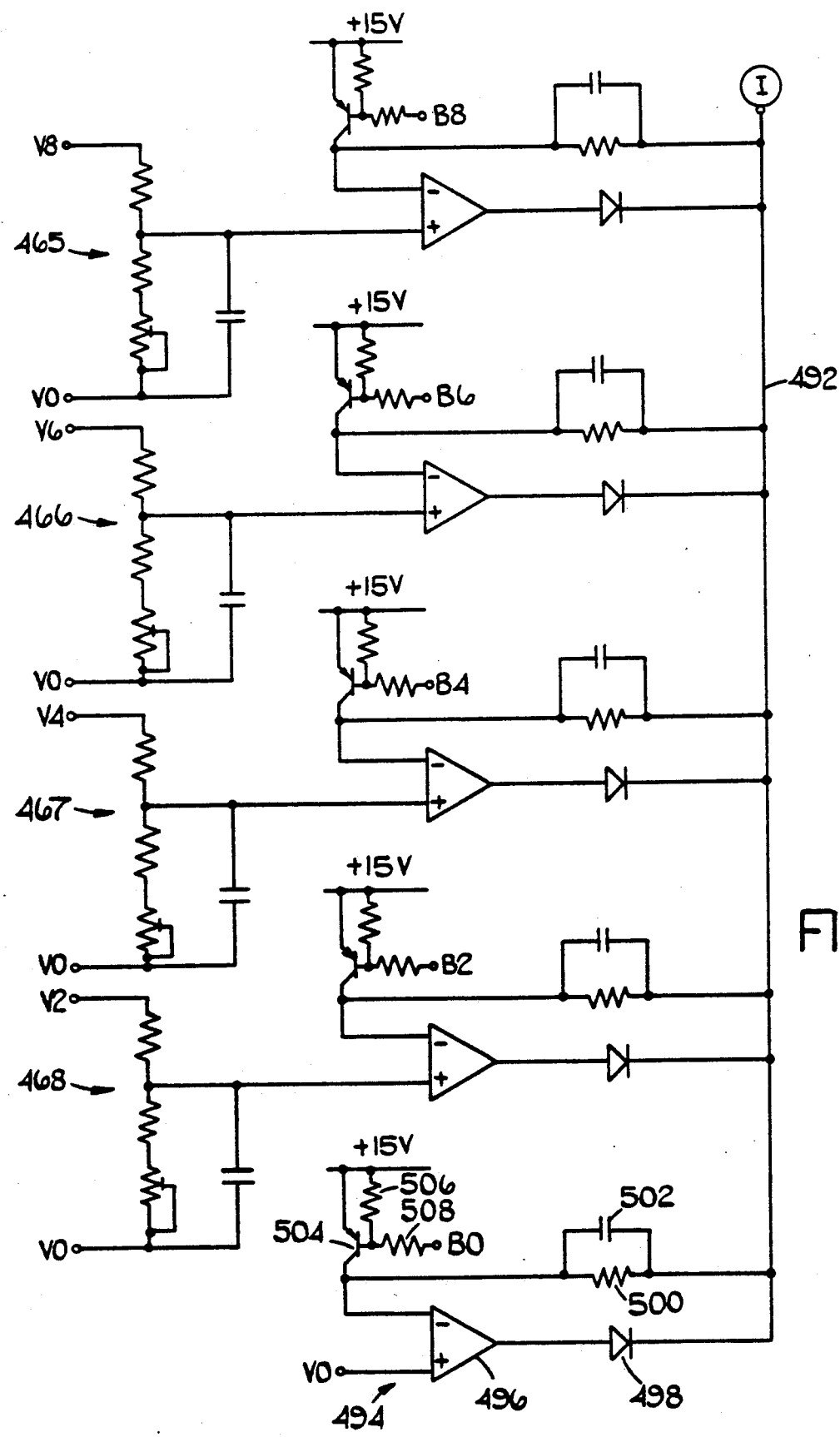

Referring now to FIGS. 7b and 7c, there are shown nine identical circuits 460 to 468, and so only circuit 460 will be described. The circuit 460 comprises an input terminal which is connected to the terminal V9 and also through a resistor 470, resistor 472, and a preset resistor 473, connected in series, to the terminal 0 V. The resistors 470 and 472 and the equivalent resistors in the circuits 461–468 are precision low drift resistors. The resistors 470 and 472 each consist of several resistors to prevent breakdown due to high voltage. The equivalent resistors in the circuits 461 to 468 require less resistors as the voltages are lower. A capacitor 475 is connected in parallel with resistors 472 and 473. Thus, a fraction of the voltage difference between terminal V9 and terminal V0 is present at the junction of resistors 470 and 472 and this voltage is connected to the non-inverting input of an operational amplifier 476. The output of amplifier 476 is connected to the anode of a diode 478, the cathode of which represents the output of the circuit and is connected to a rail 474. The rail 474 is connected through a resistor 480 to the inverting input of amplifier 476 and a capacitor 482 is connected in parallel with resistor 480. The inverting input of amplifier 476 is connected to the collector of a transistor 484, the emitter of which is connected to the $+15$ V rail. The $+15$ V rail is connected through a resistor 486, and a resistor 490, connected in series, to a control terminal, which receives the voltage selection signal B9. The junction of resistors 486 and 490 is connected to the base of transistor 484. Thus, when voltage selection signal B9 goes high, the fraction of the voltage difference between terminal V9 and terminal V0 which is present at the junction of resistor 470 and 472 will be transmitted to the rail 474.

In the case of circuit 461, the input terminal is connected to the terminal V7 and the control terminal receives the voltage selection signal B7. In the case of circuit 462 the input terminal is connected to the terminal V5 and the control terminal receives the signal B5. In the case of circuit 463, the input terminal is connected to the terminal V3 and the control terminal receives the signal B3. In the case of circuit 464, the input terminal is connected to the terminal V1 and the control terminal receives the signal B1. The outputs of circuits 461 to 464 are connected to the rail 474.

In the case of circuits 465 to 468, the inputs are connected respectively to the terminals V8, V6, V4 and V2, and the control terminals receive respectively the signals B8, B6, B4 and B2. The outputs of circuits 465 to 468 are connected to a rail 492.

In FIG. 7c there is also shown a circuit 494 which comprises an operational amplifier 496, the non-inverting input of which is connected to the terminal V0 and the output of which is connected to the anode of a diode 498. The cathode of diode 498 is connected to the rail 492 and also through a resistor 500 to the inverting input of amplifier 496. A capacitor 502 is connected in parallel with the resistor 500. The inverting input of amplifier 496 is also connected to the collector of a transistor 504, the emitter of which is connected at the +15 V rail. The +15 V rail is also connected through a resistor 506 and a resistor 508, connected in series, to a control terminal which receives the voltage selection signal B0, and the junction of resistors 506 and 508 is connected to the base of resistor 504.

Figure 7D:
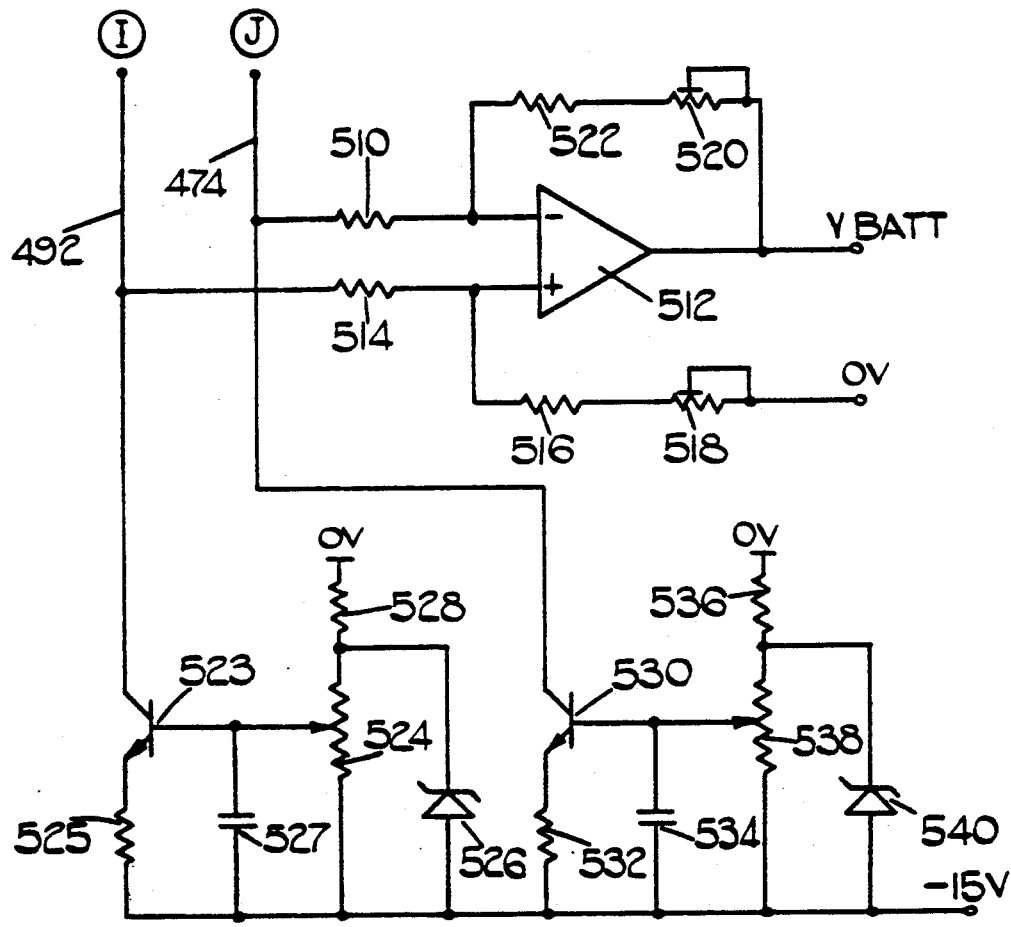

As shown in FIG. 7d, the rail 474 is connected through a resistor 510 to the inverting input of an operational amplifier 512 and the rail 492 is connected through a resistor 514 to the non-inverting input of amplifier 512. The non-inverting input is also connected through a resistor 516 and a preset resistor 518 to the 0 V rail and the output of amplifier 512 is connected through a preset resistor 520 and a resistor 522, connected in series, to the inverting input of amplifier 512.

The rail 492 is connected to the collector of an NPN transistor 523, the emitter of which is connected through a resistor 525 to the −15 V rail and the base of which is connected through a capacitor 527 to the −15 V rail. A resistor 528 and a variable resistor 524 are connected in series between the 0 V rail and the −15 V rail and the junction of resistors 528 and 524 is connected to the cathode of a zener diode 526, the anode of which is connected to the −15 V rail. The base of transistor 523 is connected to a tapping on resistor 524.

The rail 474 is connected to the collector of an NPN transistor 530, the emitter of which is connected through a resistor 532 to the −15 V rail and the base of which is connected through a capacitor 534 to the −15 V rail. The 0 V rail is connected through a resistor 536 and a variable resistor 538, connected in series, to the −15 V rail, and the junction of resistors 536 and 538 is connected to the cathode of a zener diode 540, the anode of which is connected to a −15 V rail. The base of transistor 530 is connected to a tapping on resistors 538.

The transistors 523 and 530 together with their associated circuitry each comprise a constant current source which ensure that the diodes in the two of the circuits 460 to 468 and circuit 494 which receive high voltage selection signals are conducting.

The output of amplifier 512 provides an analog signal $V_{BATT}$ which represents the voltage of one of the sub-packs. For example, if the output S5 of decoder 390 goes high, the voltage selection signals B4 and B5 will go high, and so the signal $V_{BATT}$ will be a fraction of the voltage difference between terminals V5 and V4, i.e. the voltage of sub-pack 454.

Referring now to FIG. 8a, there is shown a circuit for generating an analog signal representing temperature. This circuit includes a zener diode 541, the anode of which is connected to the −15 V rail and the cathode of which is connected through a resistor 542 to the 0 V rail. The resistor 542 is bridged by a capacitor 543 and the cathode of zener diode 541 is connected to a rail 544. The 0 V rail is also connected to the input of each of three temperature probes 546, 547 and 548, the probe 546 being mounted in the electronic circuitry and the probes 547 and 548 being mounted at two positions in the electrolyte of the traction battery pack 10. The output of probe 546 is connected to the collector of an NPN transistor 549, the emitter of which is connected through a resistor 550 to the −15 V rail, and the base of which is connected through a resistor 551 to the rail 544. The output of probe 547 is connected to the collector of a transistor 552, the emitter of which is connected through a resistor 553 to the −15 V rail and the base of which is connected through a resistor 554 to rail 544. The output of probe 548 is connected to the collector of a transistor 555, the emitter of which is connected through a resistor 556 to the −15 V rail and the base of which is connected through a resistor 557 to the rail 544.

As shown in FIG. 8b the probe 546 comprises an input rail 557 connected to the 0 V rail and an output rail 558. A preset resistor 559, and a pair of fixed resistors 560 and 561 are connected in series between the rails 557 and 558. The junction of resistors 560 and 561 is connected to the base of an NPN transistor 562, the collector of which is connected to the rail 557 and the emitter of which is connected to the base of an NPN transistor 563. The collector of transistor 563 is open circuited and its emitter is connected to the rail 558. The circuits for the probes 547 and 548 are identical to that for the probe 546.

The probes 546, 547 and 548 function as temperature dependant zener diodes and the transistors 549, 552 and 555 operate as constant current sources. Thus, in operation, the voltages present at the collectors of transistors 549, 552 and 555 represent the temperatures sensed by the probes.

The collectors of transistors 549, 552 and 555 are connected respectively through switches 564, 565, and 566 to a rail 595. The gates of switches 564, 565 and 566 receive respectively the temperature selection signals T3, T2 and T1 through resistors 567, 568 and 569. The gates are also connected through capacitors 570, 571 and 572 to the 0 V rail. The rail 595 is connected through a resistor 578 to the inverting input of an operational amplifier 580. The 0 V rail is connected to the cathode of a zener diode 573, the anode of which is connected to the anode of a diode 574. The cathode of diode 574 is connected through a resistor 575 to the −15 V rail. A resistor 582 and a preset resistor 584 are connected in series between the 0 V rail and the cathode of diode 574 and a tapping on resistor 584 is connected to the non-inverting input of amplifier 580. A capacitor 586 is connected between the non-inverting input of amplifier 580 and the 0 V rail. The output of amplifier 580 is connected through a resistor 588 and a variable resistor 590, connected in series, to the non-inverting input.

At the output of amplifier 580 there is provided a signal $V_{TEMP}$ and, as may be appreciated, this signal represents the temperature sensed by one of the probes 546, 547, 548. For example, if the temperature selection signal T2 goes low, then the signal $V_{TEMP}$ will represent the signal sensed by the probe 547.

Referring now to FIG. 9, there is shown a circuit for generating two analog signals which correspond respectively to the peak current and the average current flowing in the battery 10.

This circuit includes a National Semiconductor type LM321 precision amplifier denoted by the reference numeral 600. Pin 2 of amplifier 600 is connected through a resistor 602 to one end of the current measuring resistor 12, the other end of which is connected through a resistor 604 to pin 3. Pin 5 of amplifier 600 is connected through a resistor 606 to one end of a variable resistor 608, the other end of which is connected through a resistor 609 to pin 6. A tapping on resistor 608 is connected to the −15 V rail. Pin 1 of amplifier 600 is connected to the inverting input of a National Semiconductor type LM308 precision operational amplifier 610. Pin 8 of amplifier 600 and the non-inverting input of amplifier 610 are both connected to the 0 V rail through a capacitor. The output of amplifier 610 is connected through a capacitor 612 to its inverting input, and also through a resistor 614 and a resistor 616 connected in series, to the 0 V rail. A capacitor 618 bridges the resistor 616.

The output of amplifier 610 is connected to a movable contact 620a of a relay 620, a contact 620b of relay 620 is connected through a variable resistor 622 and a resistor 624 to pin 2 of amplifier 600, and a contact 620c of relay 620 is connected through a variable resistor 623 and a resistor 626 to pin 2 of amplifier 600.

The peripheral data line PB6 of PIA 350 shown in FIG. 6a is connected through a resistor 628 to the base of an NPN transistor 630. The collector of transistor 630 is connected to the anode of a diode 632, the cathode of which is connected to a +15 V rail, and the relay coil of relay 620 is connected across the diode 632.

The output of amplifier 610 is connected through a resistor 634 and a capacitor 636, connected in series, to the 0 V rail. The junction of resistor 634 and capacitor 636 provides an analog signal $V_{IAV}$, which represents the average current flowing in the battery 10.

As may be appreciated, the output signal appearing on the data line PB6 of PIA 350 controls the operation of relay 620. In turn, the relay 620 controls the feedback resistance between amplifiers 610 and 600, and consequently the overall gain of these two amplifiers and the current range represented by the analog signal $V_{IAV}$.

The junction of resistor 614 and capacitor 618 is connected to the non-inverting input of an operational amplifier 640 and the non-inverting input of an operational amplifier 642. The output of amplifier 640 is connected to the anode of a diode 644, the cathode of which is connected to the non-inverting input. The +15 V rail is connected through a resistor 646 of relatively high value and a resistor 648 of relatively low value to the 0V rail and the junction of these two resistors is connected through a resistor 650 to the non-inverting input to provide a positive bias. The output of amplifier 640 is connected to the anode of a diode 652, the cathode of which is connected to a rail 654. The output of amplifier 642 is connected to the cathode of a diode 656. The anode of which is connected to the inverting input. The −15 V rail connected through a resistor 658 of relatively high value and a resistor 660 of relatively low value to the 0 V rail and the junction of these two resistors is connected through a resistor 662 of relative high value to the inverting input. The output of amplifier 642 is connected to the cathode of a diode 664, the anode of which is connected to the rail 654.

During discharge of the battery 10, the output of amplifier 640 will represent the instantaneous current being withdrawn and the voltage on rail 654 will represent the peak current. During discharge, the output of amplifier 642 will be positive and normally greater than the voltage on rail 654 thereby rendering diode 664 non-conductive. Even at very low battery currents, the negative bias applied to the inverting input of amplifier 642 will ensure a positive output.

During charging, the output of amplifier 642 will represent the instantaneous charging current and the voltage on rail 654 will represent the peak charging current. During charging the output of amplifier 640 will be more negative than the voltage on rail 654 thereby rendering diode 652 non-conductive. Even at very low charging currents, the positive bias applied to the inverting input of amplifier 640 will ensure a negative output.

It is to be noted that the voltage on rail 654 is subject to a decay factor and so will not hold the peak value indefinitely.

The voltage on rail 654 provides a current analog signal $V_{IPEAK}$.

Referring now to FIG. 10, there is shown a circuit for selecting the particular analog signal supplied to the comparator 40. The analog signals $V_{IPEAK}$, $V_{IAV}$, $V_{TEMP}$, and $V_{BATT}$ are connected through switches 670 to 673 to a rail 674. The control signals IPEAK, IAV, TEMP and BATT are connected respectively through resistors 676 to 679 to the control terminals of switches 670 to 673. The control terminals of switches 670 to 673 are also connected respectively through capacitors 680 to 683 to the 0 V rail. The rail 674 is connected to the input of comparator 40 and the voltage on this rail represents the analog signal which is to be converted into digital form.

Referring now to FIG. 11, there is shown the detailed circuit diagram for the comparator 40. The rail 674 is connected through a capacitor 688 to the 0 V rail and through a resistor 690 to the non-inverting input of a type LF355 operational amplifier 692, the output of which is connected to the inverting input. This amplifier functions as a unity gain buffer. The output of amplifier 692 is connected through a resistor 694, a variable resistor 696 and a resistor 698, connected in series, to the output of a Natural Semiconductor type LF355 operational amplifier 700. The inverting input of amplifier 700 is connected to a tapping on resistor 969 and also through a capacitor 702 to the output. The resistor 694 and 698 are of relatively high value and the variable resistor 696 is of relatively low value. The position of the tapping on resistor 696 is adjusted accurately so that the resistance between the tapping and the output of amplifier 692 is equal to the resistance between the tapping and the output of amplifier 700. The output of amplifier 692 is connected to the source of an N channel MOS transistor 704, the drain of which is connected through a resistor 706 and a resistor 708, connected in series, to the non-inverting input of amplifier 700. The gate of transistor 704 is connected to the anode of a diode 710, which is bridged by capacitor 712, and the cathode of diode 710 is connected to the anode of a diode 714. The cathode of diode 714 is connected through a capacitor 716 to the cathode of diode 710, and through a resistor 718 to the 0 V rail, and directly to the gate of a P channel MOS transistor 720. The drain of transistor 720 is connected to the junction of resistor 706 and 708 and its source is connected to the 0 V rail.

The anode of diode 714 is connected to the output of a National Semiconductor type LM311 voltage comparator 722, and this output is also connected through a resistor 724 to the +15 rail and through a resistor 726 to its non-inverting input. The non-inverting input is also connected through a resistor 728 to the 0 V rail. The inverting input is connected through a resistor 730 to the +15 V rail and through a capacitor 732 to the 0 V rail. A variable resistor 734 is connected across pins 5 and 6 of comparator 722 and a tapping on this resistor is connected to the +15 V rail. Pin 6 is also connected to the collector of an NPN transistor 736, the emitter of which is connected to the 0 V rail and the base of which is connected to the +15 V rail through a resistor 738 and to control line CA2 of PIA 350 shown in FIG. 6a.

In operation, when a high signal is present on the control line CA2 of PIA 350, the transistor 736 is rendered conductive thereby rendering the output of comparator 722 open circuit and consequently the output of comparator 722 goes high by virtue of the positive bias applied through resistor 724. Consequently, transistor 720 is rendered conductive and transistor 704 is rendered non-conductive. As the 0 V rail is now effectively connected to the non-inverting input of amplifier 700, this amplifier operates as an inverter with a gain of exactly one. If the signal on control line CA2 goes low, then the output of comparator 722 will go low by virtue of the positive signal applied to its non-inverting input and the positive signal applied to pins 5 and 6, and consequently transistor 720 is rendered non-conductive and transistor 704 conductive. The output of amplifier 692 will now be applied to the non-inverting input of amplifier 700 through transistor 704, resistor 706 and resistor 708 and so amplifier 700 will now operate as a buffer with a gain of exactly one. Thus, the signal on control line CA2 determines if the output signal from amplifier 692 is inverted by amplifier 700.

The output of amplifier 700 is connected through a resistor 750 to the non-inverting input of National Semiconductor type LM311 voltages comparator amplifier 752 and the inverting input of this comparator is connected to rail 382 shown in FIG. 6a so that it receives the output of the digital to analog converter 358. A resistor 754 is connected between the output of comparator 752 and its non-inverting input to provide a small amount of hysteresis and the output of comparator 752 is connected to a +5 V rail through a resistor 755.

Thus, comparator 752 compares the output of digital to analog converter 358 with the analog signal to be compared and the output of comparator 752 is connected to the peripheral data line PB7 of PIA 350.

Vehicle State Line Interface

There is shown in FIG. 12 the interface 50 for communicating the vehicle state line signals SL0 to SL4 to the MPU 24. This interface includes a Motorola MC6821 peripheral interface adaptor (PIA) denoted by the reference numeral 760. The reset line $\overline{\text{RESET}}$ of PIA 760 receives the signal $\overline{\text{RESET}}$, the register select line RS0 receives the register select signal RS0, the register select line RS1 receives the register select signal RS1, the read/write input R/$\overline{\text{W}}$ receives the signal R/$\overline{\text{W}}$, the enable line E receives the signal E, and the chip select input CS2 receives the signal PS2. The data lines D0 to D7 of PIA 760 receives the signals D0 to D7 through input/output inverters 762. The signal PS2 is also supplied to the input of an inverter 764 the output of which is connected to one input of an AND gate 766, the remaining inputs of which receives the signal R/$\overline{\text{W}}$ and the signal E. The output of AND gate is connected to the control terminals of input/output inverters 762.

The peripheral data lines PA0 to PA4 of PIA 760 receive the vehicle state line signals SL0 to SL4 through a set of inverters, and the peripheral data lines PB0 and PB1 provide the signals PSU HOLD and PSU INHIBIT to the power supply.

Meter Driver

Referring now to FIG. 13 there is shown the circuit diagram for the meter driver 60. In this circuit the enable signal E is connected to the clock input C of a type 4024 counter 770, the Q7 output of which is connected to the input of an inverter 772. The output of inverter 772 is connected to the C input of a flip-flop 774, the $\overline{\text{Q}}$ output of which is connected to its D input and also to the clock input C of a type 4516 presettable down counter 776. The CARRY OUT output $\overline{\text{CO}}$ of counter 776 is connected to the CARRY IN input $\overline{\text{CI}}$ of a type 4516 presettable down counter 778. The clock input C of counter 778 is connected to the $\overline{\text{Q}}$ output of flip-flop 774. The PRESET inputs P1 to P4 of counter 776 receive the signals D0 to D3 on rail 780 to 783 and the PRESET inputs P1 to P4 of counter 778 receive the signals D4 to D7 on rails 784 to 787. The CARRY OUT output $\overline{\text{CO}}$ of counter 778 is connected to the input of an inverter 790, the output of which is connected to one input of a NOR gate 792. The output of NOR gate 792 is connected to the D input of a flip-flop 794, the $\overline{\text{Q}}$ output of which is connected to the other input of NOR gate 792. The C input of flip-flop 794 is connected to the Q output of flip-flop 774 and also to the two inputs of an AND gate 796. The output of AND gate 796 is connected to a rail 798.

The signal $\overline{\text{PS1}}$ is connected to the input of an inverter 80, signal RS1 to the input of an inverter 801 and a signal R/$\overline{\text{W}}$ to the input of an inverter 802. The output of inverter 800 is connected to a rail 803 and provides a signal PS1 for a purpose to be described below. The outputs of inverters 800 to 802 are connected to three inputs of an AND gate 804, the remaining input of which receives the signal E. The output of AND gate 804 is connected to the reset input R of counter 770, to the reset input R of flip-flop 774, to the PRESET ENABLE inputs PE of counters 776 and 778, and to the S input of flip-flop 794.

In operation, when the signals $\overline{\text{PS1}}$, RS1 and R/$\overline{\text{W}}$ go low and the signal E goes high, the output of AND gate 804 will go high thereby resetting counter 770, resetting flip-flop 774, setting counter 776 and 778 in accordance with the signals present on their preset inputs P1 to P4, and setting flip-flop 794. Consequently, a low signal will be present on rail 798. Subsequently, clock pulses will be generated at the $\overline{\text{Q}}$ output of flip-flop 774 and these will cause counter 776 and 778 to count down and when both counters have reached zero the CARRY OUT output of counter 778 will go low, thereby causing flip-flop 794 to be reset when it receives its next clock pulse, and thereby causing rail 798 to go high. As will be explained below, the signal RS1 goes low at intervals of 0.1 seconds, and when this happens the data on data lines D0 to D7 represents the state of charge of battery 10. Consequently, a signal will appear on rail 798, the mark to space ratio of which represents the state of charge of the battery. The rail 798 provides a signal FG and this signal is supplied to the meter 64.

Parallel to Serial Interface

Referring now to FIG. 14 there is shown the detailed circuit diagram for the interface 70. This includes a Motorola MC 6850 asynchronous communications interface adaptor (ACIA) denoted by reference numeral 810. The data lines D0 to D7 of PIA 810 receives the signals $\overline{D0}$ to $\overline{D7}$ through input/output inverters 812. The data lines D0 to D7 are also connected to rails 780 to 787 already described with reference to FIG. 13. The read/write input R/$\overline{W}$ of ACIA 810 receives the signal R/$\overline{W}$, the enable line E receives the signal E, the chip select line $\overline{CS2}$ receives the signal $\overline{PS1}$, the register select line RS receives the signal RS0 and the chip select line CS0 receives the signal RS1. The signal PS1 produced by the inverter 800 in FIG. 13 is connected to one input of an AND gate 814, the remaining inputs of which receive the signals R/$\overline{W}$, E, and RS1. The output of AND gate 814 is connected to the control terminals of inverting gates 812.

Referring now to the side of ACIA 810 which produces and receives serial information, there is shown a type 555 timer 816. The reset input R of the timer 816 is connected to the Vcc rail, and this rail is connected through a capacitor 818 to the 0 V rail and also through a resistor 820 and a capacitor 821, connected in series to the 0 V rail. The threshold input THLD, the trigger input TR and the discharge input DIS of timer 816 are connected to the junction of resistor 820 and capacitor 821. The pulse train produced to the output Q of timer 816 is connected to the C input of a flip-flop 822, the $\overline{Q}$ output of which is connected to its D input. Clock pulses will be produced at the Q output of flip-flop 822 and these are supplied to the transmit clock line TXCL of ACIA 810 and also to one input of each of AND gates 824 and 826. The data output line TXDT of ACIA 810 is connected to the other input of AND gate 826 and through a Schmitt trigger inverter 827 to the other input of AND gate 824. The output of AND gate 824 is connected to a rail 828 and the output of AND gate 826 is connected to a rail 829.

In operation, serial data is provided on the data line TXDT in non-return to zero (NRZ) format at the frequency determined by the clock pulses produced by flip-flop 222. This data is then converted into complementary return to zero (CRZ) format by AND gates 824 and 826 and Schmitt inverter 827. The rail 828 will og high for a binary 0 and the rail 829 will go high for a binary 1. Rail 828 produces a signal TXS and rail 829 produces a signal TXM. Incoming CRZ data signals RXM and RXS are received respectively on rails 830 and 831. The incoming serial data is arranged so that rail 830 will go low for a binary 1 and rail 831 will go low for a binary 0. Rail 830 is connected through a resistor 832 to the input of a Schmitt trigger inverter 833 and also through a capacitor 834 to the 0 V rail. The rail 831 is connected through a resistor 836 to the input of a Schmitt inverter 837 and also through a capacitor 838 to the 0 V rail. The output of inverter 833 is connected to one input of an AND gate 840, one input of a NOR gate 841, and one input of a NOR gate 842. The output of inverter 837 is connected to the other input of AND gate 840, to the other input of NOR gate 841, and to the other input of NOR gate 843. The output of NOR gate 843 is connected to the other input of NOR gate 842 and the output of NOR gate 842 is connected to the other input of NOR gate 843 so that these two NOR gates function as a flip-flop.

The output of AND gate 840 is connected to the data carrier detect line $\overline{DCD}$ of ACIA 810. The NOR gate 841 produces clock pulses at the data transmission frequency of the incoming data and these clock pulses are supplied to the receive clock line $\overline{RXCL}$ of ACIA 810. The NOR gates 842 and 843 invert the incoming serial data into the non-return to zero (NRZ) format and this data is supplied to the serial data input line $\overline{RXDT}$ of ACIA 810.

Opto-Isolator

Referring now to FIG. 15, there is shown an opto-isolator arrangement associated with the meter driver 60, interface 50, and interface 70. The opto-isolator arrangement serves to isolate the microprocessor system from the vehicle and also from the charger 22.

Signals TXS and TXM which are received from the circuit shown in FIG. 14 on rails 828 and 829 and signal FG which is received from the circuit shown in FIG. 13 on rail 798 are connected respectively through three resistors 850 to 852 to the cathodes of three light emitting diodes 853 to 855 forming part of an opto-isolator unit 856. The anodes of light emitting diodes 853 to 855 are connected to the Vcc rail. The light emitting diodes 853 to 855 are associated respectively with three phototransistors 858 to 860, the collectors of which are connected respectively to the collectors of three NPN transistors 861 to 863 and the emitters of which are connected respectively to the bases of transistors 861 to 863. The bases of transistors 861 to 863 are connected respectively through resistors 864 to 866 to their emitters and the emitters are all connected to the 0 V rail. The collectors of transistors 861 to 863 are connected respectively to rails 866 to 868 providing output signals TXS, TXM and FG.

The opto-isolator arrangement receives a signal RXMA and a signal RXMC on rails 870 and 871. Rail 870 is connected through a resistor 872 to the anode of a photodiode 873, the cathode of which is connected to the rail 871. The arrangement receives a signal RXSC on a rail 874 and a signal RXSA on a rail 875. The rail 875 is connected through a resistor 876 to the anode of a light emitting diode 877, the cathode of which is connected to the rail 874. Signals SL0 and SL1 from the electric vehicle received respectively on lines 880 and 881 are transmitted respectively through resistors 882 and 883 to the anodes of two light emitting diodes 884 and 885. The cathodes of diodes 884 and 885 are connected to the 0 V rail. The light emitting diodes 873, 877, 884 and 885 form part of an opto-isolator unit 886, and these light emitting diodes are associated respectively with phototransistors 888 to 891. The collectors of transistors 888 to 891 are connected to the Vcc rail. The emitters of transistors 888 and 889 are connected respectively to rails 830 and 831 which supply the signals RXM and RXS to the arrangement shown in FIG. 14. The emitters of transistors 890 and 891 are connected respectively to rails 893 and 894 which transmit the signals SL0 and SL1 to the arrangement shown in FIG. 12. The rails 830, 831, 893 and 894 are connected respectively to the 0 V rail through resistors 895 to 898.

The arrangement also receives the signals SL2, SL3 and SL4 on rails 900, 901 and 902 from the vehicle and these rails are connected respectively through resistors 903 to 905 to the anodes of three light emitting diodes 906 to 908. The cathodes of light emitting diodes 906 to 908 are connected to the 0 V rail and these three diodes form part of an opto-isolator unit 909. The light emitting diodes 906 to 908 are associated respectively with these photo-transistors 911 to 913. The collectors of transistors 911 to 913 are connected to the Vcc rail and their emitters are connected respectively to rails 915 to 917. The rails 915 to 917 supply the signals SL2, SL3 and SL4 to the arrangement shown in FIG. 12. The rails 915 to 917 are also connected respectively through resistors 919 to 921 to the 0 V rail.

Battery Charger

The detailed circuit diagram of the battery charger 22 is shown in FIG. 16. Referring in particular to FIG. 16a, the battery charger may be connected to the traction battery pack 10 through a socket 930 associated with the charger and a plug 932 associated with the traction battery pack. The charger will be described connected to the battery pack 10.

A mains power supply is connected to the charger at terminals L and N and these terminals are connected through fuses 933 and 934 and contacts 935a and 935b of a relay 935 to the two ends of a primary winding 936 of a mains transformer 937. A lamp 938 is connected across the winding 936 to indicate that the charger is working. The transformer 937 has a secondary winding 939 and an auxiliary secondary winding 940. One end of the winding 939 is connected through a fuse 941 to the anode of a thyristor 942 and to the cathode of a thyristor 943. The other end of winding 939 is connected through a fuse 944 to the anode of a diode 945 and to the cathode of a diode 946. The anode of diode 946 is connected to the anode of thyristor 943 and the cathode of diode 945 is connected to the cathode of thyristor 942. The anode of thyristor 942 is connected to the anode of diode 945 through a resistor 947, a capacitor 948, and a capacitor 949, connected in series. The gate and cathode of thyristor 943 are connected to a pair of control terminals TH1 and the gate and cathode of thyristor 942 are connected to a pair of control terminals TH2.

The cathode of thyristor 942 is connected through a ballast inductor 950 to a rail 951 which is connected through a fuse 952 to the anode of the battery 10. The cathode of battery 10 is connected through a fuse 953 to a rail 954 which is connected through a current measuring resistor 955 to a rail 956. The rail 956 is connected to the anode of thyristor 943.

Thus, when contacts 935a and 935b are closed and suitable timing signals are applied to the control terminals TH1 and TH2, the battery 10 will be charged.

Figure 16A:
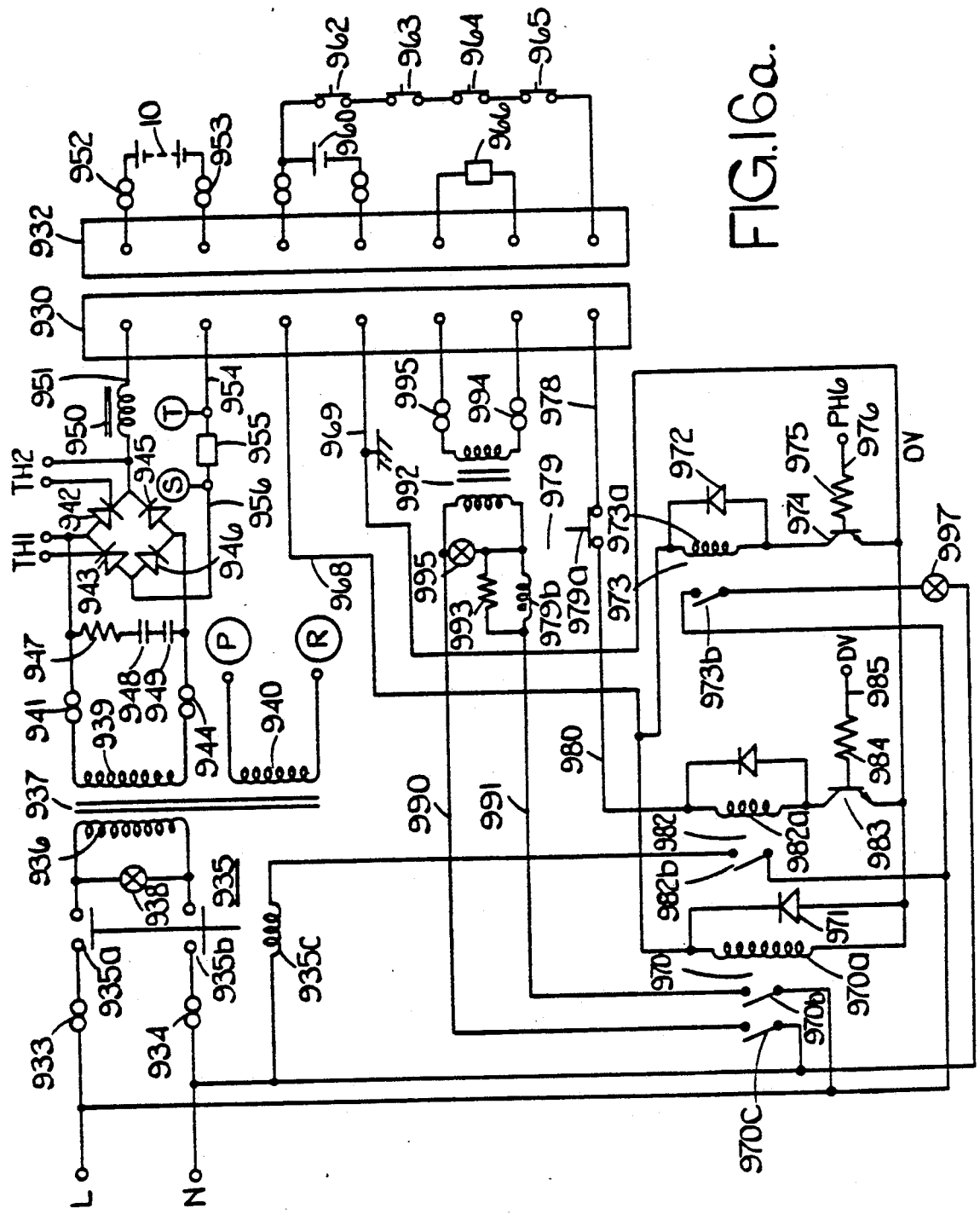

The traction battery pack 10 is associated with four pressure control switches 962 to 965, and a fan 966 for providing ventilation to the battery compartment. The pressure controlled switches 962 and 965 are mounted at four separate positions and are arranged to detect the rate at which gas is being generated in the battery 10. Providing the rate of gassing is below a predetermined level, the switches are closed. The auxiliary battery 960, which was mentioned with reference to FIG. 3, is also shown in FIG. 16a.

The positive terminal of the auxiliary battery 960 is connected to the rail 968 and the negative terminal is connected to the earth of 0 V rail 969. The rail 968 is connected to the 0 V rail through a coil 970a of a relay 970, a diode 971 bridging the coil 970a with its anode connected to the 0 V rail. The rail 968 is also connected to one end of a coil 973a of a relay 973, the other end of which is connected to the collector of an NPN transistor 974. The emitter of transistor 974 is connected to the 0 V rail, and its base is connected through a resistor 975 to a rail 976. The rail 976 receives a signal PH6 as will be described below. The relay coil 973a is bridged by a diode 972, the cathode of which is connected to the rail 968. The switches 962 to 965 are connected in series between the positive terminal of battery 960 and a rail 978. The rail 978 is connected through a pair of contacts 979a of a relay 979 to a rail 980. The rail 980 is connected to one end of a relay coil 982a of a relay 982, and the other end of coil 982a is connected to the collector of a transistor 983. The emitter of transistor 983 is connected to the 0 V rail and its base is connected through a resistor 984 to a rail 985 which receives a signal DV as will be explained below.

The terminals L and N are connected through contacts 970b and 970c of relay 970 to rails 990 and 991. Rail 990 is connected to one end of the primary winding of a transformer 992, the other end of which is connected through the relay coil 979b of relay 979 to rail 991. The coil 979b is bridged by a resistor 993. The secondary winding of transformer 992 is connected through fuses 994 and 995 to the fan 966.

The L terminal is connected through contacts 982b of relay 982 to one end of the coil 935c of relay 935 to the N terminal. Also, the L terminal is connected through contacts 973b of relay 973 and a ready lamp 997 to the terminal N.

In operation, when socket 930 is connected to plug 932, relay coil 970a will be energised thereby closing contacts 970b and 970c and consequently energising fan 966. Then, providing switches 962 to 965 are closed, the positive terminal of battery 960 will be connected to rail 978. If the fan 966 is operating correctly, relay coil 979b will be energised thereby closing contacts 979a and so connecting rail 978 to rail 980. Then, if a high signal is present on rail 985, transistor 983 will be rendered conductive thereby energising relay coil 982 and so closing contacts 982b. Consequently, relay coil 935c will be energised thereby closing contacts 935a and 935b and so supplying mains power to the transformer 937. Also, if a high signal is present on rail 976, which will be the case when charging is completed, transistor 974 will be rendered conductive thereby closing contacts 973b and energising the ready lamp 997.

As will now be explained, the circuit shown in FIG. 16a may provide the vehicle state line signals SL2 to SL4. The signal SL2 which indicates that the fan 966 is operating may be provided by a further pair of contacts associated with relay 979. The signal SL3 which indicates that the switches 962 to 965 are closed may be provided by rail 978 and the signal SL4 which indicates that the charger is on may be provided by a further set of contacts associated with relay 982.

Figure 16B:
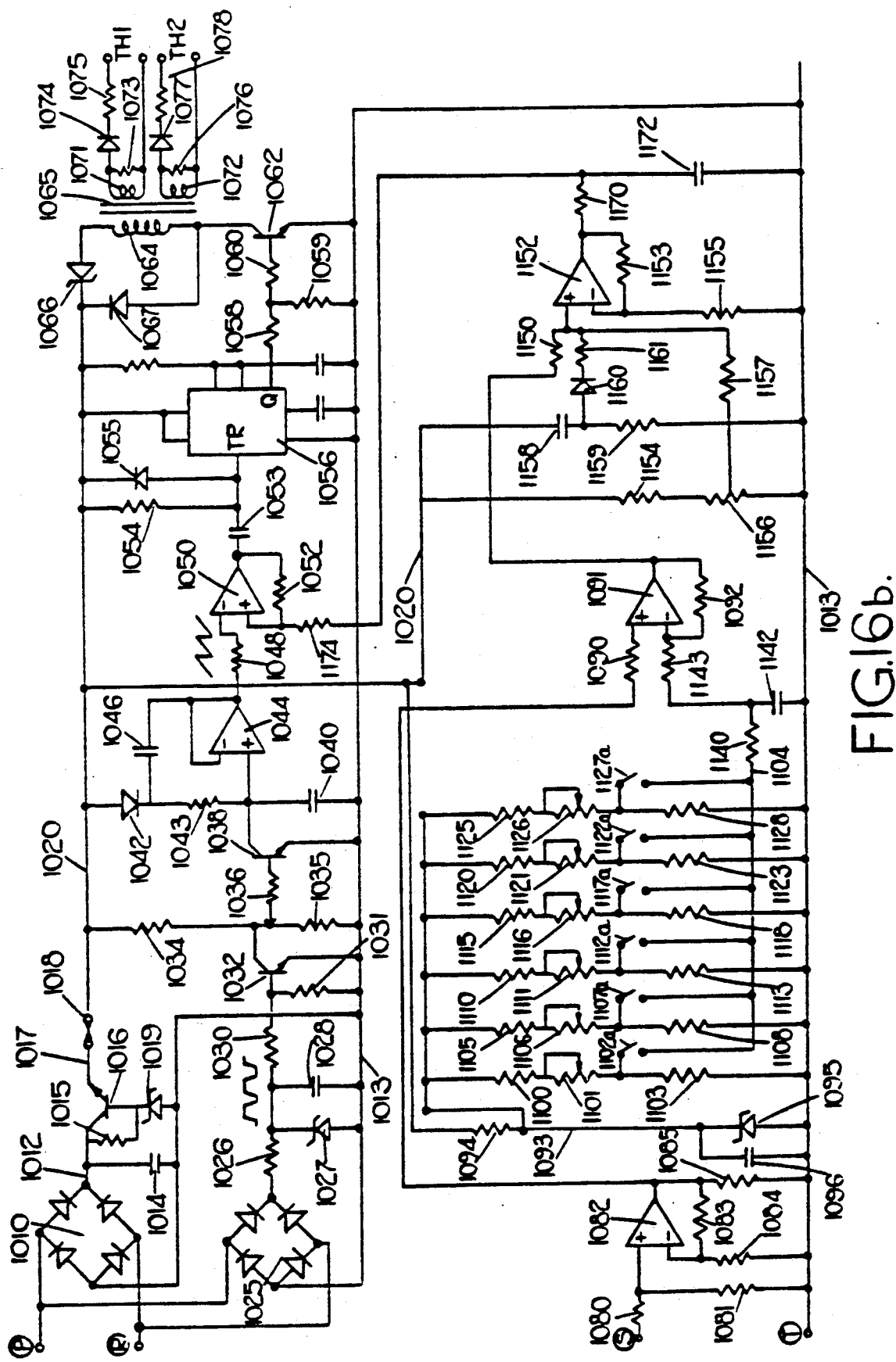

Referring now to FIG. 16b, there is shown a full wave rectifier 1010, the input terminals of which are connected across the secondary winding 940 of the mains transformer 937 shown in FIG. 16a and the output terminals of which are connected to rails 1012 and 1013. Rail 1012 is connected through a capacitor 1014 to the rail 1013 and also through a resistor 1015 to the base of a transistor 1016, the collector of which is connected to the rail 1012 and the emitter of which is connected to a rail 1017. The base of transistor 1016 is also connected to the cathode of a zener diode 1019, the anode of which is connected to the rail 1013. The rail 1017 is connected through a fuse 1018 to a rail 1020 and a constant voltage will normally be present between rails 1013 and 1020.

The secondary winding 940 is also applied to the input terminals of a second full wave rectifier 1025. One output terminal of rectifier 1025 is connected to rail 1013 and the other output terminal is connected through a resistor 1026 to the cathode of a zener diode 1027, the anode of which is connected to the rail 1013. A capacitor 1028 is connected across zener diode 1027 and the cathode of zener diode 1027 is connected through a resistor 1030, and a resistor 1031, connected in series, to rail 1013.

In operation, a clipped fully rectified waveform will be present at the junction of resistors 1030 and 1031.

The junction of resistors 1030 and 1031 is applied to the base of an NPN transistor 1032, the emitter of which is connected to the rail 1013 and the collector of which is connected through a resistor 1034 to the rail 1020 and through a resistor 1035 to the rail 1013. The junction of resistors 1034 and 1035 is connected through a resistor 1036 to the base of an NPN transistor 1038, the emitter of which is connected to the rail 1013 and the collector of which is connected through a capacitor 1040 to the rail 1013. The rail 1020 is connected to the anode of a diode 1042, the cathode of which is connected through a resistor 1043 to the collector of transistor 1038. The collector of transistor 1038 is also connected to the non-inverting input of an operational amplifier 1044, the output of which is connected to its non-inverting input and also through a capacitor 1046 to the cathode of diode 1042.

In operation, a ramp-shaped waveform will be present at the output of amplifier 1044.

The output of amplifier 1044 is connected through a resistor 1048 to the inverting input of an operational amplifier 1050, the output of which is connected to its non-inverting input through a resistor 1052. The output of amplifier 1050 is connected through a capacitor 1053 and a resistor 1054, connected in series, to rail 1020. The junction of capacitor 1053 and resistor 1054 is connected to the anode of a diode 1055, the cathode of which is connected to the rail 1020, and also to the trigger input TR of a type 555 circuit connected as a monostable 1056. The output Q of monostable 1056 is connected through a resistor 1058 and a resistor 1059, connected in series, to rail 1013, and the junction of resistors 1058 and 1059 is connected through a resistor 1060 to the base of an NPN transistor 1062.

The emitter of transistor 1062 is connected to the rail 1013 and its collector is connected through the primary winding 1064 of a transformer 1065 to the anode of a zener diode 1066, the cathode of which is connected to the rail 1020. The collector of transistor 1062 is also connected to the anode of a diode 1067, the cathode of which is also connected to the rail 1020.

The transformer 1065 has two secondary windings 1071 and 1072. A resistor 1073 is connected across the winding 1071, and one end of winding 1071 is connected to the anode of a diode 1074, the cathode of which is connected through a resistor 1075 to one of the thyristor control terminals TH1 shown in FIG. 16a. The other terminal of winding 1071 is connected directly to the other control terminal. A resistor 1076 is connected across the winding 1072 and one end of this winding is connected to the anode of a diode 1077, the cathode of which is connected through a resistor 1078 to one of the thyristor control terminals TH2. The other end of this winding is connected to the other control terminal.

The rail 954 connected to one end of measuring resistor 955 shown in FIG. 16a is connected to the rail 1013 and the other end of measuring resistor 955 is connected through a resistor 1080 and a resistor 1081, connected in series, to rail 1013. The junction of resistors 1080 and 1081 is connected to the non-inverting input of an operational amplifier 1082, the output of which is connected through a resistor 1083 to its inverting input, and its inverting input is connected through a resistor 1084 to rail 1013. The output of amplifier 1082 is also connected through a resistor 1085 to the rail 1013.

In operation, the output voltage of amplifier 1082 will be representative of the current supplied to the traction battery 10.

The output of amplifier 1082 is connected through a resistor 1090 to the non-inverting input of an operational amplifier 1091, the output of which is connected to its inverting input through a resistor 1092.

The rail 1020 is connected through a resistor 1094 to a rail 1093. The rail 1093 is connected to the cathode of a zener diode 1095, the anode of which is connected to the rail 1013, and the diode 1095 is bridged by a capacitor 1096.

The rail 1093 is connected through a resistor 1100, a preset resistor 1101, and a resistor 1103, connected in series, to rail 1013, and the junction of resistors 1101 and 1103 is connected through a relay contact 1102a to a rail 1104. The rail 1093 is connected through a resistor 1105, a variable resistor 1106 and a resistor 1108, connected in series, to the rail 1103, and the junction of resistors 1106 and 1108 is connected through a relay contact 1107a to the rail 1104. The rail 1093 is also connected through a resistor 1110, a variable resistor 1111, and a resistor 113 connected in series, to the rail 1013, and the junction of resistors 1111 and 1113 is connected through a relay contact 1112a to the rail 1114. The rail 1093 is connected through a resistor 1115, a variable resistor 1116 and a resistor 1118, connected in series, to the rail 1104 and the junction of resistors 1116 and 1118 is connected through a relay contact 1117a to rail 1104. The rail 1093 is connected through a resistor 1120, a variable resistor 1121 and a resistor 1123, connected in series, to the rail 1104, and the junction of resistors 1121 and 1123 is connected through a relay contact 1122a to the rail 1104. Finally, rail 1093 is connected through a resistor 1125, a variable resistor 1126 and a resistor 1128, connected in series, to the rail 1013, and the junction of resistors 1126 and 1128 is connected through a relay contact 1127a to the rail 1104.

The rail 1104 is connected through a resistor 1140 and a capacitor 1142, connected in series, to rail 1013, and the junction of resistor 1140 and the capacitor 1142 is connected through a resistor 1143 to the inverting input of amplifier 1091.

In operation, in accordance with the current desired, one of the contacts 1102a, 1107a, 1112a, 1117a and 1122a will be closed and so amplifier 1091 will compare the actual current with the required current and so its output will be an error signal.

The output of amplifier 1091 is connected through a resistor 1150 to the non-inverting input of an operational amplifier 1152, the output of which is connected through a resistor 1153 to its inverting input and its inverting input is connected through a resistor 1155 to the rail 1013.

The rail 1020 is connected through a resistor 1154 and a variable resistor 1156, connected in series, to the rail 1013 and a tapping on resistor 1156 is connected through a resistor 1157 to the non-inverting input of amplifier 1152. The rail 1020 is also connected through a capacitor 1158 and a resistor 1159, connected in series, to the rail 1013, and the junction of capacitor 1158 and resistor 1159 is connected to the anode of a diode 1160, the cathode of which is connected through a resistor 1161 to the non-inverting input of amplifier 1152.

The output of amplifier 1152 is connected through a resistor 1170 and a capacitor 1172 to the rail 1013 and the junction of resistor 1170 and capacitor 1172 is connected through a resistor 1174 to the non-inverting input of an amplifier 1050.

In operation, during each half cycle of the mains power supply, the output of amplifier 1050 will go low when the voltage applied to its inverting input exceeds that applied to its non-inverting input. When the output goes low, the monostable 1056 will be triggered thereby rendering transistor 1062 conductive and applying output pulses across the thyristor control terminals TH1 and TH2. Consequently, the thyristor 942 or 943 which is forwardly biased will be rendered conductive.

When the charger is first energised, a high voltage will initially be present at the junction of capacitor 1158 and resistor 1159 thereby ensuring that the initial charging current is low. Subsequently, this voltage will decay thereby allowing a gradual build-up of charging current until it reaches the value determined by the voltage on rail 1104.

Figure 16C:
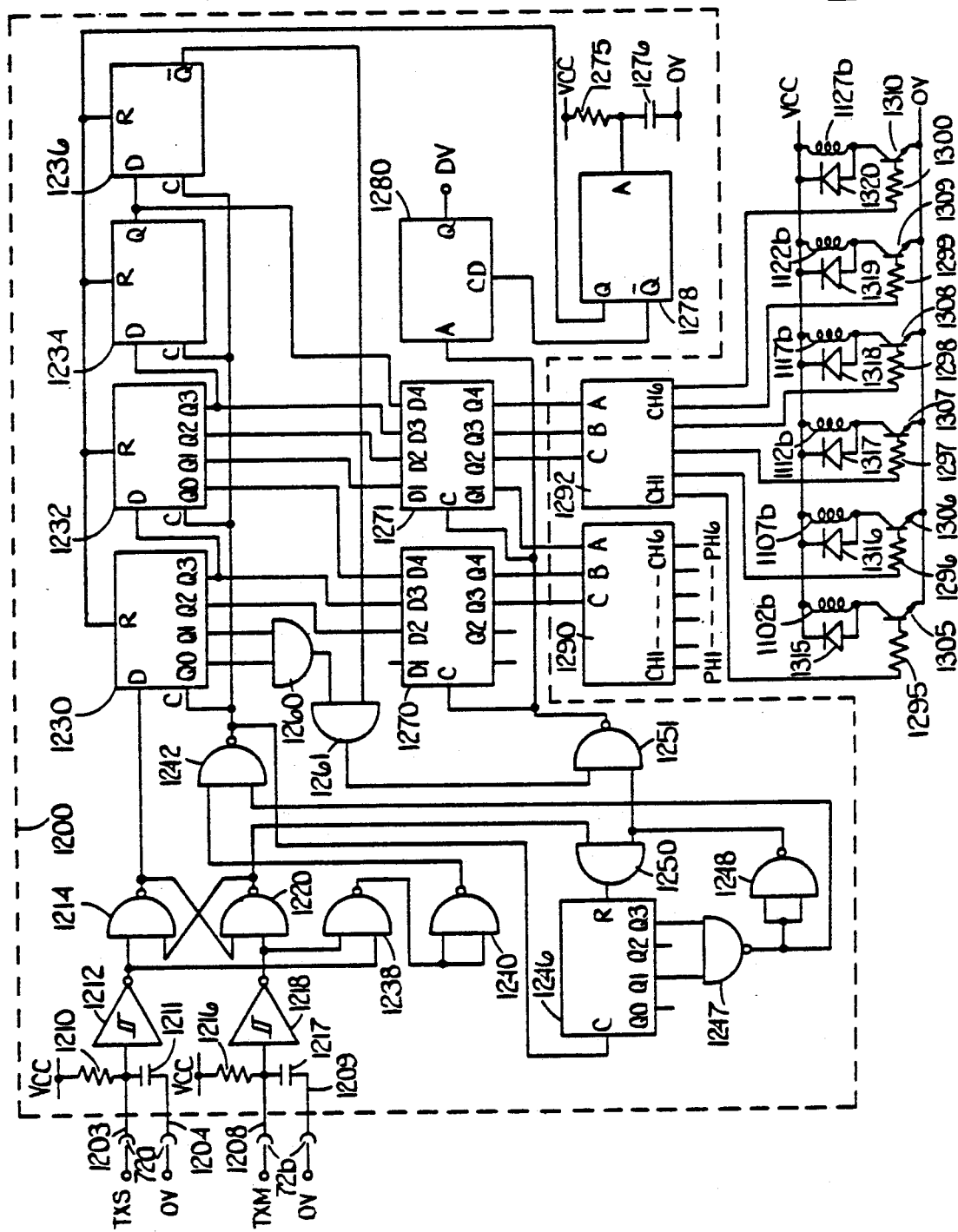

Referring now to FIG. 16c, there is shown a serial to parallel converter forming part of the charger and indicated by the chain line 1200. The rail 866 carrying the signal TXS from FIG. 15 and the 0 V rail are connected respectively to a pair of rails 1203 and 1204 through detachable connections 72a. Also the rail 867 carrying the signal TXM from FIG. 15 and the 0 V rail are connected to a pair of rails 1208 and 1209 through detachable connectors 72b. The rail 1203 is connected through a resistor 1210 to the Vcc rail and to the rail 1204 by a capacitor 1211. The rail 1203 is also connected to the input of a Schmitt trigger inverter 1212 the output of which is connected to one input of a NAND gate 1214. The rail 1208 is connected to the Vcc rail by a resistor 1216 and to the rail 1209 by a capacitor 1217. The rail 1208 is also connected to the input of a Schmitt trigger inverter 1218 the output of which is connected to one input of a NAND gate 1220. The output of NAND gate 1214 is connected to the other input of NAND gate 1220 and the output of NAND gate 1220 is connected to the other input of NAND gate 1214. Thus, the two NAND gates 1214 and 1220 function as a flip-flop. Consequently, the serial data which is received in the complementary return to zero (CRZ) format is converted by flip-flops 1214 and 1220 into the non-return to zero (NRZ) format.

The output of NAND gate 1214 is connected to the data input D of a four state shift register 1230. The Q3 output of shift register 1230 is connected to the data input D of a four stage shift register 1232. The Q3 output of shift register 1232 is connected to the D input of a flip-flop 1234 and the Q output of flip-flop 1234 is connected to the D input of a flip-flop 1236.

The outputs of the two inverters 1212 and 1218 are connected to the two inputs of a NAND gate 1238, the output of which is connected to the two inputs of a NAND gate 1240. The NAND gates 1238 and 1240 produce clock pulses at a frequency corresponding to the transmission frequency of the incoming serial data.

The output of NAND gate 1240 is connected to one input of a NAND gate 1242. The output of NAND gate 1242 is connected to the clock input C of a four stage binary up-counter 1246. The Q1 and Q3 outputs of counter 1246 are connected to the two inputs of a NAND gate 1247, the output of which is connected to the other input of NAND gate 1242. The output of NAND gate 1247 is also connected to the two inputs of a NAND gate 1248, the output of which is connected to one input of each one of NAND gates 1250 and 1251. The output of NAND gate 1250 is connected to the reset input R of counter 1246.

The output of NAND gate 1242 is connected to the clock input of shift register 1230, to the clock input of shift register 1232, to the C input of flip-flop 1234 and the the C input of flip-flop 1236. The Q0 and Q1 outputs of shift register 1230 are connected to the two inputs of and AND gate 1260, the output of which is connected to one input of an AND gate 1261. The $\overline{Q}$ output of flip-flop 1236 is connected to the other input of AND gate 1261, and the output of AND gate 1261 is connected to the other input of NAND gate 1251.

The Q2 and Q3 outputs of shift register 1230 and the Q0 output of shift register 1232 are connected respectively to the data inputs D2, D3 and D4 of a latch 1270. The Q1, Q2 and Q3 outputs of shift register 1232 and the Q output of flip-flop 1234 are connected respectively to the data inputs D1 to D4 of a latch 1271. The output of NAND gate 1250 is connected to the clock inputs C of latches 1270 and 1271.

The Vcc rail is connected through a resistor 1275 and a capacitor 1276 to the 0 V rail. The junction of resistor 1275 and capacitor 1276 is connected to the A input of a type 4528 monostable 1278, the Q output of which is connected to the reset inputs R of shift registers 1230 and 1232 and flip-flops 1234 and 1236. The Q output of monostable 1278 is connected to the CD input of another type 4528 monostable 1280. The Q output of monostable 1280 provides the signal DV which is supplied to rail 985 shown in FIG. 16a. The output of NAND gate 1251 is connected to the A input of monostable 1280.

Figure 16D:
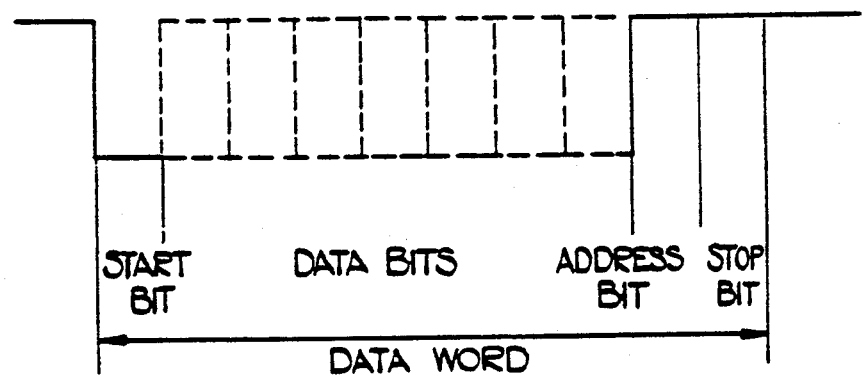

As shown in FIG. 16d, the convertor 1200 receives ten bit words. Each word comprises a start bit which is set to a binary 0, seven data bits, an address bit which is set to a binary 1 when the converter 1200 is being addressed, and a stop bit which is also set to a binary 1. In between words, a binary 1 is transmitted and consequently the output of a NAND gate 1214 is high.

When a new word is received, the start bit will cause the output of NAND 1220 to go high thereby causing the output of AND gate 1250 to go high and hence reseting the counter 1246. This will cause the output of NAND gate 1247 to go high thereby permitting clock pulses from NAND gate 1240 to pass through NAND gate 1242. These pulses will cause the incoming word to be clocked into the shift registers 1230 and 1232, the flip-flop 1234 and the flip-flop flop 1236.

When an entire word has been received, the counter 1246 will be set to the binary number 1010 and consequently the Q1 and Q3 outputs will be high. Consequently the output of NAND gate 1247 will go low thereby blocking the passage of further clock pulses through NAND gage 1242. Also, the output of NAND gate 1248 will go high thereby providing a high signal to one input of NAND gate 1250.

Also, when a complete word has been received, the Q0 output of shift register 1230, which corresponds to the stop bit, will go high, the Q1 output of shift register 1230, which corresponds to the address bit, will go high, and the Q ouput of flip-flop 1236, which corresponds to the inverse of the start bit, will also go high. Consequently, the output of AND gate 1261 will go high thereby causing the output of NAND gate 1251 to go low and the data bits to be clocked into latches 1270 and 1271.

Providing incoming words are received periodically, the output of NAND gate 1251 will go low periodically thereby ensuring that the Q output of monostable 1280 remains high. Thus a high signal will be supplied to rail 985 shown in FIG. 16a thereby causing the main contracts 935a and 935b to be closed. If for some reason, the incoming words are not received, then the signal DV will go low thereby preventing charging.

It is to be noted that the monostable 1278 is provided for initially reseting the the shift registers 1230, 1232, 1234 and 1236, and also monostable 1280.

The Q3 and Q4 outputs of latch 1270 and the Q1 output of latch 1271 are connected respectively to the C, B and A inputs of a 3 to 8 decoder 1290. The outputs CH1 to CH6 of decoder 1290 provide signals PH1 to PH6. These signals are indicative of the phase of the charging cycle which is being performed. In the arrangement shown, only the signal PH6 is utilized and when this signal is high it inidcates that the charging cycle has been completed. The signal PH6 is supplied to the rail 976 shown in FIG. 16a and, as may be readily appreciated, a high signal on this rail causes the ready lamp 997 to be energised.

The Q2, Q3 and Q4 outputs of latch 1271 are connected to the C, B and A inputs of a 3 to 8 decoder 1292. The outputs CH1 to CH6 of decoder 1292 indicated respectively the six current level at which charging is to proceed. These outputs CH1 to CH6 are connected respectively through resistors 1295 to 1300 to the bases of NPN transistors 1305 to 1310. The emitters of transistors 1305 to 1310 are connected to the 0 V rail and their collectors are connected respectively through relay windings 1102b, 1107b, 1112b, 1117b, 1122b and 1127b to rail Vcc. Energisation of these relay windings cause closure respectively of relay contacts 1102a, 1107a, 1112a, 1117a, 1122a and 1127a. The collectors of transistors 1305 to 1310 are also connected to the Vcc rail by diodes 1315 to 1320, the cathodes of these diodes being connected to the Vcc rail.

Thus, a high signal on one of the outputs CH1 to CH6 of decoder 1292 will cause the associated transistor to be rendered conductive thereby causing energisation of the associated relay winding and closure of the respective contacts shown in FIG. 16b.

Motor Controller Override

Referring now to FIG. 17, there is shown the detailed circuit diagram for the serial to parallel converter 74, the digital to analog converter 76, and the override output circuit 77 which provide the signal for overriding the controller 20. The purpose of this circuit is to limit the maximum current drawn by the traction motor 14 during the last 10 Ah of available charge of the traction battery 10 progressively from 100% of the normal maximum current to 40%.

The serial to parallel converter 74 is identical to the converter 1200 shown in FIG. 16c, except that it does not include an element equivalent to the monostable 1280. The various elements of the converter 74 are denoted by identical reference numerals to the corresponding elements of converter 1200 with the addition of the suffix A. The Q2, Q3 and Q4 outputs of latch 1270A and the Q1, Q2, Q3 and Q4 outputs of latch 1271A are connected respectively to the inputs of digital to analog converter 76. The converter 76 is a Ferranti type ZN425 ZD425 digital to analog converter. The output of converter 76 is connected to the non-inverting input of an operational amplifier 1400, the output of which is connected through a capacitor 1401 to its inverting input. The output of amplifier 1400 is connected through a variable resistor 1402 and a resistor 1403, connected in series, to the 0 V rail, and also through a resistor 1404 to the base of a PNP transistor 1405. The emitter of transistor 1405 is connected to a rail 1406 and its collector is connected through a resistor 1407 to the 0 V rail. The collector of transistor 1405 is als connected to the base of a transistor 1408, the emitter of which is connected to the 0 V rail and the collector of which is connected to the rail 1406.

The rail 1406 is connected to the base of transistor N3 shown in FIG. 3 of our above-mentioned Patent Co-operation Treaty Application No. 78/00046.

In operation, the maximum current which may be withdrawn from the traction battery 10 will be indicated in binary form at the Q2, Q3 and Q4 outputs of latch 1270A and at the Q1, Q2, Q3 and Q4 outputs of latch 1271A. Consequently, the voltage of the amplifer 1400 will be an analog signal representing the maximum current. In FIG. 3 of our above-mentioned Application, the signal at the base of transistor N3 represents the current demanded by the accelerator pedal. If the current demanded is less than the maixmum current permitted by the signal of the output of the amplifier 1400, then transistor 1405 will be non-conductive and no interference will be made to this current demand signal. However, if the current demand signal exceeds the maximum current permitted by the output of amplifer 1400, then transistors 1405 and 1408 will conduct so as to limit the maximum current to the value determined by the output of amplifier 1400.

Teletype Section

Referring now to FIG. 18, there is shown the detail circuit diagram for the serial to serial converter 79 and this will now be described.

The rail 866 carrying the signal TXS from FIG. 15 is connected through a resistor 3210 to the Vcc rail, to the 0 V rail through capacitor 3211, and to the input of a Schmitt trigger inverter 3212, the output of which is connected to one input of a NAND gate 3214. The rail 867 carrying the signal TXM from FIG. 15 is connected to the Vcc rail through a resistor 3216, the 0 V rail through a capacitor 3217, and the input of a Schmitt trigger inverter 3218, the output of which is connected to one input of a NAND gate 3220. The output of NAND gate 3214 is connected to the other input of NAND gate 3220 and the output of NAND gate 3220 is connected to the other input of NAND gate 3214. Thus, the two NAND gates 3214 and 3220 function as a flip-flop and, consequently, the serial data which is received in complementary return to zero (CRZ) format is converted by these gates into the non-return to zero (NRZ) format.

The output of NAND gate 3214 is connected to the data input D of a four stage shift register 3230. The Q3 output of shift register 3230 is connected to the data input D of a four stage shift register 3232. The Q3 output of shift register 3232 is connected to the input of a D type flip-flop 3234 and the Q output of flip-flop 3234 is connected to the D input of a flip-flop 3236.

The output of the two inverters 3212 and 3218 are connected respectively to the two inputs of an AND 3238, the output of which provides clock pulses at a frequency corresponding to the transmission frequency of the incoming serial data.

The output of AND gate 3238 is connected to one input of an AND gate 3242. The output of AND gate 3242 is connected to the clock input C of a four stage binary up counter 3246. The Q1 and Q3 outputs of counter 3246 are connected to the two inputs of a NAND gate 3247, the output of which is connected to the other input of NAND gate 3242. The output of NAND gate 3247 is also connected to the 0 V rail through a resistor 3001 and a capacitor 3002, connected in series, and the junction of resistor 3001 and capacitor 3002 is connected to the two inputs of a NAND gate 3248. The output of NAND gate 3248 is connected to one input of each one of AND gates 3250 and 3251. The output of NAND gate 3250 is connected to the reset input R of counter 3246.

The output of NAND gate 3242 is connected to the clock inputs of shift registers 3230 and 3232, and to the clock inputs of flip-flops 3234 and 3236. The Q0 output of a shift register 3230 is connected to one input of an AND gate 3260 and the Q1 output of shift register 3230 is connected to the two inputs of a NAND gate 3259, the output of which is connected to the other input of AND gate 3260. The output of AND gate 3260 is connected to one input of an AND gate 3261, the other input of which is connected to the $\overline{Q}$ output of flip-flop 3236, and the output of AND 3261 is connected to the other input of AND gate 3251.

The Q2 and Q3 outputs of shift register 3230, and the Q0 to Q3 outputs of shift register 3232, and the Q output of flip-flop 3234 are connected respectively to the parallel jam inputs of a type 4021 eight stage shift register 3270. The Q8 output of shift register 3270 is connected to the D input of a D type flip-flop 3272, the Q output of which is connected to the D input of a D type flip-flop 3274. The $\overline{Q}$ output of flip-flop 3274 is connected through a resistor 3276 to the base of a PNP transistor 3278, the emitter of which is connected to the Vcc rail and the collector of which is connected through a resistor 3280 to a rail 3282 and also through a resistor 3284 to a rail 3286, the rail 3286 being connected to the 0 V rail.

The output of AND gate 3251 is connected to the clock input of a D type flip-flop 3290 the D input of which is connected to the Vcc rail. The Q output of flip-flop 3290 is connected to one input of an AND gate 3292, the output of which is connected to the control terminal PL of shift register 3270 and to the reset input R of flip-flop 3272.

The converter further includes a NAND gate 3294, one input of which is connected to the Vcc rail and the output of which is connected to the other input through a crystal 3296. The output of NAND gate 3294 is also connected to the clock input C of a counter 3298, the Q8 outuput of which is connected to the clock input of a further counter 3300. The Q3 output of counter 3300 provides clock pulses at the teletype baud rate and these are supplied to the clock inputs of shift register 3270, and flip-flops 3272 and 3274. The Q3 output of counter 3300 is also connected to one input of an AND gate 3302, the output of which is connected to the clock input C of a counter 3304. The reset input R of counter 3304 receives the output of AND gate 3292, and the Q1 and Q3 outputs of counter 3304 are connected to the two inputs of a NAND gate 3306, the output of NAND gate 3306 is connected to the two inputs of a further NAND gate 3308, the output of which is connected to the other input of AND gate 3292. The output of NAND gate 3306 is also connected to the other input of AND gate 3302.

The converter 79 receives ten bit words in CRZ format and each word comprises a start bit which is set to binary 0, seven data bits, an address bit which is set to binary 1 when the converter 79 is being addressed, and a stop bit which is set to binary 1. In between words, a binary 1 is transmitted and consequently the output of NAND gate 3214 is high.

When any word is received, the start bit will cause the output of NAND gate 3220 to go high thereby resetting counter 3246 and thus permitting clock pulses from AND gate 3238 pass through AND gate 3242. These clock pulses will cause the incoming word to be clocked into the shift registers 3230 and 3232, and flip-flips 3234 and 3236. When an entire word has been received, the counter 3246 will be set to the binary number 1010 and consequently the output of NAND gate 3247 will go low thereby blocking the passage of further clock pulses and the output of NAND gate 3248 will go high thereby providing a high signal to one input of AND gate 3251.

Also, when a complete word has been received, the Q0 output of shift register 3230 which corresponds to the stop bit will go high, the Q1 output of shift register 3230 which corresponds to the address bit will go low, and the Q output of flip-flop 3236 which corresponds to the inverse of a start bit will also go high. Consequently, the output of AND gate 3261 will go high thereby causing the output of AND gate 3251 to go high and thus causing the Q output of flip-flop 3290 to go high. At this stage the output of NAND gate 3308 is also high and so a high signal is supplied to the control terminal PL of shift register 3270 with the result that the incoming word is loaded into the shift register. Also, the flip-flop 3272 is reset and this provides the start bit, which is a binary 0, for the out-going word to the teletype. The word loaded into the shift register 3270 is transmitted to the teletype under control of the clock pulses from the output of counter 3300 via transistor 3278 and rails 3282 and 3286.

When the output of AND gate 3292 goes high, this resets the counter 3304 thereby causing the output of AND gate 3308 and thus disabling the AND gate 3292. Counter 3304 now counts the clock pulses from the output of counter 3300 until it reaches a count of 10 at which stage the output of NAND gate 3308 goes high, thereby enabling the next word to be received by the shift register 3270. Thus, shift register 3270 is prevented from receiving a new incoming word whilst the previously received word is being transmitted to the teletype.

Incoming serial words from the teletype 82 are received on rails 3400 and 3402, these tails being connected by a resistor 3403 and the rail 3402 being connected to the 0 V rail. The rail 3400 is connected to the input of a monostable 3404, the output Q of which is connected to the reset input R of a counter 3406. The clock input C of counter 3406 receives pulses from the Q8 output of counter 3298. The monostable 3404 provides a delay equal to half a bit time after which it resets counter 3406. The Q3 output of counter 3406 consequently toggles at each half bit time and this output is connected to the two inputs of a NAND gate 3408 and to the clock input of a D type flip-flop 3410. The D input of flip-flop 3410 is connected to the rail 3400, its Q output is connected to one input of a NAND gate 3412 and its $\overline{Q}$ output is connected to one input of a NAND gate 3414. The other inputs of NAND gates 3412 and 3414 are connected to the output of NAND gate 3408. The output of NAND gate 3412 is connected through a resistor 3416 to the base of an NPN transistor 3418, the emitter of which is connected to the 0 V rail, and the collector of which is connected directly to rail 875 and through a resistor 3420 to rail 874, the rails 874 and 875 providing the input signals RXSC and RXSA to the opto isolator shown in FIG. 15. The output of NAND gate 3414 is connected to the base of an NPN transistor 3422, the emitter of which is connected to the 0 V rail, and the collector of which is connected directly to rail 870 through a resistor 3424 to rail 871, the rails 870 and 871 providing the signals RXMA and RXMC to the opto isolator shown in FIG. 15.

In operation, the NAND gates 3412 and 3414 steer the clock pulses from the Q3 output of counter 3406 to rails 874 and 875 or 870 and 871 in accordance with the incoming data with the result that the incoming serial data from the teletype is converted into CRZ format.

Program Structure

As mentioned above, the program for controlling the battery monitoring system are stored in ROM104 and ROM106 and the general structure of these programs will now be described.

Referring now to Table 1 below, the program include a set of control programs, a set of interrupt programs, and a set of utility sub-routines. The control programs include a program RESET. When power is applied or restored to the system, the program RESET is entered and this program resets the system and restores variables which have been saved in RAM100 and RAM102 to the internal RAM of MPU 24. Upon completion of the program RESET, the program INTERR is entered. This program enables communication between the teletype 82 and the MPU 24 and also transmits control words to the override output circuit 77 and to the battery charger 22. The program INTERR includes a sub-routine EXMOD which enables the system user to examine the contents of individual registers and to modify these if desired. The program INTERR also includes a sub-routine OUTCH for sending characters to an output data stack, a sub-routine PCRLF for transmitting the characters for carriage return and line feed to the output buffer, a sub-routine INCHNP for receiving a character for the teletype 82, a pair of sub-routine CHEXL and CHEXR which respectively convert the four most significant bits and the four least significant bits of a binary word held in accumulator A of the MPU 24 into their hexadecimal equivalent expressed in ASCII code, and a sub-routine CBCDHX converts a hexadecimal number expressed in ASCII code and held in accumulator A into its binary equivalent. The program INTERR also includes a sub-routine PACK which compresses two four bit words held in successive registers to a single eight bit word, and a program UNPACK which converts an eight bit binary word into two hexadecimal numbers expressed in ASCII code and sends these words to the output buffer. Finally, the program INTERR includes a sub-routine BACKGROUND which is responsible for transmitting words from the output data stack to the ACIA810 for subsequent transmission to the charger 22, the override output circuit 77 or the teletype 82. This sub-routine also tests for system shutdown.

The control programs also include a program POWRFAIL which is responsible for saving variables from the internal RAM of the MPU 24 in the RAMs100, 102 immediately before shutdown.

As explained with reference to FIG. 5b, the flip-flop 272 normally supplies interrupt signals on the interrupt line $\overline{IRQ}$ to MPU 24 at a frequency of 10Hz. If during execution of the program INTERR an interrupt signal is received, then the interrupt programs are entered. These programs include a 0.1 second routine which is performed each time an interrupt signal is received, i.e. at 0.1 second intervals, a one second routine which is performed at the end of each tenth pass through the 0.1 second routine which is performed at the end of each tenth pass through the one second routine, i.e. at ten second intervals. If an interrupt signal is received during execution of the one second routine or the ten second routine, then the 0.1 second routine will be entered. After the interrupt programs have been executed, program control reverts to its previous position which may be in the program INTERR, or in the one second routine or in the ten second routine.

The 0.1 second routine comprises a program INTSERV, the main fuctions of which are to read the vehicle state signals SLO-SL4, to load the meter driver 60, and to decide if program control should revert to the program INTERR or if it should proceed to the one second routine.

The one second routine commences with a program TRANS which determines if a transition in the vehicle status has taken place between driving and idle or between idle and charging. If such a transisition has taken place, then program control enters one of four programs which carry out the necessary operations after such a transition. These programs are CHRIDL, DRVIDL, IDLDRV, and IDLCHR and these are associated respectively with the transistions from charging to idle, driving to idle, idle to driving, and idle to charging. Subsequently, the program ADCONV is performed and this program is responsible for converting the various input analog signals into digital form and storing the digital values in appropriate registers. The program ADCONV includes a sub-routine ADC which is responsible for the actual conversion from analog to digital. If charging is taking place, program control then jumps to the program CHARGE. This program performs various tests to make sure that charging may proceed. The charger 22 has six different charging states and these are controlled respectively by the program STATE1, STATE2, STATE3, STATE4, STATE5 and STATE6. Upon completion of the program CHARGE, control jumps to one of the six programs. If the vehicle is being driven, then program control jumps from the program ADCONV to the program DISCH which is responsible for integrating current withdraw, for determining the charge storage capacity of the battery as a function of sub-pack voltage if certain conditions are fulfilled, and for setting the maximum armature current of the traction motor 14 during low states of charge. The program DISCH includes a sub-routine VPCALC which is responsible for calculating the polarisation voltage. Finally, the one second routine includes a program SEND which transmits control words to the output data stack.

The ten second routine comprises a program FGCALC, the two main functions of which are calculating the charge storage capacity of the battery if this has not been calculated in the prrogram DISCH and calculating the state of charge of the battery to be displayed by the meter 64.

The utility sub-routines comprises a program AV-CURR which averages current during charging, a program LKUP 1 which adjusts the value of discharge current in accordance with the rate of discharge, program LKUP2 and LKUP3 which are look up table used in calculating the polarisation voltage, a program SPTST which determines the sub-pack having the lowest voltage, the voltage of the sub-pack, and also the total battery voltage, a program SDCALC which calculates the self discharge of the battery which occurs during idle periods, and a program MDCALC which calculates the deflection of the needle of meter 64.

There is also provided a set of programs for performing the various arithmetic operations but as such programs are well known to those skilled in the art they will not be described.

charging. Finally, the status word PGFW is defined in FIG. 19d. In this word, bit 0 is set to indicate that charging may continue, bit 1 is set if the charger gas heads are not operating correctly, bit 2 is set if the charger fans 966 are not operating correctly, and bit 3 is set following a reduction of charging current for a period in which the gas heads are given an opportunity to reset. Bit 4 is set to indicate that a new value of a variable AHL, which represents the charge storage capacity of the battery pack, is available, bit 5 is set to indicate that partial charging has taken place, bit 6 is set to indicate that the variable AHL has been corrected, and bit 7 indicates that more than 10 Ah have been withdrawn since the last charging period.

In the programs, the various peripheral devices are given address names and these are summarised in Table

TABLE 1
PROGRAM STRUCTURE

Control Programs
RESET    INTERR    POWRFAIL
         EXMOD
         OUTCH
         PCRLF
         INCHNP
         CHEXL
         CHEXR
         CBCDHX
         PACK
         UNPACK
         BACKGRND

INTERRUPT PROGRAMS 0.1 SECOND ROUTINE
         INTSERV

1 SECOND ROUTINE
TRANS    CHRIDL    ADCONV    CHARGE    DISCH    SEND
         DRVIDL    ADC       STATE1    VPCALC
                             STATE2
         IDLDRV              STATE3
         IDLCHR              STATE4
                             STATE5
                             STATE6

10 SECOND ROUTINE
FGCALC
UTILITY SUBROUTINES
         AVCURR    SPTST
         LKUP1     SDCALC
         LKUP2     MDCALC
         LKUP3

The programs OUTCH, PCRLF, INCHNP, CHEXL, CHEXR and CBCDHX are produced by Motorola Incorporated.

Four 8 bit words are used to communicate the status of the system between the various programs and these status words will now be described. Referring firstly to FIG. 19a, there is shown the status word DEBP1. In this word, bit 0 is set when the vehicle power is on for driving, bit 1 is set when the charger 22 is connected, bit 2 is set when the charger fans 966 are working, bit 3 is set when the charger gas heads have not tripped, i.e. when the pressure operated switches 962-965 are open, and bit 4 is set when the charger 22 is energised. Referring now to FIG. 19b, there is shown the arrangement of the status word CHWORD. In this word, bits 0, 1 and 2 indicate the charger current level, charging levels 0 to 6 corresponding respectively to charging current of 0, 1, 5.5, 8, 15, 20 and 30 amps, bits 3, 4 and 5 indicate the charging state, and bit 7 is set if a transition from idle to discharge has taken place. The status word STCH is shown in FIG. 19c and in this word the bits 0, 1, 2 and 3 are set respectively to indicate a transition from dirving to idle, charging to idle, idle to driving and idle to 2 below. in the case orf PIA260, PIA760 and PIA350, the address names refer to the respective peripheral data registers and in the case of ACIA810 the address name refers to the receive data register and also to the transmit date register.

TABLE 2
PERIPHERAL LOCATION NAMES

| DEVICE | REGISTER | REGISTER NAME |
|---|---|---|
| Clock PIA260 | A side data lines | CMTA |
|  | B side data lines | CMTB |
| Meter driver 60 | Preset Inputs | FGTIM |
| ACIA810 |  | ACIAD |
| Vehicle |  |  |
| State Line PIA760 | A side data lines | STLNA |
|  | B side data lines | STLNB |
| A-D PIA350 | A side data lines | ADCA |
|  | A side control register | ADCAC |
|  | B side data lines | ADCB |

In the flow charts which are described below, the various micro processor operations are specified by codes set out in Table 3.

TABLE 3

| FLOW CHART CODES | |
|---|---|
| LDA A INDEX | Load accumulator A with data at address stored in the index register. |
| LDA B INDEX | Load accumulator B with data at address stored in the index register. |
| LDA X INDEX | Load index register with data at address stored in the index register. |
| STA A INDEX | Store data in accumulator A at address stored in the index register. |
| STA B INDEX | Store data in accumulator B at address stored in the index register. |
| PSH A | Push data in accumulator A onto stack. |
| PSH B | Push data in accumulator B onto stack. |
| PUL A | Pull data from stack into accumulator A. |
| PUL B | Pull data from stack into accumulator B. |
| ROL A | Rotate accumulator A to the left. |
| ROR A | Rotate accumulator A to th right. |
| ROL B | Rotate accumulator B to the left. |
| ROR B | Rotate accumulator B to the right. |
| ROL INDEX | Rotate the location having the addressstored in the index register to the left. |
| ROR INDEX | Rotate the location having the address stored in the index register to the right. |
| INDEX =0 | Clear location having address stored in index register |
| ASL | Arithmetic shift left. |
| ASR | Arithmetic shift right. |
| LSR | Logical shift right. |
| JSR | Jump to sub routine. |
| JMP | Jump. |
| JMP SELF | Jump to self. |
| JMP INDEX | Jump to address stored in the index register. |
| RTS | Return from sub routine. |
| RTI | Return from interrupt. |
| CLI | Clear interrupt mask. |
| SEI | Set interrupt mask. |
| Y | Yes. |
| N | No. |
| b | Bit |
| S | Hexadecimal |
| H | High byte of double byte word |
| L | Low byte of double byte word |
| X | Index resister |

The flow charts for the various programs will now be described in detail. In these flow charts, names are assigned to the physical variables and constants. It is to be appreciated that these names refer to both the variables and constants and also to the locations in which they are stored. In order to reduce the amount of memory space required, certain locations are used to store one variable for the majority of programs and to store temporarily a different variable for a particular program. In the case of these locations, the same name is used for both variables to indicate that both variables are stored in a single location.

Control Programs

Figure 20:
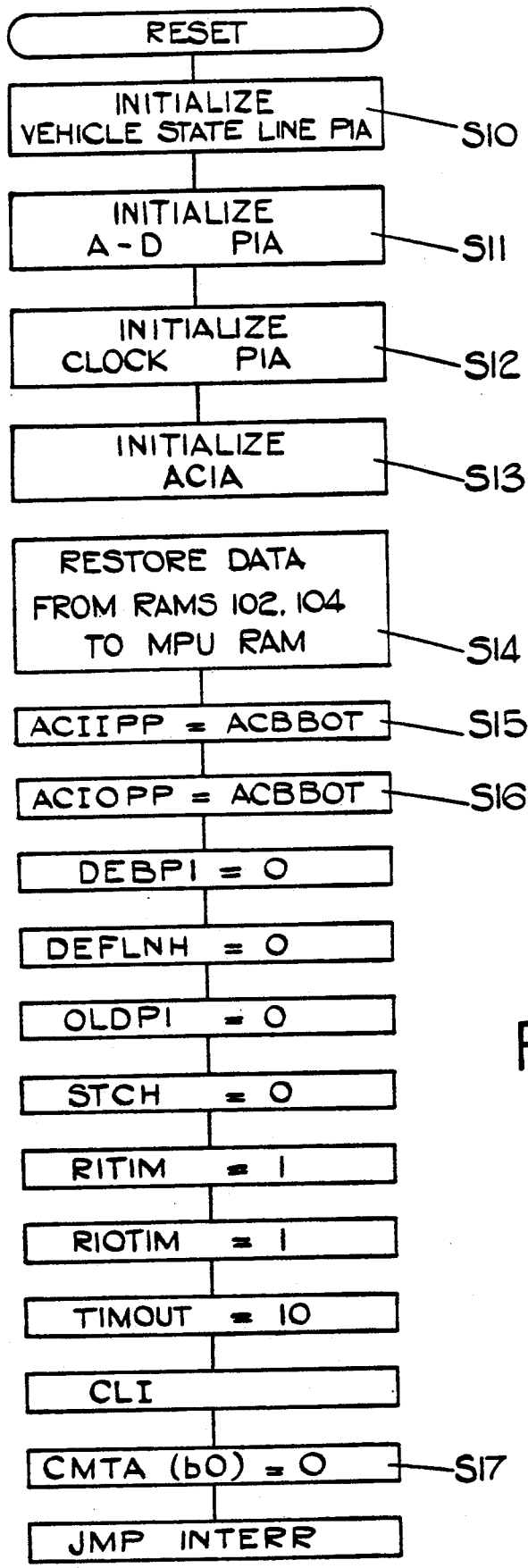
Figure 21:
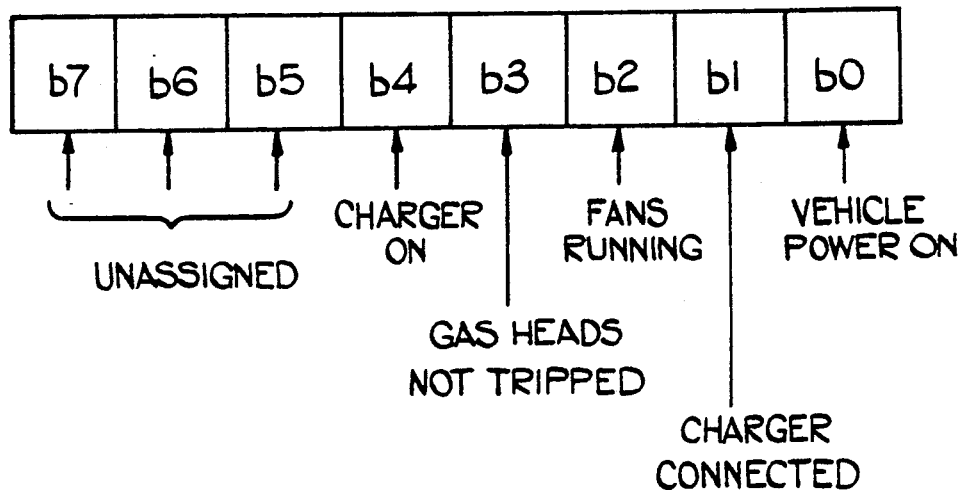
Figure 21:
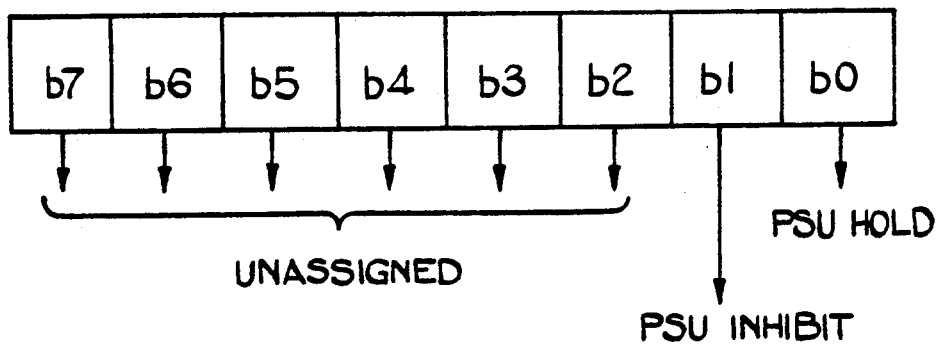
Figure 22:
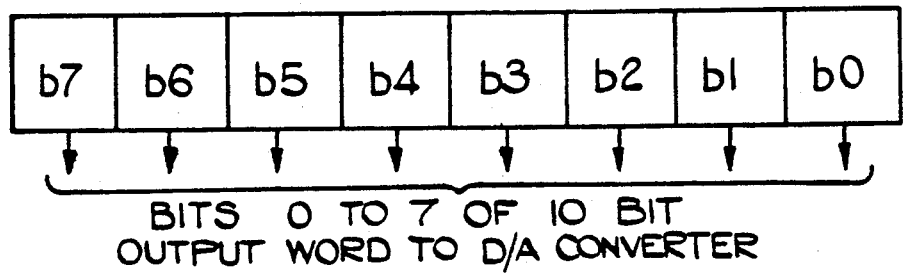
Figure 22:
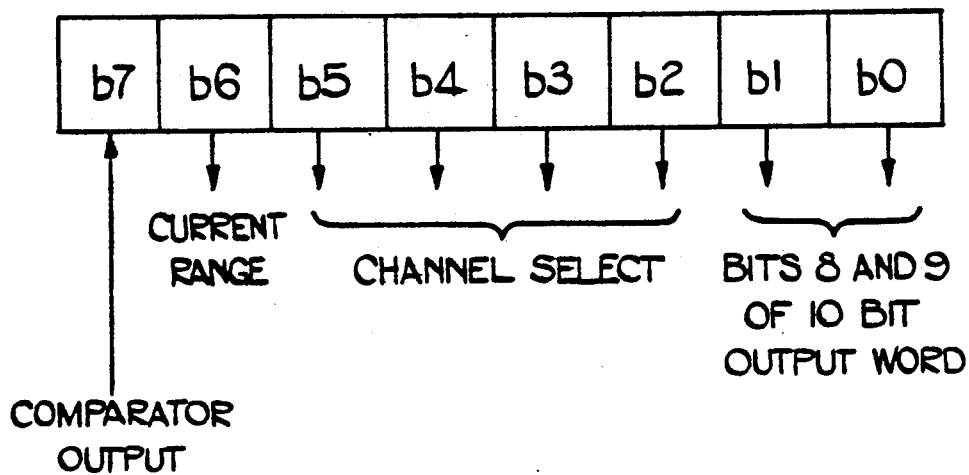
Figure 23:
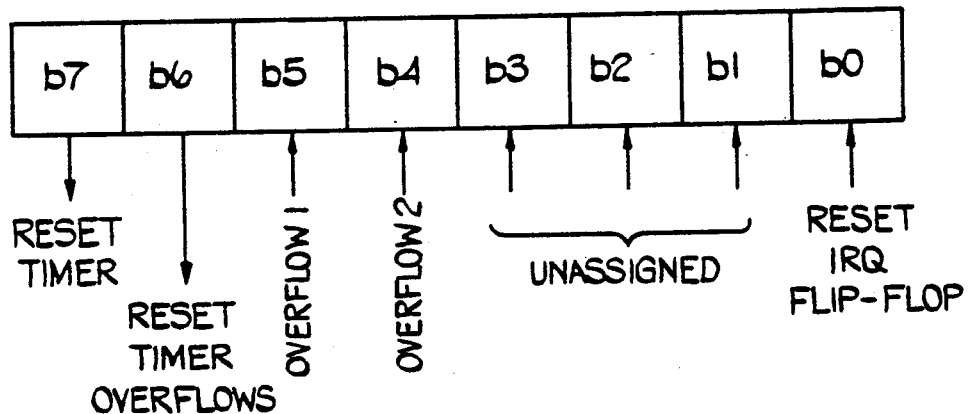
Figure 23:
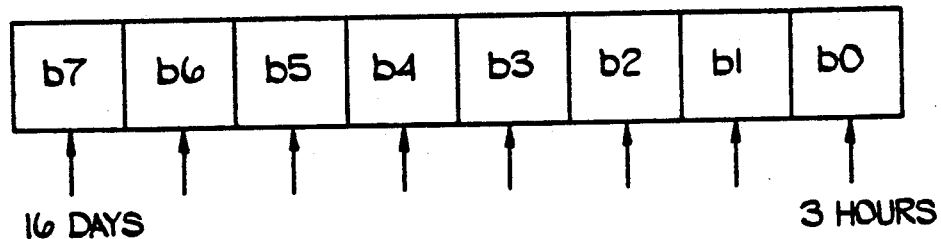

Referring now to FIG. 20, there is shown the flow chart for the program RESET. When power is restored to the system, the power fail signal PWFL goes high and after a short delay the signal RESET also goes high thus causing the program RESET to be entered. In an operation S10 at the beginning of this program, the vehicle state line PIA is initialised by programming its data direction registers so that its peripheral data lines are respectively set as inputs or outputs as shown in FIG. 21. Also, bit O of the B side of this PIA is set so that the signal PSU HOLD goes high thereby maintaining the power supply to the system. In an operation S11, the A-D PIA 350 is initialised by programming its data direction registers so that its peripheral data lines are set as inputs or outputs respectively as shown in FIG. 22. The control line CA2 is set to a 1 so that signal CA2 goes high. In an operation S12, the clock PIA 260 is initialised by programming its data direction registers so its peripheral data lines acts as inputs or outputs as shown in FIG. 23. In an operation S13, the ACIA810 is initialised by setting its control register for transmitting and receiving 8 bit words having one start bit, one stop bit and no parity bit.

In an operation S14, data which has been saved in RAMs 102, 104 is restored to the internal RAM of the MPU.

Then, in a pair of operations S15 and S16 two variables ACIIPP and ACIOPP are both set to a value ACBBOT. The constant ACBBOT defines the bottom of the output data stack, the top of this data stack being defined by the constant ACBTOP. The variables ACIIPP and ACIOPP point respectively to the next locations in this data stack at which data should be stored prior to transmission to ACIA810 and from which data should be read for transmission to ACIA.

Subsequently, the status word DEBP1 is set to 0, the high byte of a variable DEFLN used to store an output value for the meter 64 is set to 0, and a variable OLDP1 is set to 0. The variable OLDP1 is used to store data from STLNA between sucessive passes of the 0.1 second routine. The status word STCH is set to 0 and two variables are R1TIM and R10TIM are both set to 1. The variables R1TIM and R10TIM are used respectively to time the intervals between successive passes of the 1 second routine and the 10 second routine. Then a variable TIMOUT is set to 10, this variable being used to limit the time for which the system can remain powered up if neither a vehicle power on nor a charger power on signal is read form the vehicle state line interface 50. The interrupt mask is then cleared in order to enable interrupts and finally in an operation S17 bit 0 of CMTA is set to binary 0 so as to enable the flip-flop 304 in FIG. 3b which provides the signal $\overline{IRQ}$. Control then jumps to the program INTERR.

Figure 24:
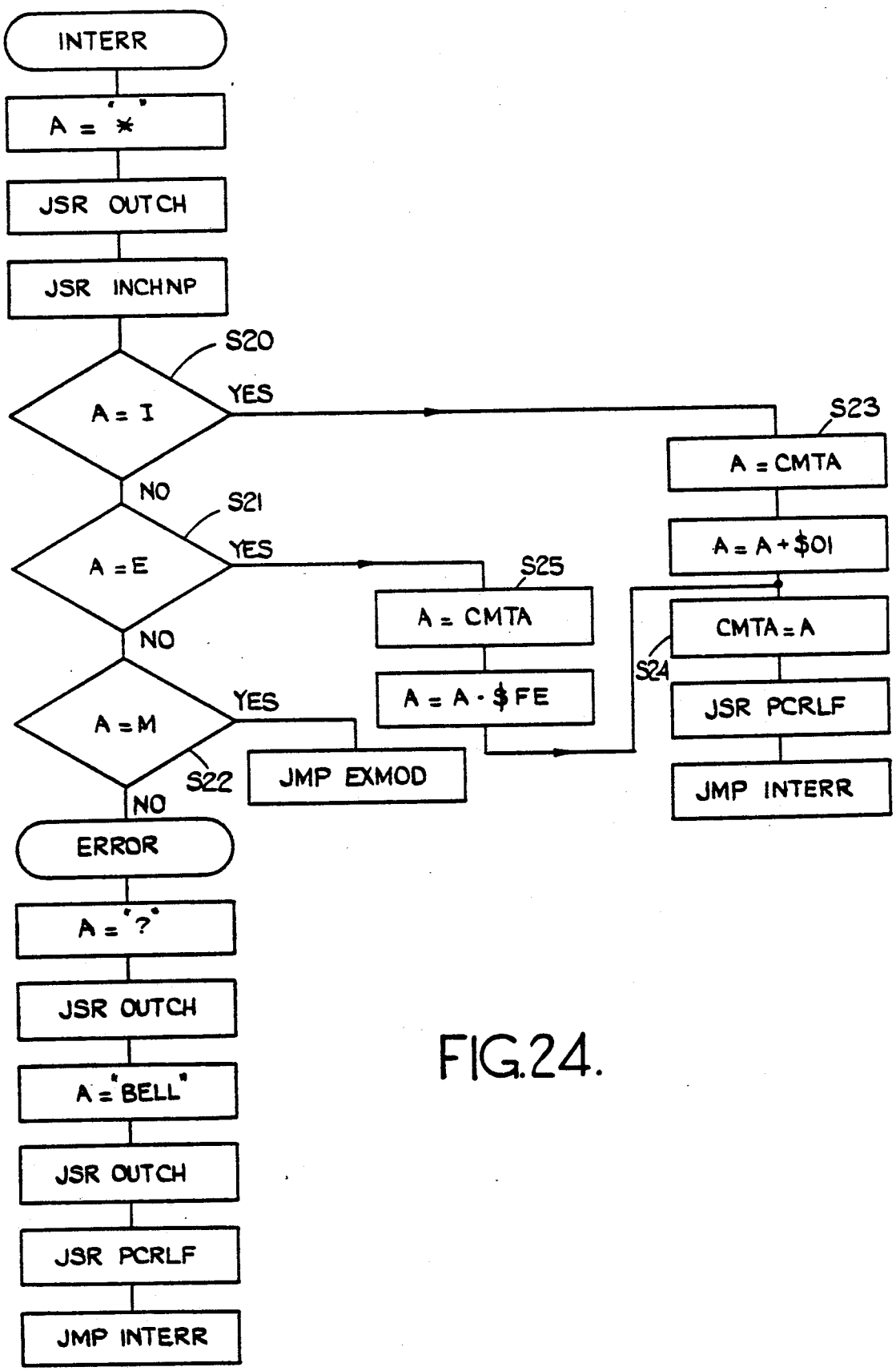
Figure 25A:
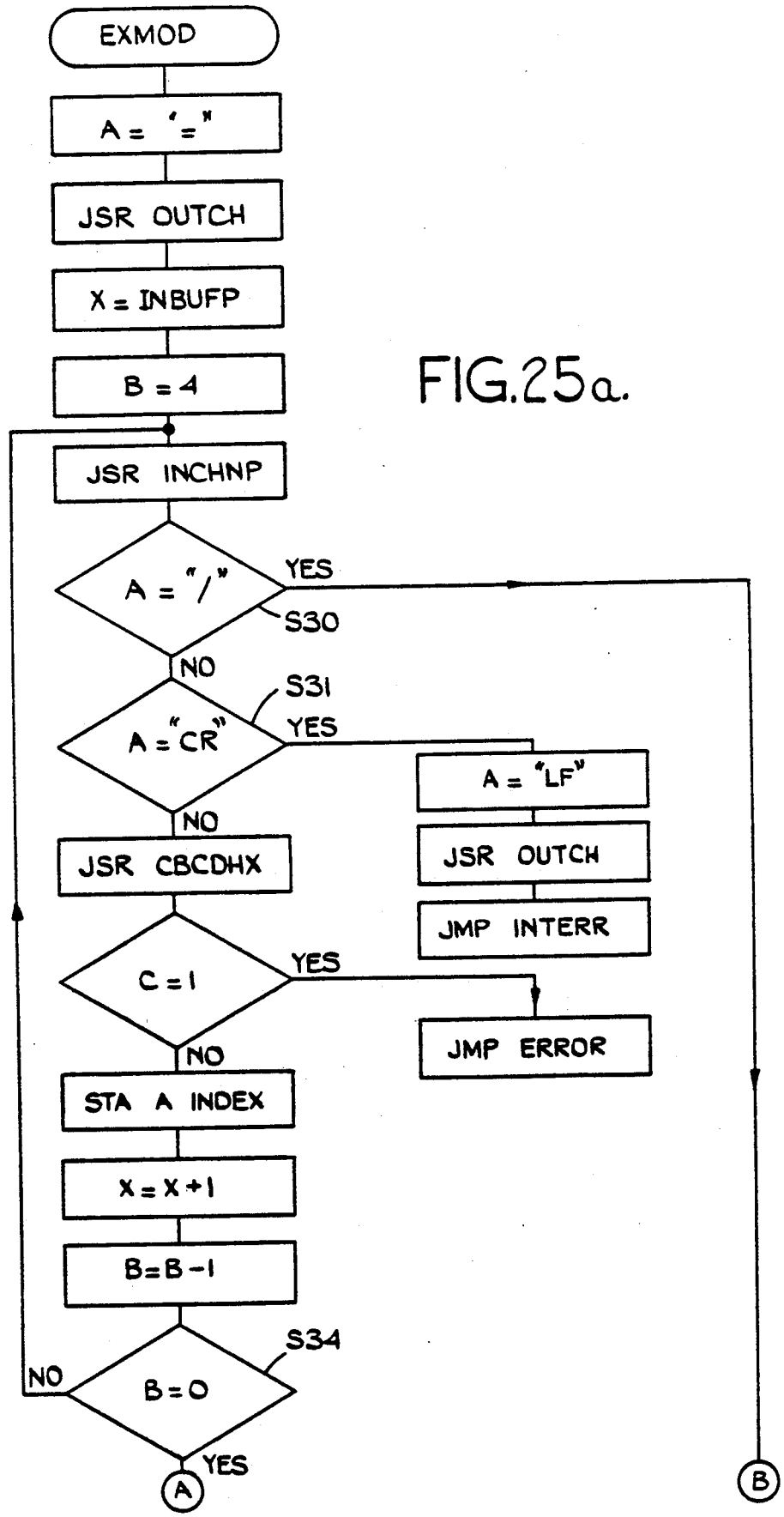
Figure 25B:
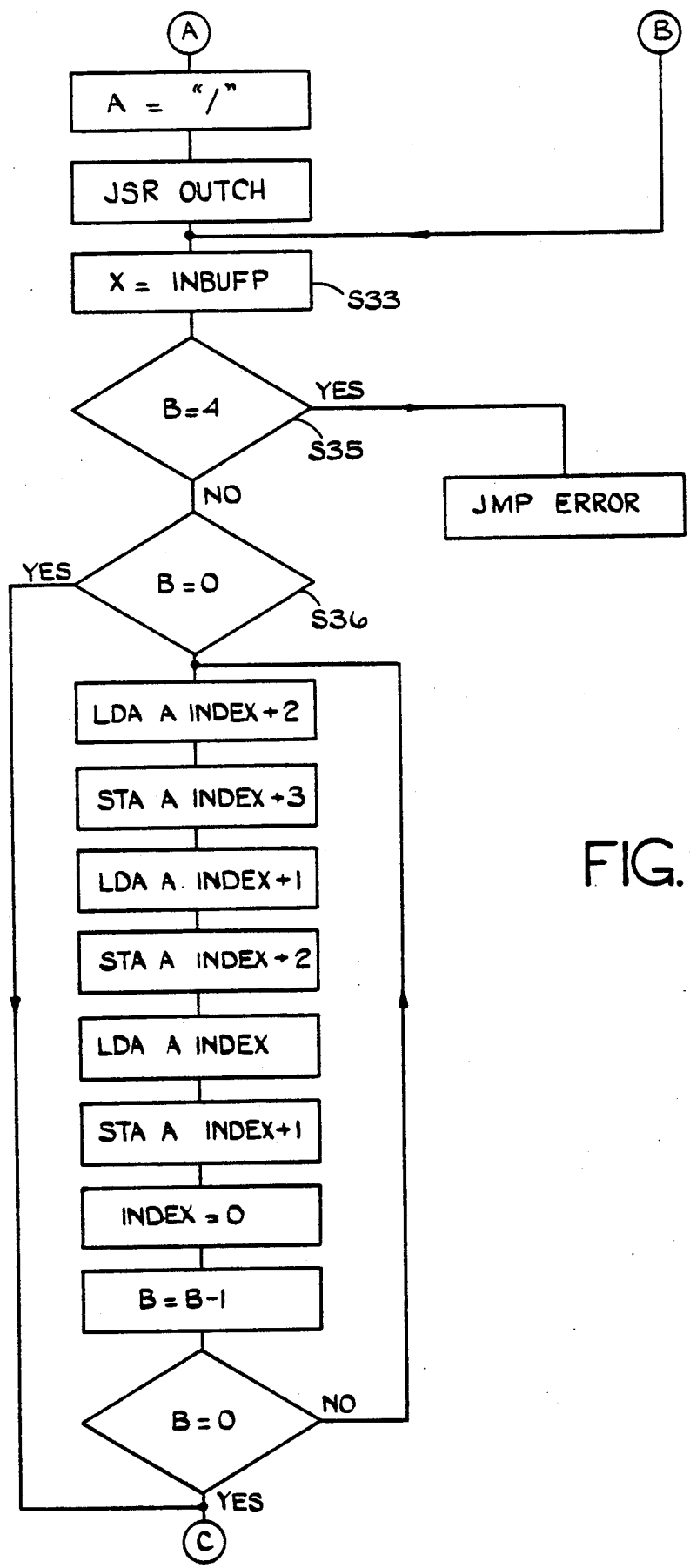
Figure 25C:
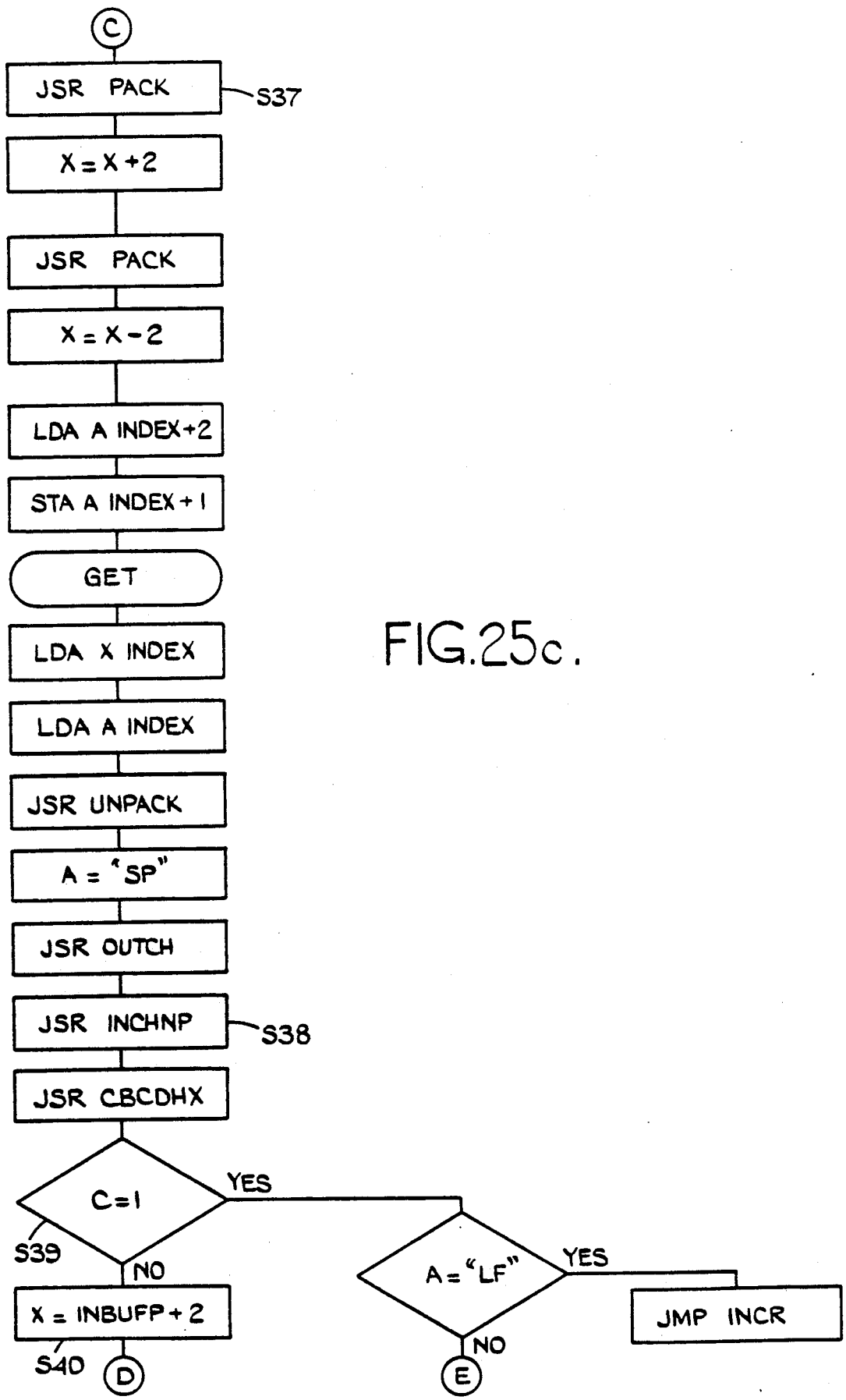
Figure 25D:
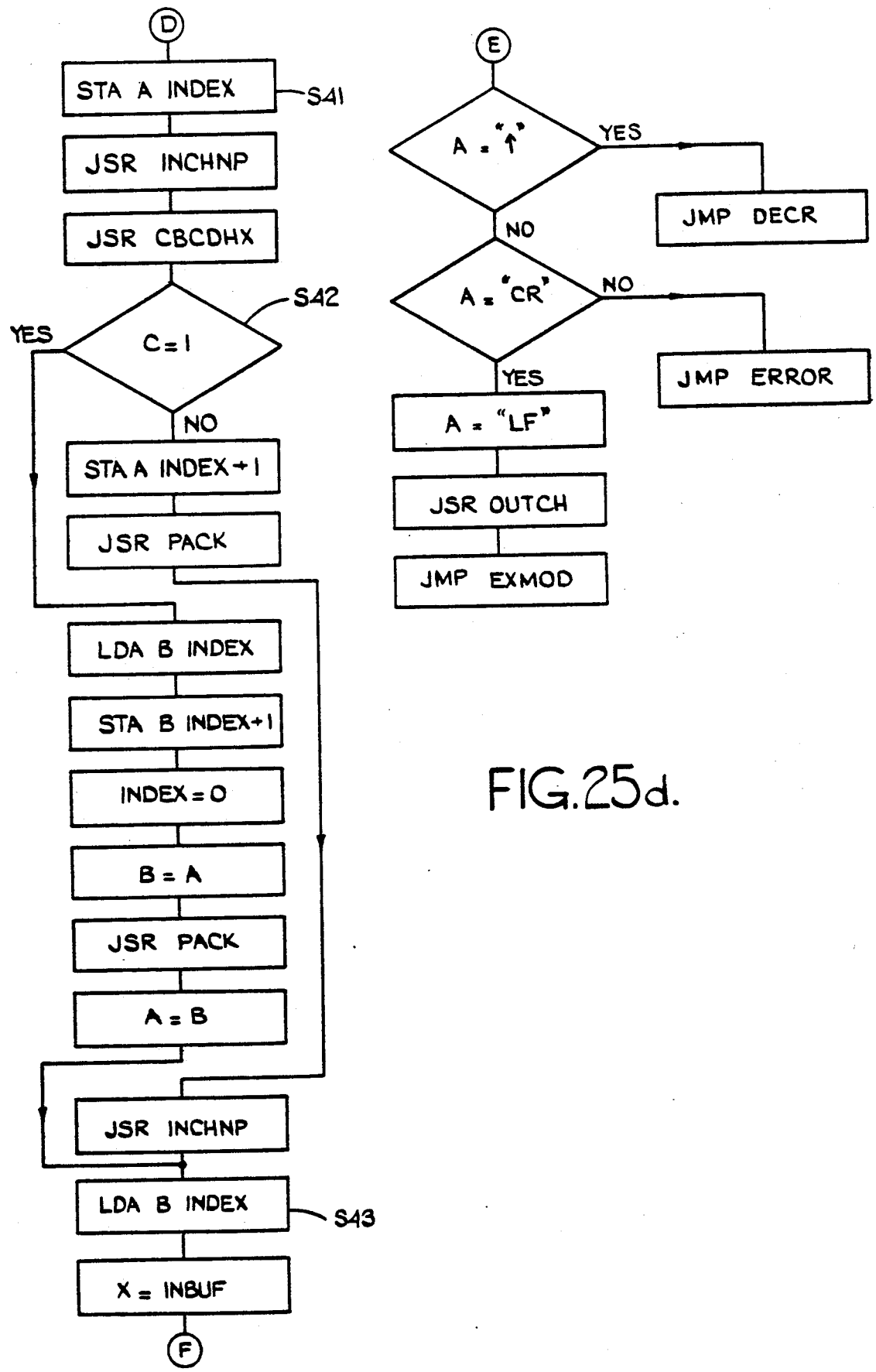
Figure 25E:
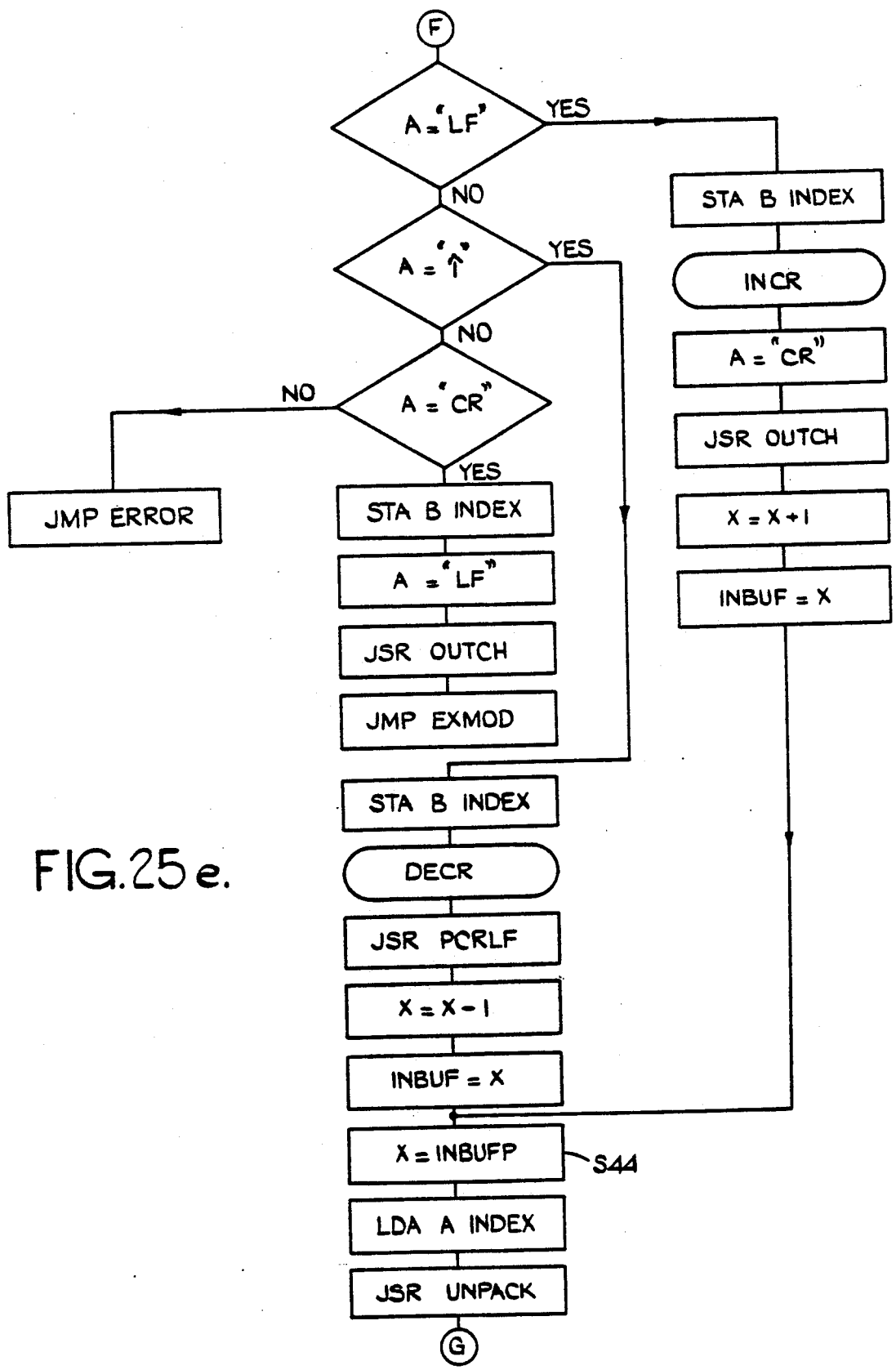
Figure 25F:
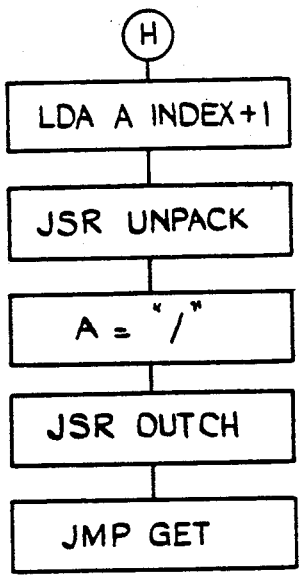

Referring now to FIG. 24, there is shown the flow chart for the program INTERR. When it is desired to use this program, the teletype 82 is connected to converter 79. When using this program, the following three commands may be entered on the teletype.

I=inhibit interrupt
E=enable interrupts
M=examine the contents of a memory and modify if desired.

After this program has been entered, the character "*" is sent to the output buffer and a character from the teletype may then be received from the ACIA. In a set of operations S20, S21 and S22 the character is examined to see if it is I, E or M. If the character is I, then the program branches to an operation S23 where the register CMTA is read into accumulator A and accumulator A is subsequently ORed with hexadecimal 01. In an operation S24, the contents of accumulator A are stored in register CMTA with the result that a high signal is supplied to the reset input R of flip-flop 304 shown in FIG. 5b thereby inhibiting further interrupt signals $\overline{IRQ}$. The code for "carriage return" and "line feed" are then transmitted to the output buffer and flow then returns to the beginning of the program. If the character is E, program flow branches from operation S21 to an operation S25 in which the contents of register CMTA are labeled into accumulator A. Accumulator A ANDed with hexadecimal FE. Program flow then branches to operation S24 with the result that a low signal is supplied to the reset input of flip flop 304. If the character is M, then program flow jumps from operation S22 to the beginning of sub routine EXMOD.

If in operation S22 it is found that the character is not M, then the program branches to a position, ERROR. Subsequently, the character "?", the code for the teletype bell, and the codes for "carriage return" and "line feed" are transmitted to output buffer. This will indicate to the user that he has made an erroneous entry. The program then returns to its beginning.

Referring now to FIG. 25, there is shown the flow chart for the sub routine EXMOD. At the beginning of this sub routine, the character "=" is transmitted to the output buffer and the index register is set to the value of a constant INBUFP. The constant INBUFP defines the bottom of a buffer in which the address of the memory to be examined will be stored. Next, accumulator B is loaded with the number 4 and the character is then read into accumulator A from the ACIA. In a pair of operations S30 and S31, the character is examined to see if it is either "/" or "carriag return". If it is "/", then the program jumps to an operation S33 to be described below. If it is "carriage return", then the code for "line feed" is transmitted to the output buffer and the program then jumps to the beginning of the main program INTERR. If the character is neither of these two characters, then the sub routine CBCDHX is performed and the carry bit C of the MPU condition code register is checked. If bit C is set, this indicates that the character is not numeric and so an error has occurred. The program therefore jumps to position ERROR to indicate to the user that he has made an erroneous entry. If bit C is not set, then the character is stored, the index register is increased, and the value of accumulator B is decreased. Then, in an operation S34 the value of accumulator B is examined. If B is not equal to 0, then a new character is read in and the program section described above is repeated. If B=0, this indicates that the maximum number of four characters necessary to specify an address have been received and so that character "/" is sent to the output buffer to indicate this. The program then continues with operation S33 in which the index register is again set to the value of the constant INBUFF.

In a pair of operations S35 and S36, the value of B is examined. If B=4, then the program jumps to the position ERROR to indicate that an erroneous error has been made and if B=0 then the program jumps to an operation S37. If B is not equal to 0, then the characters read in are shifted to the top of a buffer in which the address of a location to be examined is stored and the program then continues with the operation S37. In operation S37, sub routine PACK is called so that the two numbers in the bottom two locations of the buffer are condensed into the bottom location and in the next set of operations the two numbers held in the top two locations of the buffer and condensed into the second location of the buffer. The program now reaches the position GET at which stage the bottom two locations of the buffer contain the address of the location to be examined. In the next set of operations, the contents of this location are transmitted to the output buffer for display on the teletype.

Next, in an operation S38 a new character is received from the ACIA and then sub routine CBCDHX is called. Next, in an operation S39, the carry bit C of the MPU conditioncode register is examined. If this bit is set, thereby indicating that the character is not numeric, the character is examined to see if it is "line feed", "arrow", or "carriage return". If it is "line feed", this indicates that the user wishes to examine the contents of the next location and so that program jumps to the position INCR which will be described below. If it is "arrow", this indicates that the user wishes to examine the contents of the previous location and so that program jumps to the position DECR which will be described below. If it is "carriage return", this indicates that the user wishes to enter the address of a new location to be examined, so that character "line feed" is transmitted to the output buffer and the program then jumps to the beginning of sub routine EXMOD. If the character is none of these, then the program jumps to position ERROR indicating that an erroneous entry has been made.

If it is found in operation S39, that the carry bit C is not set, this indicates that the user wishes to enter a new value into the location being examined. The program then branches to operations S40, S41 which store the character at the location having the address INBUFP+2. A new character is then received from the ACIA, the sub routine CBCDHX is called and in an operation S42 the carry bit C of the condition code register is examined. If bit C is set, this indicates that the new character is non numeric and that the new value to be loaded into the location being examined comprises a single hexadecimal digit. This single digit is then positioned in the least four significant bits of the location having the address INBUFP+2, the four most significant bits of this location are cleared, and the program then jumps to an operation S43. If it is found in operation S42 that the carry bit is not set, then the character is numeric and this character together with the previous character area then stored at the location having the address INBUFP+2. A further character is then received from the ACIA and the program then continues with the operation S43.

In operation S43, then new value is stored in accumulator B and the address of a location being examined is stored in the index register. The character in accumulator A is then examined to see if it is "line feed", "arrow", or "carriage return". If the character is "line feed", this indicates that the user wishes to examine the contents of the next location and so the new value stored in accumulator B is stored in the location at present being examined and the program then progresses to the position INCR. After this position, the character "carriage return" is transmitted to the output buffer, the location address stored in the index register is increased to the address of the next location and this address is then stored at location INBUF. The program then jumps to an operation S44 to be described below. If the character is "arrow", this indicates that the user wishes to examine the contents of the previous location. In this case, the new value stored in accumulator B is stored in the location at present being examined and at this stage the position DECR is reached. After the position DECR, the sub routine PCRLF is called, the value of the index register is decreased so that it corresponds to the address of the previous location, this new address is then stored at location INBUF, and the program then jumps to operation S44. If the character is "carriage return", this indicates that the user wishes to enter the address of a new location to be examined. Consequently, the new value stored in the accumulator B is stored in the location being examined, "lined feed" is transmitted to the output buffer, and the program then returns to the beginning of the sub-routine EXMOD. If the character in accumulator A is none of these, then the program jumps to the position ERROR indicating that an erroneous entry has been made.

In operation S44, the index register is set to the value of the constant INBUFP, and the new address is then transmitted to the output buffer. The character "/" is then transmitted to the output buffer and the program then returns to the position GET.

Figure 26:
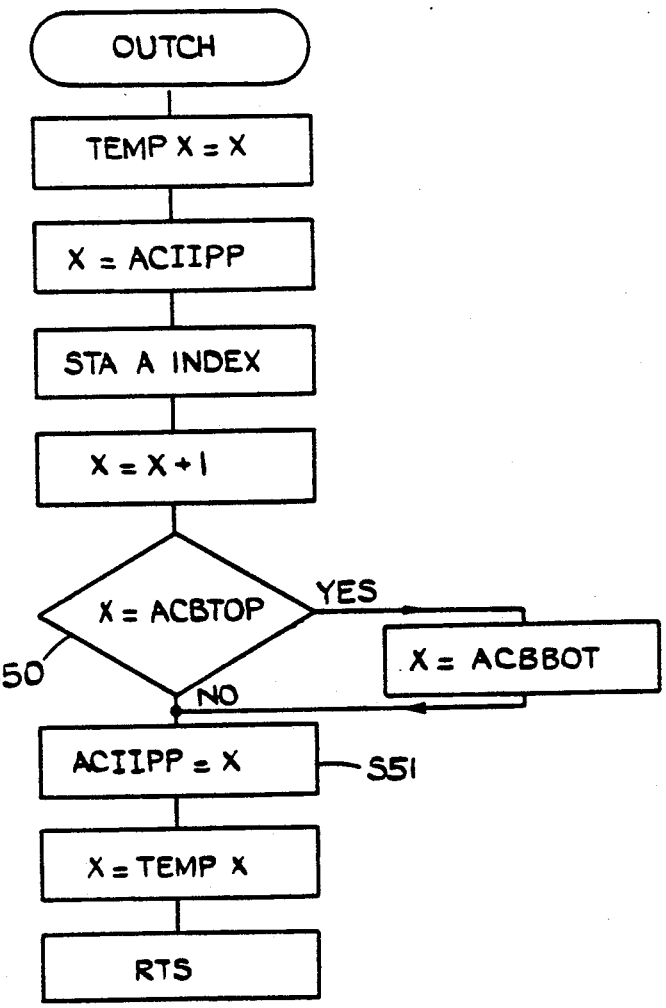

Turning now to FIG. 26, there is shown the flow chart for the sub-routine OUTCH. After this sub-routine has been entered, the present value of the index register is stored temporarily at a location TEMPX. The data in accumulator A is then loaded into the output data stack of the location determined by the variable ACIIPP, the index register is increased, and then in an operation S50 the value of the index register examined. If the value of the index register is equal to the value of the constant ACBTOP, this means that the variable ACIIPP is now pointing at the top of the output data stack and so the index register is loaded with the constant ACBBOT before the value of the index register is stored in the variable ACIIPP in an operation S51. Then, the index register is restored to its previous value.

Figure 27:
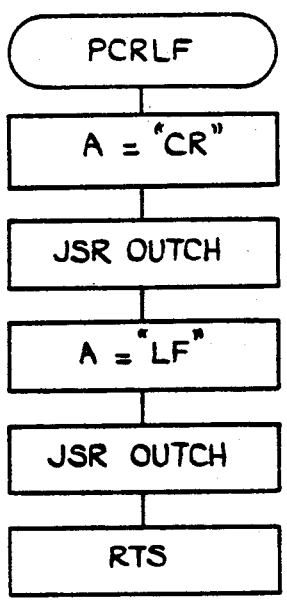
Figure 28:
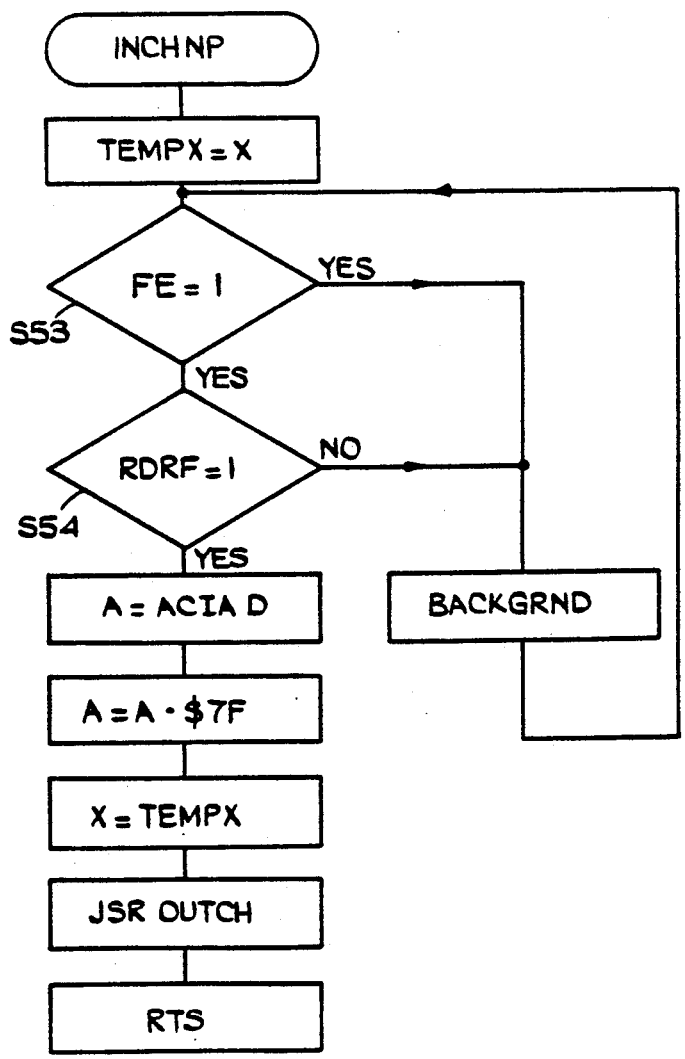

Referring now to FIG. 27, there is shown the flow chart for the sub-routine PCRLF. In this sub-routine, the ASCII code for "carriage return" and "line feed" are transmitted to the output buffer. In FIG. 28, there is shown the flow chart for the sub-routine INCHNP. At the beginning of this sub-routine, the present value of the index register is stored at the location TEMPX. Then, in an operation S53, bit 4 (FE) of the ACIA status register is examined. If this bit is set, then a framing error has occurred and the program jumps to sub-routine BACKGRND. If this bit is not set, then in an operation S54 bit 0 (RDRF) of the ACIA status register is examined. If this bit is not set, this indicates that the register ACIAD is empty and the program jumps to sub-routine BACKGRND. After the sub routine BACKGRND has been executed, the program returns to operation S53. If this bit is set, this indicates that the register ACIAD is full, and so its contents are stored in accumulator A. Accumulator A is then ANDed with hexadecimal 7F to remove the parity bit, the index register is restored to its previous value, and finally the sub routine OUTCH is called. If the teletype is not used or is disconnected, program flow loops between INCHNP and BACKGRND.

Figure 29:
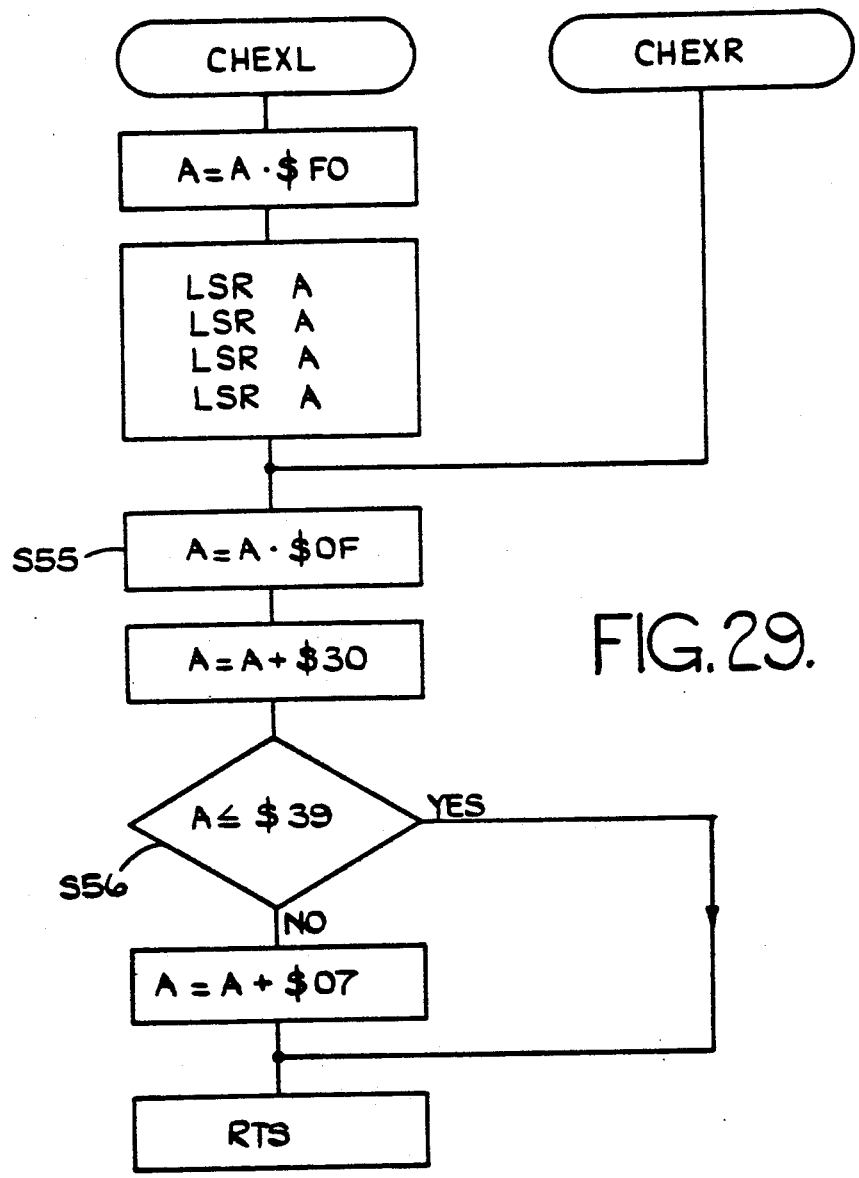

Referring now to FIG. 29, there is shown the flow chart for the sub routine CHEXL and CHEXR which respectively convert the four most significant bits and the four least significant bits of a binary number stored is accumulator A into ASCII code. After the sub routine CHEXL has been entered, accumulator A is ANDed with the hexadecimal number F0, four logical shifts to the right are performed, and then in an operation S55 accumulator A is ANDed with hexadecimal 0F. Subsequently, hexadecimal 30 is added to accumulator A and in an operation S56 the contents of accumulator A are examined. if the contents of A are greater than hexadecimal 39, then A is increased by hexadecimal 07 before return from sub routine. The sub routine CHEXR is identical to sub routine CHEXL except that it commences with operation S55.

Figure 30:
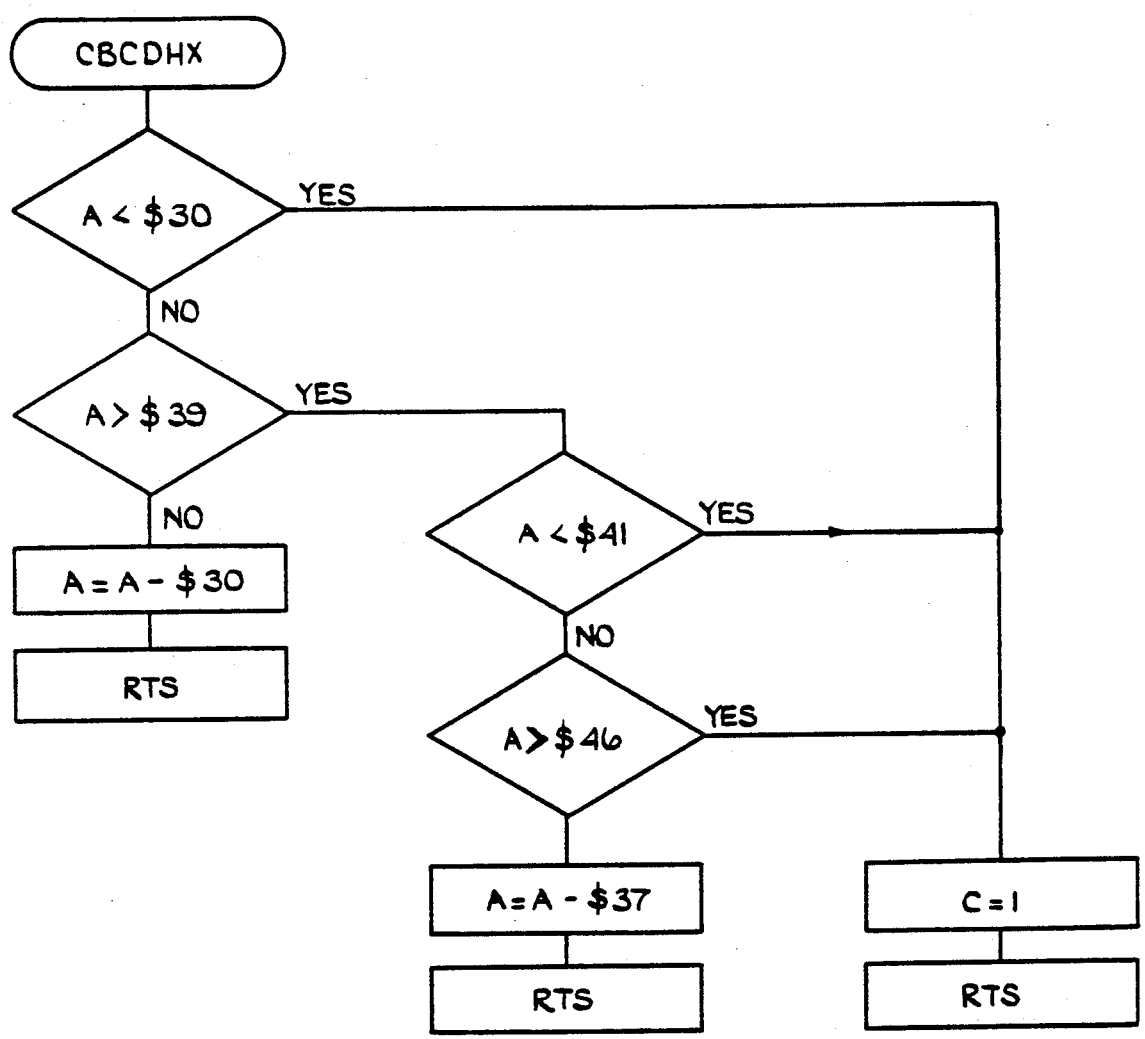

Referring now to FIG. 30, there is shown the flow chart for the sub routine CBCDHX. This sub routine converts a hexadecimal number expressed in ASCII code and stored in accumulator A into a binary number. After this sub routine has bveen entered, the value stored in accumulator A is examined. If this value is less than hexadecimal 30, or between hexadecimal 39 hexadecimal 41, or greater than hexadecimal 46, the carry bit of the MPU status register is set to indicate that the character is non numeric. If the value lies in the range hexadecimal 30 to hexadecimal 39, then hexadecimal 30 is subtracted from the contents of accumulator A. If the value lies in the range hexadecimal 41 to hexadecimal 46, then hexadecimal 37 is substracted from accumulator A.

Figure 31:
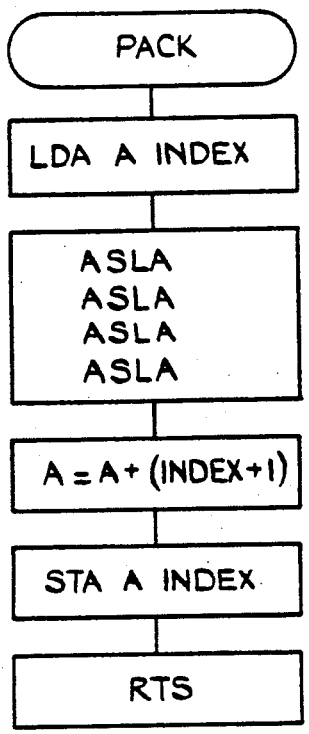

Turning now to FIG. 31, there is shown a flow chart for the sub routine PACK. After this sub routine has been entered, the contents of the location whose address is specified in the index register is loaded into accumulator A, and then a logical shift to the left is performed four times. The contents of accumulator A are then ORed with the contents of the next location and the resulting value of accumulator A is stored at the location having the address specified by the index register.

Figure 32:
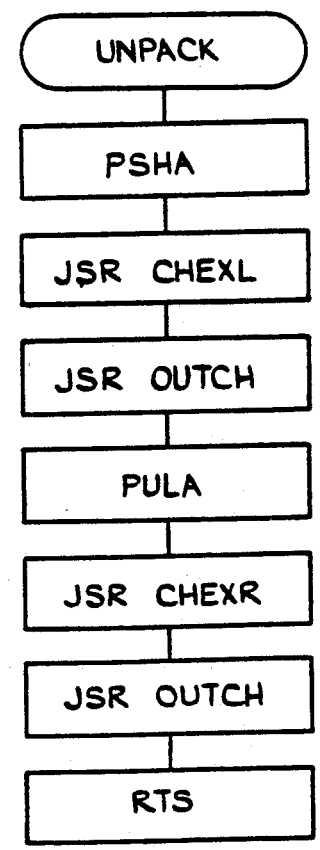

In FIG. 32, there is shown the flow chart for the sub routine UNPACK. This sub routine converts a binary number stored in accumulator A into two hexadecimal numbers expressed in ASCII code and transmits these numbers to the output buffer. After this sub routine has been entered, the contents of accumulator A are pushed onto the stack then the sub routines CHEXL and OUTCH are called. The previous contents of accumulator A are then pulled off the stack, and the sub routines CHEXR and OUTCH are called.

Figure 33:
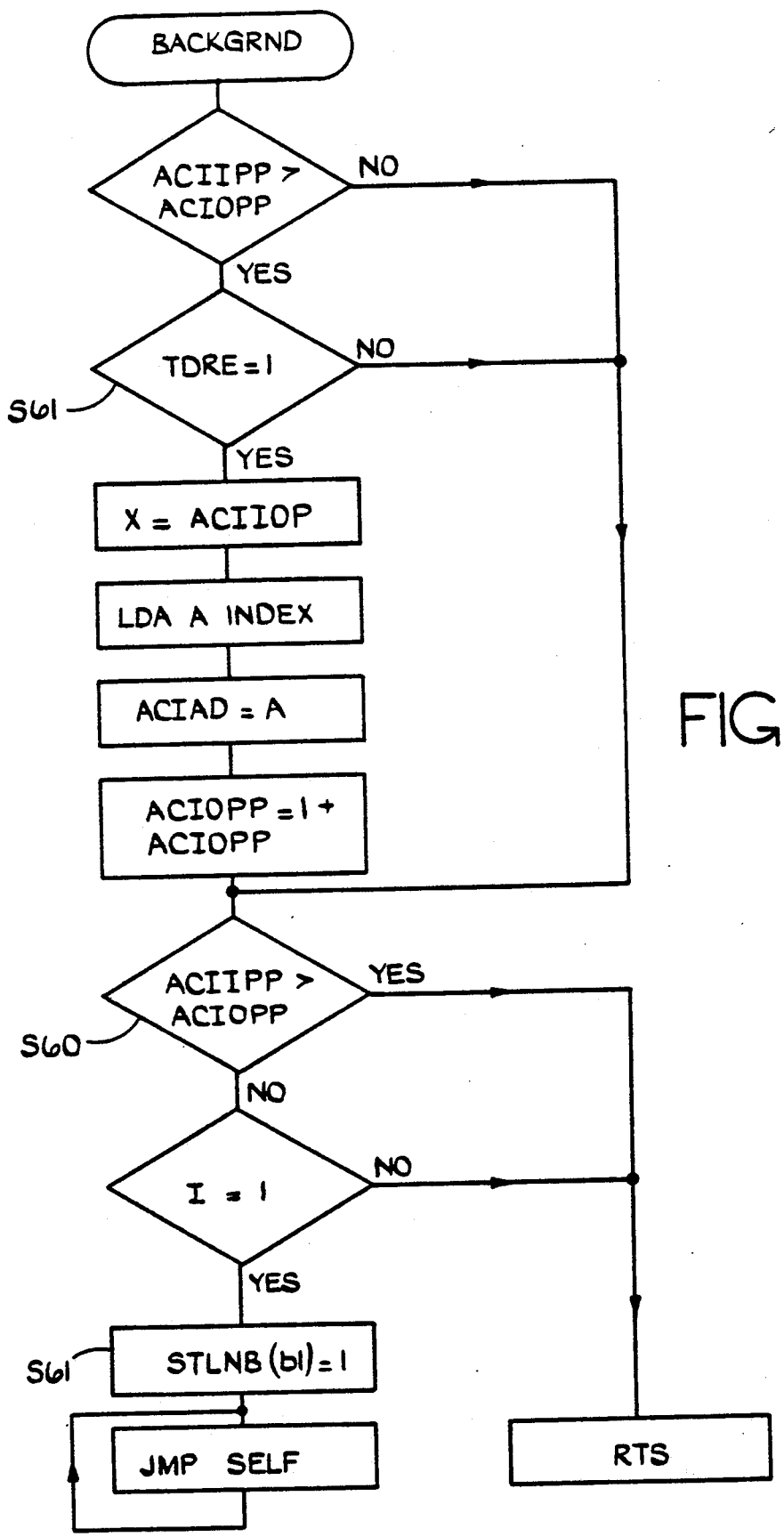

There is shown in FIG. 33 the flow chart for the sub routine BACKGRND. In this sub routine, the contents of the output data stack are transmitted to the ACIA for subsequent transmission to the charger 22, the override output circuit 77, or the teletype 82. After this program has been entered, the variables ACIIPP and ACIOPP are compared. If these variables are equal, then there is no data in the output data stack and so the program jumps to an operation S60. If the variable ACIIPP is greater than the variable ACIOPP, then the program jumps to an operation S61 in which bit 1 (TDRE) of the ACIA status register is examined. If this bit is not set, this indicates that the ACIA transmit data register is full and so that program jumps to operation S60. If this bit is set, this indicates that the transmit data register is empty, the contents of the location specified by the variable ACIIOP are transmitted to the register ACIAD and the variable ACIOPP is increased. In operation S60, the variables ACIIPP and ACIOPP are compared. If ACIIPP is greater than ACIOPP, then return from sub routine is performed. If the variables ACIIPP and ACIOPP are equal, then the interrupt mask of the MPU condition code register is examined. If the mask is not set, then a return from sub routine is performed. If the mask is set, this indicates that the system is to be shut down and in an operation S61 bit 1 of STLNB is set thereby causing the signal PSU INHIBIT to go high thereby causing the signal $\overline{PWFL}$ to go low. The sub routine then enters a perpetual loop waiting for the signal $\overline{NMI}$ to go low. It is to be noted that the operation S60 prevents the system from shutting down whilst there is data in the output data stack.

Figure 34:
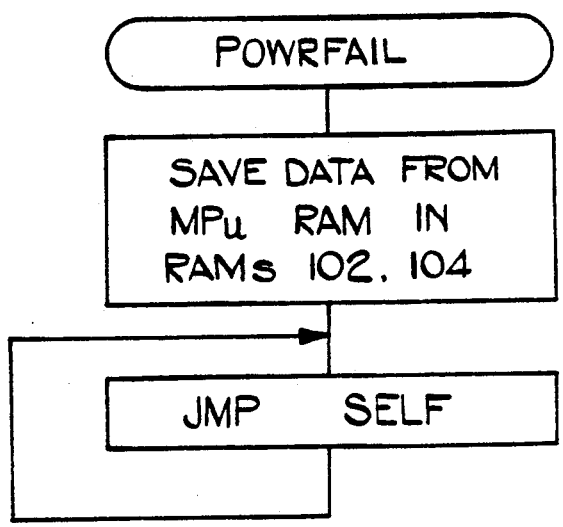

In FIG. 34, there is shown the flow chart for the program POWRFAIL. This program is entered when the signal $\overline{NMI}$ goes low due to a power supply failure and the sole function of this program is to save data from the MPU RAM in the RAMs 102, 104. The program then enters a perpetual loop until power failure occurs. As RAMs 102, 104 have their own power supply, the data is not lost.

0.1. SECOND ROUTINE

Figure 35A:
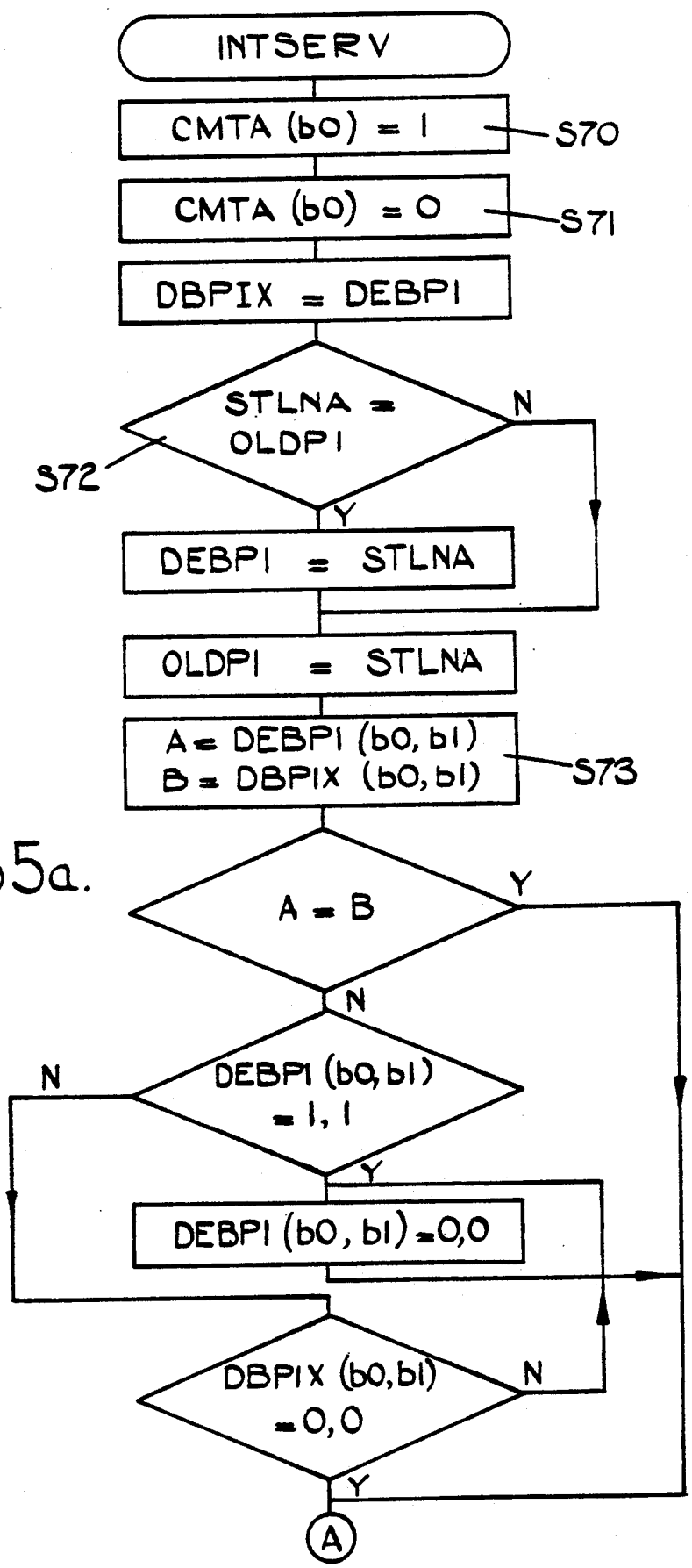
Figure 35B:
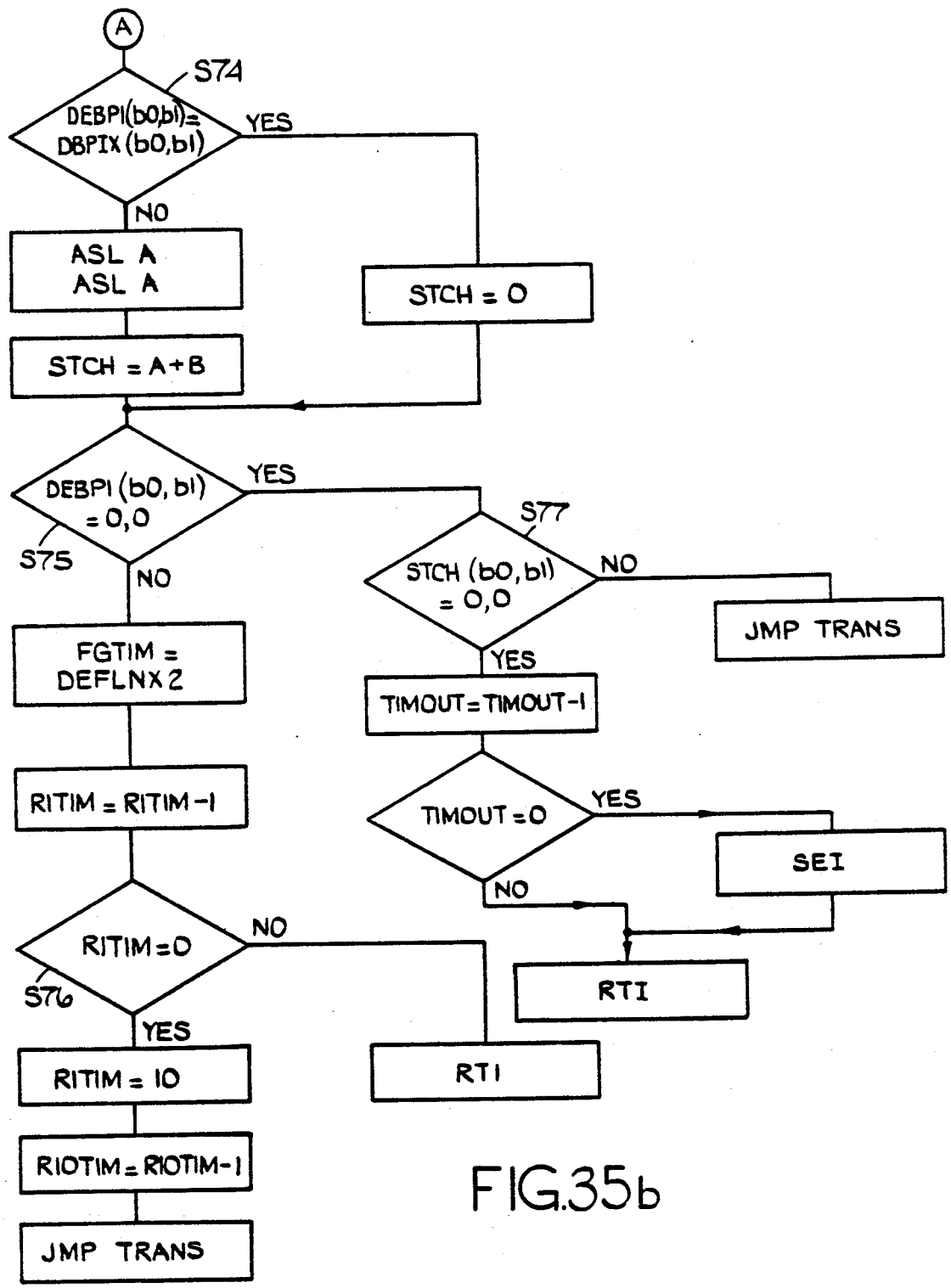

The flow chart for the sole program INTSERV for the 0.1 second routine is shown in FIG. 35. This program is entered each time the signal $\overline{IRQ}$ goes low thereby causing an interrupt.

After this program has been entered, a pair of instructions S70, S71 cause the peripheral data line PAO of the clock PIA260 to be strobed to a high level thereby resetting the flip-flop 304. It is to be noted that the flip-flop 304 prevents the signal $\overline{IRQ}$ from being low on completion of the interrupt programs.

Next, the status word DEBP1 is stored as a varaible DBPIX. Thus, the variable DBPIX stores the status word DEBP1 of the previous pass through this program. Then, in an operation OLDP1, and if these are equal the register STLNA is stored as the status word DEBP1. The state line signals SLO to SL4 may not entirely be relied upon to be at their true polarity at the instant at which they are read. In particular, the vehicle power on signal SLO and the charger connected signal SL1 are unreliable as these signals are derived from relay contacts which may spend an appreciable time bouncing. By performing the operation S72, the status word DEBP1 is only set to the value of the vehicle state line signals SLO to SL4 if these signals are unchanged from the previous pass. The register STLNA is then stored in the variable OLDP1.

As will be explained with reference to the 1 second routine, each time a transition occurs between an active state (vehicle power on or charger connected) and the idle state, certain operations have to be performed. Consequently, if bit 0 and bit 1 of the status word DEBP1 are both set to a binary 1, or if a comparison of the status word DEBP1 and the variable DBPIX show that a transition has taken place from one active state to the other active state, then it is necessary to correct the status word DEBP1 by setting these two bits to binary 0. In order to achieve this, bits 0 and 1 of the status word DEBP1 are loaded into accumulator A and bits 0 and 1 of the variable DBPIX are loaded into accumulator B. If these accumulators are equal, then no correction is necessary and the program jumps to an operation S74. If the accumulators are not equal, then bits 0 and 1 of the status word DEBP1 are examined and, if they are both equal to binary 1, these two bits are set to binary 0 before jumping to operation S74. If these two bits are not both equal to binary 1, then bits 0 and 1 of the variable DBPIX are examined. If these are both equal to binary 0, this indicates that an allowable transition has taken place and the program jumps to operation S74. If these are not both equal to binary 0, this indicates that a correction is necessary and so bits 0 and 1 of the status word DEBP1 are both set to binary 0 before jumping to operation S74.

In operation S74, bits 0 and 1 of the status word DEBP1 are examined and if both of these are set to binary 0 to status word STCH is set to 0. If either bit 0 or bit 1 of the status word DEBP1 is set to a binary 1, accumulator A is shifted twice to the left, then accumulators A and B are ORed and the result is stored as the status word STCH.

Next, in an operation S75 bits 0 and 1 of status word DEBP1 are examined to see if the vehicle is in an active state. If the vehicle is in an active state, the pre-set enable inputs P1 to P4 of counters 776 and 778 shown in FIG. 13 are loaded with twice the value of variable DEFLN. As the variable DEFLN represents the state of charge of the battery 10, and as the pre-set inputs will be loaded at a frequency of 10 Hz, the signal FG provided by AND gate 796 will have a mark to space ratio which represents the state of charge of the battery. Then, the variable R1TIM is decremented and in an operation S76 examined to see if it is equal to zero. If it is not equal to zero, this indicates it is not yet time to perform the one second routine and so as return from interrupt occurs. If it is equal to zero, this indicates that the one second routine should be performed and so the variable R1TIM is set to 10, the variable R10TIM is decremented, and a jump occurs to the program TRANS.

If in the operation S75 it is found that the vehicle is in the idle state, then in an operation S77 the status word STCH is examined to see if a transition has taken place. If a transition has taken place, then a jump occurs to the program TRANS. If a transition has not taken place, then the variable TIMOUT is decremented and examined. If the variable TIMOUT is equal to zero, this indicates that the system has remained in the idle state for one second and as this is illegal the system should be shut down. Consequently, the interrupt mask of the condition code register associated with the main program is set so that shut down will occur during a subsequent pass through the program BACKGRND, and a return from interrupt is performed. If the variable TIMOUT is not yet equal to zero, then return from interrupt is performed.

1 SECOND ROUTINE

Figure 36:
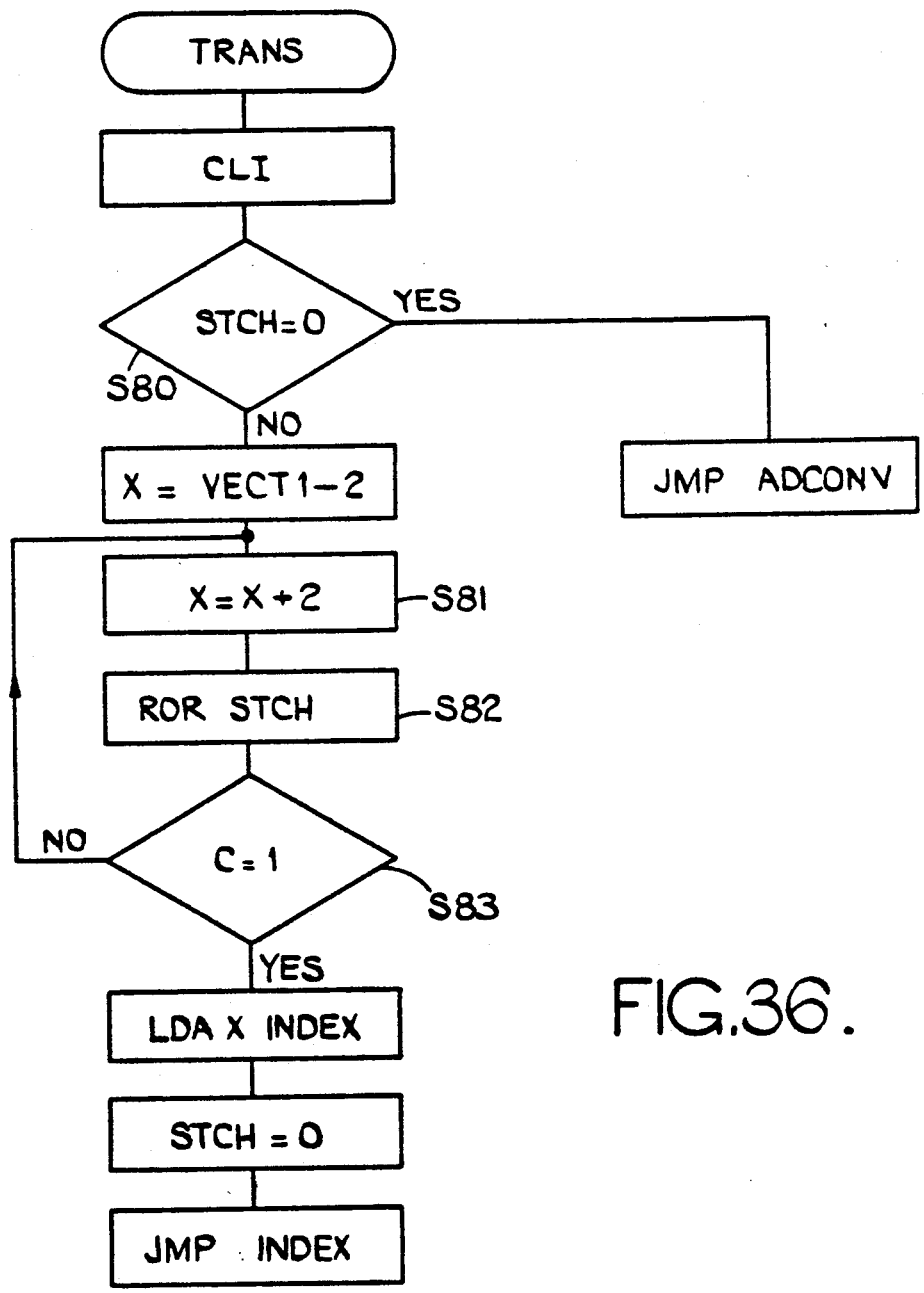

The flow chart for the program TRANS is shown in FIG. 36. After this program has been entered, the interrupt mask is cleared so that the one second routine can be interrupted. Then in an operation S80, the status word STCH is examined to see if a transition has occurred. If no transition has occurred, then program control jumps to the program ADCONV.

If a transition has occurred, then it is necessary to perform one of the program DRVIDL, CHRIDL, IDLDRV or IDLCHR. In order to achieve the necessary jump, the index register is loaded with VECT1-2. VECT1 is a constant which represents the bottom address of a buffer in which the start addresses of the programs DRVIDL, CHRIDL, IDLDRV and IDLCHR are successively stored. Next, in an operation S81, the index register is incremented twice and then in an operation S82 the word STCH is shifted to the right. The carry bit C of the MPU condition code register is then examined in an operation S83. If this shows that the carry bit is not set, then operations S81 and S82 are repeated. If the carry bit is set, then the index-register points to the address in which the start address of the program to be performed are stored. A jump is then made to this address after setting STCH to zero.

Figure 37:
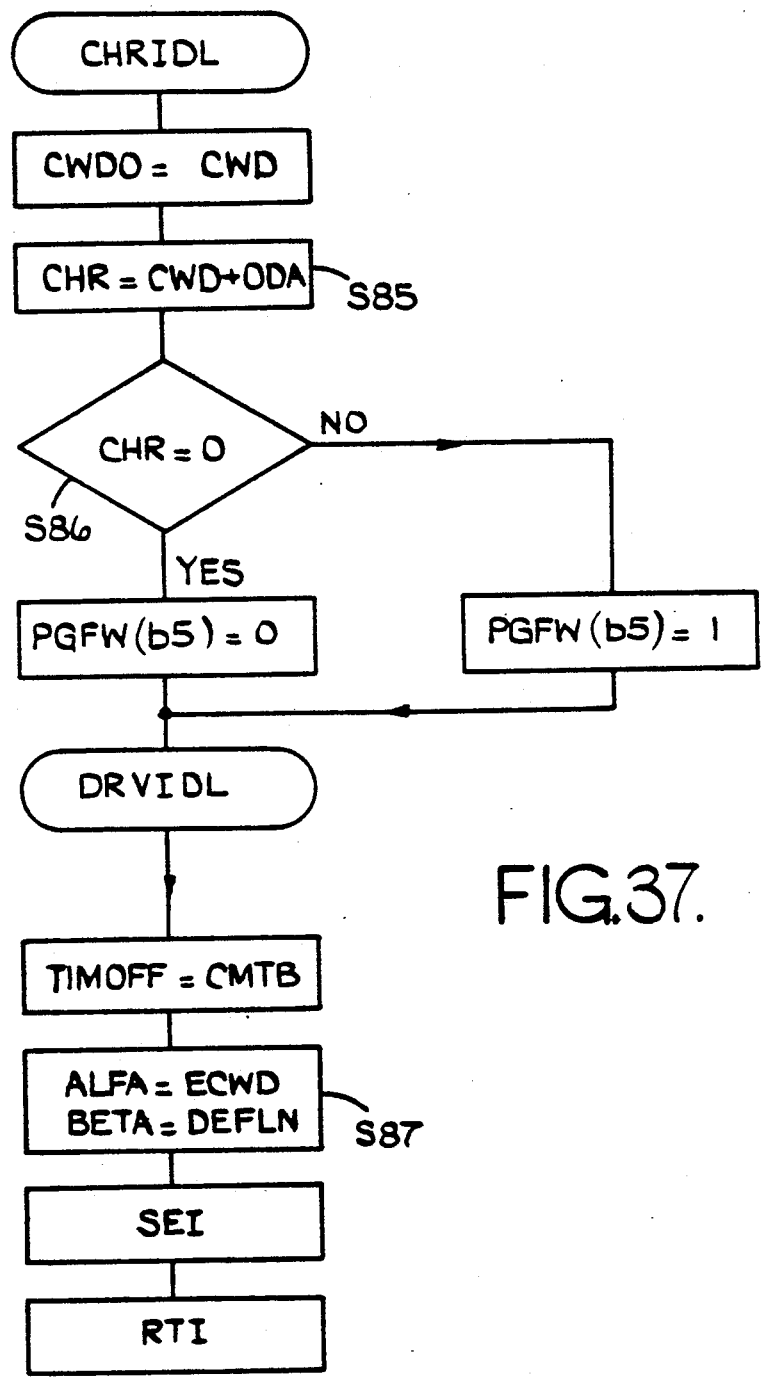

Referring now to FIG. 37, there is shown the flow chart for the program CHRIDL and DRVIDL. As may be seen, the operations performed during the program DRVIDL also form part of the program CHRIDL.

After the program CHRIDL has been entered, a variable CWD is stored as a variable CWDO. The variable CWD represents the charge which has been withdrawn from the battery or, in other words the extent to which the battery has been discharged below its fully charged state. Then, in an operation S85, the variable CWD is added to a variable OCA and stored as a variable CHR. The variable OCA represents the additional charge which should be given to the battery during the third charging phase and the calculation of this variable will be explained with reference to the program IDLCHR. Nect, in an operation S86, the value of CHR is examined. If this is zero, it implies that the battery is fully charged and so the partial charge flag of the status word PGFW is set to binary 0. If CHR is not zero, then the partial charge flag is set to binary 1. At this stage, the beginning of the program DRVIDL is reached.

After the program DRVIDL has been entered, the register CMTB is stored as a variable TIMOFF. The variable TIMOFF represents the time at which the idle period begins. Then, in an operation S87, a variable ECWD is stored as a variable ALFA and the variable DEFLN is stored as a variable BETA. The variable ECWD represents the charge withdrawn corrected to take account of the rate at which the charge has been withdrawn and the calculation of this variable will be described with reference to the programs DISCH and LKUP1. Lastly, before return from interrupt is performed, the interrupt mask of the condition code register associated with the main program is set to ensure that the system will shut down during a subsequent pass through the program BACKGRND.

Figure 38:
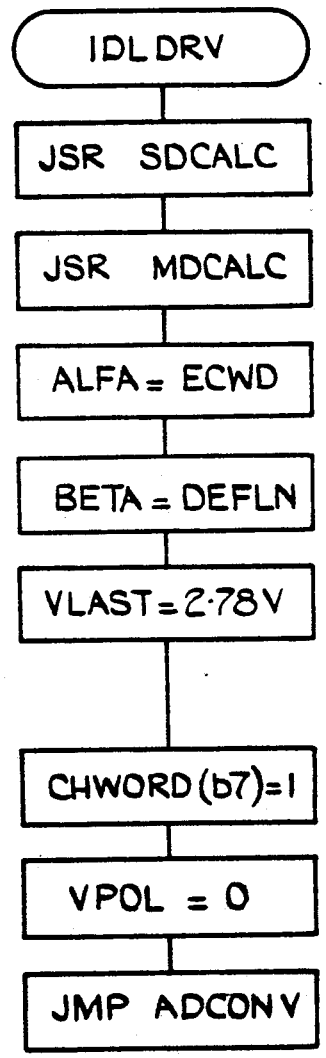

Referring now to FIG. 38, there is shown the flow chart fro the program IDLDRV. At the beginning of this program, the sub-routine SDCALC is called to calculate the self discharge which has occurred during the idle period. Then, the sub-routine MDCALC is called, the variable ECWD is stored as the variable ALFA and the variable DEFLN is stored as a variable BETA. Next, a variable VLAST used in the program DISCH is set to a value corresponding to 2.78 volts/cell. Subsequently, bit 7 of the status word CHWORD is set to binary 1 to indicate that a transition from the idle state to the vehicle power on state has taken place. This bit is examined in the program DISCH as will be described below. Lastly, a variable VPOL used in the sub-routine VPCALC is set to zero and a jump then occurs to the program ADCONV.

Figure 39A:
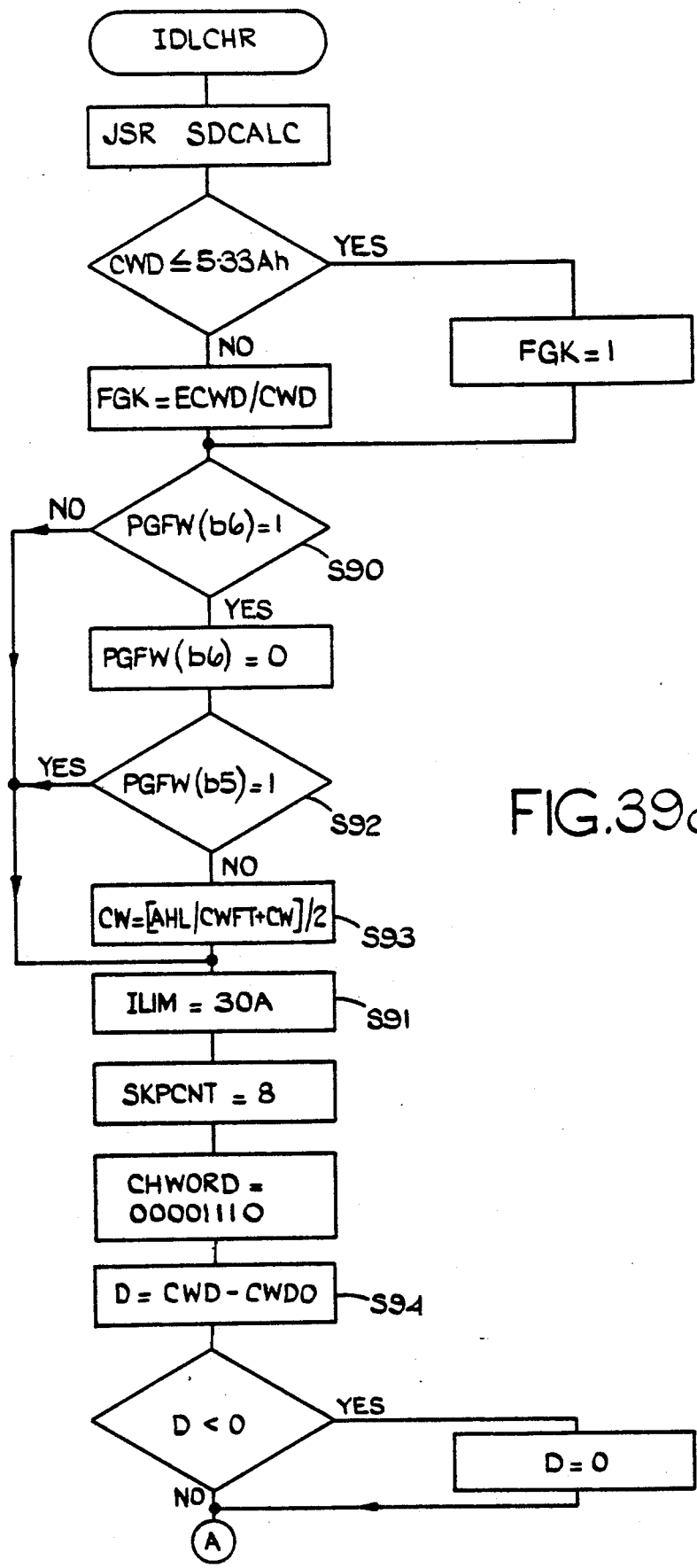
Figure 39B:
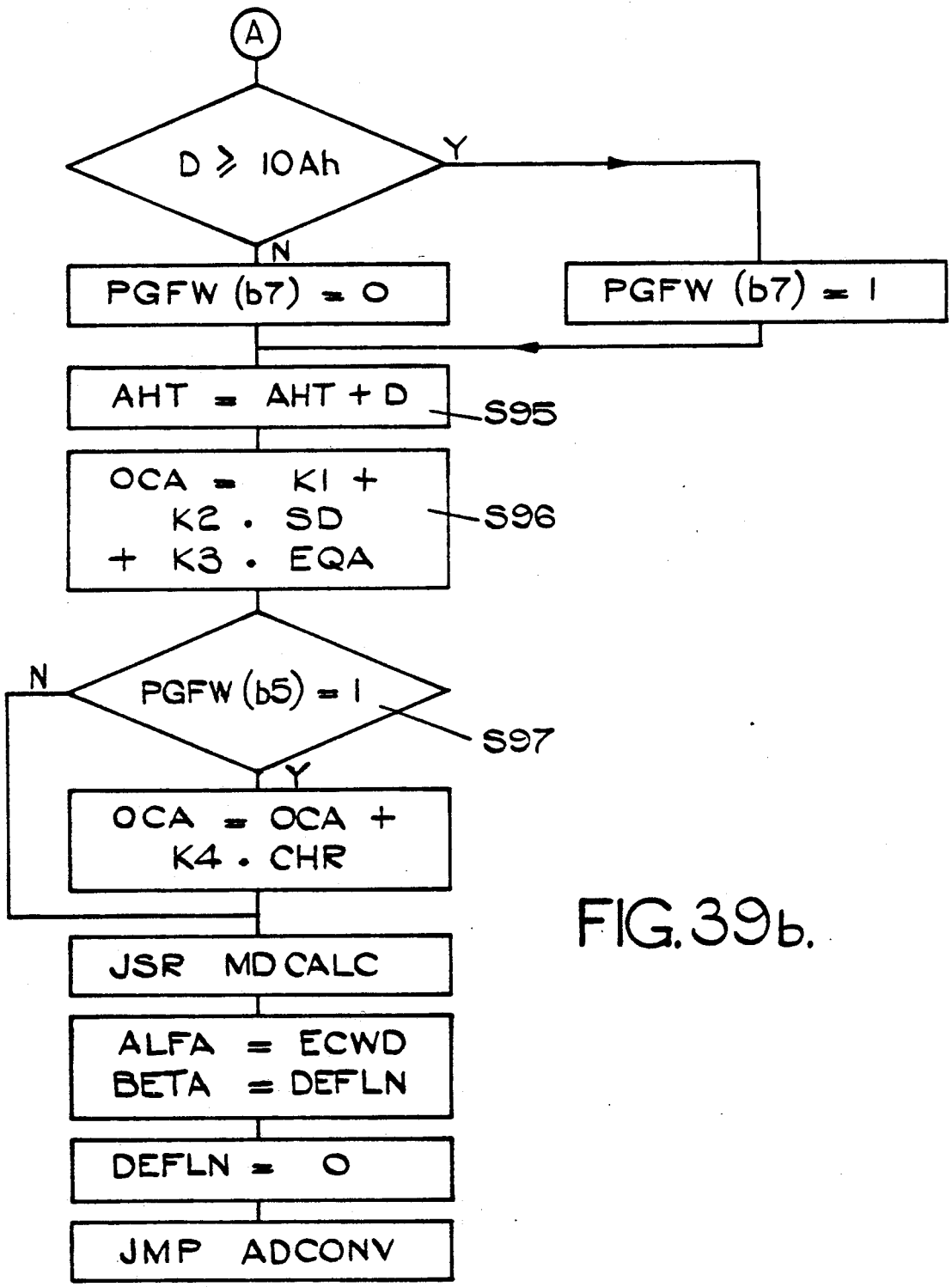

In FIG. 39, there is shown the flow chart for the program IDLCHR.

At the beginning of this program, the sub-routine SDCALC is called to calculate the self discharge which has occurred during the idle period. Next, the variable CWD is examined. If this is greater than 5.33 Ah then the variable FGK is set to ECWD/CWD, and if it is less than or equal to 5.3 Ah, then the variable FGK is set to unity. The variable FGK is used in the program STATE 1 to calculate the ECWD in accordance with the equation ECWD=CWD. FGK and the variable ECWD is used to calculate the varaible DEFLN.

Next, in an operation S90, the AHL corrected bit of the status word PGFW is examined. If this bit is binary 0, then the program jumps to an operation S91 and, if it is equal to binary 1, it is set to binary 0 and the program continues with an operation S92. In the operation S92, the partial charge bit of the status word PGFW is examined and if this is equal to binary 1 the program jumps to the operation S91. If this bit is equal to binary 0, then a variable CW is calculated in an operation S93 as the average of its previous value and AHL/CWFT. The variable CW represents the charge capacity of the battery at 30° celsius, the variable AHL represents the actual capacity of the battery at the temperature at which it is being used, and the variable CWFT is a function of temperature and to calculate AHL from CW. As will be explained with reference to the program DISCH, if during discharge the lowest sub-pack voltage falls below a certain value, then the variable AHL is calculated as a function of this voltage and as a function of the variable ECWD. The AHL corrected bit of the status word PGFW is also set to binary 1 to indicate that this calculation has been performed. In operation S90, S92 and S93 this new value is used to calculate the variable CW providing the battery was fully charged during the previous charging cycle. Thus, the value of CW is corrected and updated so that it corresponds closely to the actual capacity of the battery, which may be expected to fall during its working life. By correcting the value of CW, the accuracy of the state of charge calculation is improved.

In operation S91, a variable ILIM is set to a value corresponding to 30 amps. The variable ILIM is used in the charging routines. Next, a variable SKPCNT is set to 8, this variable being used in the program AVCURR. Then, the status word CHWORD is set to binary 00001110 corresponding to charging phase 1 and current level 6.

In an operation S94, a variable D is calculated as the difference between CWD and CWDO and then set to zero if it is negative. The variable D represents the charge which has been withdrawn from the battery since the previous charging cycle. If D corresponds to a value greater than or equal to 10 Ah, then bit 7 of the status word PGFW is set. Next, in an operation S95, the current value of D is added to the current value of a variable AHT. The variable AHT represents the total charge withdrawn so far from the battery during its working life and is used in the sub-routine SDCALC.

Next, in an operation S96, the variable OCA is calculated as a function of a constant K1, a constant K2, a variable SD representing the self discharge which has occurred, a constant K3, and a variable EQA which represents the equalising charge which is given to the battery at periodic intervals. Then, in an operation S97, the partial charge bit of the status word PGFW is examined and, if this is equal to binary 1, then the variable OCA is increased by an amount equal to a constant K4 multiplied by the variable CHR.

Lastly, the sub-routine MDCALC is called, ECWD is stored as ALFA, DEFLN is stored as BETA, and DEFLN is set to zero. A jump then occurs to the program ADCONV.

As explained above with reference to FIGS. 6 to 11, the peripheral data lines PB2 to PB5 of the analog to digital PIA 350 are connected to the inputs DATA 1 to DATA 4 of the decoder 390, the output signals S1 to S14 of which determine which analog signal is supplied to the comparator 40. In particular, outputs S1 to S9 of decoder 390 correspond respectively to the individual voltages of the 9 sub-packs 450 to 458, output S10 corresponds to peak current, output S11 corresponds to average current, outputs S12 and S13 correspond to the battery electrolyte temperature as measured by the two temperature sensors 547 and 548, and the output S14 corresponds to the temperature of the system electronics as measured by the temperature sensor 546. The relationship between the signal levels of the peripheral data lines PB2 to PB5 of PIA 350 and the analog signals is summarised in table 4 below.

TABLE 4

| ANALOG SIGNAL SELECTION | | | | | |
|---|---|---|---|---|---|
| PB5 | PB4 | PB3 | PB2 | | ANALOG SIGNAL |
| 0 | 0 | 0 | 1 | first | sub-pack voltage |
| 0 | 0 | 1 | 0 | second | sub-pack voltage |
| 0 | 0 | 1 | 1 | third | sub-pack voltage |
| 0 | 1 | 0 | 0 | fourth | sub-pack voltage |
| 0 | 1 | 0 | 1 | fifth | sub-pack voltage |
| 0 | 1 | 1 | 0 | sixth | sub-pack voltage |
| 0 | 1 | 1 | 1 | seventh | sub-pack voltage |
| 1 | 0 | 0 | 0 | eigth | sub-pack voltage |
| 1 | 0 | 0 | 1 | ninth | sub-pack voltage |
| 1 | 0 | 1 | 0 | | peak current |
| 1 | 0 | 1 | 1 | | average current |
| 1 | 1 | 0 | 0 | first | electrolyte temperature probe |
| 1 | 1 | 0 | 1 | second | electrolyte temperature probe |
| 1 | 1 | 1 | 0 | | electronics temperature probe |

The conversion of these analog signals to digital form will now be described with reference to FIG. 40 which is a flow chart of the program ADCONV and FIG. 41 which is a flow chart of the sub-routine ADC. During the program ADCONV, the digital values corresponding to these analog signals are stored in a 24 byte A-D buffer. In table 5 below, the name of each individual location in this buffer is given together with the analog signal with which it is associated, the bottom location being SBPK1H and the top location being TELEC. As may be seen, each sub-pack voltage, and the two current values are stored as two byte words, the two electrolyte temperatures are averaged and stored as a single byte word, and the electronics temperature is also stored as a single byte word. The A-D buffer is located in the internal RAM of the MPU and as the storage capacity of this RAM is limited certain locations are temporarily used to store variables other than their associated analog signal. In particular, the locations SBPK1H, SBPK1L, SBPK2H, SBPK2L, SBPK3H and SBPK3L are initially used to store the temperature analog signals, and the location TELEC is used as a loop counter for the major part of the program. It should be noted that the address of location SBPK1H is defined by the constant VECT2.

TABLE 5

| A - D BUFFER | |
|---|---|
| LOCATION NAME | ANALOG SIGNAL |
| SBPK1H | first sub-pack voltage |
| SBPK1L | " |
| SBPK2H | second sub-pack voltage |
| SBPK2L | " |
| SBPK3H | third sub-pack voltage |
| SBPK3L | " |
| SBPK4H | fourth sub-pack voltage |
| SBPK4L | " |
| SBPK5H | fifth sub-pack voltage |
| SBPK5L | " |
| SBPK6H | sixth sub-pack voltage |
| SBPK6L | " |
| SBPK7H | seventh sub-pack voltage |
| SBPK7L | " |
| SBPK8H | eighth sub-pack voltage |
| SBPK8L | " |
| SBPK9H | ninth sub-pack voltage |

TABLE 5-continued

| A - D BUFFER | |
|---|---|
| LOCATION NAME | ANALOG SIGNAL |
| SBPK9H | " |
| IPEAKH | peak current |
| IPEAKL | |
| CURRH | average current |
| CURRL | |
| TBATT | average electrolyte temperature |
| TELEC | electronics temperature |

Figure 40A:
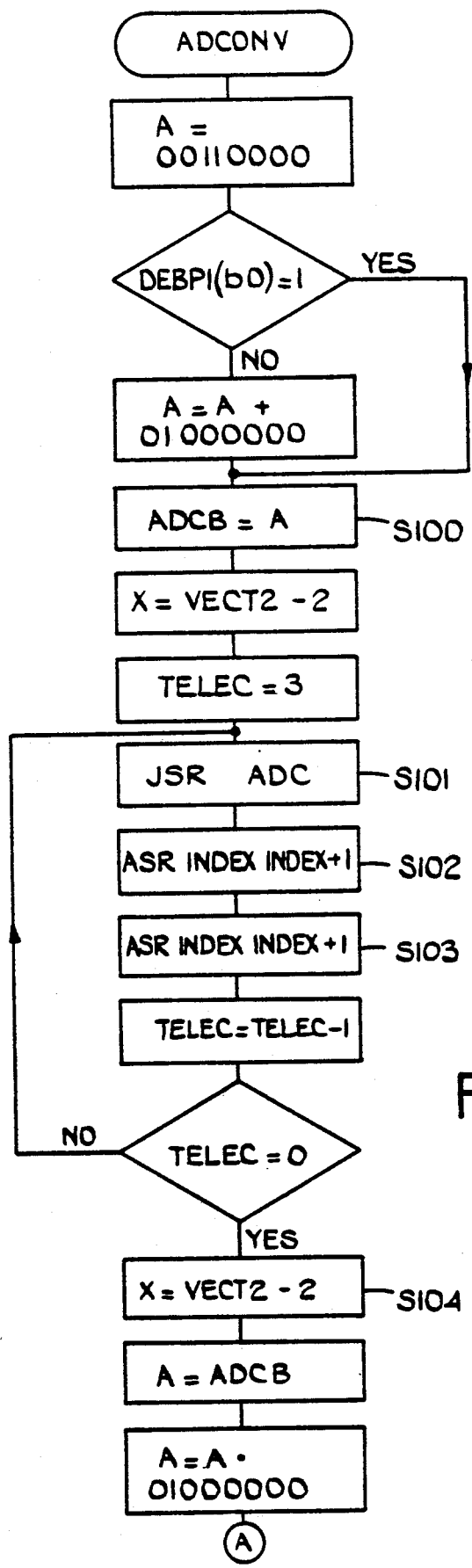
Figure 40B:
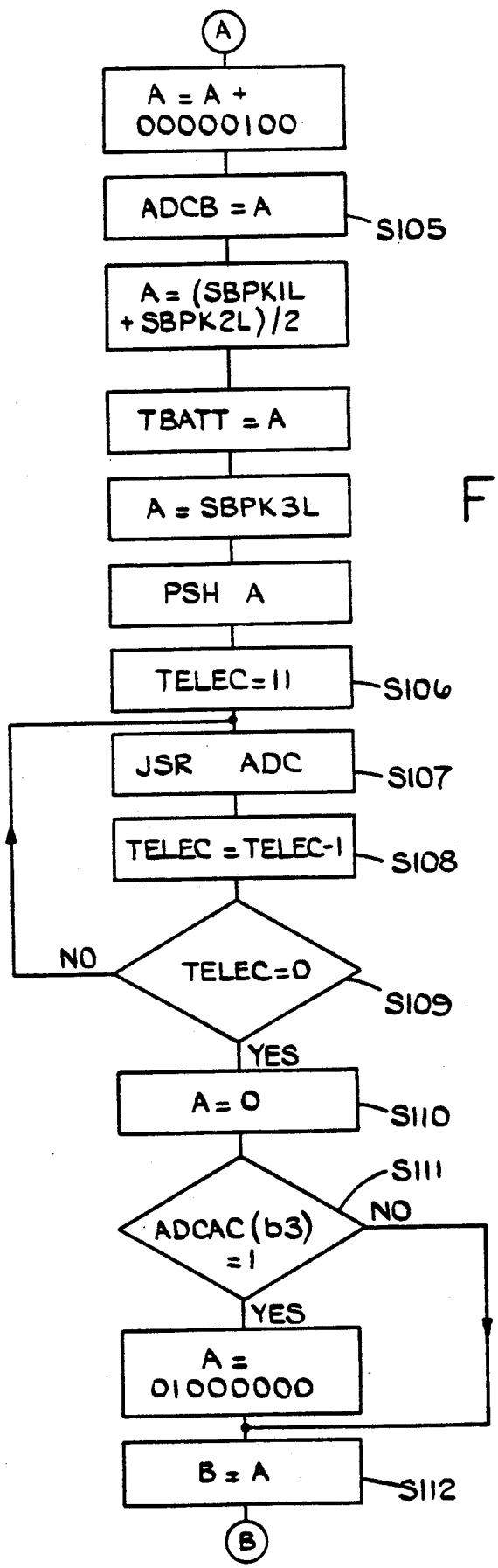
Figure 40C:
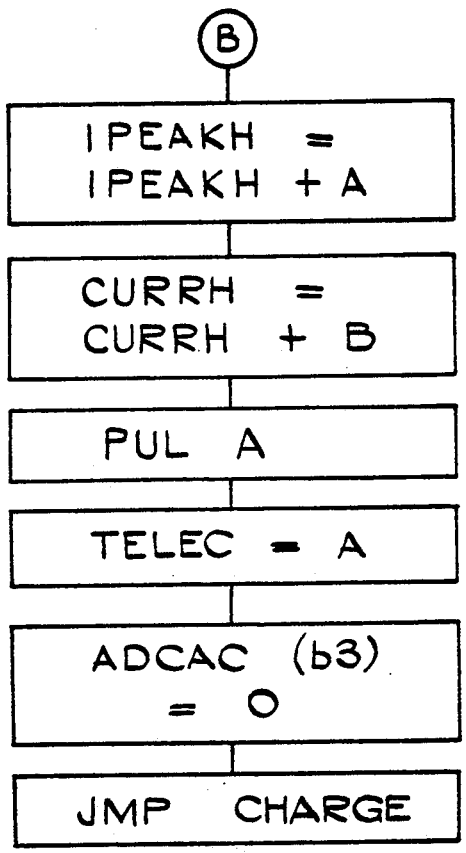

Referring now to FIG. 40, after the program ADCONV has been entered, accumulator A is set to binary 00110000, bit 0 of the status word DEBP1 is examined to see if it is set to binary 1 and, if it is, accumulator A is ORed with binary 01000000. Then, in an operation S100, accumulator A is stored in register ADCB. Thus the first electrolyte temperature sensor is selected and the current range is set to the high value if the vehicle power is on.

Next, the index register is set to VECT2-2 and the location TELEC is set to 3, TELEC being used here as a loop counter. Then, in an operation S101, subroutine ADC is called, and in a pair of operations S102 and S103 the result is shifted twice to the right so as to store it as a single byte word, and then TELEC is decremented. TELEC is then examined and if it is not yet zero then the program returns to the operation S101. If it is zero, then the program progresses to an operation S104. At this stage, the first electrolyte temperature, the second electrolyte temperature andd the electronics temperature are stored as single byte words respectively in locations SBPK1L, SBPK2L, and SBPK3L.

In operation S104, the index register is reset to the value VECT2-2, register ADCB is then loaded into accumulator A and the result AND-ed with binary 01000000, ORed with binary 00000100, and then in an operation S104 the result is loaded into register ADCB. Thus, as a result of operation S105, the current range which was originally selected is preserved and the analog signal corresponding to the first sub-pack voltage has now been selected.

Followin operation S106, the contents of locations SBPK1L and SBPK2L, which correspond to the two electrolyte temperatures, are averaged and stored at location TBATT. Then, the contents of location SBPK3L, which correspond to the electronics temperature, are stored on the MPU stack.

In an operation S10, TELEC is set to 11 in preparation for converting the remaining 11 analog signals. Then, in an operation S107, the sub-routine ADC is called, and in an operation S108 TELEC is decremented. Then, in an operation S109, the value of TELEC is examined and if it is not equal to zero the program returns to operation S107. If TELEC is zero, then the analog signals for the 9 sub-pack voltage and the 2 currents are stored in their associated locations and the program continues with an operation S110.

In operation S110, accumulator A is set to zero. In an operation S111, bit 3 of the register ADCAC is examined. As will be explained below, this bit is set during the subroutine ADC. If it is set to binary 1, amplifier 700 of FIG. 11 was operating as an inverter during conversion of the current signals. Consequently, the values of the current signals stored in locations IPEAKH and CURRH should be given a negative sign and in order to achieve this, accumulator A is set to binary 10000000 before proceeding to an operation S112.

In operation S112, accumulator A is loaded into accumulator B, accumulator A is then added to location IPEAKH, and accumulator B is added to location CURRH. The two current values will now be stored with their correct polarity as bit 7 of the high byte of a double byte word indicates a negative value if set and a positive quantity if clear.

The value of the electronics temperature which has been temporarily stored on the stack is now loaded into location TELEC, lastly bit 3 of register ADCAC is set to binary 0 before a jump is made to the program CHARGE.

Figure 41A:
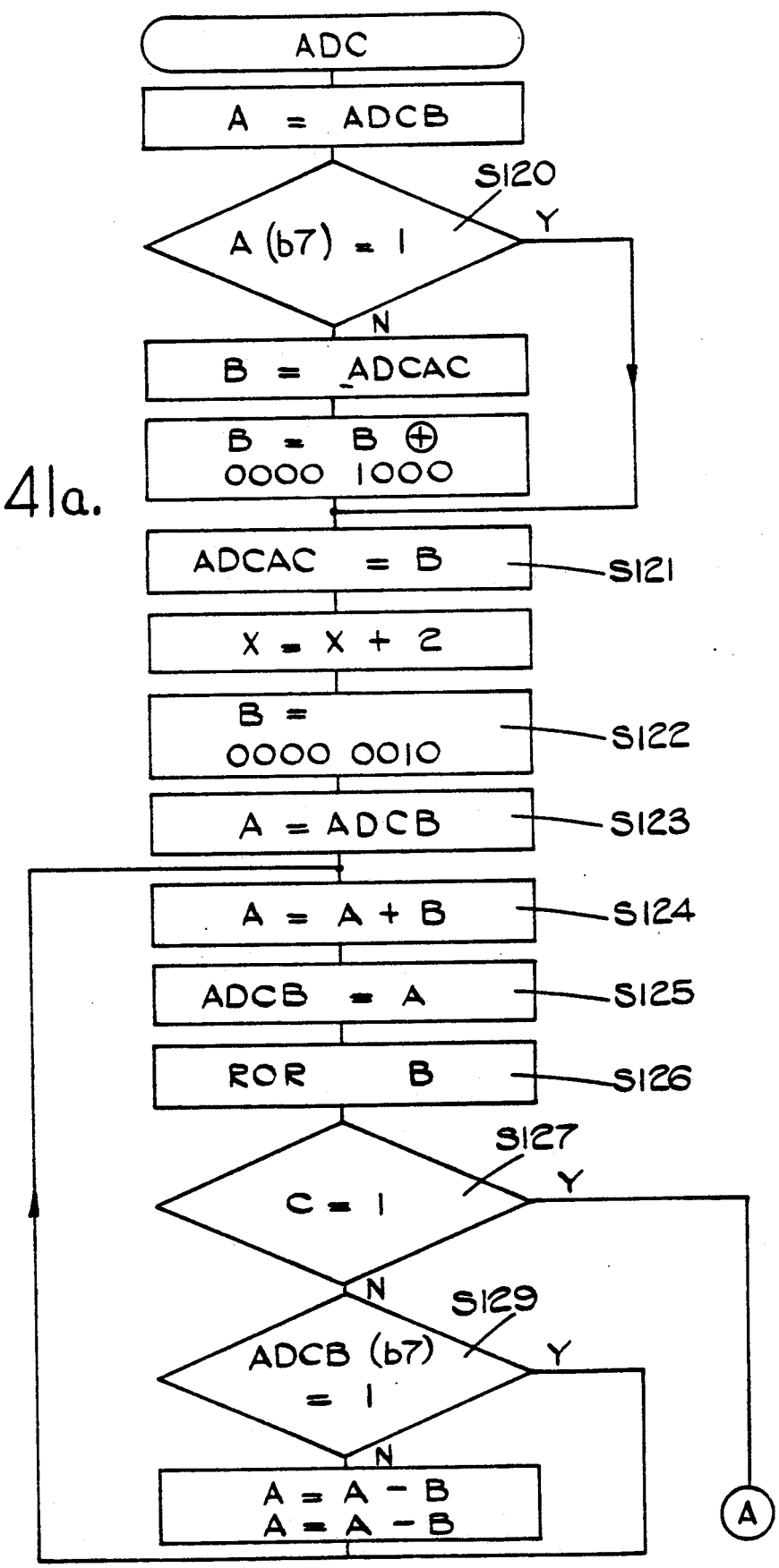
Figure 41B:
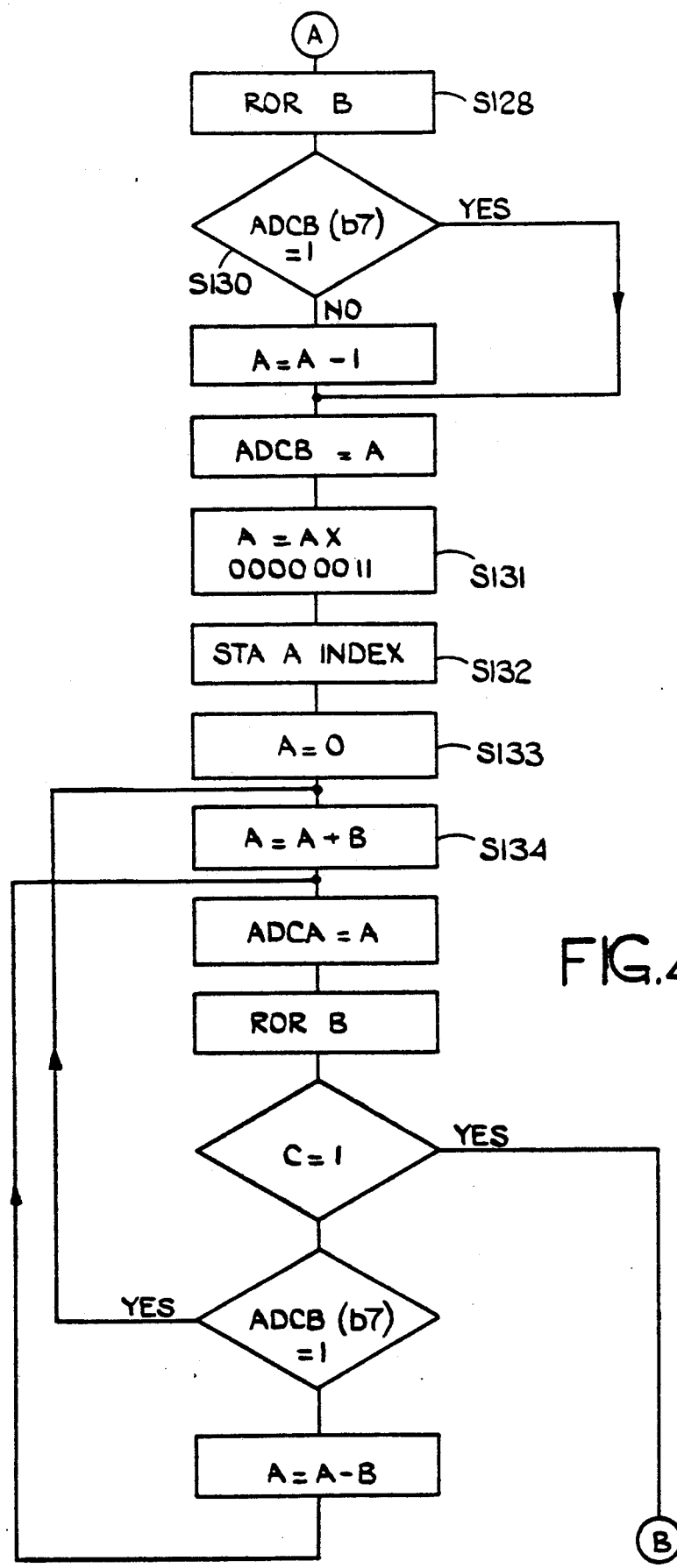
Figure 41C:
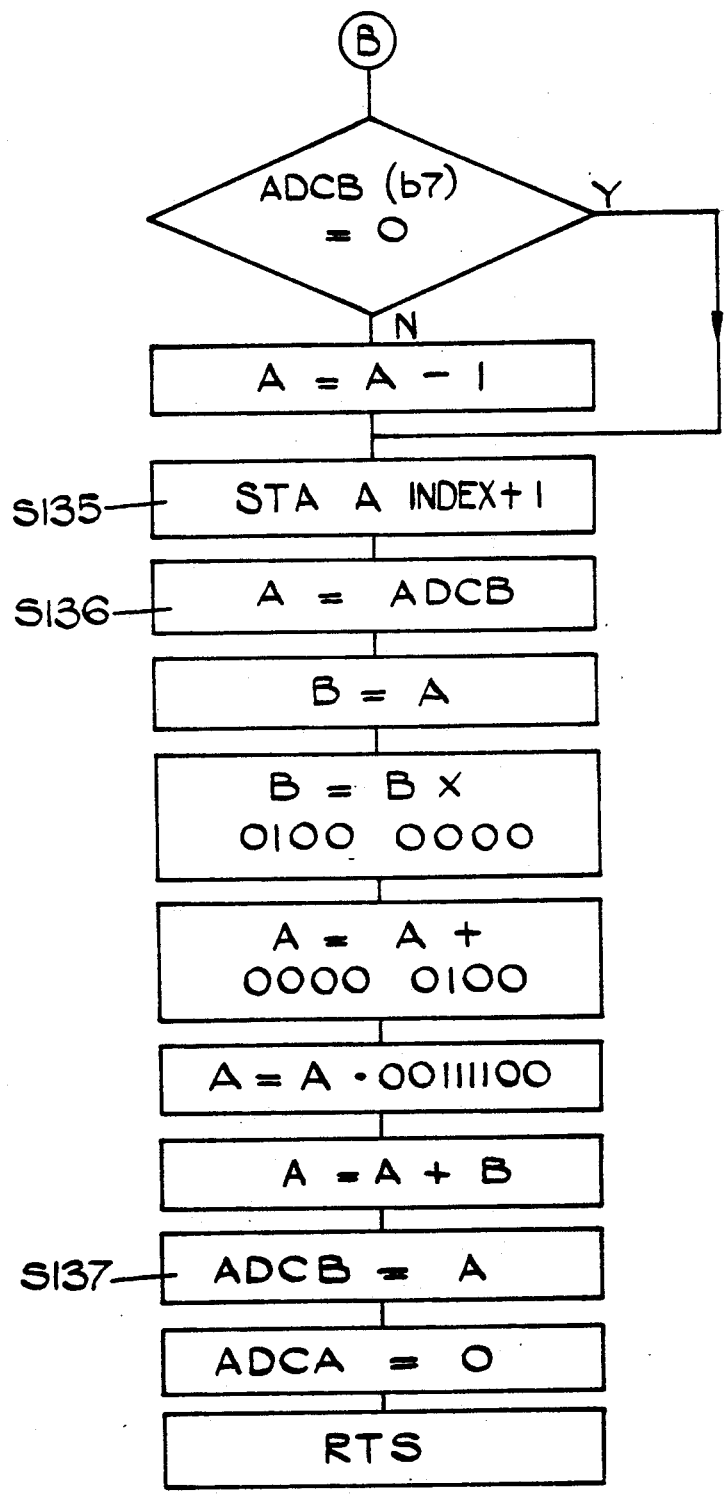

Turning now to FIG. 41, there is shown a flow chart for the sub-routine ADC. In this sub-routine, a selected one of the analog signals is converted into a 10 bit binary number, the two most significant bits of which are found by setting bits 0 and 1 of register ADCB and the remaining 8 bits of which are found by setting the 8 bits of register ADCA.

After the sub-routine ADC has been entered, in an operation S120, bit 7 of register ADCB is examined. If bit 7 is equal to binary 1, then the output of amplifier 700 shown in FIG. 11 is positive and so this amplifier is operating with the correct polarity and so the program jumps directly to an operation S121. If this bit is not set, then it is necessary to invert the polarity of amplifier 700. This is achieved by loading control register ADCAC into accumulator B and then inverting bit 3 in an exclusive OR operation before storing accumulator B in register ADCAC. As this bit controls the polarity of signal CA2, inversion of this bit will invert the polarity of amplifier 700.

Next, the index register is incremented twice so that it now points to the location in the A-D buffer in which the result of the A-D conversion is to be stored. Then, in an operation S122, binary number 00000010 is loaded into accumulator B and this accumulator now contains the bit to be tested. In a set of operations S123, S124 and S125, register ADCB is loaded into accumulator A, accumulators A and B are added, and accumulator A is loaded with register ADCB. Then in an operation S126 accumulator B is shifted to the right once and now contains the next bit to be tested. In a comparison S127, the carry bit of the MPU condition code register is examined. If this is set to binary 1, then bits 1 and 0 of register ADCB have been tested and the program jumps to an operation S128. If the carry bit is equal to binary 0, then the program continues with an operation S129 in which bit 7 of register ADCB is examined. This bit gives the result of the comparison and, if it is equal to binary 1, then the bit being tested should be set to binary 1 and so the program returns to operation S124. If this bit is set to binary 0, then accumulator B is subtracted from accumulator A twice so as to clear the bit being tested before returning to operation S124.

In operation S128, accumulator B is shifted to the right once and now contains the bit to be tested in preparation for a successive approximation on the 8 bits of register ADCA. In an operation S130, bit 7 of register ADCB is again tested and bit 0 of register ADCB is set to binary 1 or 0 in accordance with the result. Then, in a set of operations S131 and S132 bits 0 and 1 of register ADCB, which correspond to the two most significant bits of the result, are stored.

In an operation S133, register A is set to zero. Then, in a set of operations S134 to S135 which are generally similar to the operations S124 to S132, a successive approximation is performed on the 8 bits of register ADCA and the result is stored in its correct location in the A-D buffer.

Finally, in a set of operations S136 to S137, bits 2 to 5 of register ADCB are incremented so as to select the next analog signal and bit 6, which controls the current range, is retained. Register ADCA is then set to zero before performing return from subroutine.

Figure 42A:
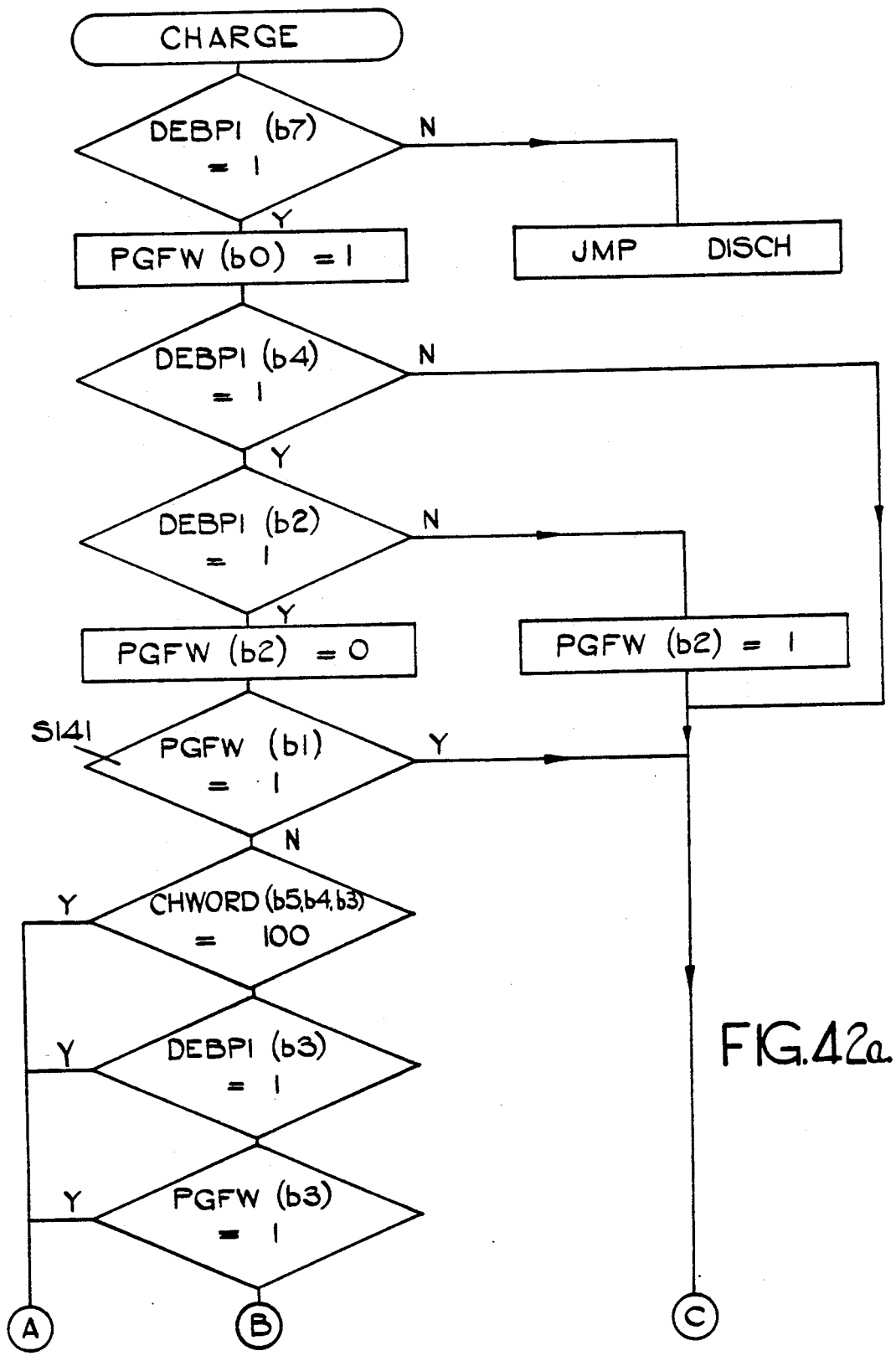
Figure 42B:
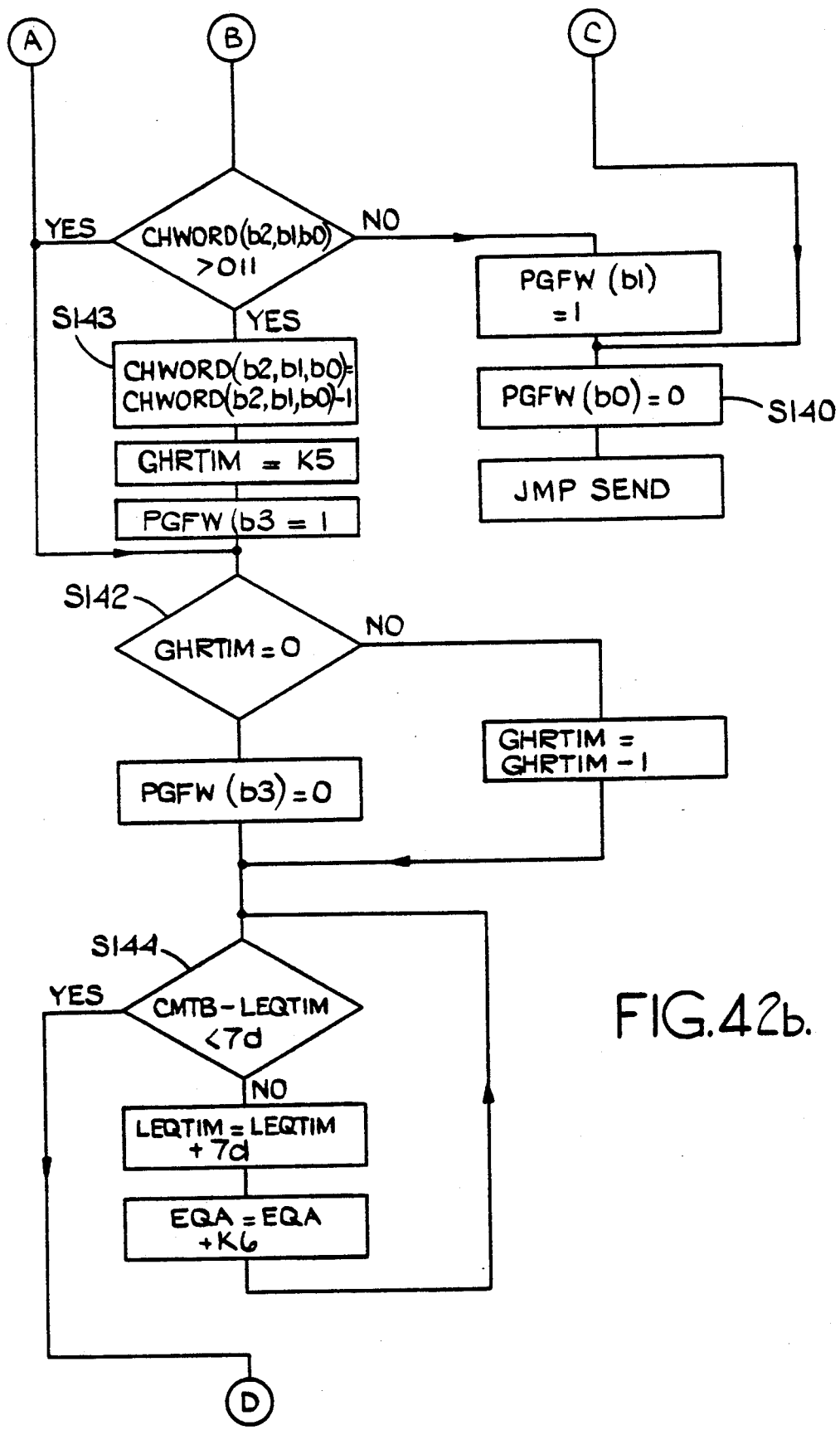
Figure 42C:
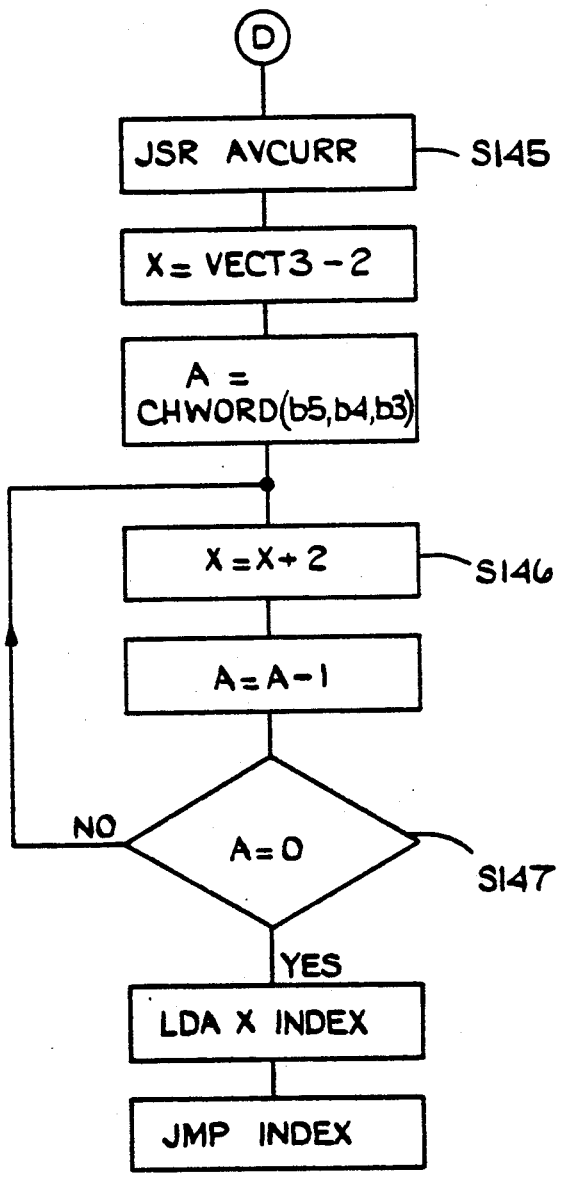

As explained above, during charging in each pass of the 1 second routine the program CHARGE is executed followed by one of the programs STATE1 to STATE6, these programs corresponding respectively to phases 1 to 6 of the charging cycle. The flow chart for the program CHARGE is shown in FIG. 42 and will now be described.

After this program has been entered, bit one of status word DEBP1 is examined to see if the charger is connected. If the charger is not connected, then a jump is made to the program DISCH. If the charger is connected, then bit 0 of the status word PGFW is set to binary 1 to indicate that charging may take place. Next, bit 4 of status word DEBP1 is examined to check that the charger power is switched on. If is not switched on, then a jump is made to an operation S140 in which bit 0 of the status word PGFW is cleared and a jump is then made to the program SEND. Providing the charger power is switched on, then bit 2 of the status word DEBP1 is examined to check that the fans are running. If the fans are not running, then bit 2 of the status word PGFW is set to 1 to indicate fan failure and a jump is then made to operation S140. If the fans are running, then bit 2 of status word PGFW is cleared and the program continues with an operation S141.

In operation S141, bit 1 of status word PGFW is examined to see if a gas head failure has occurred. If such a failure has occurred, then a jump is made to operation S140. If no failure has occurred, then bits 5, 4 and 3 of the status word CHWORD are checked to see if charging phase 4 is being executed. If phase 4, which is the phase in which operation of the gas heads is checked, is being executed a jump is made to an operation S142. If phase 4 is not being executed, then bit 3 of the status word DEBP1 is checked to see if the gas heads have tripped. Providing the gas heads not tripped, the program jumps to operation S142. If the gas heads have tripped, then bit 3 of status word PGFW is examined to see if the gas heads are resetting. As will be explained, the gas heads are given a fixed period to reset after they have tripped. If the gas heads are resetting, then the program jumps to operation S142. If the gas heads are not resetting, then bits 2, 1 and 0 of the status word CHWORD are examined to determine the present current level. The gas heads are designed so that they should not trip at current level 3 or below. Consequently, if the current is set at level 3 or below, then bit 1 of status word PGFW is set to 1 to indicate gas head failure and a jump is made to operation S140. If the current is set at a value greater than level 3, then in an operation S143, bits 2, 1 and 0 of the status word CHWORD are reduced by binary 1 in order to reduce the current level, and then a variable GHRTIM is set to a constant K5. The variable GHRTIM is used to time the reset period for the gas heads. Bit 3 of status word PGFW is then set to indicate that the gas heads are resetting. The program then continues with operation S142. In operation S142, the value of GHRTIM is checked and, if it is not equal to zero, it is decremented before proceeding with an operation S144. If it is zero, then bit 3 of status word PGFW is cleared to indicate that the gas heads are no longer resetting before proceeding with operations S144.

In operation S144, the present value of register CMTB is compared with a variable LEQTIM. The variable LEQTIM represents the time of the last charging cycle in which a decision was made to give the battery an equalising charge. If the difference between CMTB and LEQTIM is less than seven days, the program continues with an operation S145. If the time difference is greater than seven days, then LEQTIM is increased by seven days, a constant representing the amount of equalising charge which should be given to the battery is added to the variable EQA, and the program then returns to the operation S144.

In operation S145, sub-routine AVCURR is called. Next, the index register is set to a value VECT3 - 2. VECT 3 is a constant which points to the bottom of a data stack in which the successive starting addresses of the programs STATE1 to STATE6 are stored. Then, accumulator A is set equal to bits 5, 4 and 3 of the status word CHWORD so that it stores the present charging state. Next, in an operation S146, the index register is incremented twice and then accumulator A is decremented once. In an operation S147, the contents of accumulator A are examined and, if not equal to zero, the program returns to operations S146. If the contents are zero, this indicates that the index register now points to the data stack in which the start address of a program which is to be performed and a jump is then made to that program.

Figure 43A:
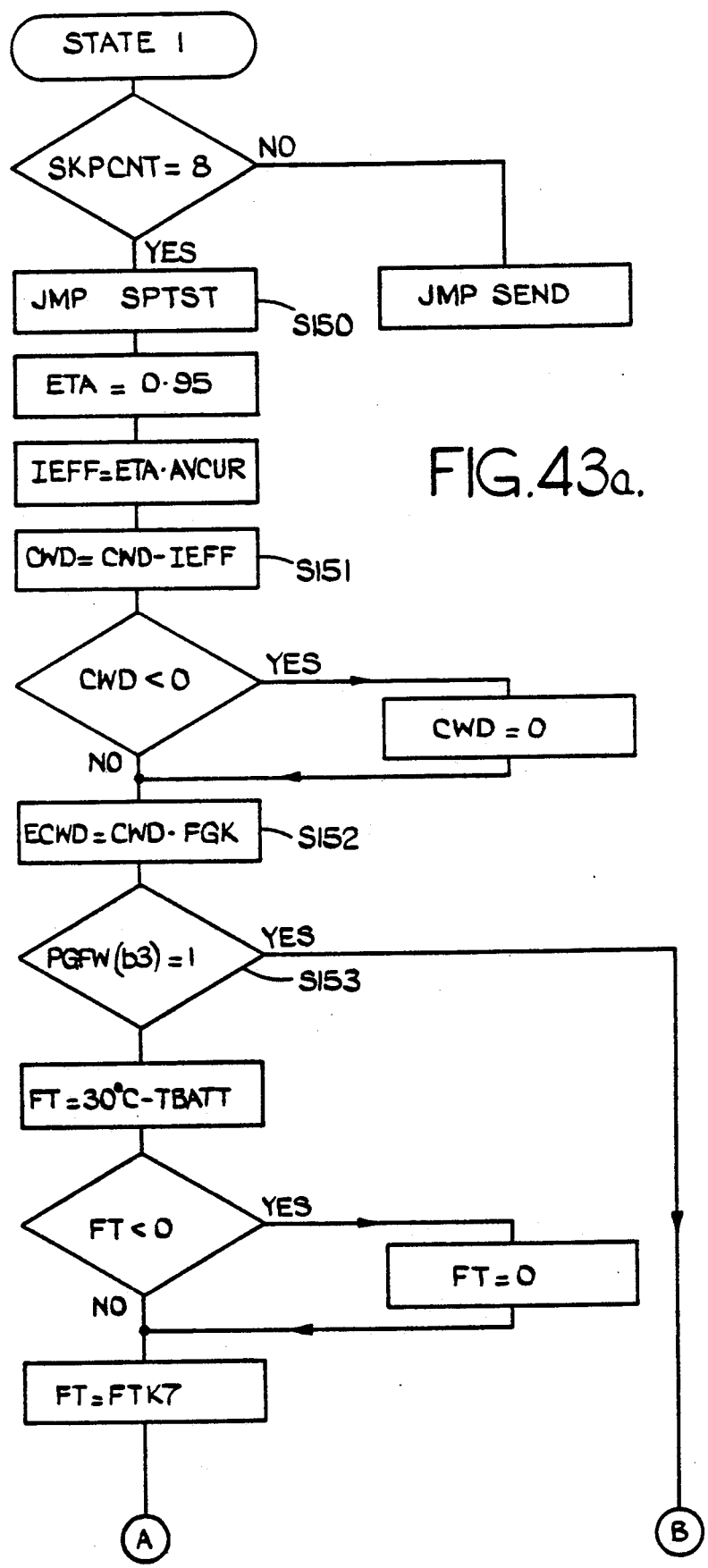
Figure 43B:
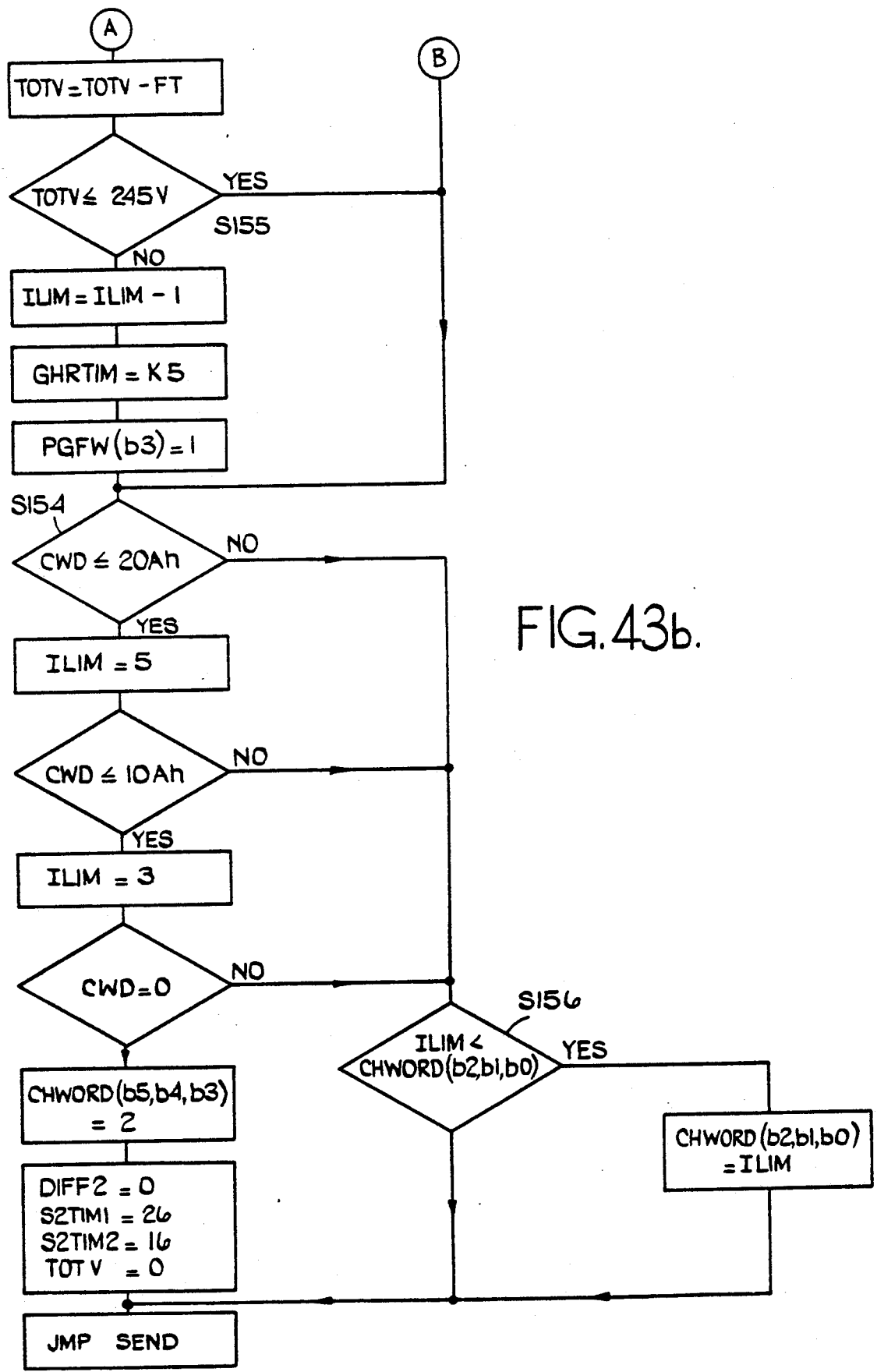

Turning now to FIG. 43, there is shown the flow chart for the program STATE1, which controls phase 1 of the charging cycle and during which the charge withdrawn from the battery is replaced.

After this program has been entered, a variable SKPCNT is examined. This variable is used in the sub-routine AVCURR and when it is equal to 8 a variable AVCUR validly represents the average current. If SKPCNT does not equal 8, then a jump is made to the program SEND but otherwise the program continues with an operation S150. In operation S150 the sub-routine SPTST is called which calculates the total battery voltage represented by a variable TOTV, the address of the sub-pack having the lowest voltage represented by IND, and the value of that lowest voltage represented by the variable LOWV. Next, a variable ETA representing the charging efficiency is set to a value 0.95 and then used to calculate a variable IEFF which represents the effective charging current. In an operation S151, the variable CWD is decremented by IEFF and then set to zero if it has become negative.

As the state of charge of the battery is calculated during charging, it is necessary to calculate the variable ECWD. The variable FGK was calculated during the program IDLCHR as the ratio of ECWD to CWD and now, in an operation S152, ECWD is calculated by multiplying CWD by FGK. Thus, ECWD falls linearly to zero with CWD.

In the next set of operations, commencing with operation S153, the total battery voltage compensated for temperature is examined and, if it exceeds 245 volts, the charging current is reduced. In operation S153, bit 3 of the status word PGFW is examined to see if the gas heads are resetting and, if they are, a jump is made to an operation S154. In order to compensate for the temperature of the battery, a variable FT is set to a value representing the difference between 30° C. Celsius and the temperature of the battery electrolyte and then cleared if less than zero. The variable FT is then multiplied by constant K7 which represents the voltage variation with temperature and corresponds to a value of 6.5 mV/° Celsius for each cell. The variable FT is then subtracted from TOTV to obtain the compensated voltage. Next, in an operation S155, the total battery voltage is examined to see if it is less than 245 volts. If it is, then a jump is made directly to operation S154. Otherwise, the variable ILIM is decremented to reduce the current level, the variable GHRTIM is set to the value of a constant K5, and bit 3 of the status word PGFW is set to 1 thereby using the gas head reset mechanism to provide a delay during which the total battery voltage may fall below 245 V.

In order to maintain the charging efficiency at approximately 0.95 and also in order to avoid excessive gassing, the current level is reduced as charging proceeds in accordance with the amount of charge which remains to be replaced as represented by the variable CWD. In the operation S154, the remaining charge to be replaced is examined and if this is greater than 20 ampere hours a jump is made to an operation S156. If the charge to be replaced is between 10 and 20 ampere hours then the variable ILIM is set of 5 before jumping to operation S156 and, if it is between 10 ampere hours and zero, ILIM is set to 3 before jumping to operation S156.

In operation S156, the value of ILIM is compared with bits 2, 1 and 0 of the status word CHWORD, which represent the current level, and if necessary these bits of the status word CHWORD are reduced to ILIM. A jump is then made to the program SEND.

If it is found that the variable CWD equals 0 and as there is no more charge to be replaced, then its 5, 4 and 3 of the status word CHWORD are set to 2 to indicate that the charging cycle should now enter phase 2. Then, variables DIFF2, S2TIM1, and S2TIM2, which are used during phase 2, are initialised respectively to 0, 26, and 16. Also, the variable TOTV is set to zero and then a jump is made to the program SEND.

Figure 44A:
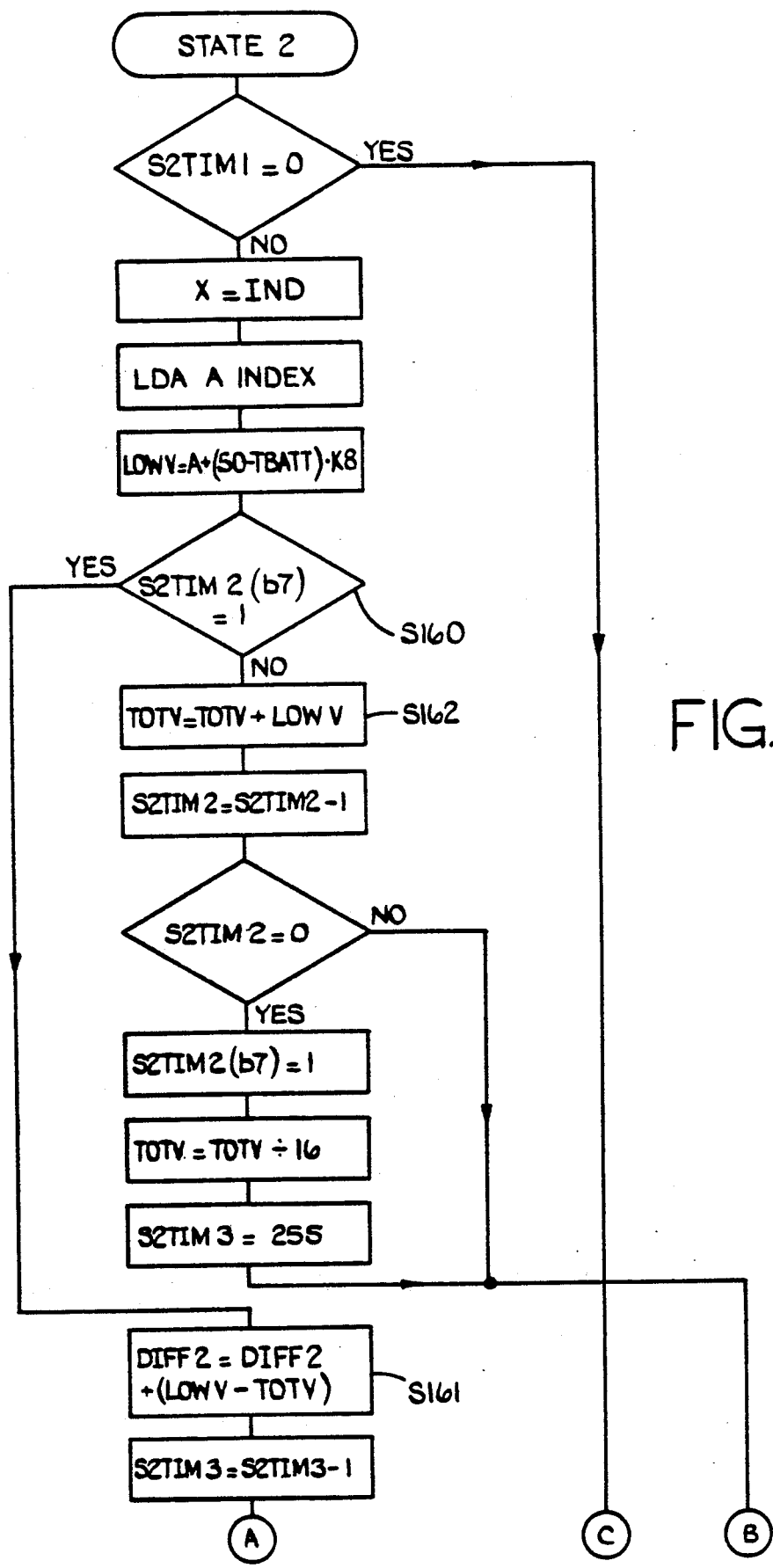
Figure 44B:
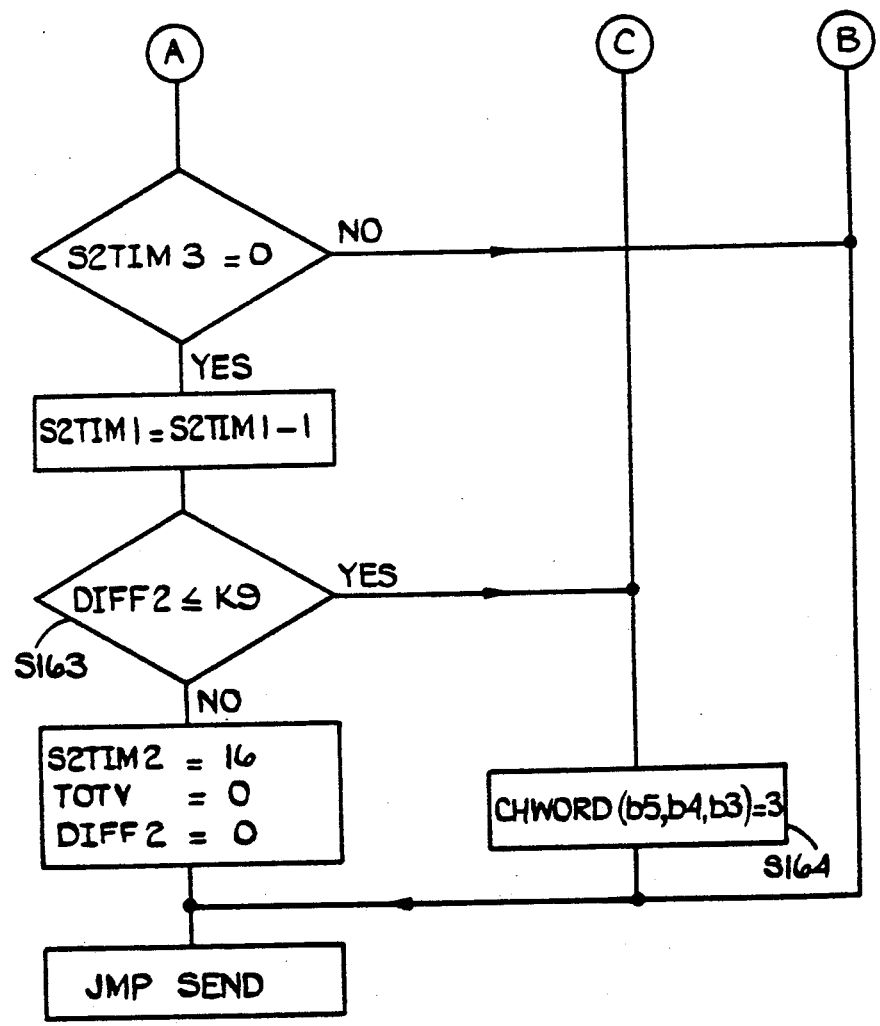

During phase 2 of the charging cycle, the rate of rise of the lowest sub-pack voltage is examined and this phase is terminated when the rate of rise falls below a critical value. This phase ensures that the weakest sub-pack is fully charged. This phase is controlled by the program STATE2 and the flow chart for this program is shown in FIG. 44.

After this program has been entered, the variable S2TIM1 is examined. If this is equal to zero, approximately 118 min in this phase have elapsed and, as there is an overall time limit of 118 min in this phase, a jump is made to the program SEND. If it is not equal to zero, then the index register is loaded with the address of the lowest sub-pack voltage found during the last pass through the program STATE1 and the value of this voltage compensated for temperature is loaded into the variable LOWV. In order to compensate the voltage for temperature, the quantity (50-TBATT).K8 is found, K8 being the temperature coefficient and equal to 6.5 mV/° Celsius for each cell, thereby normalising the lowest sub-pack voltage to 50° C.

Next, in an operation S160, bit 7 of the variable S2TIM2 is examined. If this bit is equal to 1, an average value for the lowest sub-pack voltage has been found and so the program jumps to an operation S161. If this bit is not equal to 1, then the program continues with an operation S162. In operation S162, the location TOTV is incremented by an amount LOWV. In this program, the location TOTV is temporarily used to store the average sub-pack voltage. Next, the variable S2TIM2 is decremented and if not equal to 0 a jump is made to the program SEND. If it is equal to 0, then bit 7 of variable S2TIM2 is set to 1 to indicate that the average sub-pack voltage has been found, TOTV is divided by 16 as the average has been found over 16 passes, and a variable S2TIM3 is set to 255. The average rate of rise of the lowest sub-pack voltage will now be found over the next 255 passes through this program and the variable S2TIM3 is used to count these passes. A jump is then made to the program SEND.

Operation S161 is entered when the average sub-pack voltage has been found and is the beginning of the set of instructions in which the average rate of rise of the lowest sub-pack voltage is determined. In this operation, the variable DIFF2 is incremented by an amount (LOWV−TOTV), which corresponds to the difference between the present value of the lowest sub-pack voltage and the average value previously found. Then, the variable S2TIM3 is decremented and, if not equal to 0, a jump is made to the program SEND. If it is equal to 0, then the 255 passes have been completed. The variable S2TIM1 is then decremented. In an operation S163, the value of DIFF2 is compared with a constant K9 which corresponds to the critical rate of rise of the lowest sub-pack voltage. The value for the critical rate of rise is 2.45 mV/cell in 4 min 16s, i.e. in 255 passes through this program. If DIFF2 is less than K9, then a jump is made to an operation S164 in which bits 5, 4 and 3 of the status word CHWORD are set to 3 so that the program STATE3 will be executed during the next pass through the 1 second routine. A jump is then made to the program SEND. If DIFF2 is not less than K9, then the variables S2TIM2, TOTV and DIFF2 are initialised before the jump is made to the program SEND.

Figure 45:
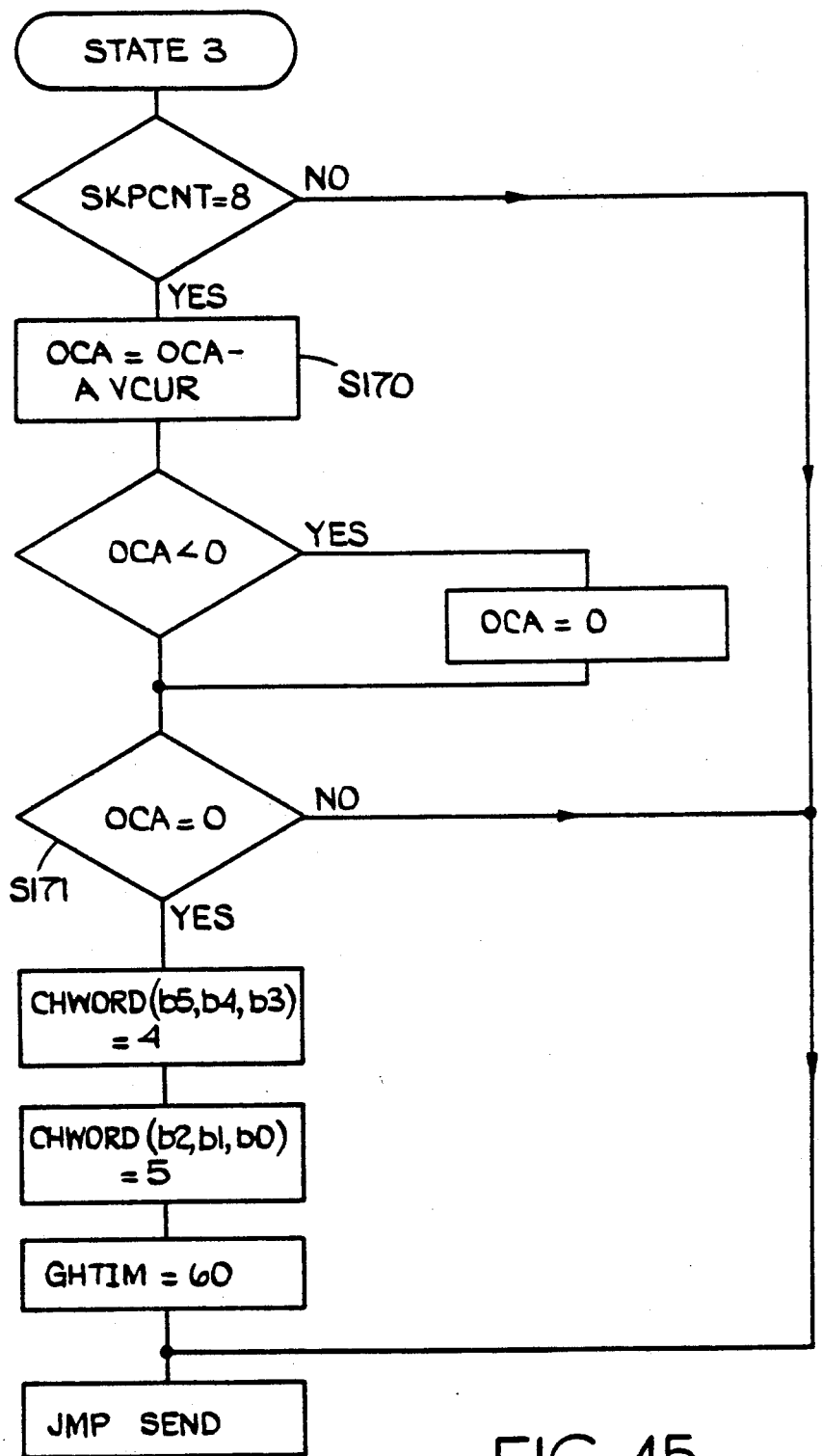

Turning now to FIG. 45, there is shown the flow chart for the program STATE3 which is responsible for controlling phase 3 of the charging cycle. During this phase, the battery is overcharged by an amount determined by the variable OCA.

After this program has been entered, the variable SKPCNT is examined to see if a valid average current is available. If it is not, then a jump is made to the program SEND. If is, then in an operation S170, the variable OCA is decremented by an amount AVCUR. The variable OCA is then examined and set to 0 if it is negative. Then, in an operation S171, the value of OCA is examined and, if not yet equal to 0, a jump is made to the program SEND. If it is equal to 0, then bits 5, 4 and 3 are of the status word CHWORD are set to 4 so that the program STATE4 will be executed during the next pass through the 1 second routine, and bits 2, 1 and 0 are set to 5 so that charging will proceed at current level 5. Lastly, a variable GHTIM used in the program STATE4 is initialised to 60 and then a jump is made to the program SEND.

Figure 46:
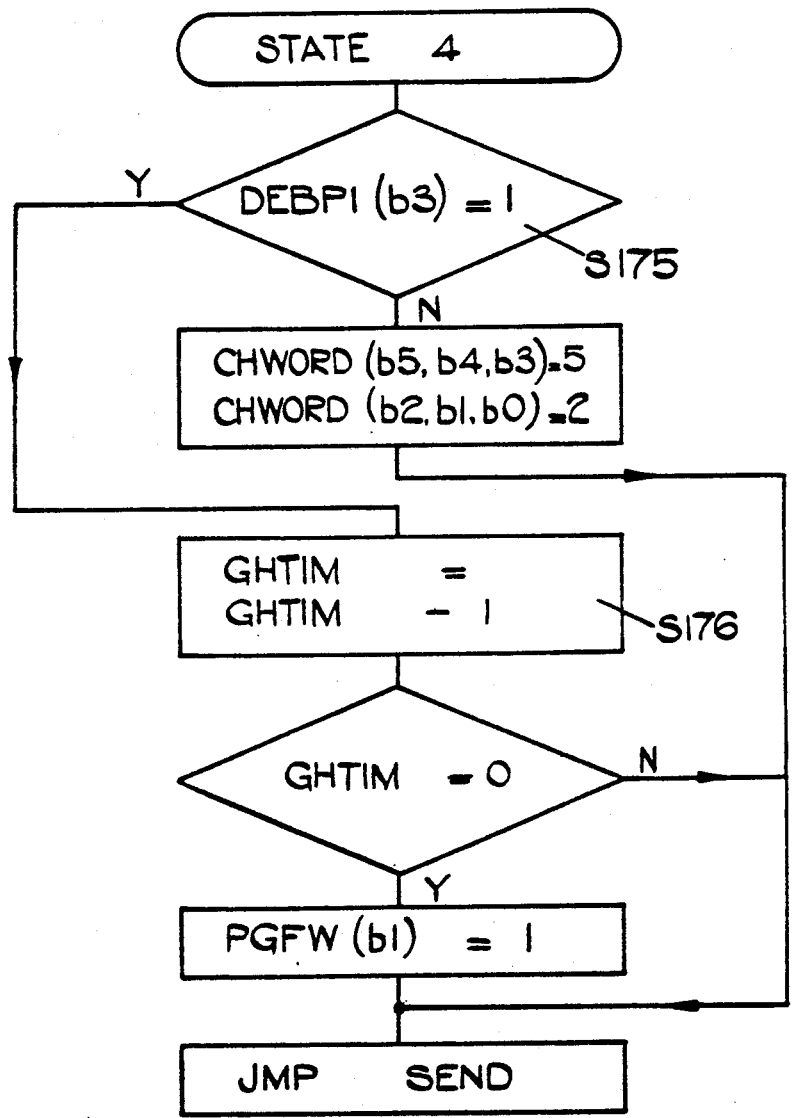

Turning now to FIG. 46, there is shown the flow chart for the program STATE4 which corresponds to phase 4 of the charging cycle. In this program, the gas heads are checked to see if they are operating correctly. The gas heads are designed to trip if a current of 10 amps or greater is being used for electrolysis. This phase is conducted at a charging current of 20 amps, corresponding to current level 5, and as the battery should be fully charged by the beginning of this phase this current will be used for electrolysis and should therefore cause the gas heads to trip.

After this phase has been entered, in an operation S175, bit 3 of the status word DEBP1 is examined to see if the gas heads have tripped. If they have, then bits 5, 4 and 3 of the status word CHWORD are set to 5 and bits 2, 1 and 0 are set to 2 so that the program STATE5 will be executed during the next pass through the 1 second routine at current level 2 and a jump is then made to the program SEND. If the gas heads have not tripped, then a jump is made to an operation S176 in which the variable GHTIM is decremented and, if this is not yet equal to 0, a jump is then made to the program SEND. If it is equal to 0, this implies that the gas heads have failed as they have not tripped during 60s at a charging current of 20 amps. Accordingly, bit 1 of the status word PGFW is set to 1 to indicate this failure and a jump is then made to the program SEND.

Figure 47:
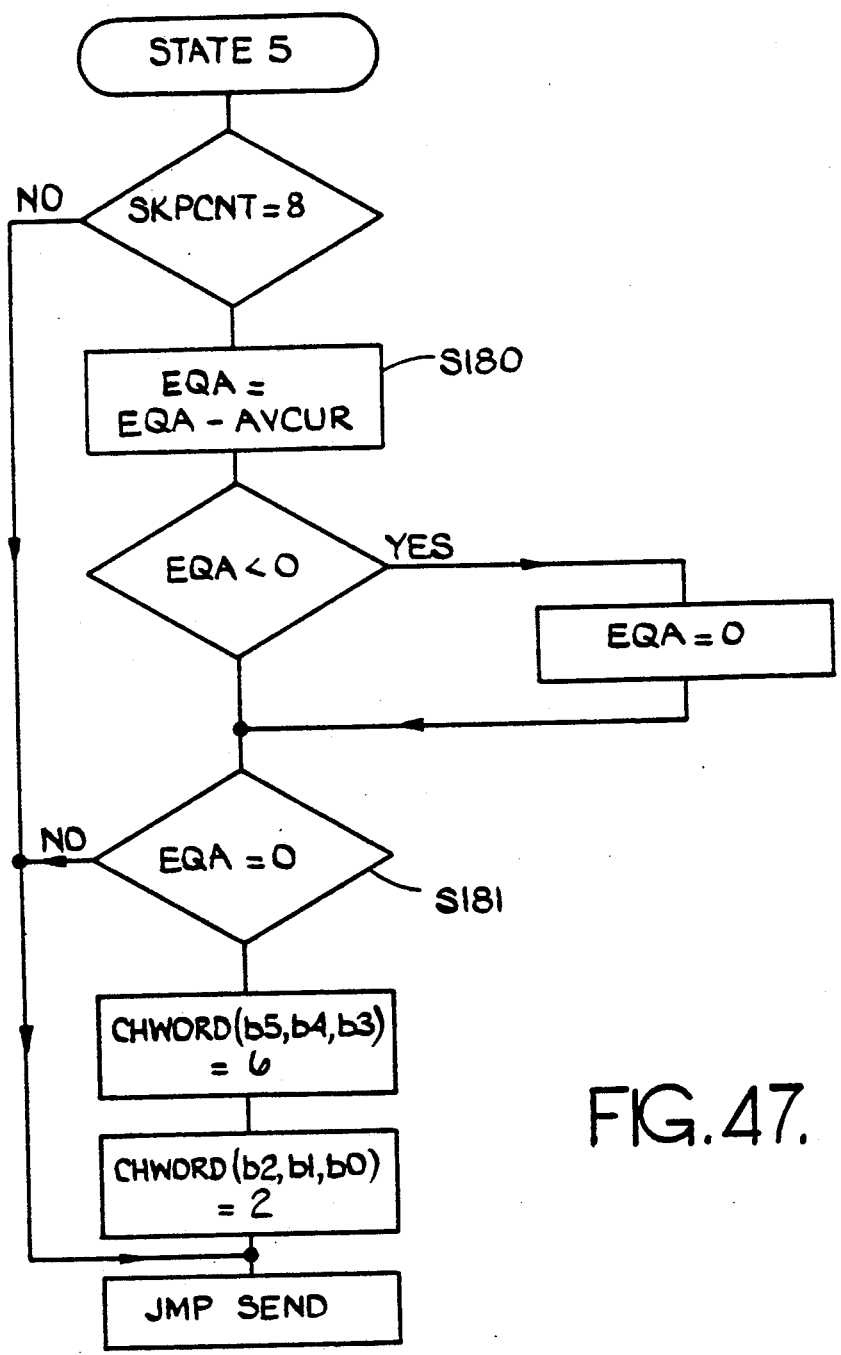

After the battery pack 10 has been discharged and then recharged in accordance with the charging phases controlled by the programs STATE1, STATE2 and STATE3 some of the individual cells of the battery may not be as well charged as the other cells. In order to ensure that all the cells are fully charged and in order to avoid some of the cells becoming progressively less well charged with further discharging and charging cycles, an additional charge known as an equalising charge is supplied to the battery at periodic intervals. The supply of this additional charge is controlled by the program STATE5, the flow chart of which is shown in FIG. 47.

After this program has been entered, the variable SKPCNT is examined and if not equal to 8 a jump is made to the program SEND. If it is equal to 8, then the program continues with an operation S180. In this operation, the present value of the variable AVCUR is subtracted from the variable EQA, which is set to a constant value at periodic intervals by the program CHARGE. The value of EQA is then examined and set to 0 if negative. Next, in an operation S181, the value of EQA is examined and if not 0 a jump is made to the program SEND. If it is 0, then bits 5, 4 and 3 of the status word CHWORD are set to 6 so that during the next pass to the 1 second routine the program STATE6 will be executed, and bits 2, 1 and 0 of the status word CHWORD are set to 1 so that charging proceeds at current level 1. A jump is then made to the program SEND.

Figure 48:
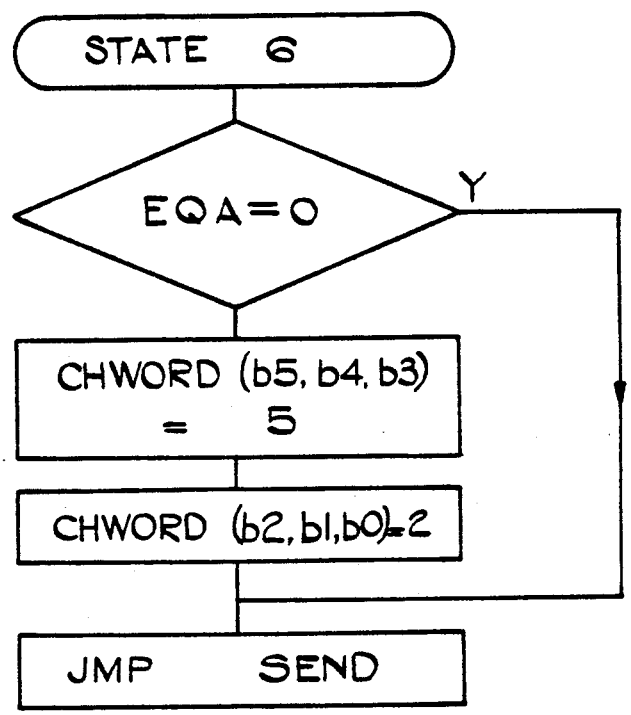

Turning now to FIG. 48, there is shown the flow chart for the program STATE6 which controls the sixth and last phase of the charging cycle. This phase is the "ready" phase and charges the battery at current level 1 so that it is kept fully charged. In the program STATE6, the variable EQA is examined and, if it is equal to 0, a jump is made to the program SEND. If it is not equal to 0, then the status word CHWORD is set so that the program flow will jump to STATE5 during the next pass through the 1 second routine and so that charging will proceed at current level 2. Thus, if it becomes time to give the battery pack an equalising charge whilst STATE6 is being executed, program flow returns to STATE5.

Figure 49A:
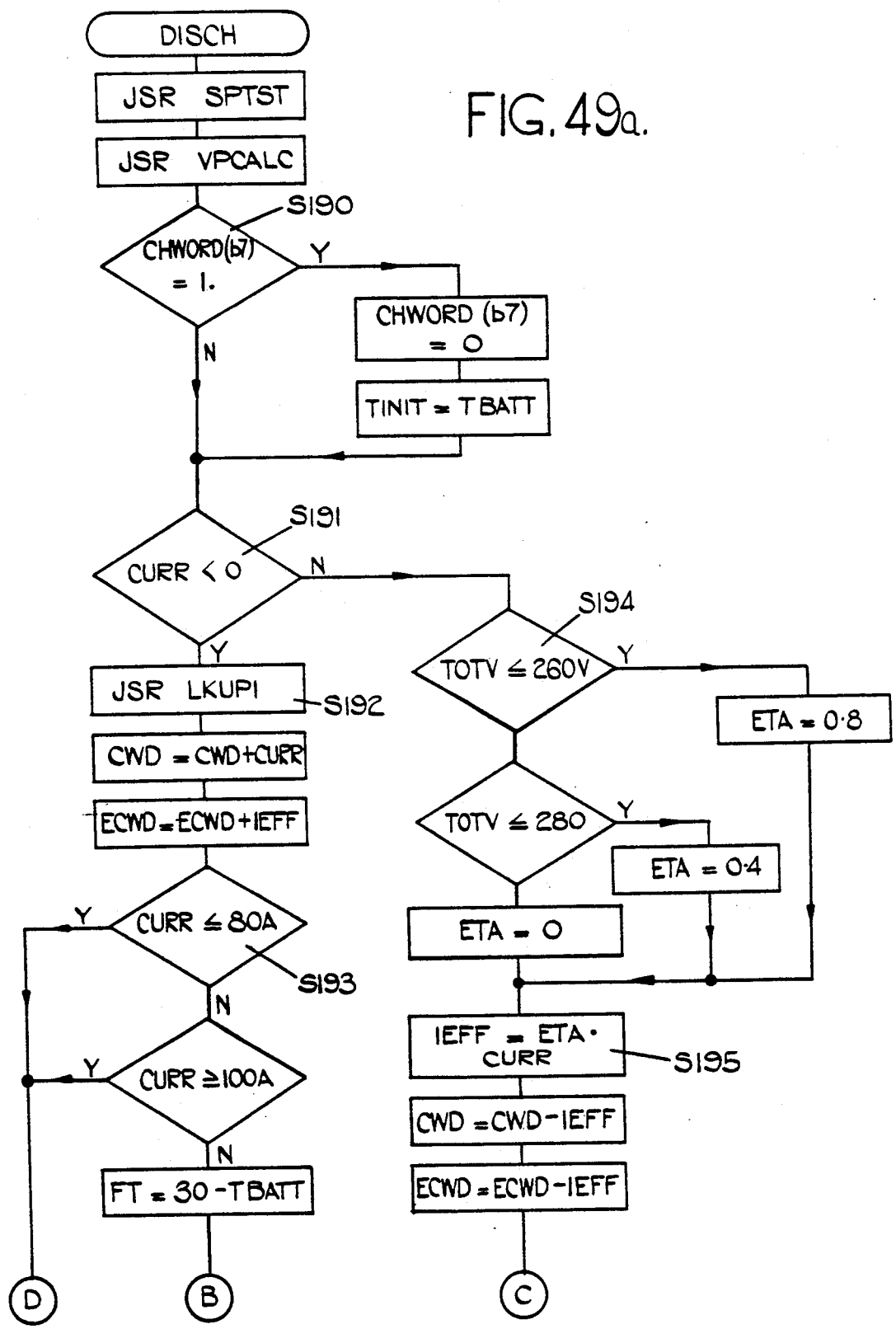
Figure 49B:
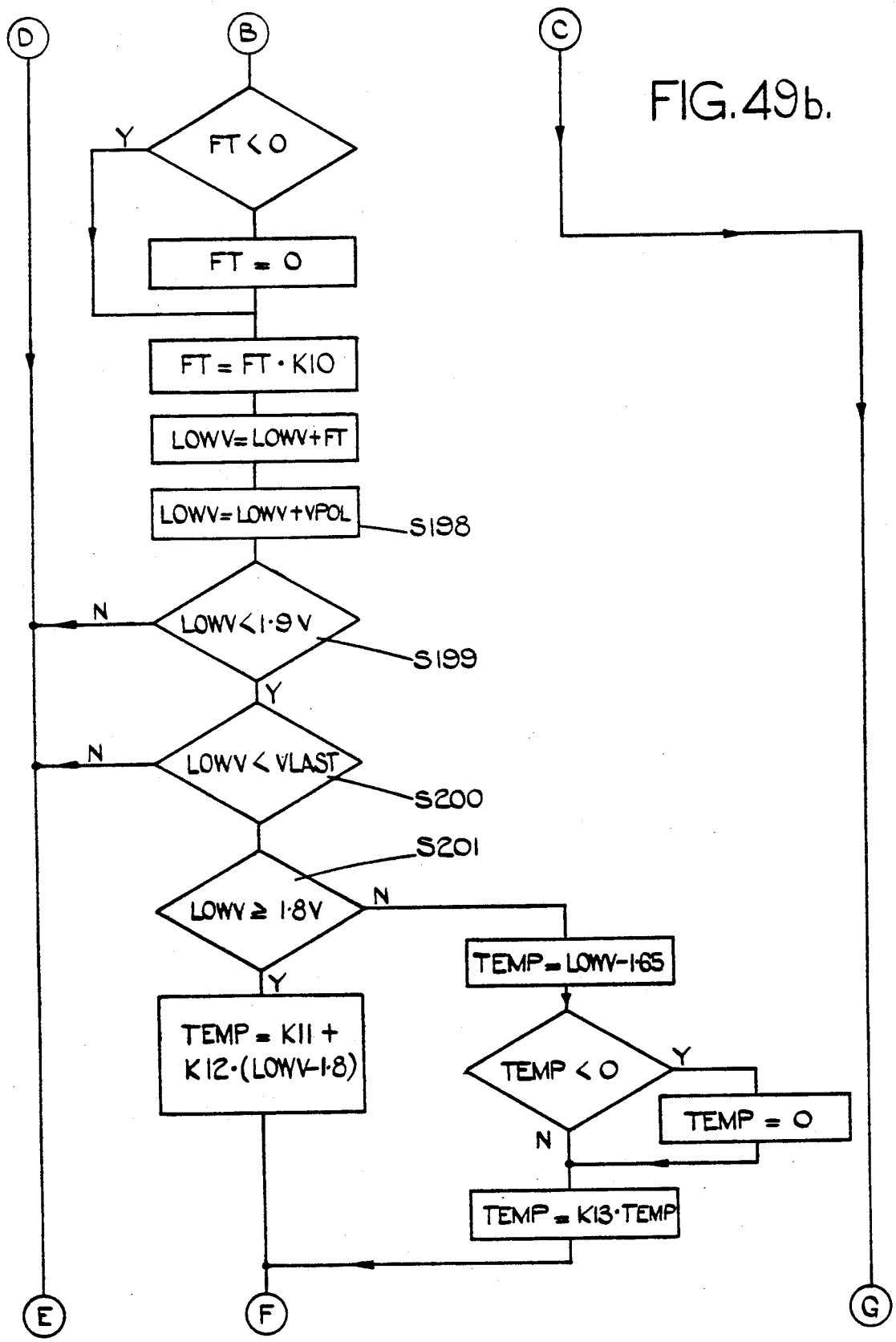
Figure 49C:
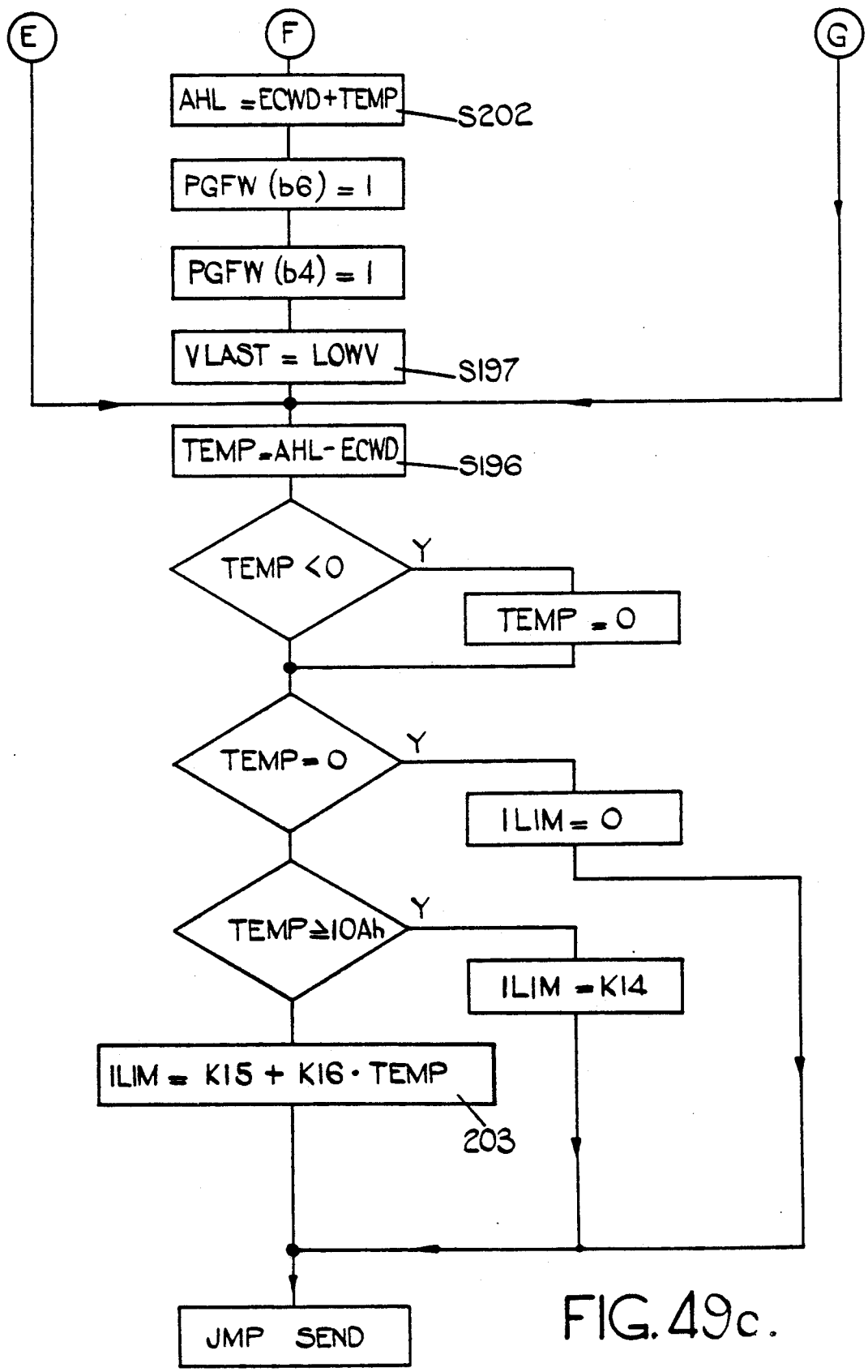

When the vechile is being driven, the program DISCH is executed during the 1 second routine in order to monitor discharge of the battery and also to decide if the armature current of the motor 14 should be limited. The flow chart for this program is shown in FIG. 49 and this will now be described.

After this program has been entered, the sub-routine SPTST is called to determine the lowest sub-pack voltage, which is stored as the variable LOWV, and the total battery voltage, which is stored as the variable TOTV. The sub-routine VPCALC is also called to calculate the polarisation voltage and this is stored as the variable VPOL. Next, in an operation S190 bit 7 of the status word CHWORD is examined. This is set during the program IDLDRV and, if it has been set, the present temperatures of the battery electrolyte is stored as a variable TINIT for subsequent use during the 10 second routine.

In the next part of this program, beginning with an operation S191, the variables CWD and ECWD are calculated. These represent respectively the charge which has been withdrawn from the battery and also the charge withdrawn ajusted to take account of the rate at which it has been withdrawn.

In operation S191, the variable CURR is examined to determine if the battery is being discharged, in which case this variable is negative, or if it being recharged as a result of the motor 14 acting as a generator which will be the case during regenerative braking and in which case the variable will be positive. If the variable is negative, then in an operation S192, the sub-routine LKUP1 is called in which a variable IEFF is calculated and represents the discharge current ajusted in accordance with the rate of discharge. Then, the variable CWD is increased in accordance with the variable CURR and the variable ECWD is increased in accordance with the variable IEFF. The program then continues with an operation S193.

If in operation S191 it was found that the battery was being charged, then the program jumps to an operation S194. The total battery voltage is examined and the variable ETA which represents the charging efficiency is set accordingly. If the total battery voltage is less than 260 V, then ETA is set to 0.8, if it is between 260 and 280 V it is set to 0.4, and if it is greater than 280 V it is set to 0. Then, in an operation S195, the variable IEFF is calculated by multiplying CURR by ETA. The variable CWD is then decreased by an amount IEFF and the variable ECWD is decreased by an amount IEFF. The program then jumps to an operation S196.

As mentioned hereinbefore, the battery voltage falls more rapidly towards the end of discharge and becomes a progressively more reliable parameter for estimating the remaining charge capacity of the battery. Also, the ultimate performance of a battery will be limited by the first cells to reach their end of discharge points. In the next part of this program, providing three conditions are fulfilled, the lowest sub-pack voltage is used to determine the remaining capacity of the battery and this is used to calculate the charge storage capacity of the battery pack.

The first condition is that the discharge current lies in the range 80 amps to 100 amps. If the current is outside this range, then a jump is made to an operation S196. If the current lies within this range, then the lowest sub-pack voltage is corrected in accordance with the electrolyte temperature. To this end, the difference between the electrolyte temperature and 30° Celsius is calculated and stored as a variable FT and this variable is then cleared if negative as connection is not necessary at temperatures greater than 30° C. The variable FT is then multiplied by a constant K10 to obtain the temperature compensation, the variable K10 corresponding to a temperature co-efficient of 2.7 mV/° Celsius for each cell. The variable FT is then added to the variable LOWV to obtain the temperature compensated lowest sub-pack voltage. Then, the variable LOWV is compensated to take account of the polarisation voltage and in order to do this it is increased by an amount VPOL.

The next condition is that the lowest sub-pack voltage is less than 1.9 V/cell. In an operation S199 the lowest sub-pack voltage is examined and if it greater than 1.9 V/cell a jump is made to the operation S196. If it is less than 1.9 V/cell then the program continues with an operation S200.

The third condition is that the lowest sub-pack voltage represented by LOWV is less than the previous value of this voltage represented by the variable VLAST and this condition is examined in operation S200. If the lowest sub-pack voltage is not less than the previous reading, then a jump is made to operation S196 but otherwise the program continues with operation S201.

Figure 50:
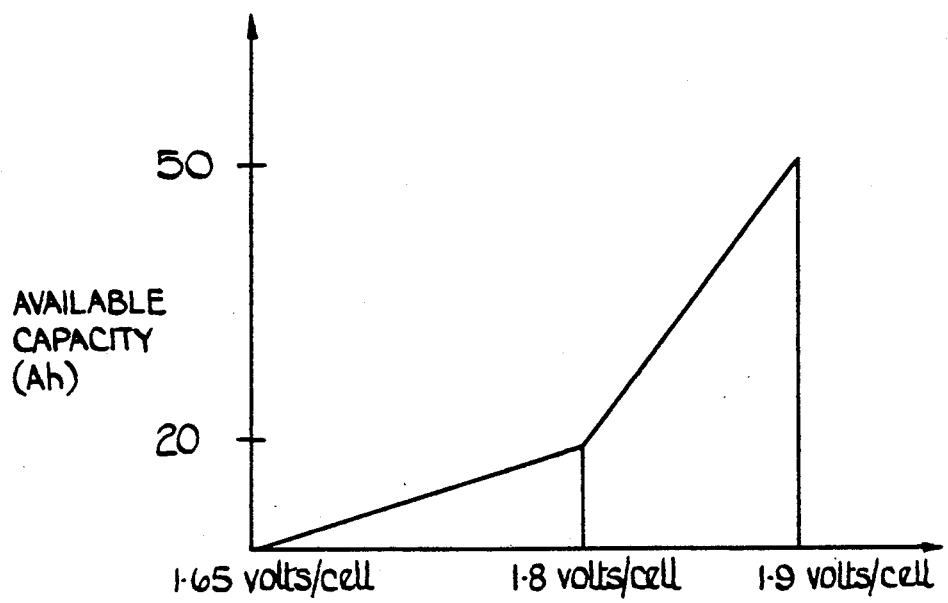
Figure 51:
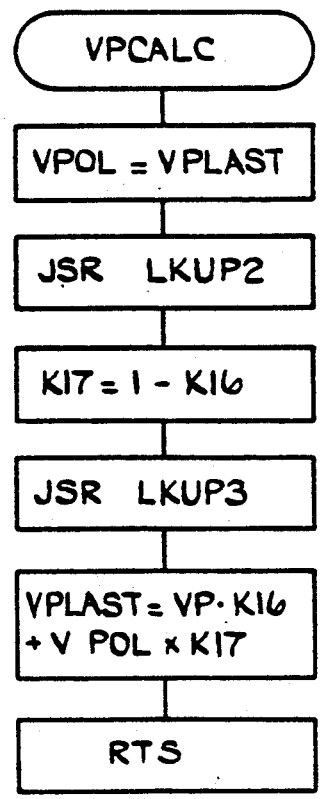

Providing all these three conditions have been fulfilled, the available capacity is then calculated and stored in location TEMP. A graph showing the relationship between the available capacity and the lowest sub-pack voltage is shown in FIG. 50 and the section of the program commencing with operation S201 computes FT in accordance with this graph using constants K11, K12 and k13.

The charge storage capacity of the battery is then calculated in an operation S202 by adding the variables TEMP and ECWD and storing the result as the variable AHL, which represents the charge storage capacity expressed in amps-hours. Bits 4 and 6 of the status word PGFW are then set to indicate respectively that a new value of AHL is available and that AHL has been corrected. The variable LOWV is then stored as the variable VLAST in the operation in the operation S197 before the operation proceeds to operation S196.

In the last past of the program DISCH commencing with the operation S196 the variable ILIM, which represents the maximum current which may be supplied to the traction motor 14, is calculated. In order to achieve this, in operation S196, the remaining capacity of the battery is calculated as the difference between the variables AHL and ECWD and the result is stored as the variable TEMP. The variable TEMP is then set to 0 if negative. If the variable TEMP is equal to 0, then the variable ILIM is set to 0 before a jump is made to the program SEND. Thus, if there is no remaining charge, the traction motor 14 is disabled. If the remaining charge is greater than 10 amp-hours, then the variable ILIM is set to a constant K14 which represents the normal maximum demand current of the motor 14. If the available capacity is between 0 and 10 amp-hours, then in operation S203 the variable ILIM is set equal to a constant K16 multiplied by the variable TEMP and added to a constant K15. The constants K15 and K16 are selected so that the maximum current of the motor 14 will be reduced linearly as the available capacity falls from 10 amp-hours to 0 from the normal maximum value to 0.4 of this value.

By reducing the maximum motor current in this way, damaging the discharge to the battery, which may result for example in cell reversal, is avoided, and at the same time the vehicle remains drivable during low states of charge.

The program VPCALC will not be described which calculates the polarisation voltage for each sub-pack. It has been found that polarisation voltage is a complex function of time and current which may be expressed as follows:

$$VP = 0.076 \, I^{.377}$$

and $$\tau = 29.3 - 4.71 \ln \omega)$$

Where VP is polarisation voltage as time tends to infinity, I is the peak current, and $\tau$ is the time constant.

Figure 52:
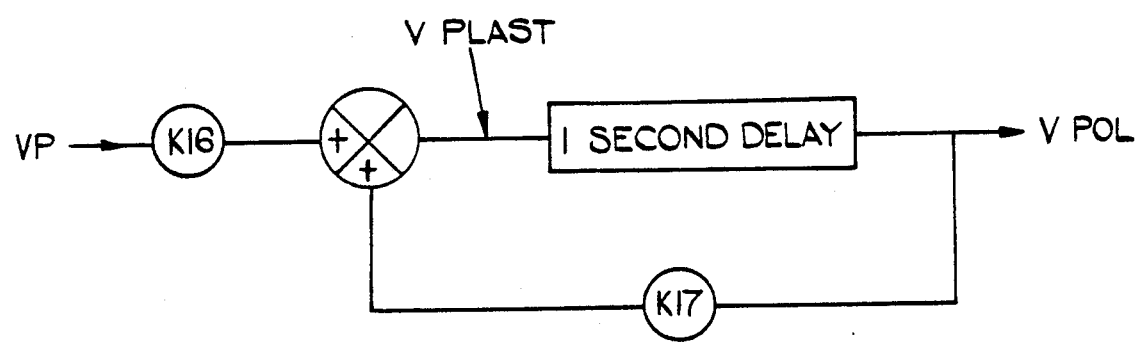

In order to calculate the polarisation voltage VPOL, the program VPCALC simulates the filter shown in FIG. 52. This filter uses constants K16 and K17 and also a variable VPLAST which are defined as follows:

K17=1$^{-1/\tau}$
K16=1−K17
VPLAST=K16.VP+K17.VPOL

Turning now to FIG. 50, there is shown the flow chart for the program VPCALC. After the program has been entered, the variable VPOL is set equal to the value of VPLAST calculated during the previous pass through this program, which will have been 1 s previously. The sub-routine LKUP2 is then called which is a look-up table for calculating the constant K16 as a function of peak current as given by the variable IPEAK. Next, the variable K17 is calculated. Then the sub-routine LKUP3 is called which calculates the variable VP as a function of the peak current. Finally, the variable VPLAST is calculated in accordance with the definition given above.

Figure 53:
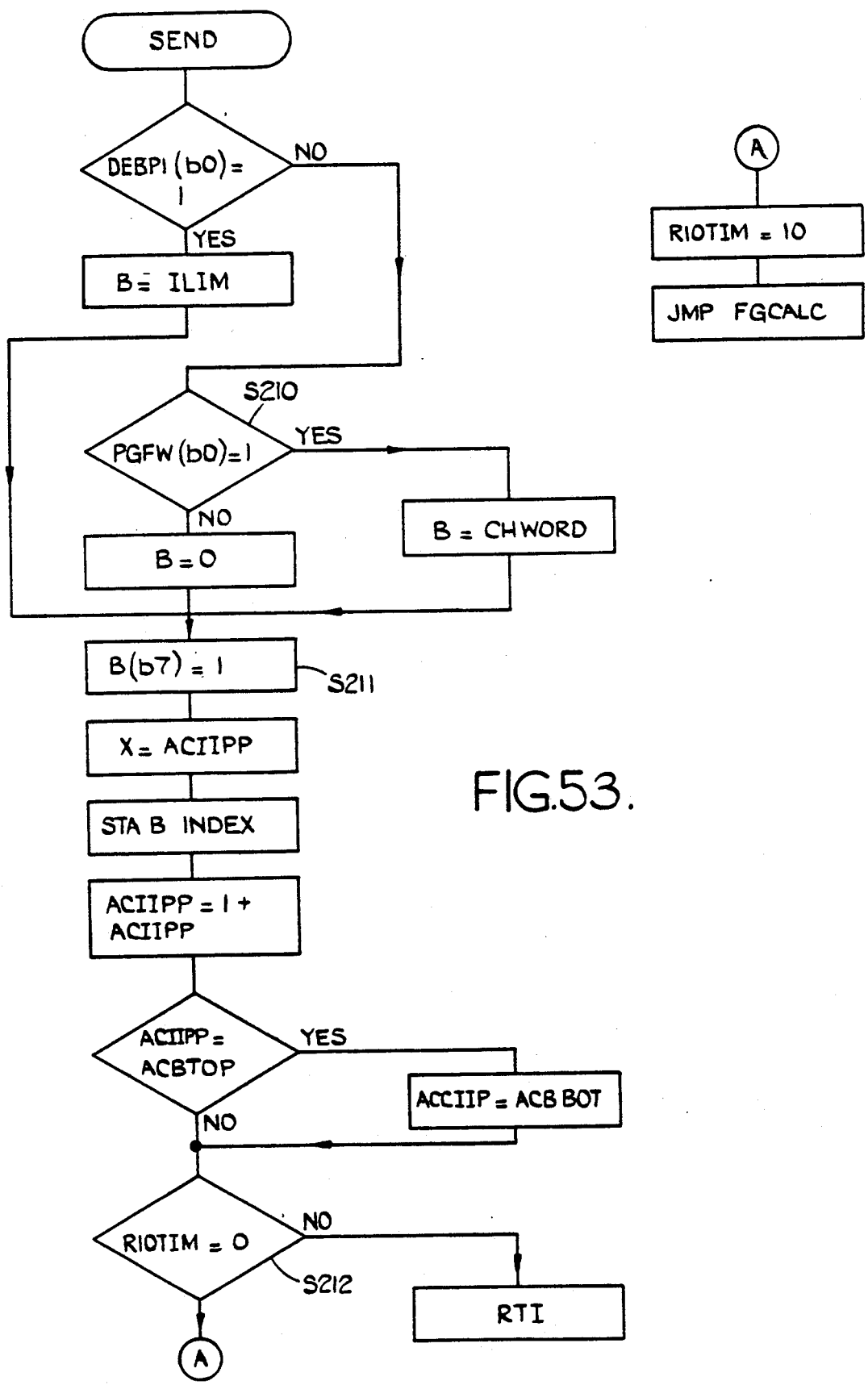

Turning now to FIG. 53, there is shown the flow chart for the program SEND. This program is responsible for loading data into the output buffer for transmission to the ACIA during the sub-routine BACKGRND.

After this program has been entered, a bit 0 of the status word DEBP1 is examined to determine if the vehicle power is on. If it is not on, then a jump is made to an operation S210. If it is on, then the variable ILIM is loaded into accumulator B, and a jump then made to an operation S211. In operation S210. bit 0 of the status word PGFW is examined to determine if the charger should be enabled. If it should be enabled, then the status word CHWORD is loaded into accumulator B and a jump is then made to operation S211. Otherwise, accumulator B is set to 0.

In operation S211, bit 7 of accumulator B is set to 1 as this is the address bit for the serial to parallel converter 74 and also for the charger 22. Accumulator B is then stored in the output data stack at the location pointed at by the variable ACIIPP, and this variable is then incremented. The variable ACCIPP is then examined and, if it is equal to ACBTOP, i.e. if it has now reached the top of the output data stack, it is reset to ACBBOT which is the bottom of the output data stack.

Next, in an operation S212, the variable R10TIM is examined to determine if it is zero and the 10 second routine should be performed. If the 10 second routine is to be performed, the variable R10TIM is set to 10 and a jump is then made to the program FGCALC. If the 10 second routine is not to be performed, a return from interrupt is performed.

10 SECOND ROUTINE

Figure 54A:
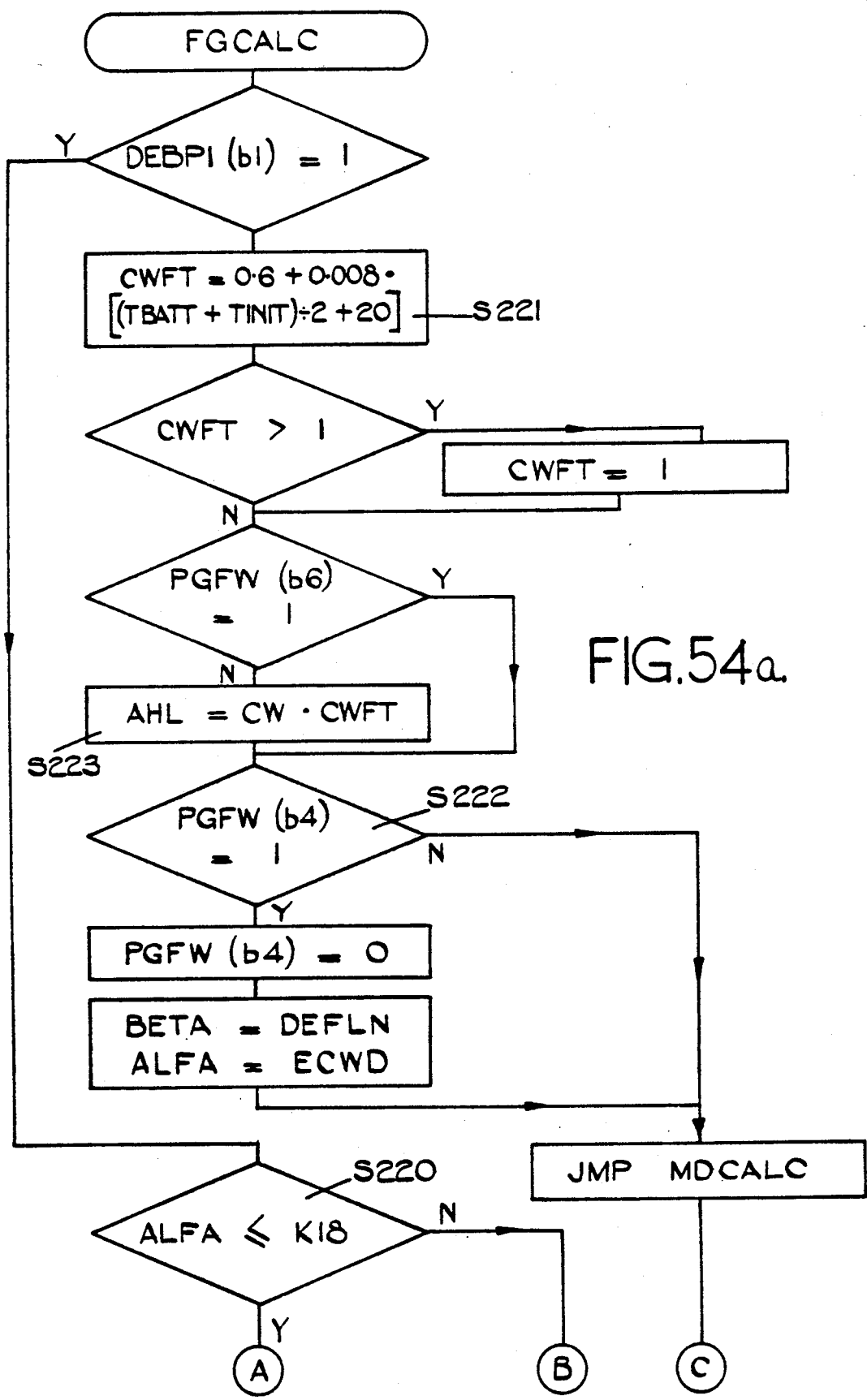
Figure 54B:
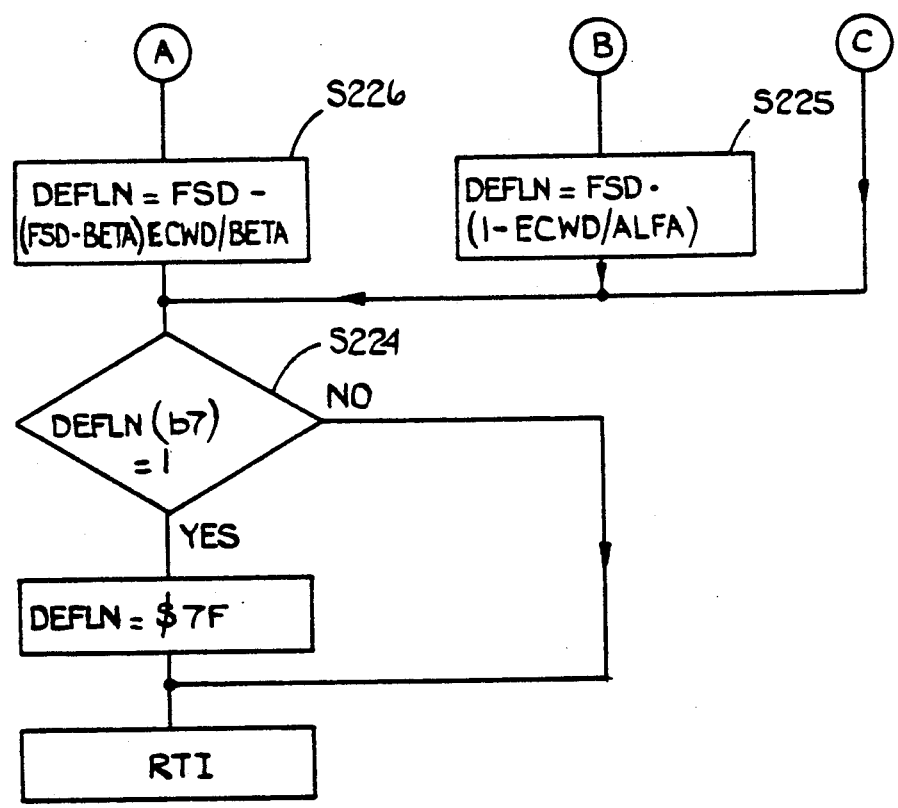

Referring now to FIG. 54, there is shown the flow chart for the program FGCALC which is responsible for calculating the state of charge of the battery and storing the result as the variable DEFLN.

After the program has been entered, bit 1 of the status word DEBP1 is examined to see if the charger is connected. If the charger is connected, a jump is made to an operation S220 but otherwise the program continues with an operation S221.

In operation S221, the variable CWFT is calculated as a function of the electrolyte temperature represented by the variable TBATT and by the initial electrolyte temperature represented by the variable TINIT. The value of this variable is then checked and if greater than 1 it is set to 1.

Next, bit 6 of the status word PGFW is examined to see if the variable AHL was corrected during the program DISCH. If it has been corrected, then a jump is made to an operation S222. If the variable AHL was not corrected, then it is calculated in an operation S223 by multiplying the variable CW by the variable CWFT. The variable CW represents the charge storage capacity limit of the battery at 30° Celsius. By multiplying this by CWFT, it is effectively derated by 0.8%/°C.

In operation S222, bit 4 of the status word PGFW is examined to determine if a new value of the variable AHL is available. If a new value of AHL is not available, then sub-routine MDCALC is called to calculate the variable DEFLN and a jump is then made to an operation S224. If a new value of the variable AHL is available, then bit 4 of PGFW is cleared, and then the present value of DEFLN is stored as the variable BETA and the variable ECWD is stored as the variable ALFA before calling the sub-routine MDCALC. As will be explained with reference to the sub-routine MDCALC, this results in rescaling the meter 64 each time the value of AHL is adjusted during the program DISCH to avoid a discontinuity in the meter reading.

In operation S220, the variable ALFA is compared with a constant K18 and, providing it is greater than this constant, the value of DEFLN is calculated in operation S225. If ALFA is less than K18, the operation S225 will not produce an accurate value for the variable DEFLN and so it is calculated instead in an operation S226. In operations S225 and S226 a constant FSD is used which represents full scale deflection of the meter 64. The program then continues with the operation S224.

In operation S224, bit 7 of the high byte of the variable DEFLN is examined and, if it is set to 1, the variable DEFLN is set to hexadecimal 7F as a 1 in bit 7 implies that the variable is negative when in fact an overflow will have occurred. A return from interrupt is then executed.

As the 1 second routine or the 10 second routine may have been interrupted to perform the 0.1 second routine, and as the interrupt bit of the condition code register may have been set during the 0.1 second routine to indicate that the system should be shut down following a transition to idle, before return from interrupt is performed at the end of the 1 second or 10 second routine the interrupt mask bit in the condition code register is examined and, if necessary, handed on to the interrupt mask bit in the condition code register to be restored as a result of the return from interrupt operation.

UTILITY SUB-ROUTINES

Figure 55:
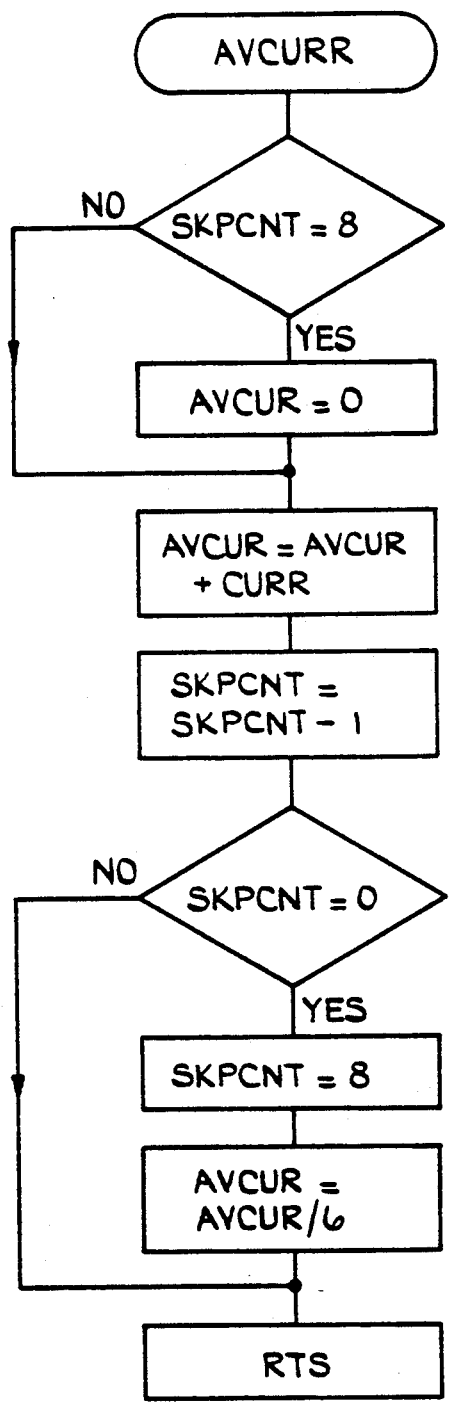

Referring now to FIG. 55, there is shown the flow chart for the program AVCURR which calculates the average current during charging and stores this as a variable AVCUR. After this sub-routine has been entered, the variable SKPCNT is examined and, if it is equal to 8, this means that an average current was found during the previous pass through this sub-routine and so AVCUR is set to 0. Next, the variable AVCUR is incremented by CURR and the variable SKPCNT is then decremented. Next, the variable SKPCNT is examined and, if it is equal to 0, a valid average current may now be calculated as 8 passes through this sub-routine have been completed. Therefore, the variable SKPCNT is now set equal to 8 in preparation for the next pass through this sub-routine and the variable AVCUR is divided by 6. This division is performed because during charging the current amplifier formed by amplifiers 600 and 610 shown in FIG. 7 is set to its low range which results in the current readings being multiplied by a factor of 6 compared with the high range. A return from sub-routine is then performed.

In general, the charge which may be withdrawn from a battery decreases with increasing discharge current because of the selection of progressively more preferential reaction sites at the surfaces of the battery plates at higher currents. In the programs described above, the variable IEFF has represented the discharge current corrected to take account of the rate of discharge. Peukert has shown that the variable IEFF is related to the variable CURR as follows:

$$IEFF = I2(CURR/I2)^n$$

where I2 is the current which will discharge the battery in two hours and n is a constant, typically 1.15 for lead acid batteries.

Figure 56A:
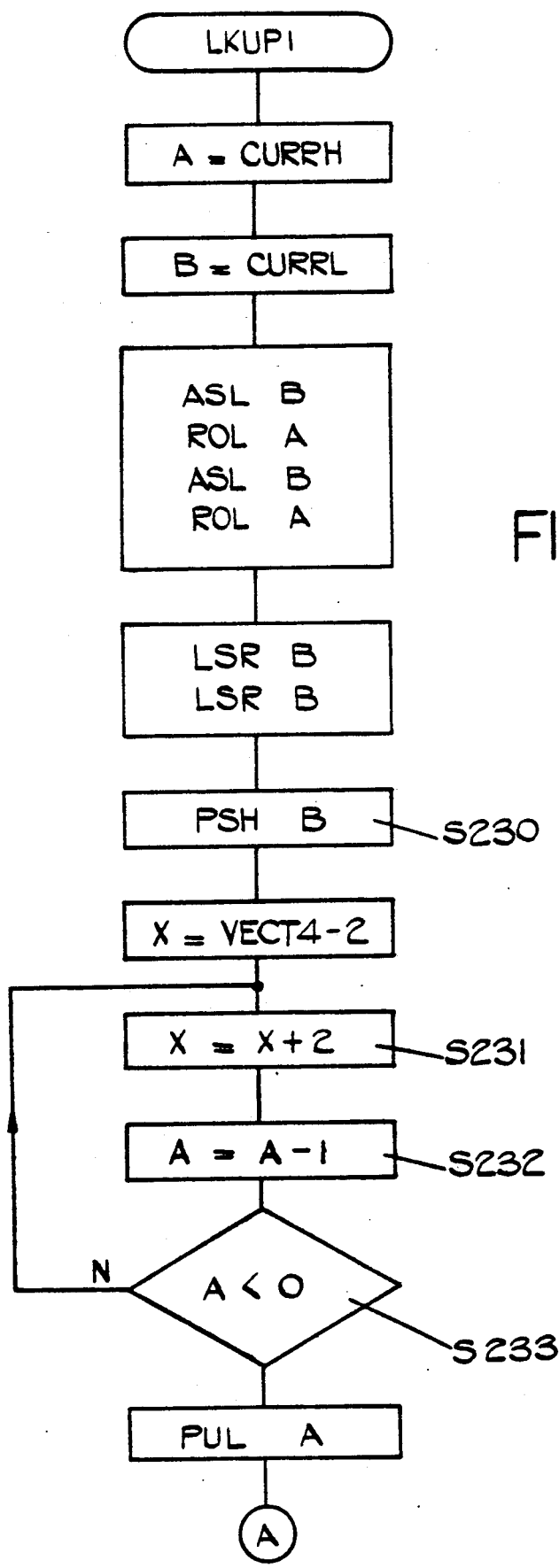
Figure 56B:
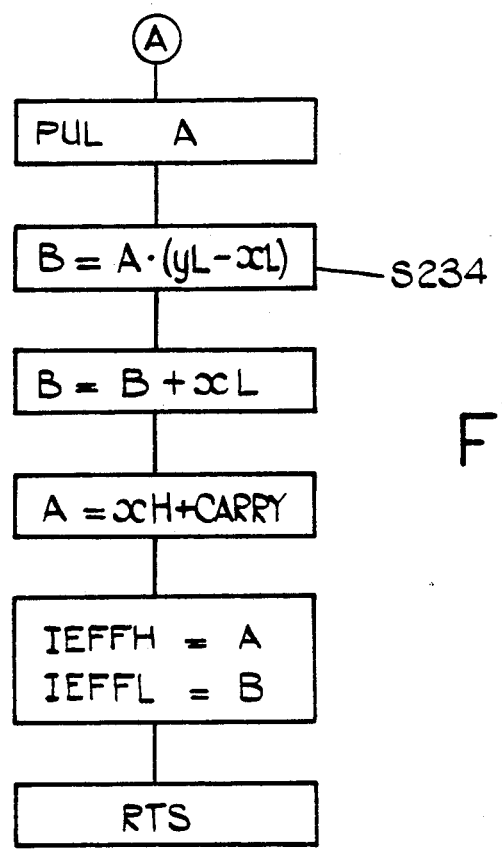
Figure 57:
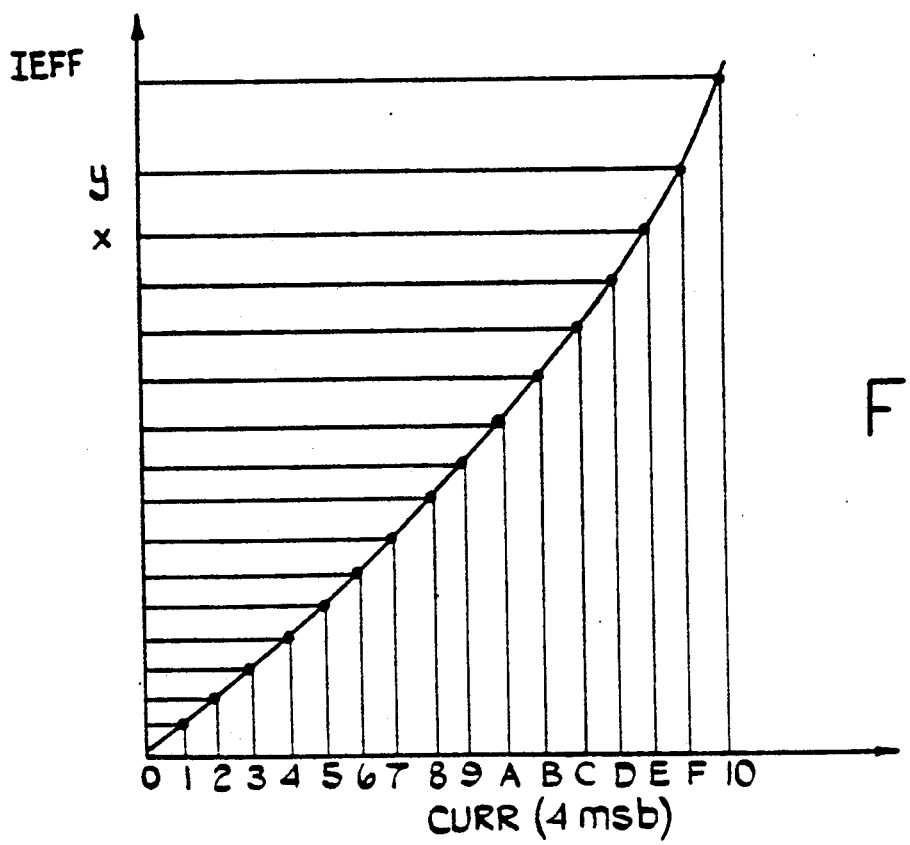

In FIG. 56, there is shown the flow chart for the program LKUP1 which calculates the variable IEFF from the variable CURR. This program includes a table for converting the 4 most significant bits of the variable CURR to the value of IEFF corresponding to those 4 bits, and the remaining 6 bits of CURR are then converted in interpolation. The flow chart will now be described with reference to FIG. 57 which is a graph showing the variation of IEFF with CURR.

After the program has been entered, the high byte of CURR is stored in accumulator A and a low byte in accumulator B. The 4 most significant bits of the variable CURR are then positioned in accumulator A and, in an operation S230, the 6 least significant bits are pushed on to the stack. The index register is then set to a value VECT4-2, VECT4 representing the bottom of the table for converting CURR to IEFF. Then, in an operation S231, the index register is incremented twice, in an operation S232 the accumulator A is decremented, and in an operation S233 the value of A is examined and if not less than zero operations S231, S232 and S233 are repeated. If the value of A is now equal to or greater than zero, then the index register now points to the location at which the high byte of value of IEFF corresponding to the 4 most significant bits of CURR is stored and low byte is stored in the next location. If we assume that the 4 most significant bits of CURR are equal to hexadecimal E, then the corresponding value of IEFF will be x.

Interpolation on the next six bits is now performed. In order to achieve this, these six bits are pulled from the stack and loaded into accumulator A. Then, in an operation S234, these six bits are multiplied by the difference between the low byte yL of the next higher value in the table and the low byte of x, i.e. xL and the result is stored in accumulator B. xL is then added to the accumulator B in an operation S235 and the sum of xH and the carry bit form operation S235 is loaded into accumulator A. Lastly, before executing a return from sub-routine, the high and low bytes of the variable IEFF are set respectively to the values of accumulators A and B.

Figure 58:
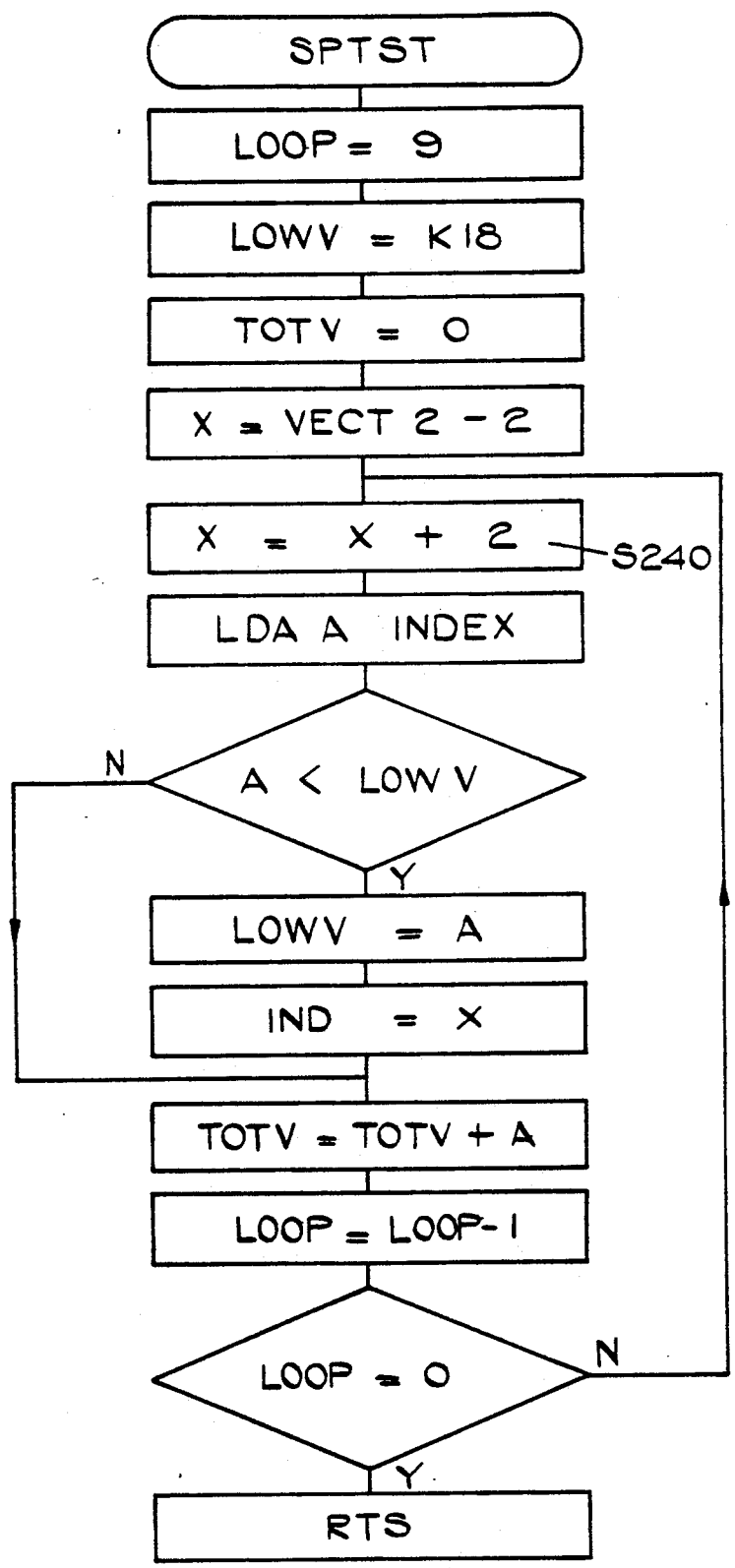

Referring now to FIG. 58, there is shown the flow chart for the sub-routine SPTST in which the lowest sub-pack voltage is found and stored as the variable LOWV, the address of that sub-pack is found and stored as the variable IND, and the total battery voltage is found and stored as the variable TOTV.

After the sub-routine has been entered, a variable LOOP is set to 9, LOWV is set to the constant K18, and TOTV is set to 0. The index register is then set to VECT2-2, VECT2 being the address of the first sub-pack. Then, in an operation S240, the index register is incremented twice, and then the voltage of the sub-pack at which the index register is pointing is loaded into accumulator A. If this is lower than the present value of LOWV, it is stored as LOWV and the index register, which is the address of this sub-pack, is stored in IND. Accumulator A is then added to TOTV, LOOP is decremented, and a jump is made to operation S240 if LOOP is not yet 0. (Although the sub-pack voltages are stored as double byte variables, they are treated as single byte variables in the above explanation for reasons of simplicity).

Figure 59A:
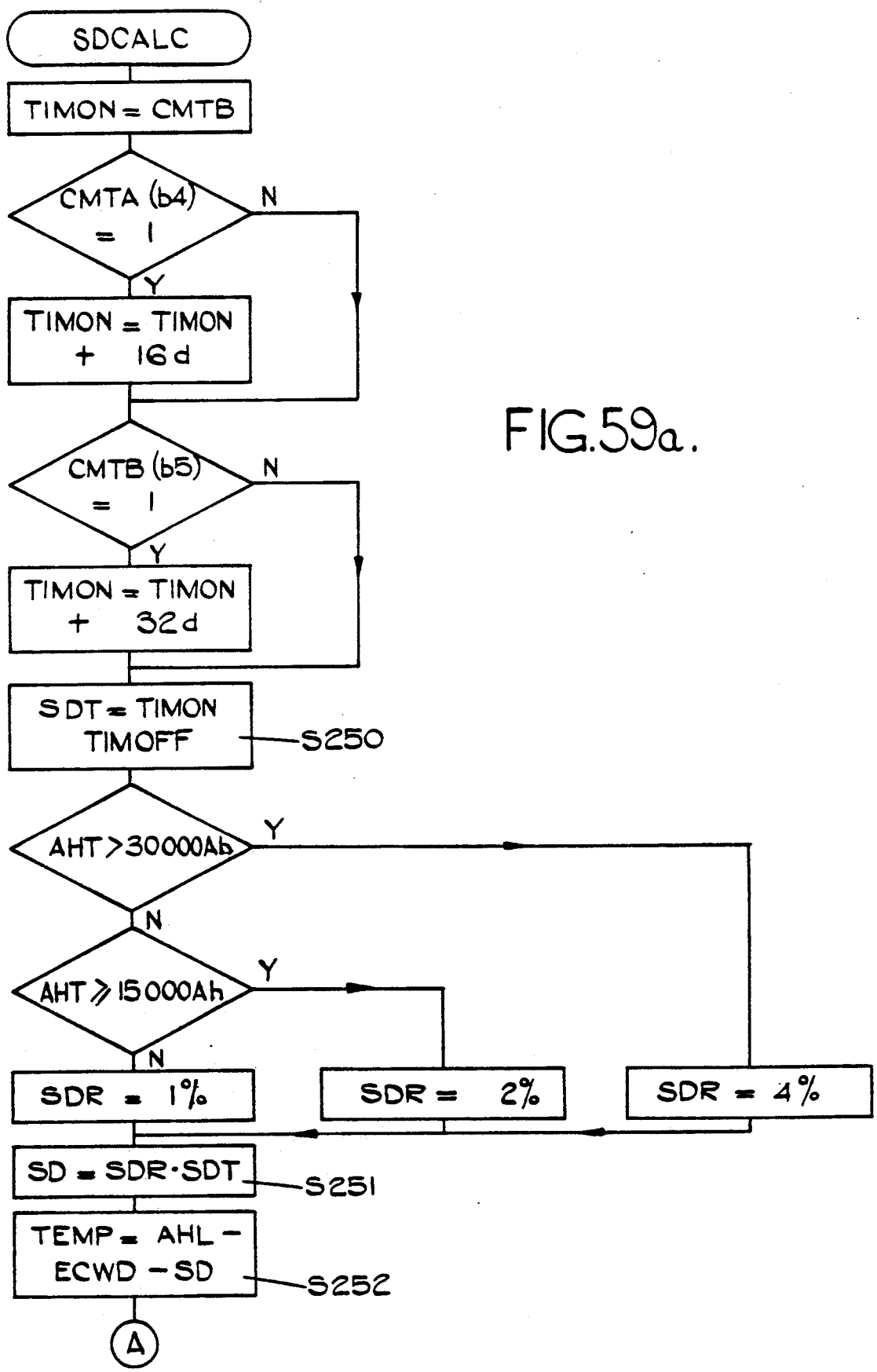
Figure 59B:
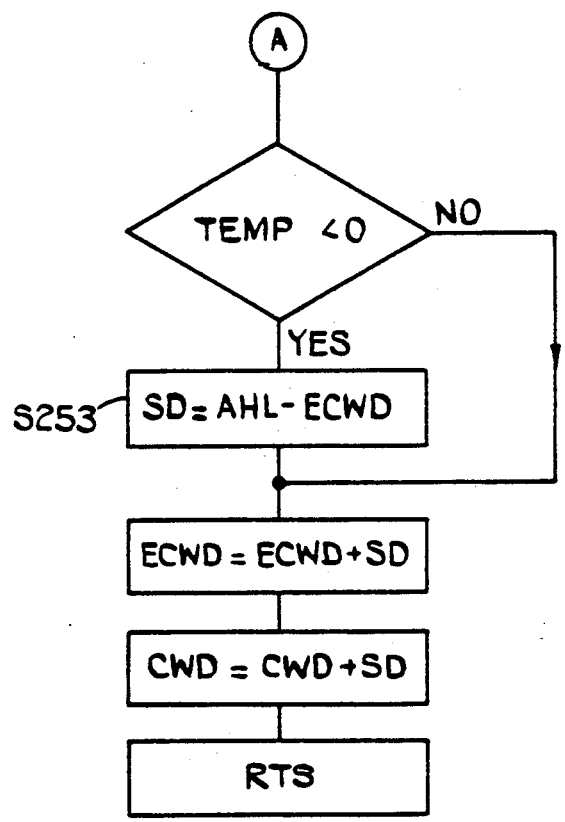

During idle periods, the battery will undergo self discharge and the flow chart of the sub-routine SDCALC which calculates this is shown in FIG. 59. This sub-routine is performed at the end of each idle period.

After this sub-routine has been entered, the register CMTB is stored as a variable TIMON, the variable TIMON then being increased by a value representing 16 days if bit 4 of register CMTA is set to 1, and then by a further 16 days if bit 5 of CMTB is set equal to 1. The time at which the idle period ceased is now stored as TIMON and the idle period is obtained, in an operation S250, by subtracting TIMOFF from TIMON and stored as SDT.

The variable AHT, which represents the total cumulative discharge of the battery, is now examined and used to calculate a variable SDR representing discharge rate. If AHT is greater than 30,000 Ah, then SDR is set to a value which corresponds to a discharge rate of 4% of the total battery capacity per day, if AHT lies in the range 15,000 Ah to 30,000 Ah the variable SDR is set to a value which represents 2% per day, and if it is less than 15,000 Ah then SDR is set to a value which corresponds to 1% per day. The variable SD which represents the self discharge which has occurred is then calculated in an operation S251 by multiplying SDR by SDT. Then, in the set of operations S252 to S253 the variable SD is compared with AHL and ECWD to check if the self discharge is greater than the remaining capacity of the battery. If it is greater than the remaining capacity, then an operation S253 SD is set equal to the difference between AHL and ECWD, i.e. the remaining capacity. Finally, the variable SD is added to both the variables CWD and ECWD before a return from sub-routine is executed.

Figure 60:
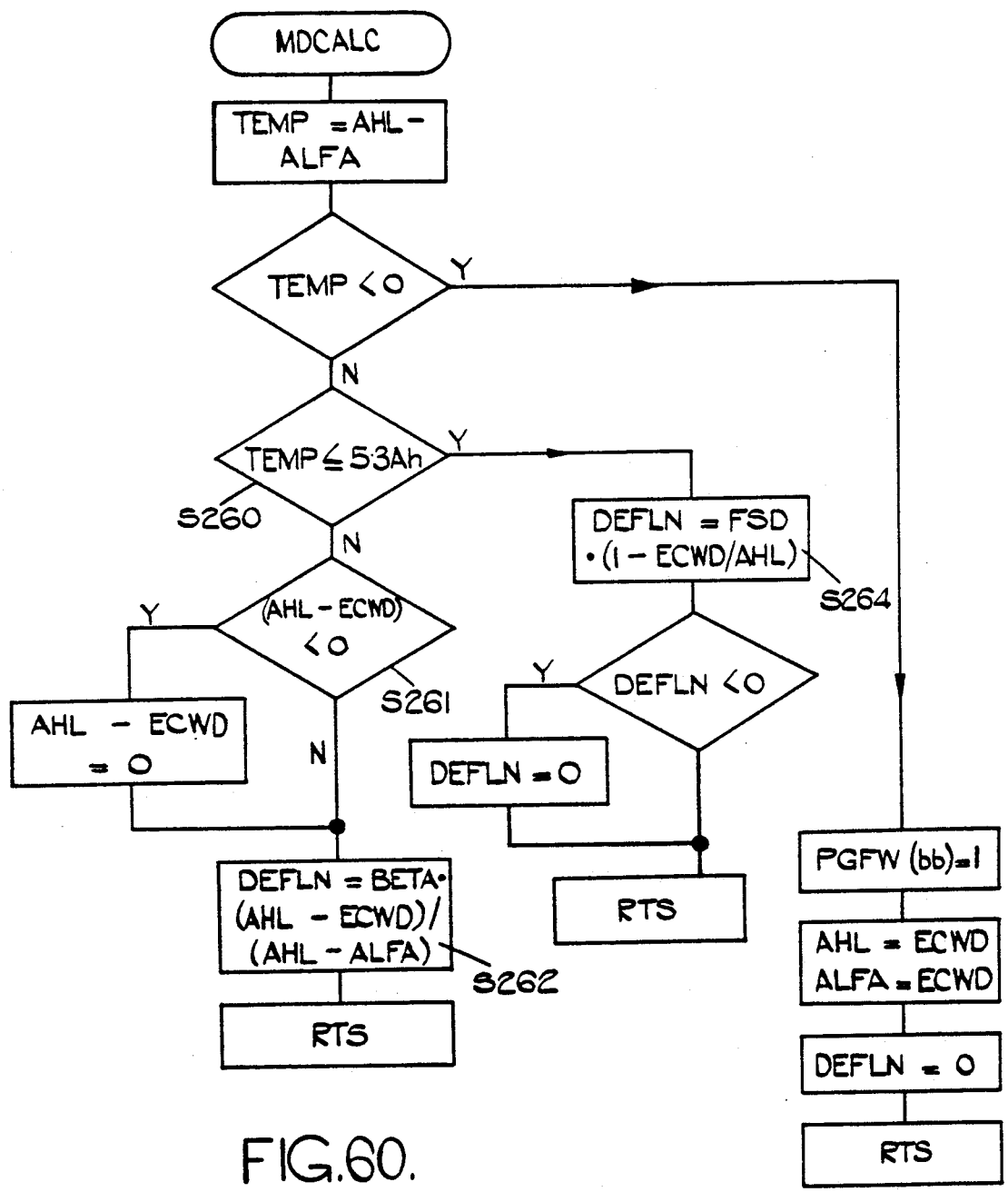

The flow chart for the sub-routine MDCALC which is called by the programs IDLCHR, IDLDRV and FGCALC and which calculates the variable DEFLN is shown in FIG. 60.

After this program has been entered, ALFA is subtracted from AHL and loaded into location TEMP. The value of TEMP is examined. If TEMP is negative, this implies that the effective charge which has been withdrawn from the battery exceeds its capacity and, consequently, bit 6 of the status word PGFW is set to 1 to indicate that the variable AHL has been corrected, and both AHL and ALFA are set to the present value of ECWD thereby correcting AHL. Before a return from sub-routine is executed, DEFLN is set to 0.

If TEMP is not less than 0, then the program continues with an operation S260. In this operation, TEMP is examined to see if it is greater than 5.3 Ah and, if it is, the sub-routine continues with an operation S261. In operation S261, the quantity (AHL−ECWD) is examined and, if it is negative, it is set to 0. The value of DEFLN is then calculated in operation S262 in accordance with the following equation.

$$DEFLN = BETA.(AHL-ECWD)/(AHL-ALFA)$$

Figure 61:
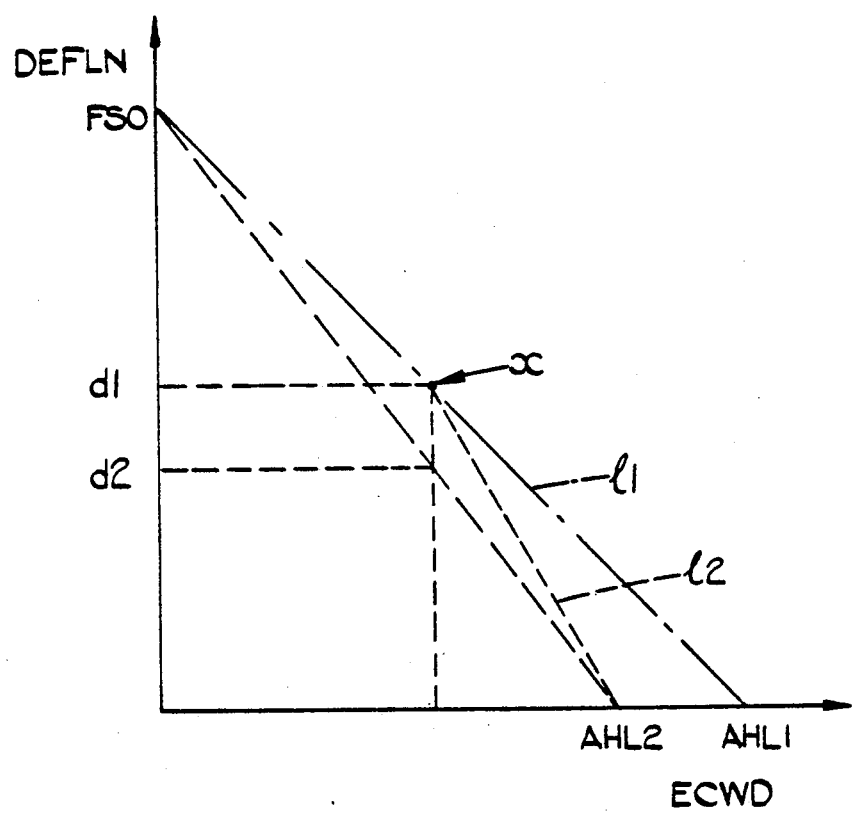

The reason for using this equation will now be explained with reference to FIG. 61. If DEFLN was simply calculated as being proportional to ECWD/AHL and discharge commenced with a full battery it would initially be set to a value FSD representing full charge. Then, if the value of AHL was initially AHL1, the value of DEFLN would fall linearly with increasing ECWD as indicated by the line 1 1. Then, if at point x a new value of AHL was calculated as AHL2, the value of DEFLN would jump from d1 to d2. It is in order to avoid this jump that the equation given above is used. As the variables BETA and ALFA are set respectively to the present values of DEFLN and ECWD each time the value of AHL is corrected, the jump is avoided and the variable DEFLN is effectively rescaled.

Returning now to operation S260, if it is found that TEMP is less than 5.3 Ah, then the quantity (AHL−ALFA) is too small for accurate division in operation S262. Therefore, a jump is made to an operation S264 in which the value of DEFLN is calculated in accordance with the expression there shown.

The value of DEFLN is then examined and set to zero if negative before executing a return from sub-routine.

The sub-routines LKUP2 and LKUP3 will not be described in detail as these are generally similar to the sub-routine LKUP1.

What is claimed is:

1. A combined motor control and battery monitoring system for an electric vehicle having a main electric traction motor, said system comprising:
   a traction battery pack having a plurality of cells connected in series for providing power to the traction motor, said battery pack being divided into a plurality of sub-packs each of which includes one or more cells;
   means for controlling the current supplied to the traction motor;
   means for determining when a voltage of the sub-packs having the lowest voltage falls below a critical value;
   means interconnected with the controlling means and the determining means for restricting the current supply to the traction motor when the lowest sub-pack voltage falls below said critical value; and
   wherein the determining means is responsive to the battery current, the determining means calculates polarization voltage as a function of battery current and time, and the determining means compensates the individual sub-pack voltages for the polarization voltage.

* * * * *